(12) United States Patent
Nil et al.

(10) Patent No.: US 8,269,284 B2
(45) Date of Patent: Sep. 18, 2012

(54) METHOD OF MANUFACTURING SEMICONDUCTOR DEVICE, AND SEMICONDUCTOR DEVICE

(75) Inventors: Koji Nil, Kanagawa (JP); Motoshige Igarashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/019,600

(22) Filed: Feb. 2, 2011

(65) Prior Publication Data

US 2011/0193173 A1 Aug. 11, 2011

(30) Foreign Application Priority Data

Feb. 5, 2010 (JP) ................................. 2010-024513

(51) Int. Cl.
*H01L 27/088* (2006.01)
*H01L 21/8234* (2006.01)
(52) U.S. Cl. ................ 257/368; 257/374; 257/E21.616; 257/E27.026; 438/294; 438/295
(58) Field of Classification Search .................. 257/368, 257/374; 438/294, 295
See application file for complete search history.

(56) References Cited

U.S. PATENT DOCUMENTS

| | | | | |
|---|---|---|---|---|
| 6,466,489 B1 * | 10/2002 | Ieong et al. | ............... | 365/189.09 |
| 7,245,158 B2 * | 7/2007 | Yang et al. | .................... | 326/105 |
| 7,304,874 B2 * | 12/2007 | Venkatraman et al. | ....... | 365/49.1 |
| 7,601,569 B2 * | 10/2009 | Cai et al. | ........................ | 438/149 |
| 2007/0194392 A1 * | 8/2007 | Travis et al. | ................... | 257/394 |
| 2007/0287239 A1 * | 12/2007 | Yoon et al. | ..................... | 438/184 |
| 2009/0134468 A1 * | 5/2009 | Tsuchiya et al. | .............. | 257/368 |
| 2009/0321831 A1 * | 12/2009 | Cai et al. | ........................ | 257/348 |
| 2010/0112779 A1 * | 5/2010 | Travis et al. | ................... | 438/401 |
| 2011/0073958 A1 * | 3/2011 | Chang et al. | ................... | 257/390 |
| 2011/0241121 A1 * | 10/2011 | Kwon et al. | .................... | 257/369 |
| 2012/0086077 A1 * | 4/2012 | Fried et al. | ..................... | 257/347 |

OTHER PUBLICATIONS

Jae-Joon Kim et al., "Relaxing Conflict Between Read Stability and Writability in 6T SRAM Cell Using Asymmetric Transistors," IEEE Electron Device Letters, vol. 30, No. 8, Aug. 2009.

* cited by examiner

*Primary Examiner* — Alexander Ghyka
(74) *Attorney, Agent, or Firm* — McDermott Will & Emery LLP

(57) ABSTRACT

There are provided a method of manufacturing a semiconductor device which achieves a reduction in implantation masks, and such a semiconductor device. By implanting boron into NMOS regions using a resist mask and another resist mask as the implantation masks, p-type impurity regions serving as the halo regions of access transistors and drive transistors are formed. By further implanting phosphorus or arsenic into a PMOS region using another resist mask as the implantation mask, n-type impurity regions serving as the halo regions of load transistors are formed.

20 Claims, 92 Drawing Sheets

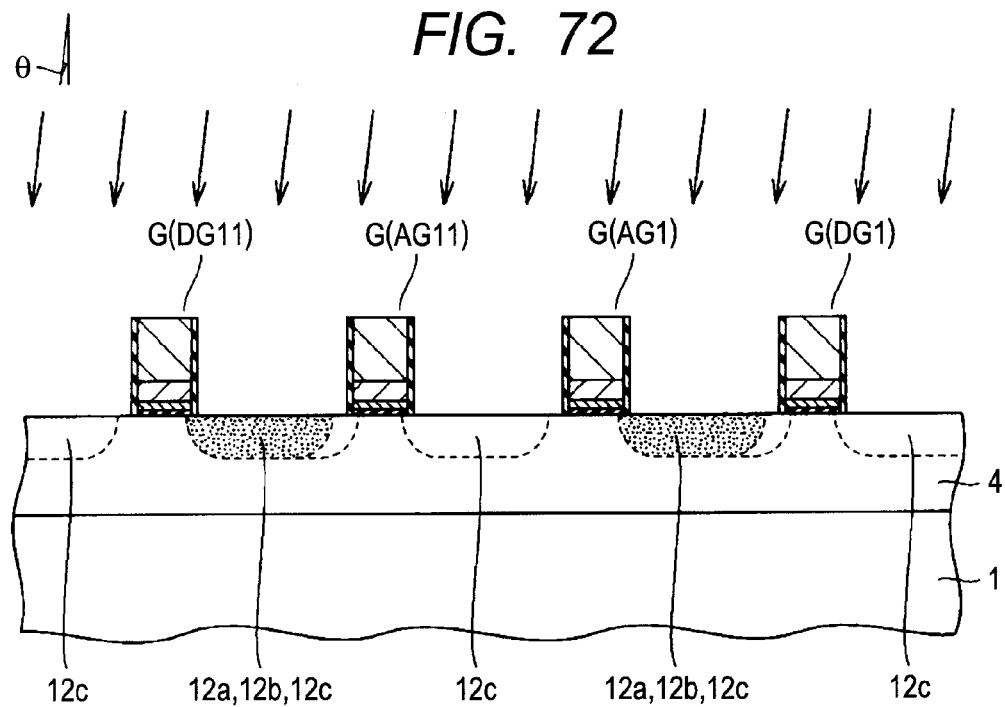
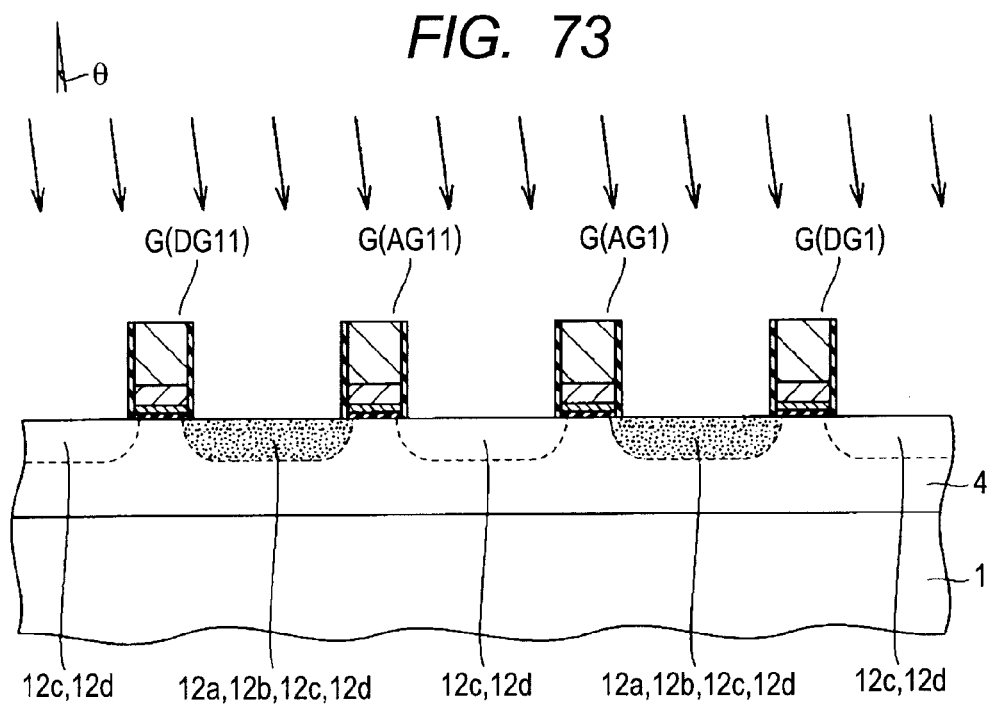

METHOD OF MANUFACTURING SEMICONDUCTOR DEVICE, AND SEMICONDUCTOR DEVICE

CROSS-REFERENCE TO RELATED APPLICATIONS

The disclosure of Japanese Patent Application No. 2010-24513 filed on Feb. 5, 2010 including the specification, drawings and abstract is incorporated herein by reference in its entirety.

BACKGROUND OF THE INVENTION

The present invention relates to a method of manufacturing a semiconductor device and the semiconductor device, and particularly to a method of manufacturing a semiconductor device including a SRAM and such a semiconductor device.

As a form of a semiconductor device, there is a semiconductor device called a SOC (System On Chip). In a semiconductor device of this type, a plurality of logic circuits, memory cells, and the like are mounted on one chip. A description will be given herein of a semiconductor device in which a SRAM (Static Random Access Memory) is applied to a memory cell of such a semiconductor device.

A SRAM memory cell includes a flip-flop in which two inverters are cross-coupled, and two access transistors. In the flip-flop, two cross-coupled storage nodes are provided. In the two storage nodes, a bi-stable state is present in which the potential at one of the storage nodes is set at a HIGH level, and the potential at the other storage node is set at a LOW level. As long as a predetermined power source potential is applied, the state is held and stored as "1" or "0" as information.

In a typical SRAM memory cell including six transistors, the drive transistors are coupled between the storage nodes and a ground potential, and the load transistors are coupled between the storage nodes and a power source potential. Additionally, between the storage nodes and bit lines, the access transistors are coupled. Data writing and reading is performed via the access transistors.

To ensure a read margin, when data is read, it is required to increase the threshold voltage of each of the access transistors, and increase a ratio (β ratio) of a current in each of the drive transistors to a current in the access transistor. On the other hand, to ensure a write margin, when data is written, it is required to reduce the threshold voltage of the access transistor, and increase the ratio (γ ratio) of the current in the access transistor to a current in each of the load transistors.

As access transistors responding to such requirements, access transistors have been proposed in a SRAM memory cell described in Non-Patent Document 1 in each of which the impurity concentrations of a pair of halo regions are set asymmetrically. That is, the access transistors have been proposed in each of which the impurity concentration of the one of the pair of halo regions coupled to a storage node is set higher than the impurity concentration of the other halo region coupled to a bit line. Note that the halo regions are impurity regions formed in a miniaturized transistor so as to suppress a short channel effect. Ion implantation for forming the halo regions is referred to also as pocket implantation.

[Prior Art Document]
[Non-Patent Document]
[Non-Patent Document 1]

Jae-Joon Kim, Adiya Bansal, Rahul Rao, Shih-Hsien Lo, and Ching-Te Chuang "Relaxing Conflict Between Read Stability and Writability in 6T SRAM Cell Using Asymmetric Transistors" IEEE ELECTRON DEVICE LETTERS, VOL. 30, NO. 8, August 2009.

SUMMARY OF THE INVENTION

However, in the SRAM including the access transistors described above has the following problem.

The halo regions are formed not only in the access transistors, but also in drive transistors and load transistors. The impurity concentrations of a pair of halo regions formed in each of the drive transistors and the load transistors are set the same (symmetrically). As the access transistors and the drive transistors, NMIS (N-channel-type metal Insulator Semiconductor) transistors are formed, and the halo regions thereof are formed as P-type impurity regions. On the other hand, as the load transistors, PMIS (P-channel-type metal Insulator Semiconductor) transistors are formed, and the halo regions thereof are formed as n-type impurity regions.

In the SRAM (memory cell) described above, to form a pair of halo regions each having the same impurity concentration for each of the access transistors, the drive transistors, and the load transistors, three resist masks are formed as implantation masks. For each of the access transistors, to set the impurity concentration of one of the pair of halo regions such that it is higher than the impurity concentration of the other halo region, one more resist mask is formed as an implantation mask. Thus, in a semiconductor device including the conventional SRAM, to form the halo regions of each of the transistors forming the SRAM memory cell, at least four implantation masks are required.

The present invention proposes an improvement in a semiconductor device including the conventional SRAM. An object of the present invention is to provide a method of manufacturing a semiconductor device which allows a reduction in implantation masks, and another object thereof is to provide such a semiconductor device.

A method of manufacturing a semiconductor device according to an embodiment of the present invention is a method of manufacturing a semiconductor device having a static random access memory, and includes the following steps. An isolation insulating film is formed in a main surface of a semiconductor substrate to define each of a first element formation region where a transistor of a first conductivity type is to be formed and a second element formation region where a transistor of a second conductivity type is to be formed. In the first element formation region, gate structures are formed which include a first gate structure disposed over a region located between a first area and a second area spaced apart from each other, and a second gate structure disposed over a region located between the second area and a third area spaced apart from the second area. A first implantation mask is formed which has a first opening exposing a first side surface of the first gate structure facing toward the second area and exposing a region extending from the first side surface to a portion of the second area spaced apart at a predetermined distance from the first side surface, and covers a second side surface of the first gate structure facing toward the first area, the first area, and the second element formation region. Via the first implantation mask, a first impurity is implanted through the first opening at an angle tilted from a direction perpendicular to the main surface of the semiconductor substrate. The first implantation mask is removed. A second implantation mask is formed which has a second opening exposing the first gate structure, the second gate structure, the first area, the second area, and the third area, and covers the second element formation region. Via the second implantation mask, a second impurity of the second conductivity type is implanted through the second opening at an angle tilted from a direction perpendicular to the main surface of the semiconductor substrate. The second implantation mask is removed. A bit line electrically coupled to the first area is formed, and a wiring is formed which electrically couples an area of the second element formation region serving as a source or drain electrode of the transistor of the second conductivity type to the second area and which serves as a storage node.

A semiconductor device according to an embodiment of the present invention is a semiconductor device having a static random access memory, and includes a first storage node, a second storage node, a first bit line, a second bit line, a first access transistor, a second access transistor, a first drive transistor, and a second drive transistor. Each of the first storage node and the second storage node stores data therein. Each of the first bit line and the second bit line performs a data input/output operation. The first access transistor is coupled between the first storage node and the first bit line. The second access transistor is coupled between the second storage node and the second bit line. The first drive transistor is coupled between the first storage node and a ground line. The second drive transistor is coupled between the second storage node and the ground line. Each of the first access transistor and the second access transistor includes an access gate electrode, a first source or drain region, a second source or drain region, a first halo region, and a second halo region. The access gate electrode extends in a predetermined direction. The first source or drain region is coupled to the corresponding first bit line or the corresponding second bit line, and has an impurity of a first conductivity type. The second source or drain region is coupled to the corresponding first storage node or the corresponding second storage node, and has the impurity of the first conductivity type. The first halo region is adjacent to the first source or drain region in an area immediately under the access gate electrode, and has an impurity of a second conductivity type different from the first conductivity type. The second halo region is adjacent to the second source or drain region in the area immediately under the access gate electrode, and has the impurity of the second conductivity type at an impurity concentration higher than an impurity concentration of the first halo region. Each of the first drive transistor and the second drive transistor includes a third source or drain region, a fourth source or drain region, a third halo region, and a fourth halo region. The third source or drain region is coupled to the corresponding first storage node or the corresponding second storage node, and has the impurity of the first conductivity type. The fourth source or drain region is coupled to the ground line, and has the impurity of the first conductivity type. The third halo region is adjacent to the third source or drain region in the area immediately under the access gate electrode, and has the impurity of the second conductivity type at an impurity concentration of the same order as that of the impurity concentration of the second halo region. The fourth halo region is adjacent to the fourth source or drain region in the area immediately under the access gate electrode, and has the impurity of the second conductivity type at an impurity concentration of the same order as that of the impurity concentration of the second halo region.

In accordance with the method of manufacturing the semiconductor device according to the present invention, it is possible to reduce implantation masks for forming the halo regions of the transistor of the first conductivity type and the transistor of the second conductivity type.

BRIEF DESCRIPTION OF THE DRAWINGS

FIG. 72 is a cross-sectional view showing a step performed after the step shown in FIG. 71 in Embodiment 3, which is a cross-sectional view along a cross-sectional line corresponding to the cross-sectional line LXXII-LXXII shown in FIG. 71;

FIG. 73 is a cross-sectional view showing a step performed after the step shown in FIG. 72 in Embodiment 3;

DESCRIPTION OF THE PREFERRED EMBODIMENTS

Embodiment 1

Figure 1:
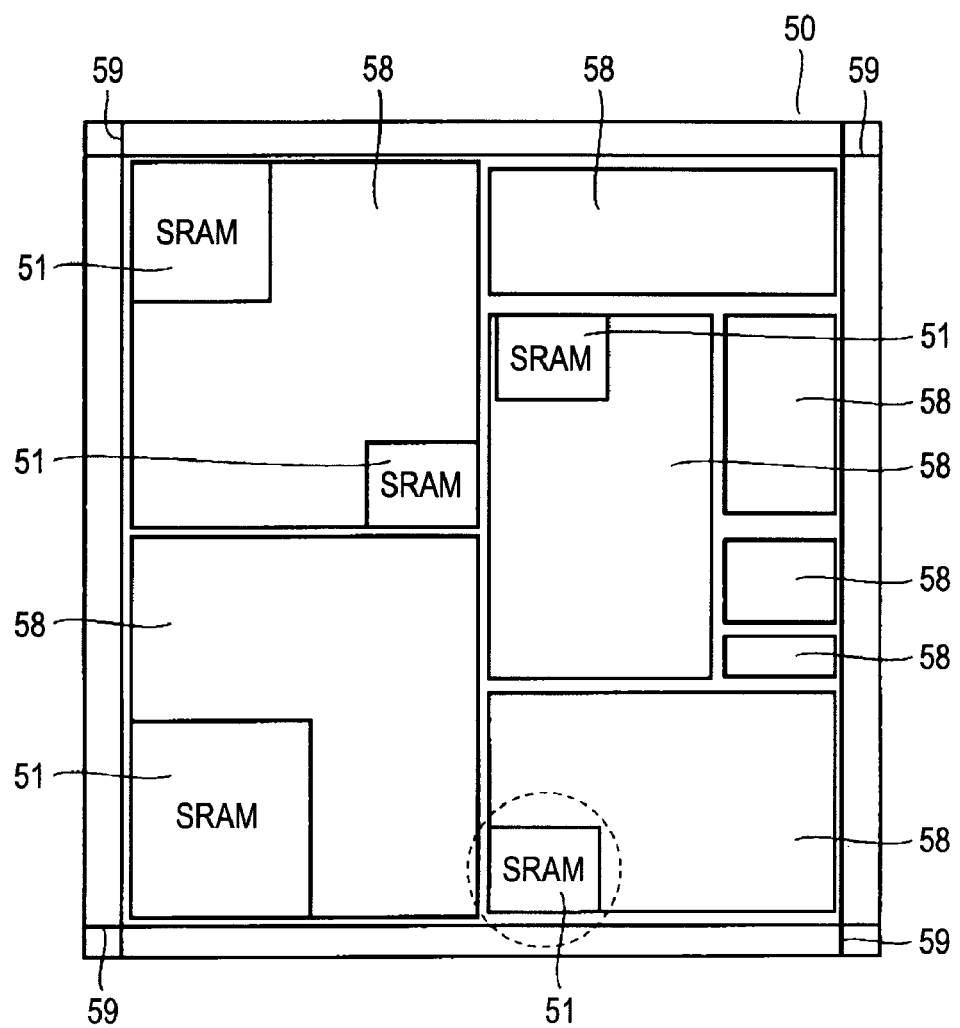
FIG. 1 is a plan view showing an example of layout relationships in a semiconductor device including SRAMs according to Embodiment 1 of the present invention.
Figure 2:
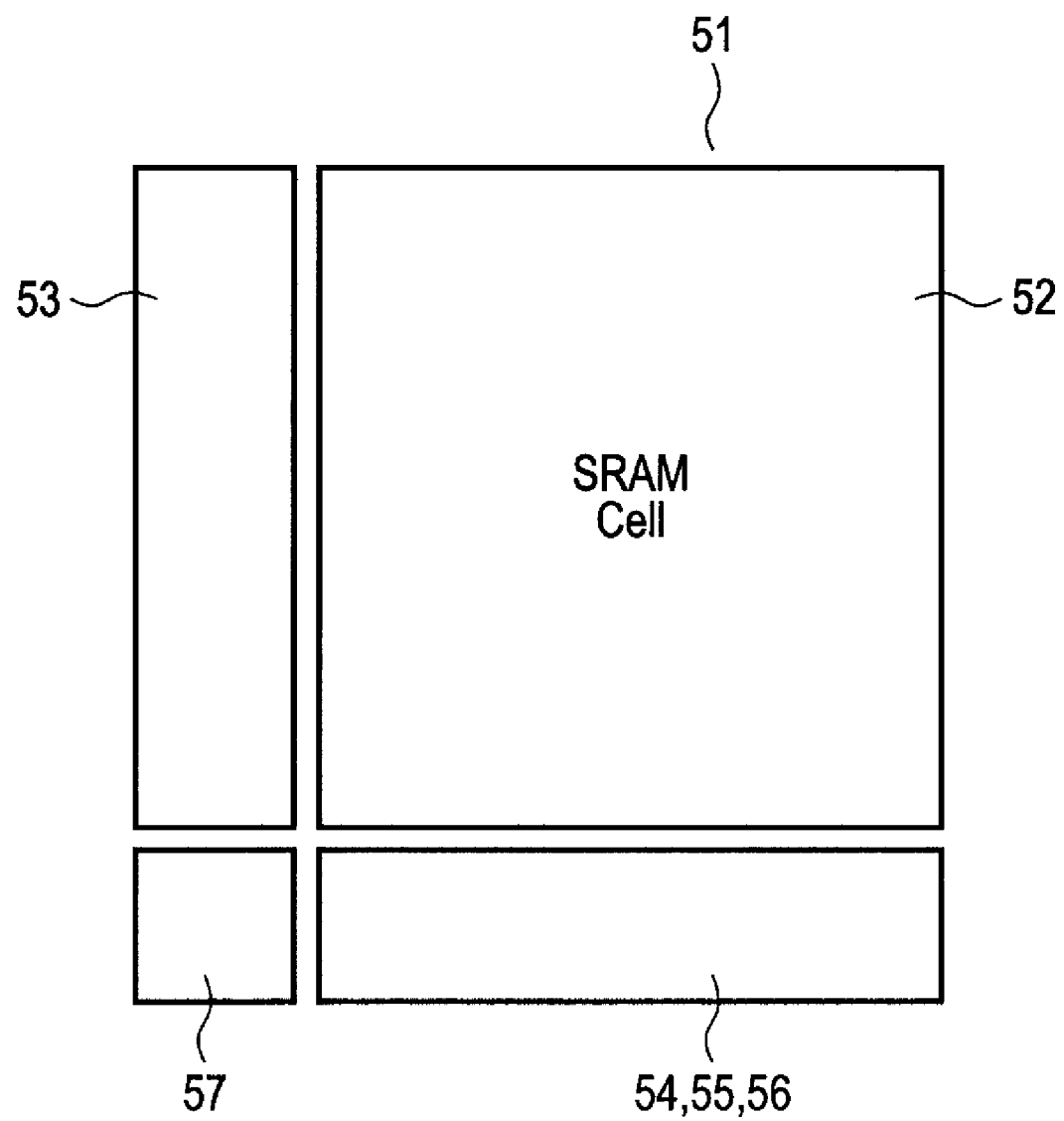
FIG. 2 is a plan view showing a configuration of a SRAM memory cell within the dot-line frame shown in FIG. 1 in Embodiment 1.

First, a description will be given of an example of a semiconductor device referred to as a SOC in which a SRAM is applied to a memory cell. As shown in FIG. 1, in a semiconductor device 50, a plurality of logic circuits 58 which implement the respective specific functions of a micro-control unit, an analog-digital converter, a digital-analog converter, a bus controller, and the like, SRAMs 51 coupled to some of the logic circuits to temporarily store data therein, and the like are mounted on one chip. IO regions 59 are formed so as to surround the logic circuits 58 and the SRAMs 51. As shown in FIG. 2, each of the SRAMs 51 includes a SRAM memory cell array 52 having a plurality of memory cells arranged in a matrix, an X-decoder 53, a Y-decoder 54, a sense amplifier 55, a line driver 56, and a main control circuit 57.

Figure 3:
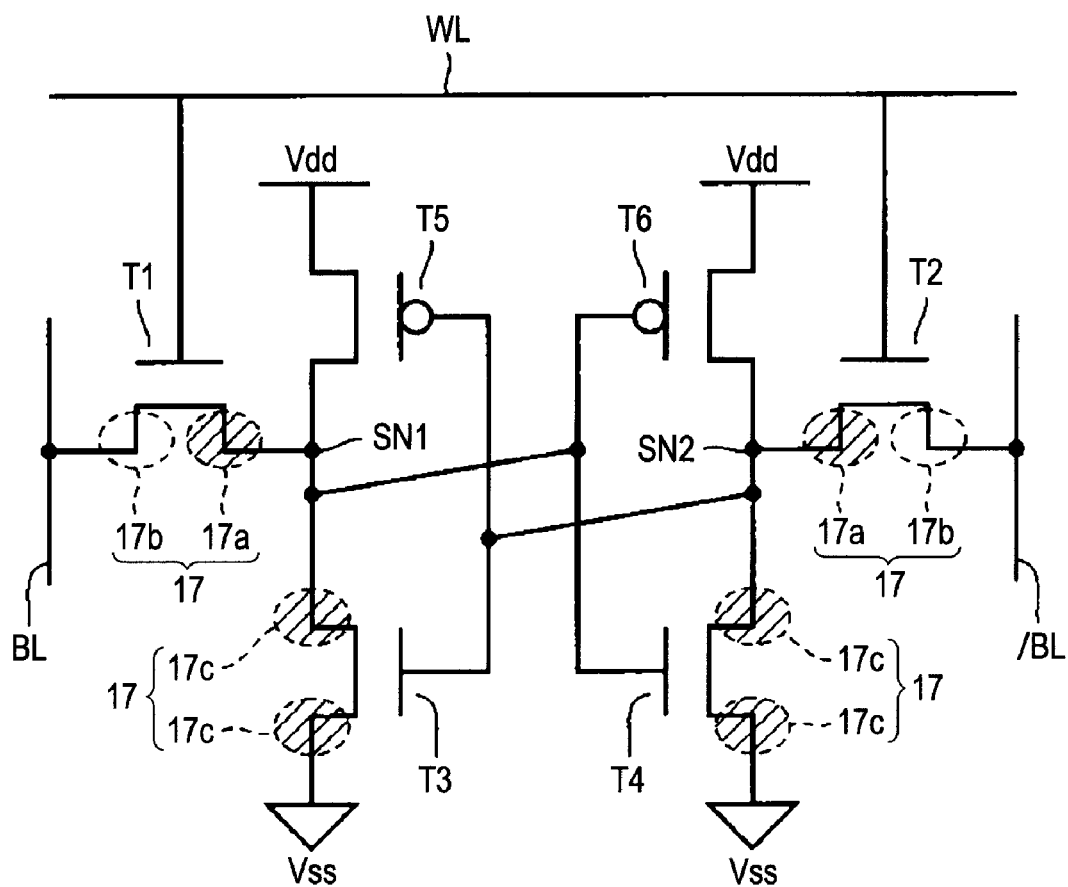
FIG. 3 is a view showing an equivalent circuit of the SRAM memory cell in Embodiment 1.

Next, a description will be given of an equivalent circuit of the SRAM memory cell. As shown in FIG. 3, the SRAM memory cell includes a flip-flop in which two inverters are cross-coupled, and two access transistors T1 and T2. In the flip-flop, two cross-coupled storage nodes SN1 and SN2 are provided. The access transistors T1 and T2 are coupled between the storage nodes SN1 and SN2 and bit lines BL and /BL. The respective gates of the access transistors T1 and T2 are coupled to a word line WL.

In the flip-flop, drive transistors T3 and T4 are coupled between the storage nodes SN1 and SN2 and ground lines (Vss). Additionally, between the storage nodes SN1 and SN2 and power source lines (Vdd), load transistors T5 and T6 are coupled. The gate of the drive transistor T3, the gate of the load transistor T5, and the storage node SN2 are electrically coupled to each other. Also, the gate of the drive transistor T4, the gate of the load transistor T6, and the storage node SN1 are electrically coupled to each other.

Prior to data reading or writing, the bit lines BL and /BL are each precharged to a H level. For example, in the memory cell in which the H level and a L level are respectively stored in the storage nodes SN1 and SN2, when data is read therefrom, the drive transistor T4 in an ON state extracts charges with which the bit line /BL is charged via the access transistor T2 to lower the potential of the bit line /BL. A sense amplifier not shown senses a voltage reduction in the bit line /BL. When the data in the memory cell is rewritten, a write driver not shown performs an operation of extracting charges with which the storage node N1 is charged via the bit line BL charged to the H level and the access transistor T1.

In each of the plurality of SRAM memory cells in the semiconductor device according to Embodiment 1, in the access transistors T1 and T2, the respective pairs of halo regions 17 formed therein include halo regions 17a coupled to the storage nodes SN1 and SN2 and halo regions 17b coupled to the bit lines BL and /BL, and the impurity concentrations of the halo regions 17a are set higher than the impurity concentrations of the halo regions 17b. On the other hand, in the drive transistors T3 and T4, the impurity concentrations of respective one pairs of halo regions 17 (17c) formed therein are set the same as the impurity concentrations of the halo regions 17a.

Figure 4:
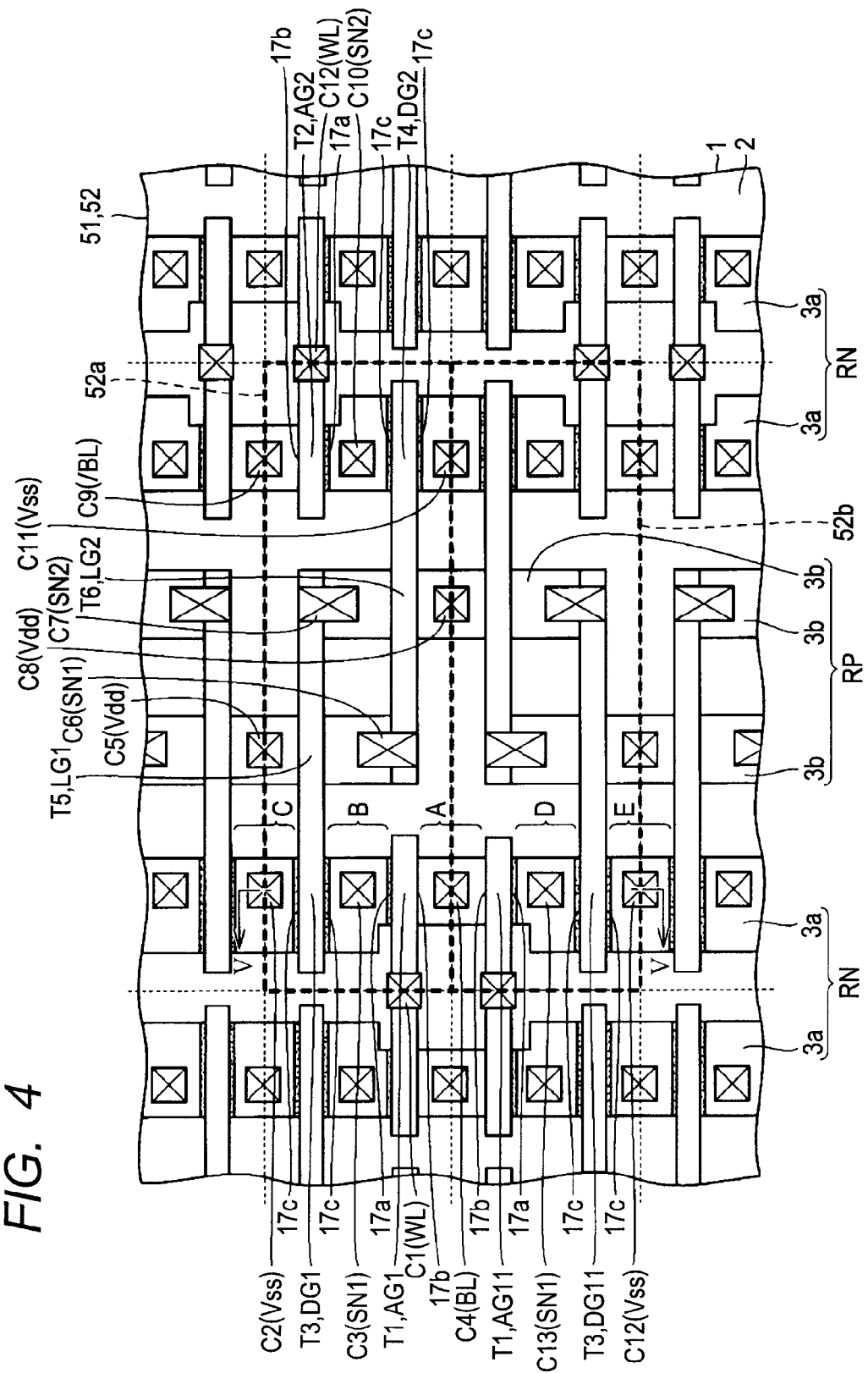
FIG. 4 is a plan view showing a layout pattern of the SRAM memory cells in Embodiment 1.

Next, a description will be given of a structure of each of the SRAM memory cells. FIG. 4 is a plan view showing a layout of transistors forming the memory cells of the SRAM cell array and contacts coupled to the transistors. In the plan view, each of the areas surrounded by the dot lines form one of the SRAM memory cells. The transistors and the contacts of each of the SRAM memory cells are mirror-symmetrically laid out to those of the memory cell adjacent thereto. A representative SRAM memory cell 52a has the access transistors T1 and T2, the drive transistors T3 and T4, and the load transistors T5 and T6.

In a main surface of a semiconductor substrate 1, an isolation insulating film 2 is formed to define element formation regions 3a and 3b electrically isolated from each other. The element formation regions 3a are formed in NMIS regions RN. In the element formation regions 3a, as n-channel MIS transistors, the access transistors T1 and T2 and the drive transistors T3 and T4 are formed. The element formation regions 3b are formed in a PMIS region RP. In the element formation regions 3b, as p-channel MIS transistors, the load transistors T5 and T6 are formed.

Access gate electrodes AG1 and AG2 of the access transistors T1 and T2 and drive gate electrodes DG1 and DG2 of the drive transistors T3 and T4 are formed so as to traverse the element formation regions 3a. Load gate electrodes LG1 and LG2 of the load transistors T5 and T6 are formed so as to traverse the element formation regions 3b. The access gate electrodes AG1 and AG2, the drive gate electrodes DG1 and DG2, and the load gate electrodes LG1 and LG2 are each formed so as to extend in one direction.

Figure 5:
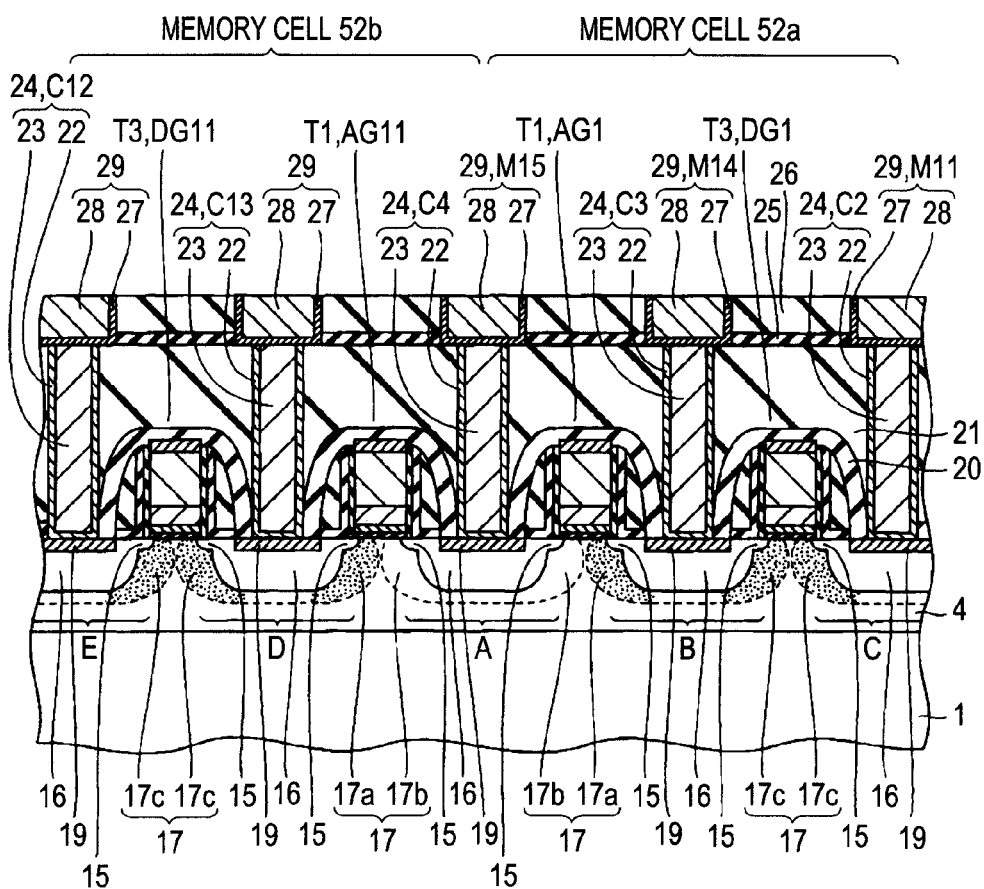
FIG. 5 is a cross-sectional view along the cross-sectional line V-V shown in FIG. 4 in Embodiment 1.

FIG. 5 is a cross-sectional view along the cross-sectional line V-V which orthogonally crosses the extending directions of the gate electrodes so as to pass through the drive transistors T3 and the access transistors T1 of the SRAM memory cells 52a and 52b adjacent to each other in FIG. 4. In the portion (area A between the access gate electrodes AG1 and AG11) of the element formation region 3a located on the opposite side of the drive gate electrode DG1 relative to the access gate electrode AG1, there are formed two halo regions 17b, two extension regions 15, a source or drain region 16, and a metal silicide film 19.

In each of the portion (area B) of the element formation region 3a located between the access gate electrode AG1 and the drive gate electrode DG1 and the portion (area D) of the element formation region 3a located between the access gate electrode AG11 and the drive gate electrode DG11, there are formed the halo region 17a, the halo region 17c, the two extension regions 15, the source or drain region 16, and the metal silicide film 19.

In each of the portion (area C) of the element formation region 3a located on the opposite side of the access gate electrode AG1 relative to the drive gate electrode DG1 and the portion (area E) of the element formation region 3a located on the opposite side of the access gate electrode AG11 relative to the drive gate electrode DG11, there are formed the halo region 17c, the extension region 15, the source or drain region 16, and the metal silicide film 19. The halo regions 17a and 17b are formed so as to reach respective areas immediately under the access gate electrodes AG1 and AG11. The halo regions 17c are formed so as to reach respective areas immediately under the drive gate electrodes DG1 and DG11.

Stress liner films 20 such as silicon nitride films are formed so as to cover the access gate electrodes AG1 and AG11 and the drive gate electrodes DG1 and DG11. An interlayer insulating film 21 such as a silicon oxide film (e.g., a TEOS (Tetra Ethyl Ortho Silicate) film) is formed so as to cover the stress liner films 20. There are formed plugs 24 which extend through the interlayer insulating film 21 and the stress liner films 20 to be electrically coupled to the metal silicide films 19. Each of the plugs 24 includes a barrier metal film 22 such as a TiN film and a tungsten film 23. The plugs 24 coupled to the respective metal silicide films 19 in the areas E, D, A, B, and C form contacts C12, C13, C4, C3, and C2 shown in FIG. 4.

An etching stopper film 25 such as a silicon nitride film is formed over the interlayer insulating film 21 so as to cover the plugs 24. Over the etching stopper film 25, an interlayer insulating film 26 such as a silicon oxide film is formed. There are formed copper wires 29 which extend through the interlayer insulating film 26 and the etching stopper film 25 to be electrically coupled to the plugs 24. Each of the copper wires 29 includes a barrier metal film 27 such as a TaN film and a copper film 28 to form a first metal wire. In layers over the first metal wires, multilayer metal wiring is further formed, though not shown in FIG. 5.

Figure 6:
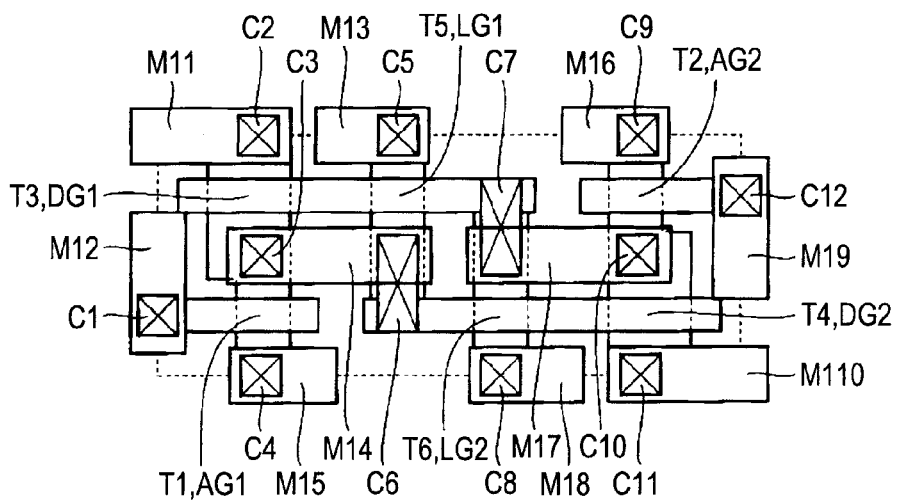
FIG. 6 is a plan view showing a coupling structure between individual transistors and first metal wires in Embodiment 1.
Figure 7:
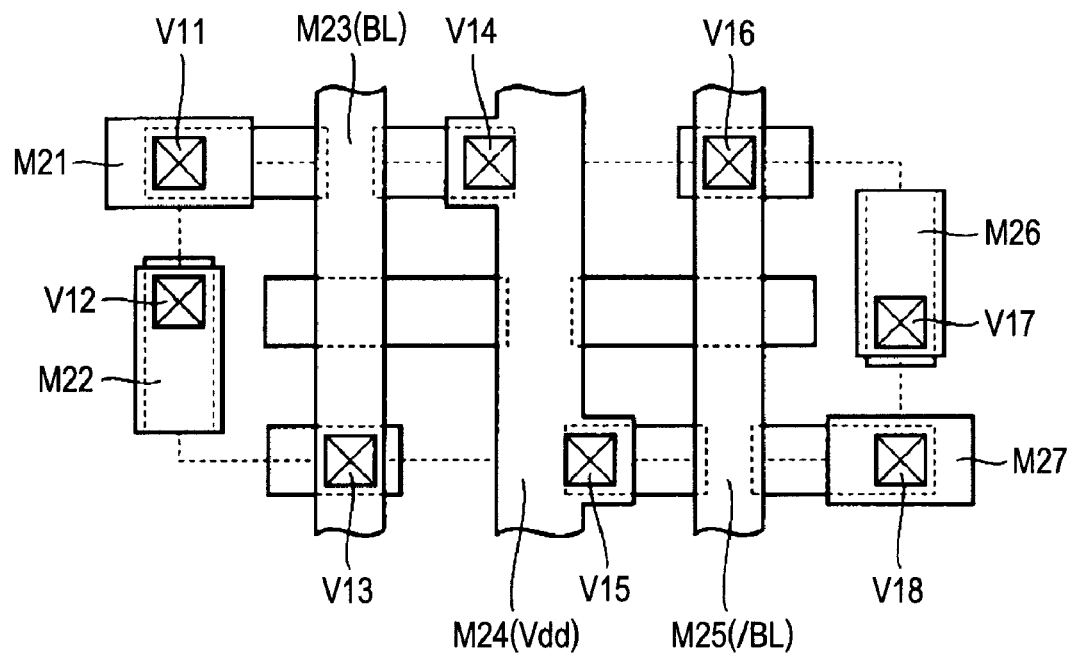
FIG. 7 is a plan view showing a coupling structure between the first metal wires and second metal wires in Embodiment 1.
Figure 8:
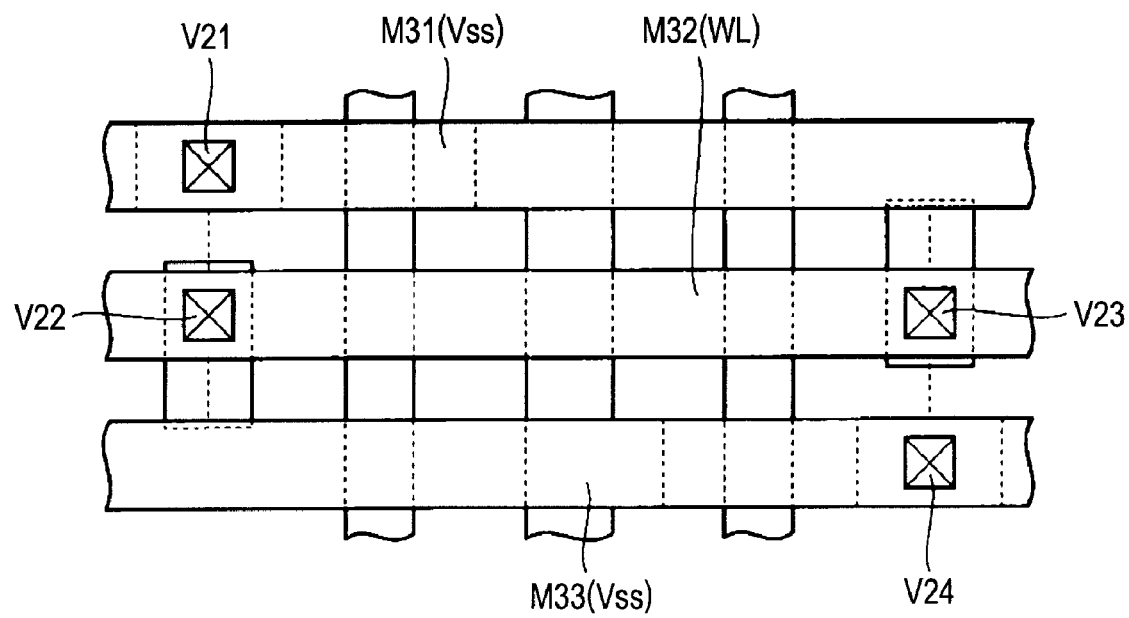
FIG. 8 is a plan view showing a coupling structure between the second metal wires and third metal wires in Embodiment 1.

Next, a description will be given of a multilayer wiring structure which electrically couples the individual transistors. FIG. 6 is a plan view showing a coupling structure between the transistors and the first metal wires. FIG. 7 is a plan view showing a coupling structure between the first metal wires and second metal wires. FIG. 8 is a plan view showing a coupling structure between the second metal wires and third metal wires. FIGS. 6 to 8 show a multilayer wiring structure for one memory cell but, in a multilayer wiring structure over a SRAM memory cell adjacent thereto, wiring patterns are formed mirror-symmetrically to those of FIGS. 6 to 8. Therefore, a description will be given mainly of the SRAM memory cell 52a.

One (area A) of the source or drain regions (as necessary, hereinafter referred to as "S/D" regions) of the access transistor T1 is electrically coupled to a second metal wire M23 serving as the bit line BL via the contact C4 (plug 24), a first metal wire M15 (copper wire 29), and a via V13. The other (area B) of the S/D regions of the access transistor T1 is electrically coupled to one of the S/D regions of the load transistor T5, the load gate electrode LG2 of the load transistor T6, and the drive gate electrode DG2 of the drive transistor T4 via the contact C3 (plug 24), a first metal wire M14, and a contact C6. The other (area B) of the S/D regions of the access transistor T1 is also electrically coupled to one (area B) of the S/D regions of the drive transistor T3.

The access gate electrode AG1 of the access transistor T1 is electrically coupled to a third metal wire M32 as the word line WL via the contact C1 (plug 24), a first metal wire M12, a via V12, a second metal wire M22, and a via 22. The other (area C) of the S/D regions of the drive transistor T3 is electrically coupled to a third metal wire M31 as the ground line Vss to which a ground potential is given via the contact C2 (plug 24), a first metal wire M11, a via V11, a second metal wire M21, and a via V21. The other of the S/D regions of the load transistor T5 is electrically coupled to a second metal wire M24 as the power source line via a contact C5, a first metal wire M13, and a via V14.

One of the S/D regions of the access transistor T2 is electrically coupled to a second metal wire M25 as the bit line /BL via a contact C9, a first metal wire M16, and a via V16. The other of the S/D regions of the access transistor T2 is electrically coupled to one of the S/D regions of the load transistor T6, the load gate electrode LG1 of the load transistor T5, and the drive gate electrode DG1 of the drive transistor T3 via a contact C10, a first metal wire M17, and a contact C7. The other of the S/D regions of the access transistor T2 is electrically coupled to one of the S/D regions of the drive transistor T4.

The access gate electrode AG2 of the access transistor T2 is electrically coupled to the third metal wire M32 as the word line WL via the contact C12, a first metal wire M19, a via V17, a second metal wire M26, and a via V23. The other of the S/D regions of the drive transistor T4 is electrically coupled to a third metal wire M33 as the ground line Vss to which the ground potential is given via the contact C11, a first metal wire M110, a via V18, a second metal wire M27, and a via V24. The other of the S/D regions of the load transistor T6 is electrically coupled to the second metal wire M24 as the power source line Vdd to which a power source potential is given via a contact C8, a first metal wire M18, and a via V15.

As a result, as shown in FIG. 4, in the SRAM memory cell 52a, the common word line WL is coupled to the contacts C1 and C12. To the contacts C2 and C11, the ground lines Vss are coupled. To the contacts C5 and C8, the power source lines Vdd are coupled. To the contacts C4 and C9, the bit lines BL and /BL are respectively coupled. The contacts C3 and C6 form the storage node SN1, and the contacts C7 and C10 form the memory node SN2.

In the SRAM memory cell 52b adjacent to the memory cell 52a, the contact C13 forms the storage node SN1 of the adjacent SRAM memory cell 52b. To the contact C12, the ground line Vss is coupled. The contact C4 coupled to the bit line BL is shared by the SRAM memory cells 52a and 52b.

Figure 9:
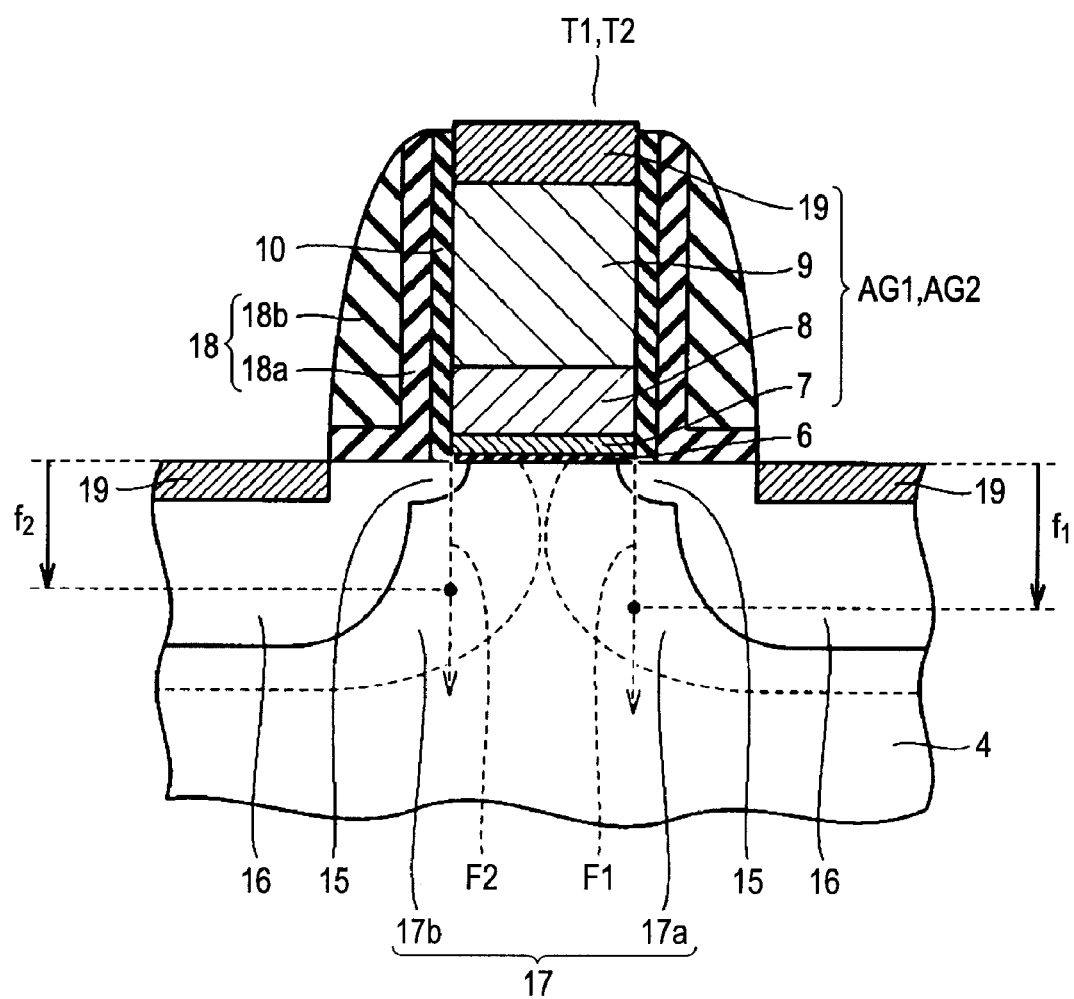
FIG. 9 is a partial enlarged cross-sectional view showing an access transistor in Embodiment 1.

Next, a detailed description will be given of a structure of the access transistor. Note that each of cross-sectional views referred to thereafter shows a cross-sectional structure along a cross-sectional line corresponding to the cross-sectional line V-V shown in FIG. 4. As shown in FIG. 9, the access gate electrode AG1 of the access transistor T1 (T2) formed so as to traverse the element formation region 3a (see FIG. 4) is formed in a form in which a High-k film 7 comprised of $HfO_2$, HfSiON, or the like each containing La and having a predetermined dielectric constant, a metal film 8 comprised of TiN or the like and having a predetermined work function, and a polysilicon film 9 are stacked over an interface layer (Inter Layer) 6 comprised of SiON or the like. In the surface of the polysilicon film 9, the metal silicide film 19 comprised of nickel silicide or the like is further formed. Over the both side surfaces of the access gate electrode AG1, offset spacers 10 each comprised of, e.g., a silicon nitride film or the like are formed. Over the offset spacers 10, sidewall spacers 18 each comprised of a silicon oxide film 18a and a silicon nitride film 18b are formed.

In one (on the side where the drive transistor T3 is located) of the two portions of the element formation region opposing each other with the access gate electrode AG1 interposed therebetween in a direction (gate length direction) orthogonal to the extending direction of the access gate electrode AG1, there are formed the halo region 17a, the extension region 15, the source or drain region 16, and the metal silicide film 19. In the other portion of the element formation region, there are formed the halo region 17b, the extension region 15, the source or drain region 16, and the metal silicide film 19.

Figure 10:
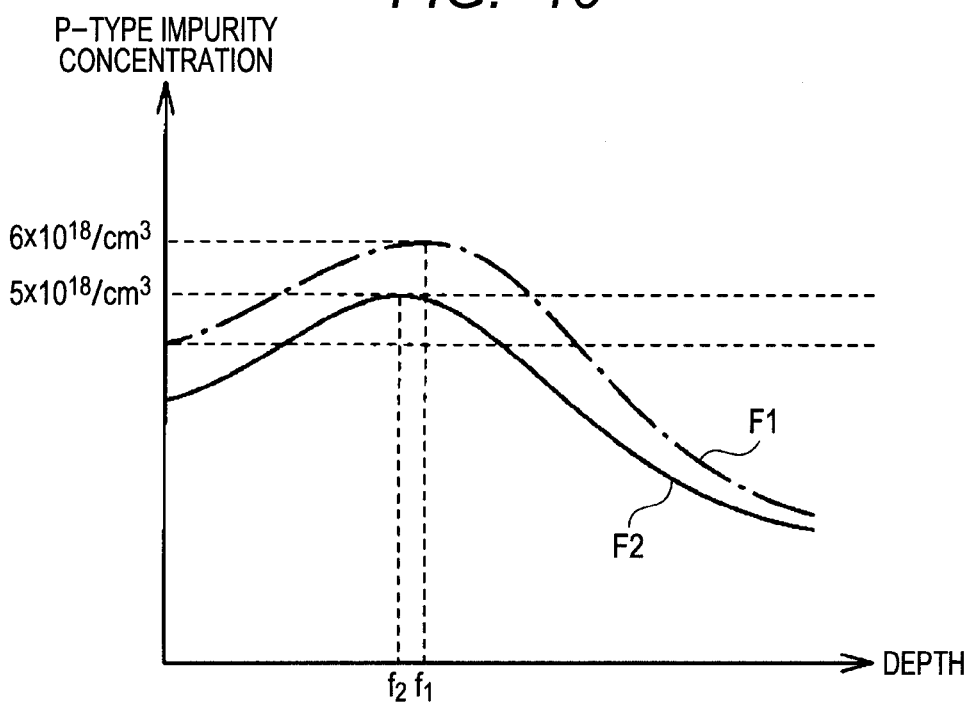
FIG. 10 is a graph showing an impurity concentration profile of each of the halo regions of the access transistor in Embodiment 1.

As shown in FIG. 9, the halo regions 17a and 17b are in areas adjacent to the respective portions of the pair of source or drain regions 16 opposing each other, and formed so as to extend from areas immediately under the sidewall spacers 18, and reach areas immediately under the access gate electrode AG1. The impurity concentrations of the halo regions are on the order of $1 \times 10^{18}/cm^3$ to $1 \times 10^{19}/cm^3$ but, in the semiconductor device according to Embodiment 1, the impurity concentration of the halo region 17a is set higher than the impurity concentration of the halo region 17b. The impurity concentration profiles of the halo regions are shown in FIG. 10, in which the abscissa axis represents depths (arrows F1 and F2) from the surface portions of the semiconductor substrate under the lower end portions of the side surfaces of the access gate electrode AG1, and the ordinate axis represents the impurity concentrations of the P-type impurity. In the halo regions 17a and 17b, the impurity concentration of the halo region 17a is higher than the impurity concentration of the halo region 17b in the surface portions of the semiconductor substrate under the lower end portions of the side surfaces of the access gate electrode AG1. At the respective predetermined depths f1 and f2 from the surface, impurity concentration peaks (maximum values) first appear. The impurity concentration peak in the halo region 17a, which is about $6 \times 10^{18}/cm^3$, is also higher than the impurity concentration peak in the halo region 17b, which is about $5 \times 10^{18}/cm^3$. The impurity concentrations of the extension regions of the SRAM memory cell are $5 \times 10^{20}/cm^3$ to about $1 \times 10^{21}/cm^3$, and the impurity concentrations of the source or drain regions thereof are about $5 \times 10^{21}/cm^3$.

As will be described later, in the semiconductor device according to Embodiment 1, the impurity concentrations of the halo regions 17a, which are the ones of the pairs of halo regions 17 of the access transistors T1 and T2 coupled to the storage nodes SN1 and SN2, are set higher than the impurity concentrations of the other halo regions 17b coupled to the bit lines BL and /BL. This can ensure a read margin and a write margin.

Next, a description will be given of a method of manufacturing the semiconductor device described above. In the semiconductor device, a logic circuit and the like are also included besides a SRAM circuit. Here, however, the description will be given mainly of a method of forming the access transistors and the drive transistors of the SRAM memory cells.

Figure 11:
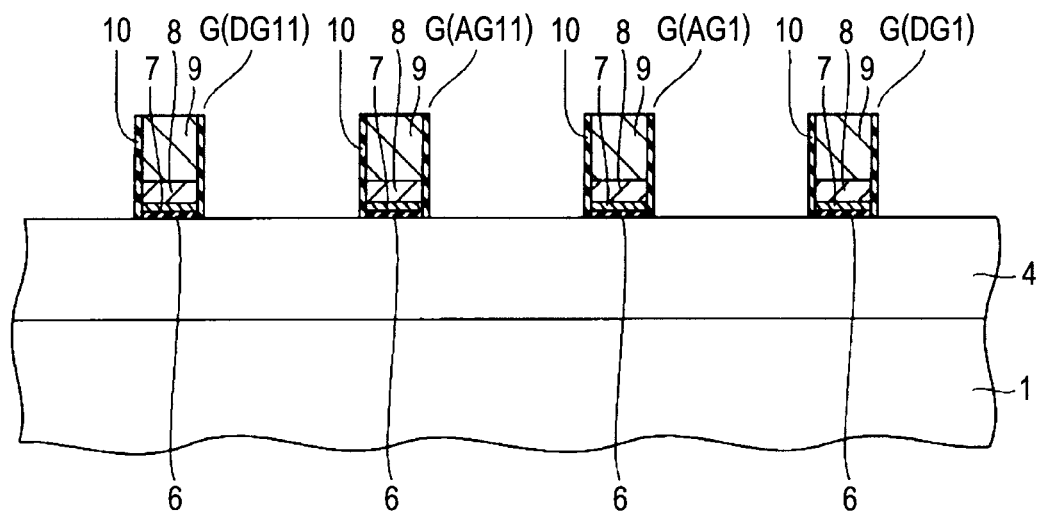
FIG. 11 is a cross-sectional view showing a step of a method of manufacturing the semiconductor device in Embodiment 1.

First, in the main surface of the semiconductor substrate 1, the isolation insulating film 2 is formed to define the element formation regions 3a and 3b electrically isolated from each other (see FIG. 4). Then, as shown in FIG. 11, a p-well 4 is formed in each of the element formation regions 3a.

Next, in a form in which the High-k film 7 having the predetermined dielectric constant, the metal film 8 having the predetermined work function, and the polysilicon film 9 are stacked over the main surface of the semiconductor substrate 1 with the interface layer 6 interposed therebetween, gate structures G serving as the access gate electrodes (AG1 and AG11) and the gate structures G serving as the drive gate electrodes (DG1 and DG11) are formed. Then, over the semiconductor substrate 1, a silicon nitride film (not shown), for example, is formed so as to cover the gate structures G. Then, anisotropic etching is performed to the silicon nitride film to form the offset spacers 10 over the both side surfaces of the gate structures G.

Figure 12:
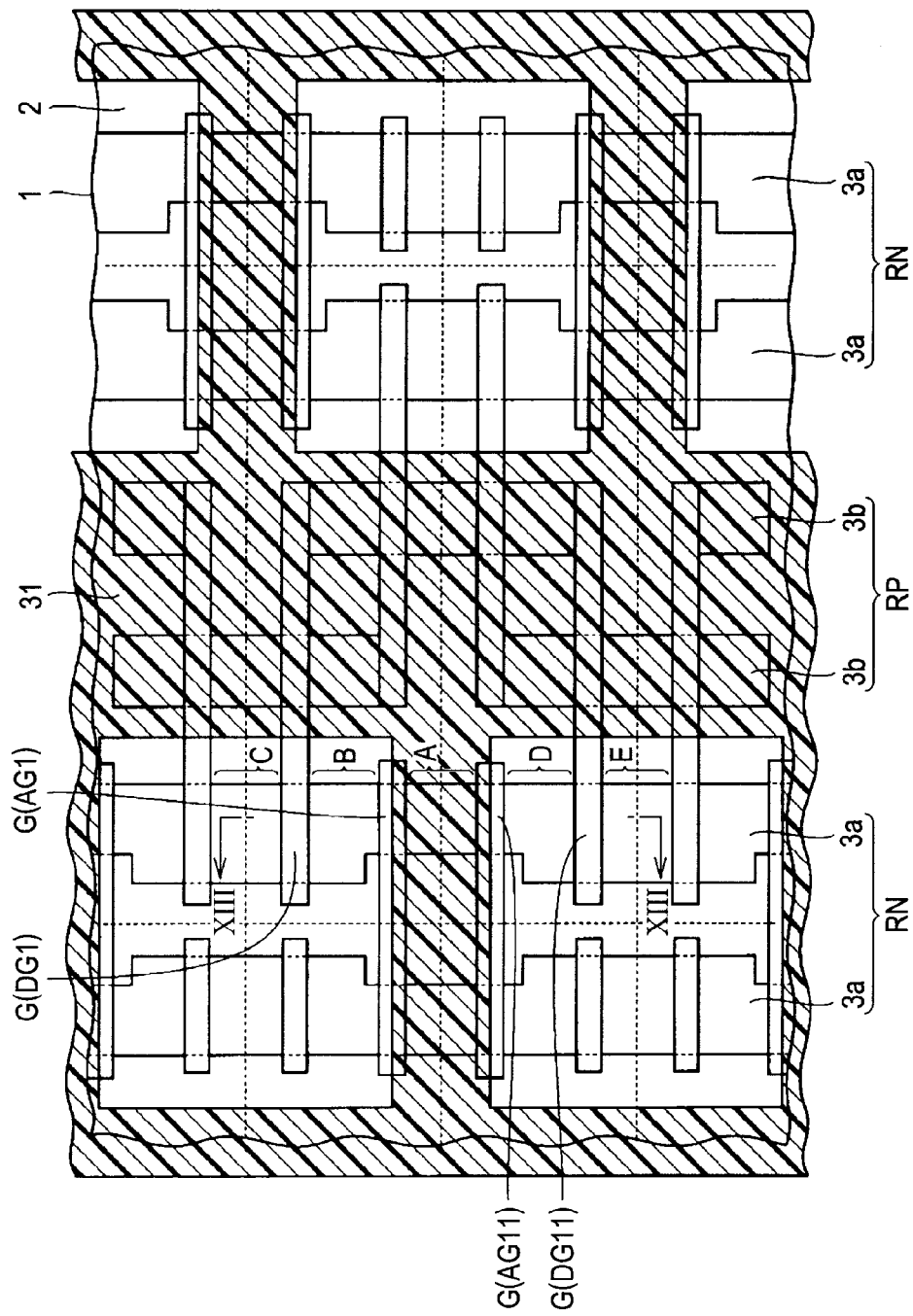
FIG. 12 is a plan view showing a step performed after the step shown in FIG. 11 in Embodiment 1.
Figure 13:
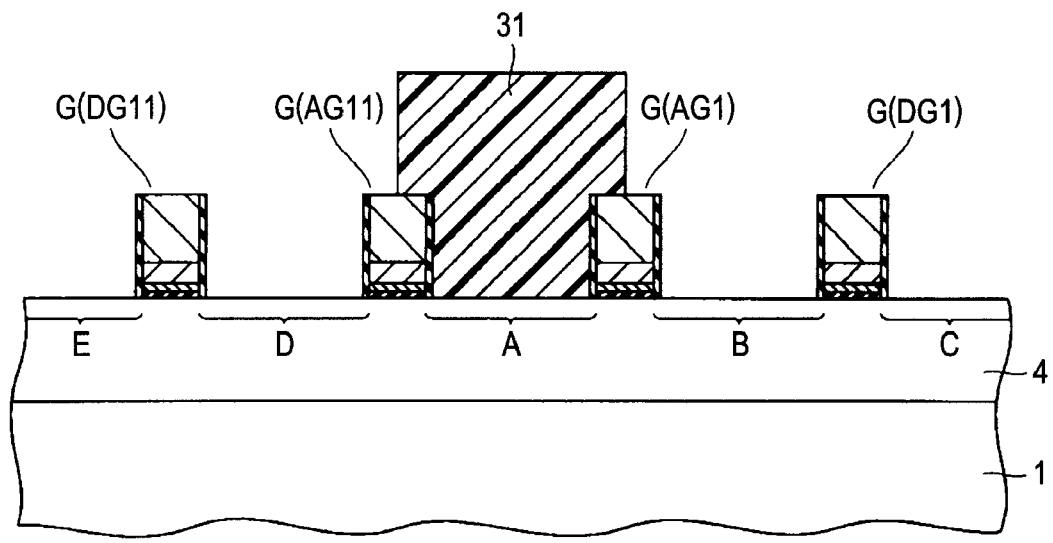
FIG. 13 is a cross-sectional view along the cross-sectional line XIII-XIII shown in FIG. 12 in Embodiment 1.

Next, as shown in FIGS. 12 and 13, a predetermined photographic process is performed to form a resist mask 31 serving as an implantation mask (implantation mask A) for forming halo regions. The resist mask 31 is formed into a pattern covering the portion (area A located between the access gate electrodes AG1 and AG11) of each of the element formation regions 3a located on the opposite side of the gate structure G serving as the drive gate electrode DG1 relative to the gate structure G serving as the access gate electrode AG1, exposing the portion (area B) of the element formation region 3a located between the gate structure G serving as the access gate electrode AG1 and the gate structure G serving as the drive gate electrode DG1 and the portion (area C) of the element formation region 3a located on the opposite side of the gate structure G serving as the access gate electrode AG1 relative to the gate structure G serving as the drive gate electrode DG1 through one opening, and exposing the portion (area D) of the element formation region 3a located between the gate structure G serving as the access gate electrode AG11 and the gate structure G serving as the drive gate electrode DG11 and the portion (area E) of the element formation region 3a located on the opposite side of the gate structure G serving as the access gate electrode AG11 relative to the gate structure G serving as the drive gate electrode DG11 through the other opening.

That is, the individual openings of the resist mask 31 are formed to extend between the adjacent two SRAM memory cells, and continuously expose areas extending from one side surfaces of the gate structures serving as the access gate electrodes of one of the SRAM memory cells to one side surfaces of the gate structures serving as the access gate electrodes of the other SRAM memory cell. The resist mask 31 covers the other side surfaces opposite to the one side surfaces of the gate structures serving as the access gate electrodes and the portions of the element formation regions adjacent to the other side surfaces, and also covers the PMIS region RP.

Figure 14:
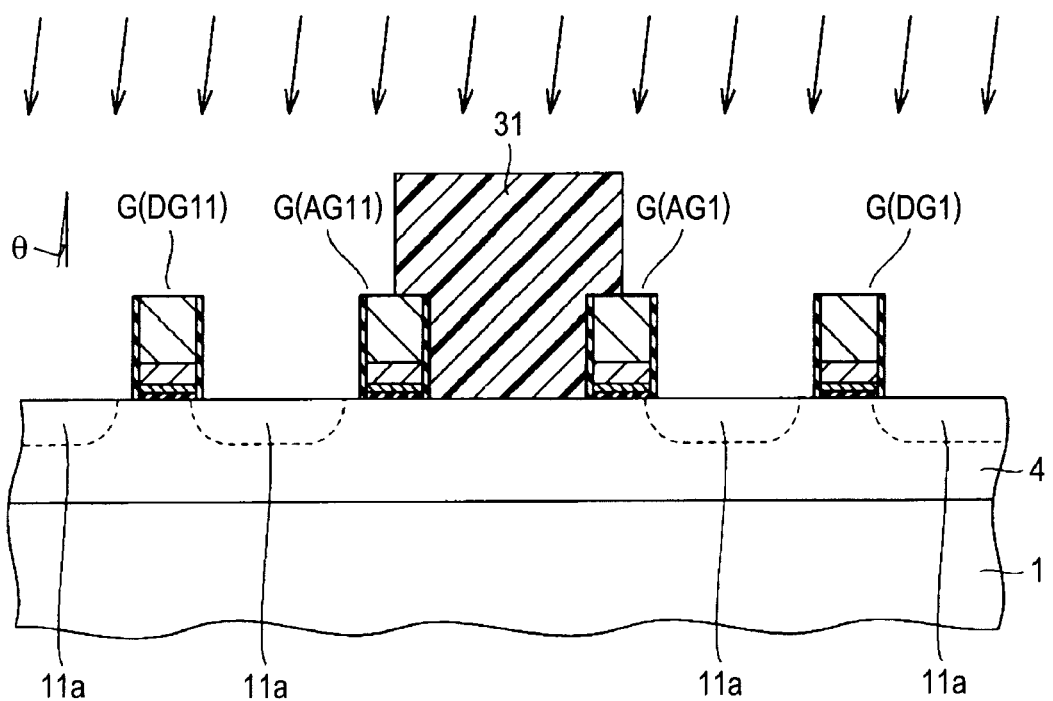
FIG. 14 is a cross-sectional view showing a step performed after the step shown in FIG. 13 in Embodiment 1.
Figure 15:
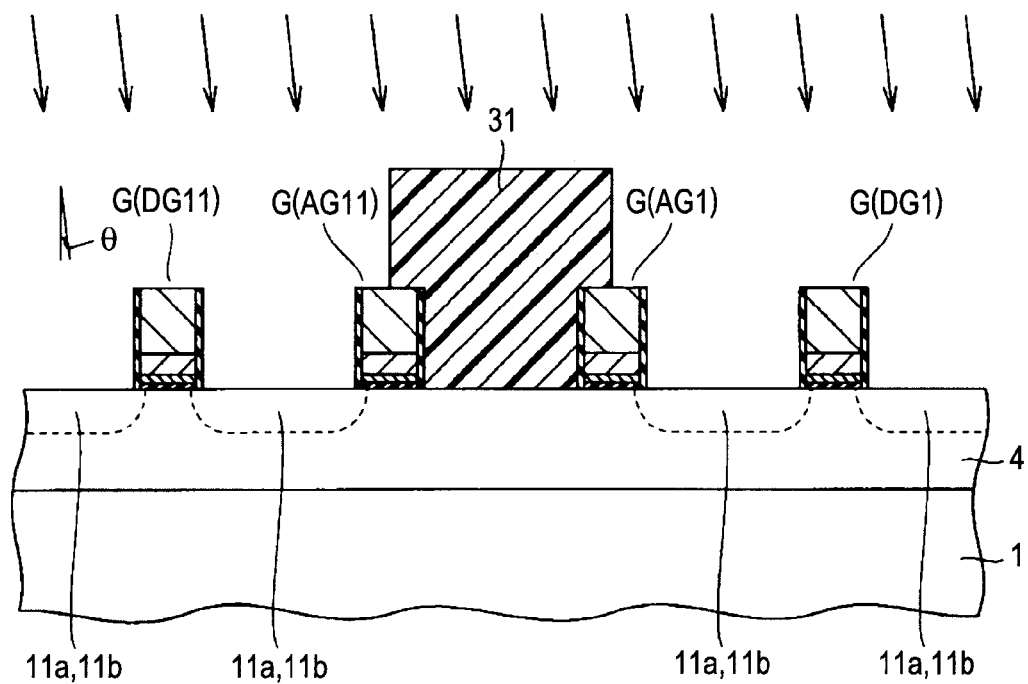
FIG. 15 is a cross-sectional view showing a step performed after the step shown in FIG. 14 in Embodiment 1.

Next, as shown in FIG. 14, using the resist mask 31 as an implantation mask, boron, for example, is implanted obliquely (θ=about 7°) to a direction perpendicular to the main surface of the semiconductor substrate 1 from one side in a direction generally orthogonal to the extending directions of the gate structures G, thereby forming p-type impurity regions 11a in the exposed p-well 4 in the areas B and C. Then, as shown in FIG. 15, using the same resist mask 31 as an implantation mask, boron is implanted obliquely (θ=about 7°) to a direction perpendicular to the main surface of the semiconductor substrate 1 from the other side opposite to the one side in a direction generally orthogonal to the extending directions of the gate structures G, thereby forming p-type impurity regions 11b in the exposed p-well 4 in the areas B and C (halo implantation A). Note that, in each of the implantation in the step shown in FIG. 14 and the implantation in the step shown in FIG. 15, boron is implanted at the same implantation dose and with the same implantation energy.

Figure 16:
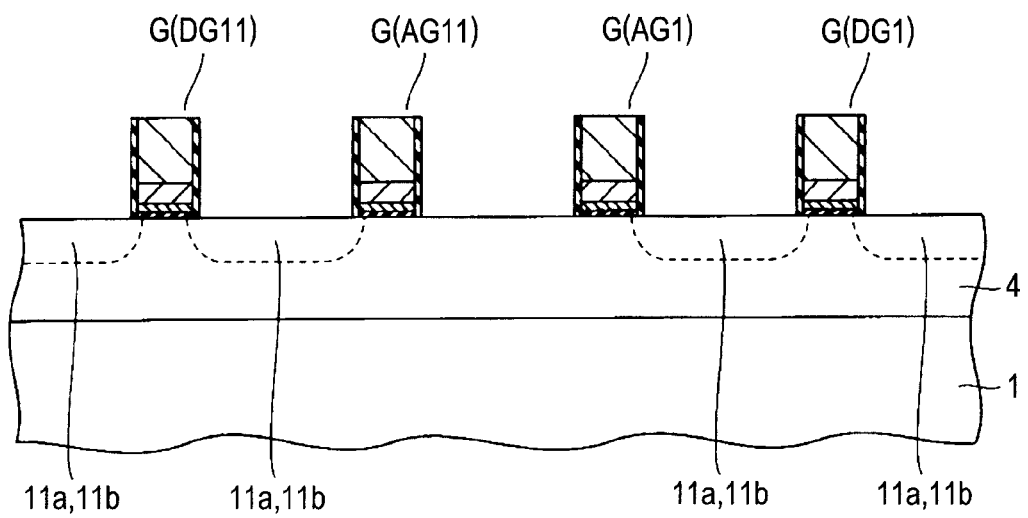
FIG. 16 is a cross-sectional view showing a step performed after the step shown in FIG. 15 in Embodiment 1.
Figure 17:
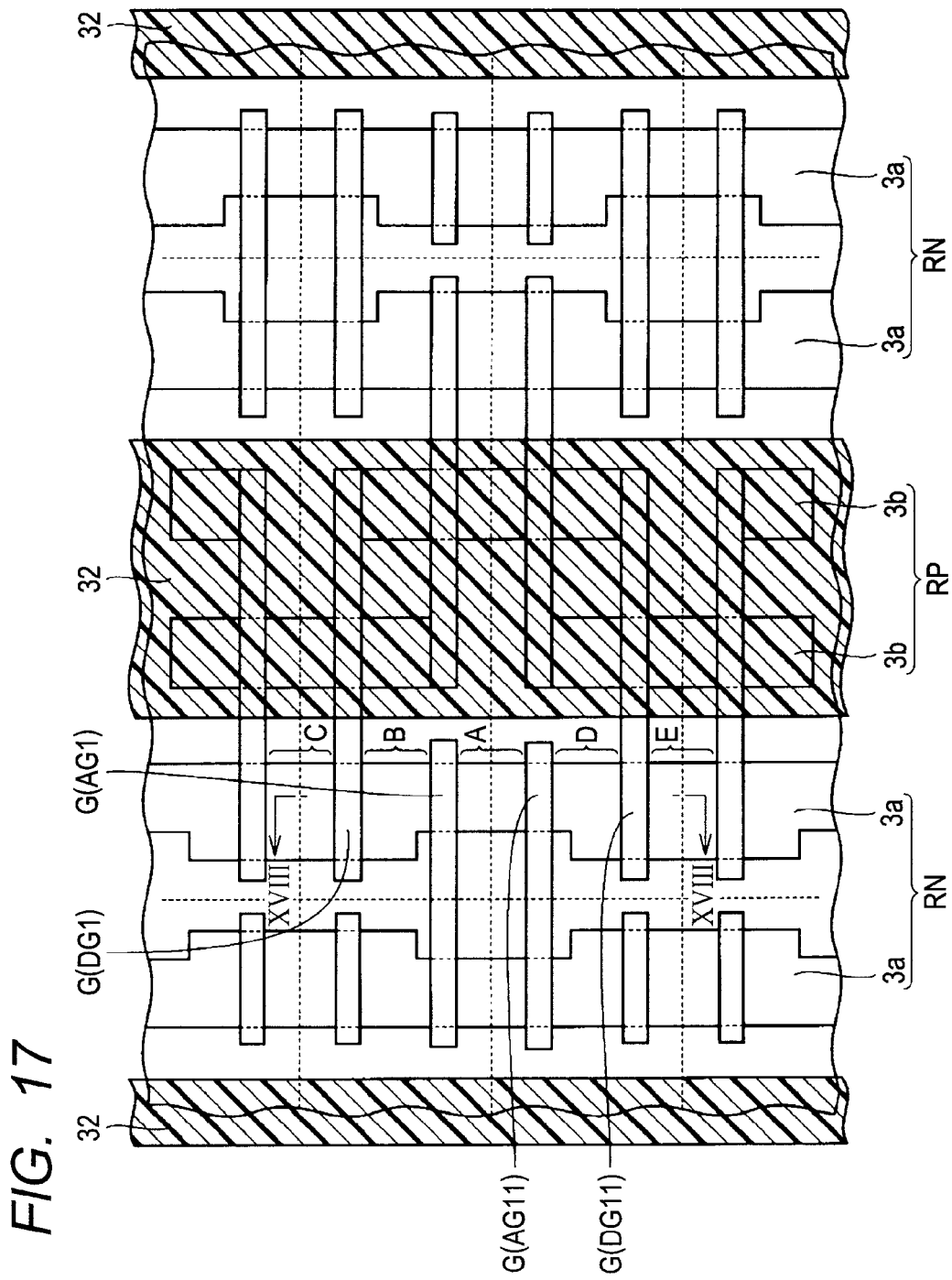
FIG. 17 is a plan view showing a step performed after the step shown in FIG. 16 in Embodiment 1.

Next, as shown in FIG. 16, the resist mask 31 is removed. At this time, in the area A in each of the element formation regions 3a, no impurity region is formed. Then, as shown in FIG. 17, a predetermined photographic process is performed to form a resist mask 32 serving as an implantation mask (implantation mask B) for forming halo regions. The resist mask 32 is formed into a pattern covering the PMIS region RP, and exposing the NMIS regions NP including the areas A to E.

Figure 18:
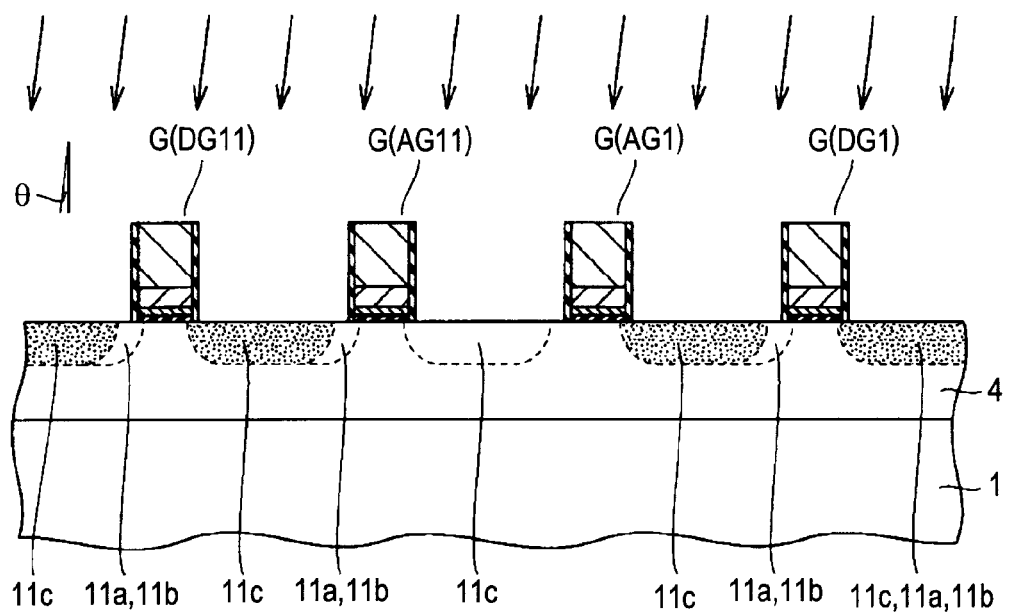
FIG. 18 is a cross-sectional view showing a step performed after the step shown in FIG. 17 in Embodiment 1, which is a cross-sectional view along a cross-sectional line corresponding to the cross-sectional line XVIII-XVIII shown in FIG. 17.

Next, as shown in FIG. 18, using the resist mask 32 (see FIG. 17) as an implantation mask, boron, for example, is implanted obliquely (θ=about 7°) to a direction perpendicular to the main surface of the semiconductor substrate 1 from one side in a direction generally orthogonal to the extending directions of the gate structures G, thereby forming p-type impurity regions 11c in the exposed p-well 4 in the areas A, B, and C. Then, as shown in FIG. 19, using the same resist mask 32 as an implantation mask, boron is implanted obliquely (θ=about 7°) to a direction perpendicular to the main surface of the semiconductor substrate 1 from the other side opposite to the one side in a direction generally orthogonal to the extending directions of the gate structures G, thereby forming p-type impurity regions 11d in the exposed p-well 4 in the areas A, B, and C (halo implantation B).

Figure 19:
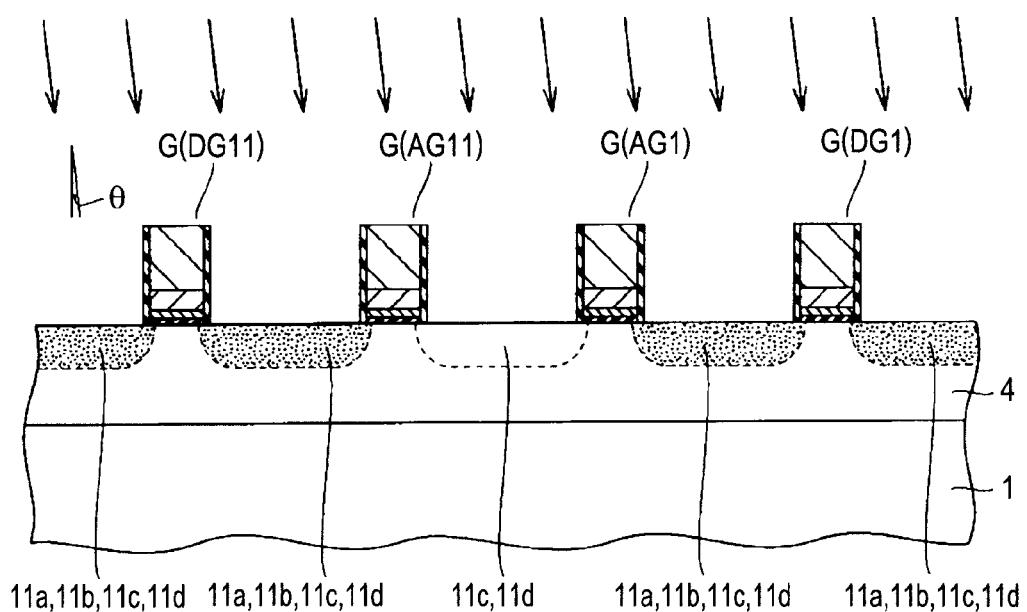
FIG. 19 is a cross-sectional view showing a step performed after the step shown in FIG. 18 in Embodiment 1.

Note that, in each of the implantation in the step shown in FIG. 18 and the implantation in the step shown in FIG. 19, boron is implanted at the same implantation dose and with the same implantation energy. The implantation doses in the steps shown in FIGS. 14 and 15 and the implantation doses in the steps shown in FIGS. 18 and 19 may be set the same or different from each other. Also, the implantation energies in the steps shown in FIGS. 14 and 15 and the implantation energies in the steps shown in FIGS. 18 and 19 may be set the same or different from each other.

Figure 20:
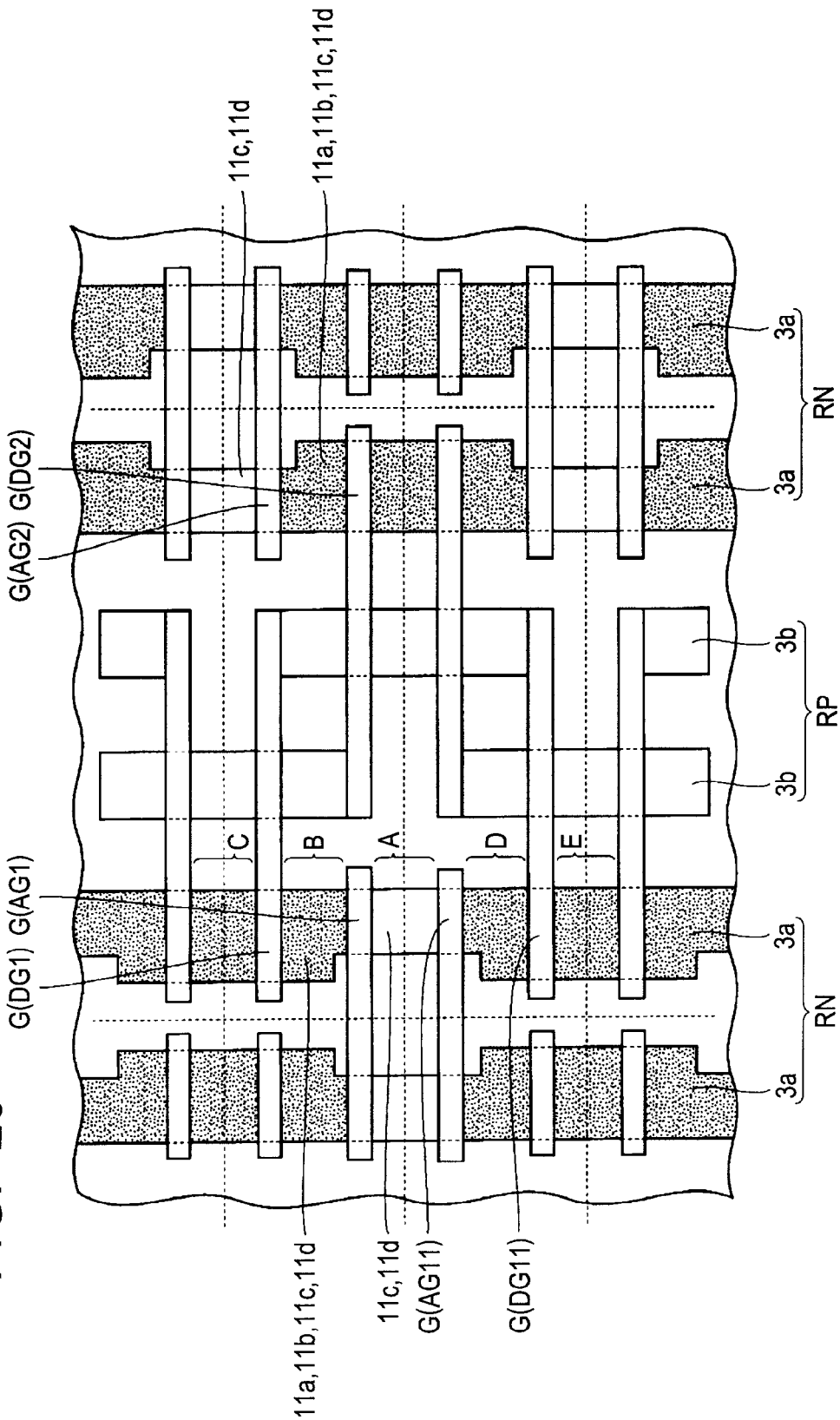
FIG. 20 is a plan view showing the implantation of boron at a time when the step shown in FIG. 19 is ended in Embodiment 1.

In this manner, as shown in FIG. 20, the p-type impurity regions 11c and 11d are formed in the area A, while the p-type impurity regions 11a, 11b, 11c, and 11d are formed in the areas B to E. Respective parts of the p-type impurity regions 11a, 11b, 11c, and 11d serve as halo regions.

Figure 21:
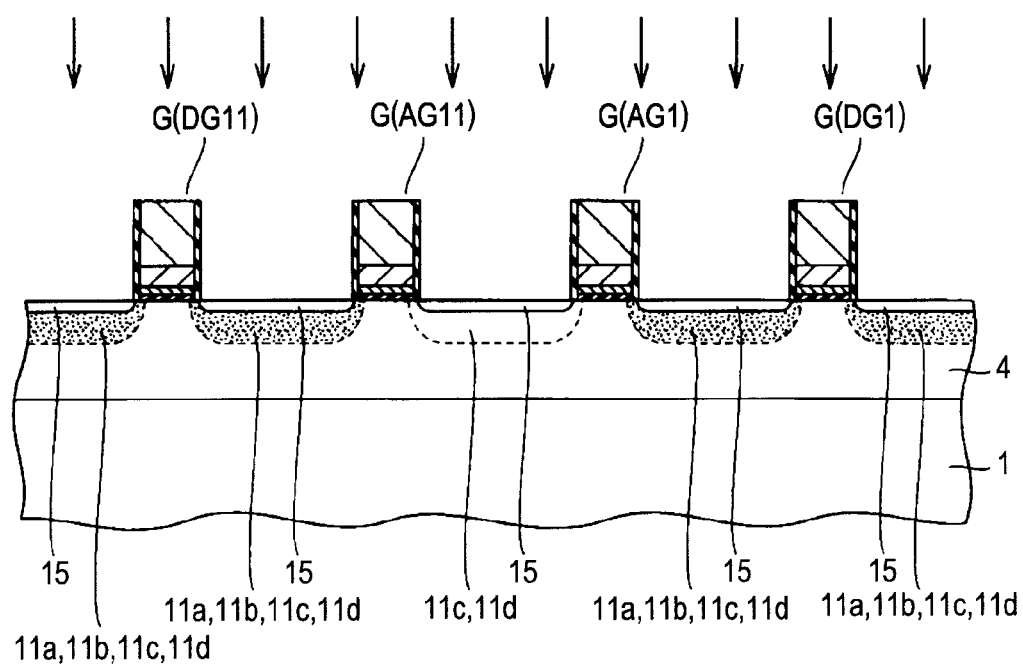
FIG. 21 is a cross-sectional view showing a step performed after the step shown in FIG. 19 in Embodiment 1.

Next, as shown in FIG. 21, using the same resist mask 32 as an implantation mask (implantation mask B), phosphorus or arsenic, for example, is implanted into the semiconductor substrate 1 from a direction perpendicular to the main surface of the semiconductor substrate 1, thereby forming the extension regions 15 each extending from the exposed surface of the p-well 4 to a predetermined depth (extension implantation). Thereafter, the resist mask 32 is removed. Note that the extension implantation step shown in FIG. 21 may also be performed after the mask formation step shown in FIG. 17 and prior to the halo implantation step shown in FIGS. 18 and 19. The sequence of steps shown in FIGS. 17 to 21 (involving the case where the step shown in FIG. 21 is performed prior to the step shown in FIG. 18) may also be performed prior to the mask formation step and the halo implantation step that are shown in FIGS. 12 to 16.

Figure 22:
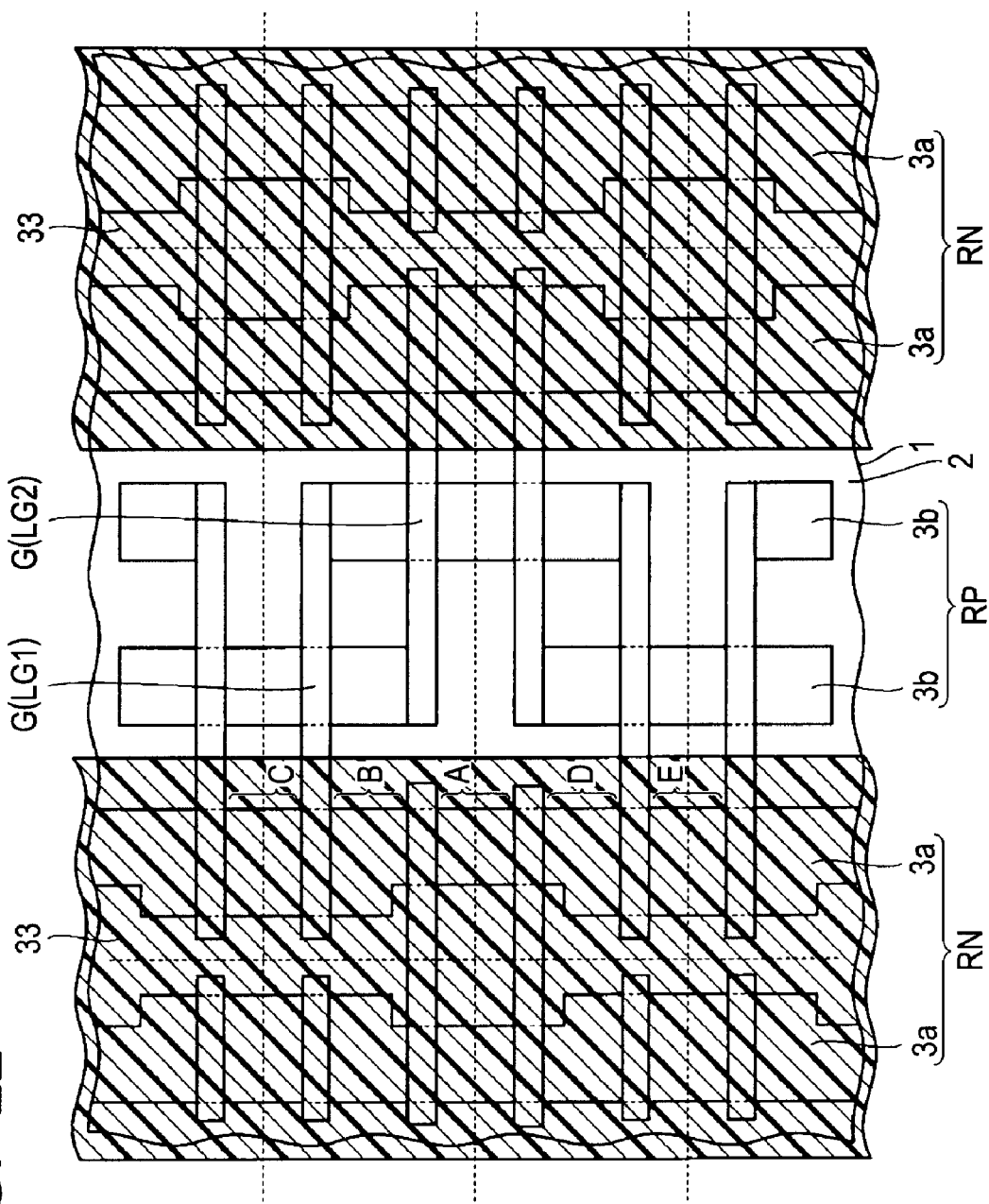
FIG. 22 is a plan view showing a step performed after the step shown in FIG. 21 in Embodiment 1.

Next, as shown in FIG. 22, a resist mask 33 (implantation mask C) covering the NMIS regions RN, and exposing the PMIS region RP is formed. Then, in the same manner as in the steps of forming the halo regions 11a, 11b, 11c, and 11d in the element formation regions 3a, using the resist mask 33 as an implantation mask, phosphorus or arsenic is implanted into the substrate 1 from a direction perpendicular to the main surface of the semiconductor substrate 1, thereby forming halo regions (not shown) in the element formation regions 3b. Then, boron is implanted into the semiconductor substrate 1 from a direction perpendicular to the main surface of the semiconductor substrate 1, thereby forming extension regions (not shown). Thereafter, the resist mask 33 is removed.

Next, a silicon oxide film and a silicon nitride film (not shown), for example, are successively formed so as to cover the gate structures G (such as the access gate electrodes AG1 and AG11 and the drive gate electrodes DG1 and DG11).

Figure 23:
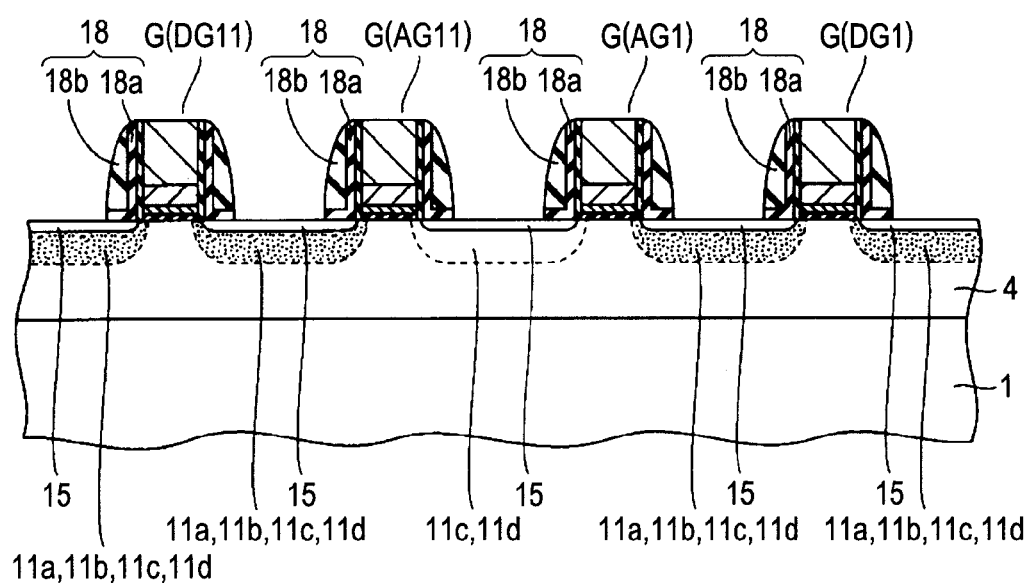
FIG. 23 is a cross-sectional view showing a step performed after the step shown in FIG. 22 in Embodiment 1.

Then, anisotropic etching is performed to the silicon oxide film and the silicon nitride film to form the sidewall spacers 18 each comprised of the silicon oxide film 18a and the silicon nitride film 18b over the both side surfaces of the gate structures G, as shown in FIG. 23.

Figure 24:
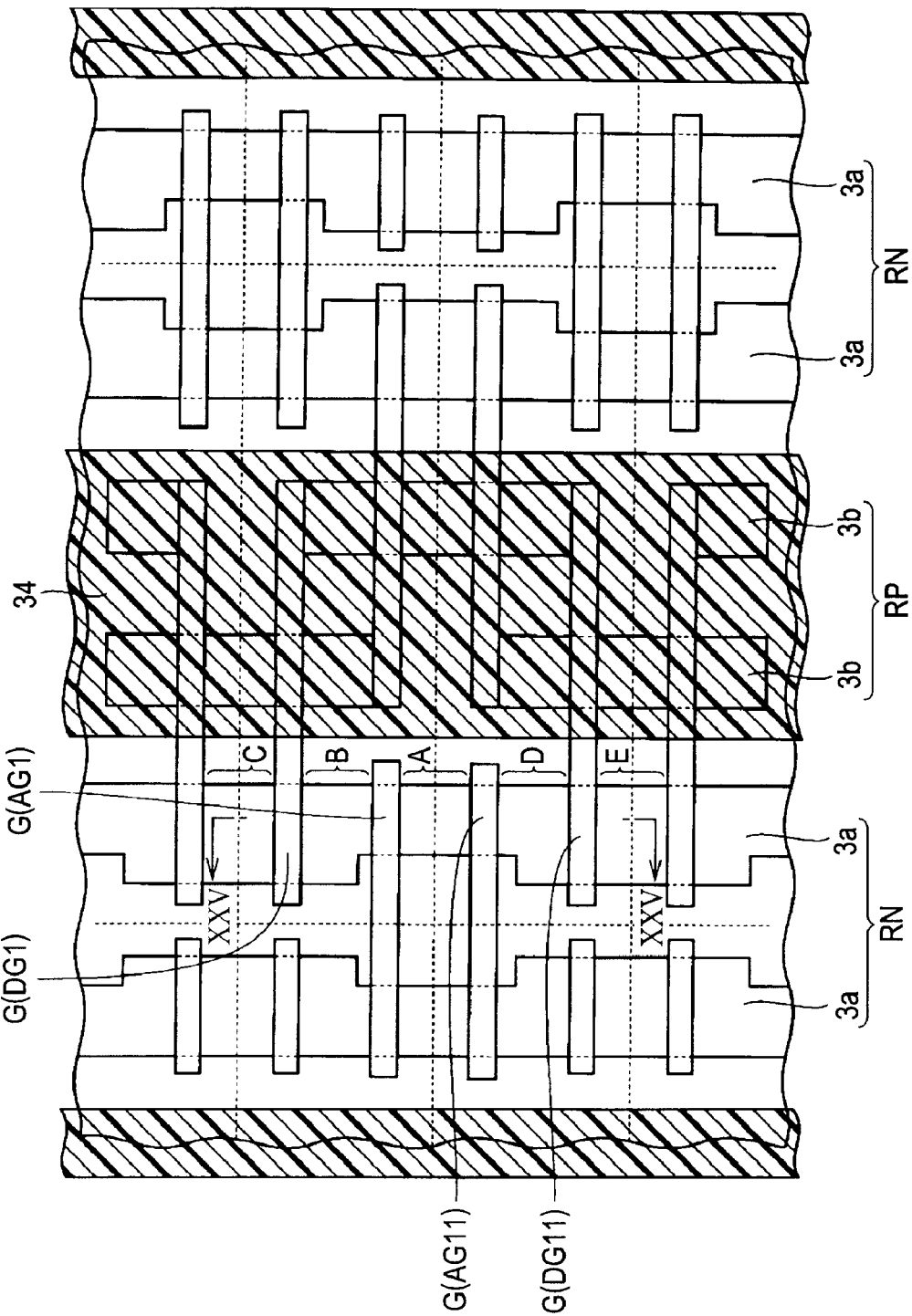
FIG. 24 is a plan view showing a step performed after the step shown in FIG. 23 in Embodiment 1.
Figure 25:
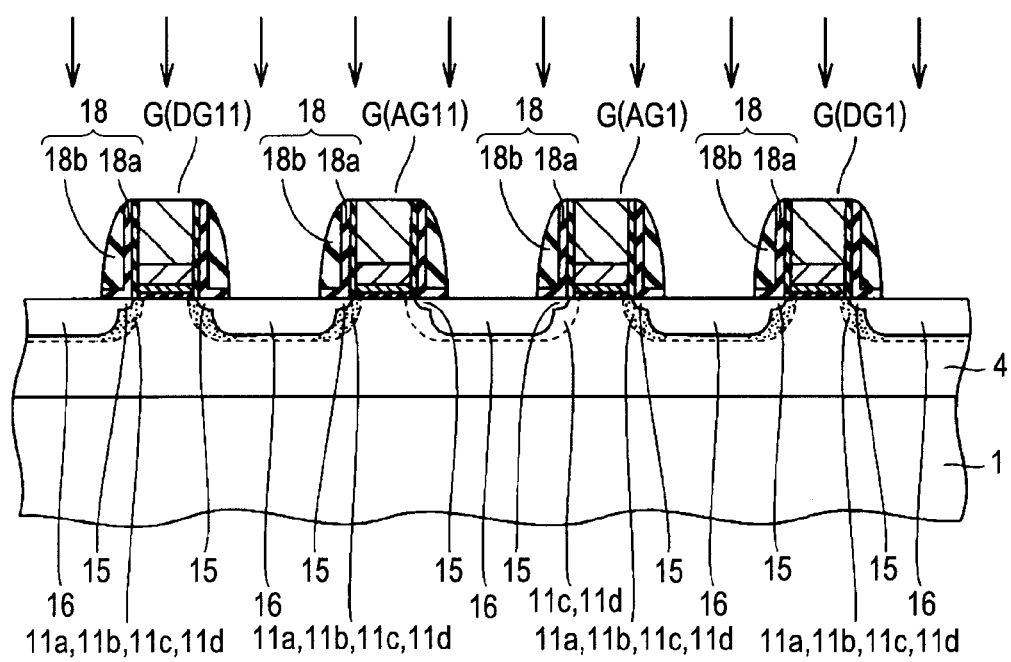
FIG. 25 is a cross-sectional view showing a step performed after the step shown in FIG. 24 in Embodiment 1, which is a cross-sectional view along a cross-sectional line corresponding to the cross-sectional line XXV-XXV shown in FIG. 24.

Next, as shown in FIG. 24, a resist mask 34 exposing the NMIS regions RN, and covering the PMIS region RP is formed. Then, as shown in FIG. 25, using the resist mask 34 (FIG. 24), the sidewall spacers 18, and the like as an implantation mask, phosphorus or arsenic is implanted into the semiconductor substrate 1 from a direction perpendicular to the main surface of the semiconductor substrate 1, thereby forming the source or drain regions 16 each extending from the exposed surface of the p-well 4 to a predetermined depth. Thereafter, the resist mask 34 is removed.

Figure 26:
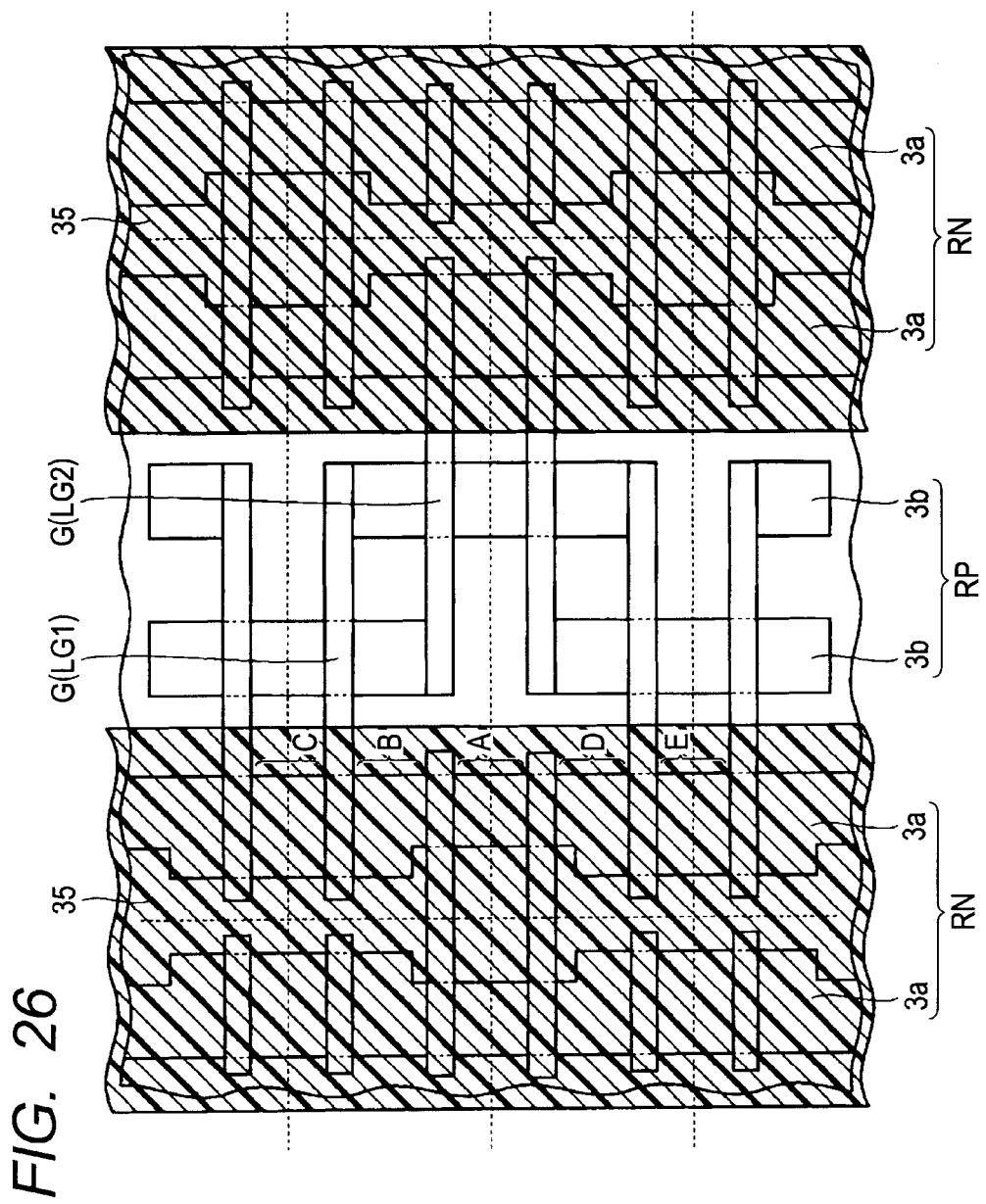
FIG. 26 is a plan view showing a step performed after the step shown in FIG. 25 in Embodiment 1.

Next, as shown in FIG. 26, a resist mask 35 covering the NMIS regions RN, and exposing the PMIS region RP is formed. Then, using the resist mask 35, the sidewall spacers 18, and the like as an implantation mask, boron is implanted into the semiconductor substrate 1 from a direction perpendicular to the main surface of the semiconductor substrate 1, thereby forming source or drain regions (not shown) extending from the exposed surfaces of the element formation regions 3b to a predetermined depth. Thereafter, the resist mask 35 is removed.

Figure 27:
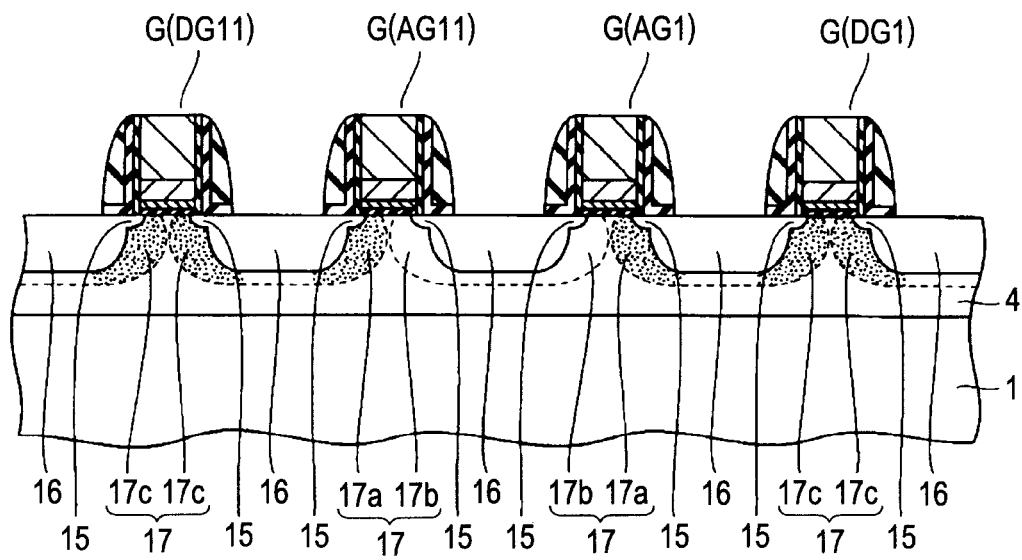
FIG. 27 is a cross-sectional view showing a step performed after the step shown in FIG. 26 in Embodiment 1.

Next, as shown in FIG. 27, a predetermined annealing process is performed to thermally diffuse the implanted impurities, and thereby activate the source or drain regions 16, the extension regions 15, and the halo regions 17a, 17b, and 17c. At this time, through the thermal diffusion of the impurities, the source or drain regions 16, the extension regions 15, and the halo regions 17a, 17b, and 17c expand in a lateral direction and in a vertical (depth) direction.

Figure 28:
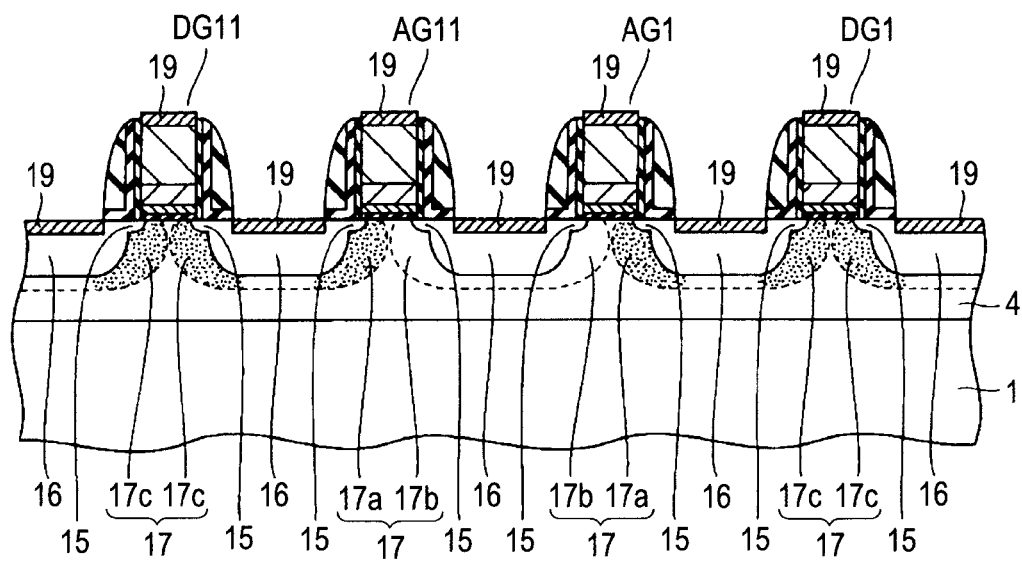
FIG. 28 is a cross-sectional view showing a step performed after the step shown in FIG. 27 in Embodiment 1.
Figure 29:
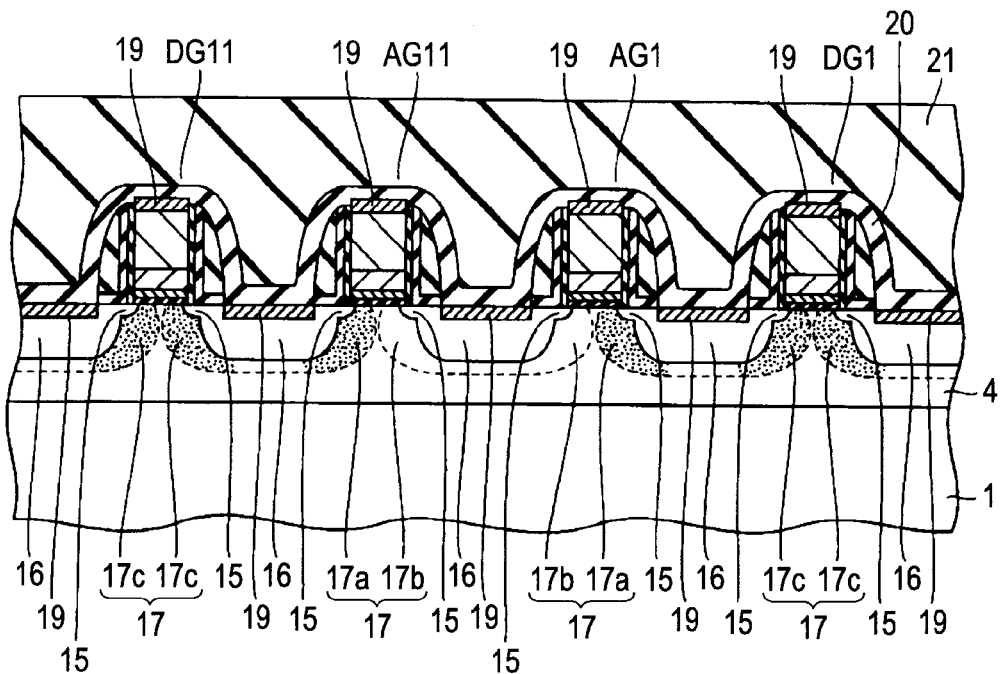
FIG. 29 is a cross-sectional view showing a step performed after the step shown in FIG. 28 in Embodiment 1.

Next, as shown in FIG. 28, by a salicide process, the metal silicide films 19 comprised of, e.g., nickel silicide or the like are formed in the exposed surfaces of the polysilicon films of the source or drain regions 16, the access gate electrodes AG1 and AG11, and the drive gate electrodes DG1 and DG11. Then, as shown in FIG. 29, the stress liner film 20 such as, e.g., a silicon nitride film is formed so as to cover the access gate electrodes AG1 and AG11 and the drive gate electrodes DG1 and DG11. Then, the interlayer insulating film 21 such as a silicon oxide film (e.g., a TEOS film) is formed so as to cover the stress liner film 20.

Figure 30:
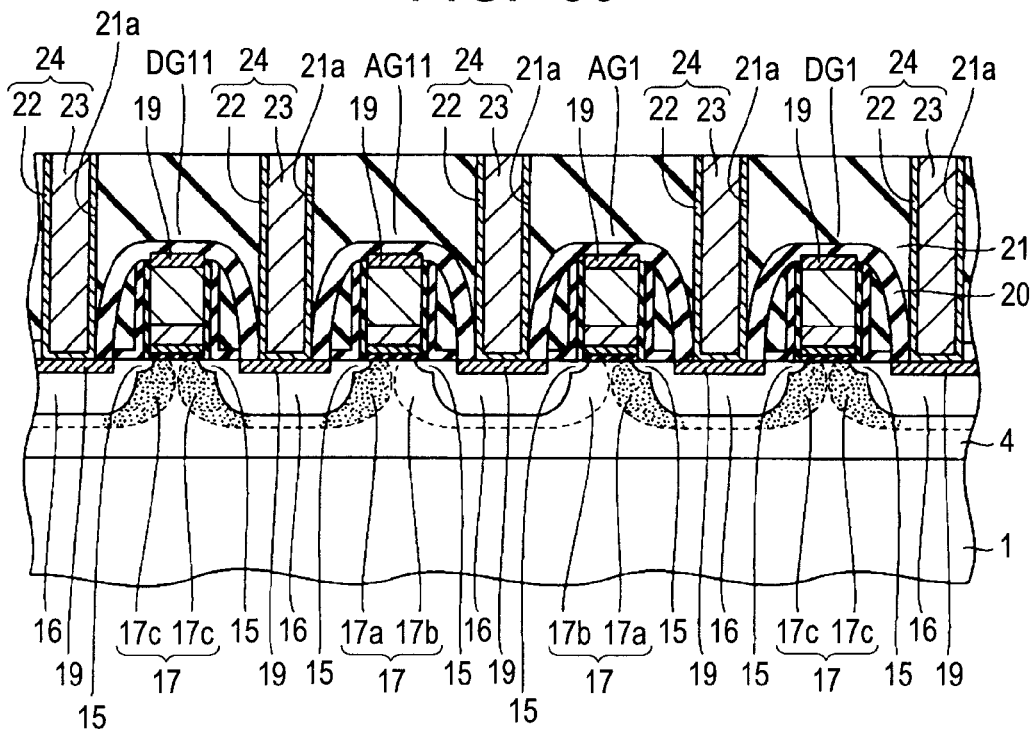
FIG. 30 is a cross-sectional view showing a step performed after the step shown in FIG. 29 in Embodiment 1.

Next, anisotropic etching is performed to the interlayer insulating film 21 to form contact holes 21a (see FIG. 30) which expose the metal silicide films 19. Then, the barrier metal film (see FIG. 30) comprised of titanium nitride (TiN) or the like is formed so as to cover the inner walls of the contact holes 21a, and the tungsten film 23 (see FIG. 30) is further formed over the barrier metal film 22 so as to fill the insides of the contact holes 21a. Then, a CMP (Chemical Mechanical Polishing) process is performed to remove the respective portions of the barrier metal film and the tungsten film located over the upper surface of the interlayer insulating film 21. As a result, as shown in FIG. 30, the plugs 24 each including the barrier metal film 22 and the tungsten film 23 are formed in the contact holes 21a.

Next, as shown in FIG. 5, the etching stopper film 25 such as a silicon nitride film is formed so as to cover the plugs 24. Over the etching stopper film 25, the interlayer insulating film 26 such as a silicon oxide film is formed. Then, trenches 26a are formed to expose the surfaces of the plugs 24. Then, the barrier metal film 27 comprised of, e.g., tantalum nitride (TaN) or the like is formed so as to cover the inner walls of the trenches 26a. Further, over the barrier metal film 27, the copper film 28 is formed so as to fill the insides of the trenches 26a. Then, a chemical mechanical polishing process is performed to remove the respective portions of the barrier metal film and the copper film located over the upper surface of the interlayer insulating film 26, and form the copper wires 29 each including the barrier metal film 27 and the copper film 28 in the trenches 26a. The copper wires 29 correspond to first metal wires.

Thereafter, an interlayer insulating film (not shown) is formed so as to cover the copper wires 29. In the interlayer insulating film, the vias V11 to V18 (see FIG. 6) are formed by the same method as the method of forming the plugs 24. Then, an interlayer insulating film (not shown) is formed so as to cover the vias V11 to V18. In the interlayer insulating film, the second metal wires M21 to M27 (see FIG. 7) are formed by the same method as the method of forming the copper wires 29.

Next, an interlayer insulating film (not shown) is formed so as to cover the second metal wires M21 to M27. In the interlayer insulating film, the vias V21 to V24 (see FIG. 8) are formed by the same method as the method of forming the plugs 24. Then, an interlayer insulating film (not shown) is formed so as to cover the vias V21 to V24. In the interlayer insulating film, the third metal wires M31 to M33 (see FIG. 8) are formed by the same method as the method of forming the copper wires 29. In this manner, the main portions of the SRAM memory cells are formed.

In general, it is known that, to ensure the read margin of a SRAM memory cell, a $\beta$ ratio is preferably increased and, to ensure the write margin thereof, a $\gamma$ ratio is preferably increased. For example, referring to FIG. 3, the $\beta$ ratio is represented by the current ratio of the drive transistor T3 (T4) to the access transistor T1 (T2) (under the condition that each of a source-gate voltage and a source-drain voltage is the same between the access transistor and the drive transistor). The $\gamma$ ratio is represented by the current ratio of the access transistor T1 (T2) to the load transistor T5 (T6) (under the condition that each of the source-gate voltage and the source-drain voltage is the same between the access transistor and the load transistor).

As a means for ensuring both the read margin and the write margin, it is effective to use, as the access transistors, transistors each having an asymmetric property such that a current characteristic differs depending on the direction in which a current flows. In the semiconductor device according to Embodiment 1, in the access transistors T1 and T2 each having the pair of halo regions 17a and 17b, the impurity concentration of the halo region 17a is set higher than the impurity concentration of the halo region 17b.

Figure 31:
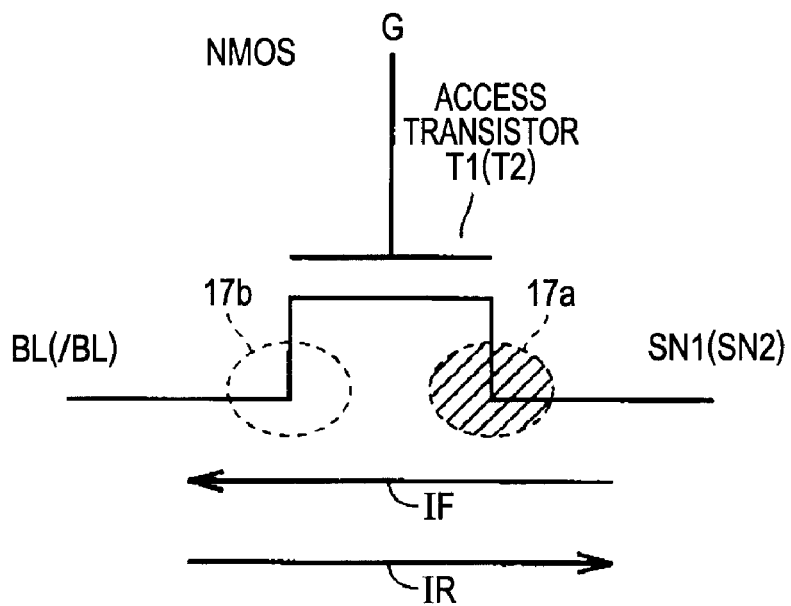
FIG. 31 is a view showing a current flowing in the access transistor in Embodiment 1.
Figure 32:
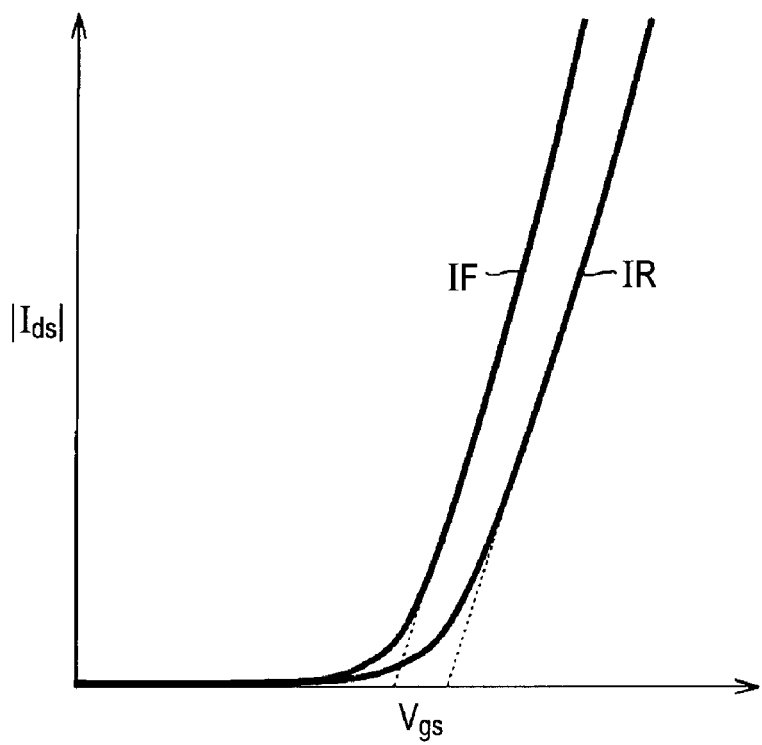
FIG. 32 is a graph showing current characteristics versus a gate voltage in the access transistor in Embodiment 1.

As shown in FIG. 31, in the access transistor T1 (T2), a current flowing from the source or drain region located on the side formed with the halo region 17a having a relatively high impurity concentration to the source or drain region located on the side formed with the halo region 17b having a relatively low impurity concentration is designated by IF, and a current flowing in the opposite direction is designated by IR. The relationships between the currents IF and IR and the source-gate voltage Vgs at the same source-drain voltage are as shown in FIG. 32. That is, the threshold voltage of the transistor when a current flows from the source or drain region on the side formed with the halo region 17a to the source or drain region on the side formed with the halo region 17b is lower than the threshold voltage of the transistor when a current reversely flows from the source or drain region on the side formed with the halo region 17b to the source or drain region on the side formed with the halo region 17a.

In view of the foregoing, by forming the halo region 17a having a relatively high impurity concentration on the side coupled to the storage node SN1 (SN2), and forming the halo region 17b having a relatively low impurity concentration on the side coupled to the bit line (BL) (/BL), it is possible to increase the likelihood of suppressing a current from the bit line to the storage node during reading, and increase the likelihood of increasing a current from the storage node to the bit line during writing. This can increase the γ ratio without degrading the β ratio, and increase the β ratio without degrading the γ ratio. Alternatively, it is possible to increase both of the β ratio and the γ ratio. As a result, it is possible ensure the read margin and the write margin.

In addition, in the semiconductor device according to Embodiment 1, it is possible to reduce the resist masks serving as the implantation masks for forming the halo regions of the individual transistors including such access transistors. A description will be given thereof in accordance also with a comparative example.

Figure 33:
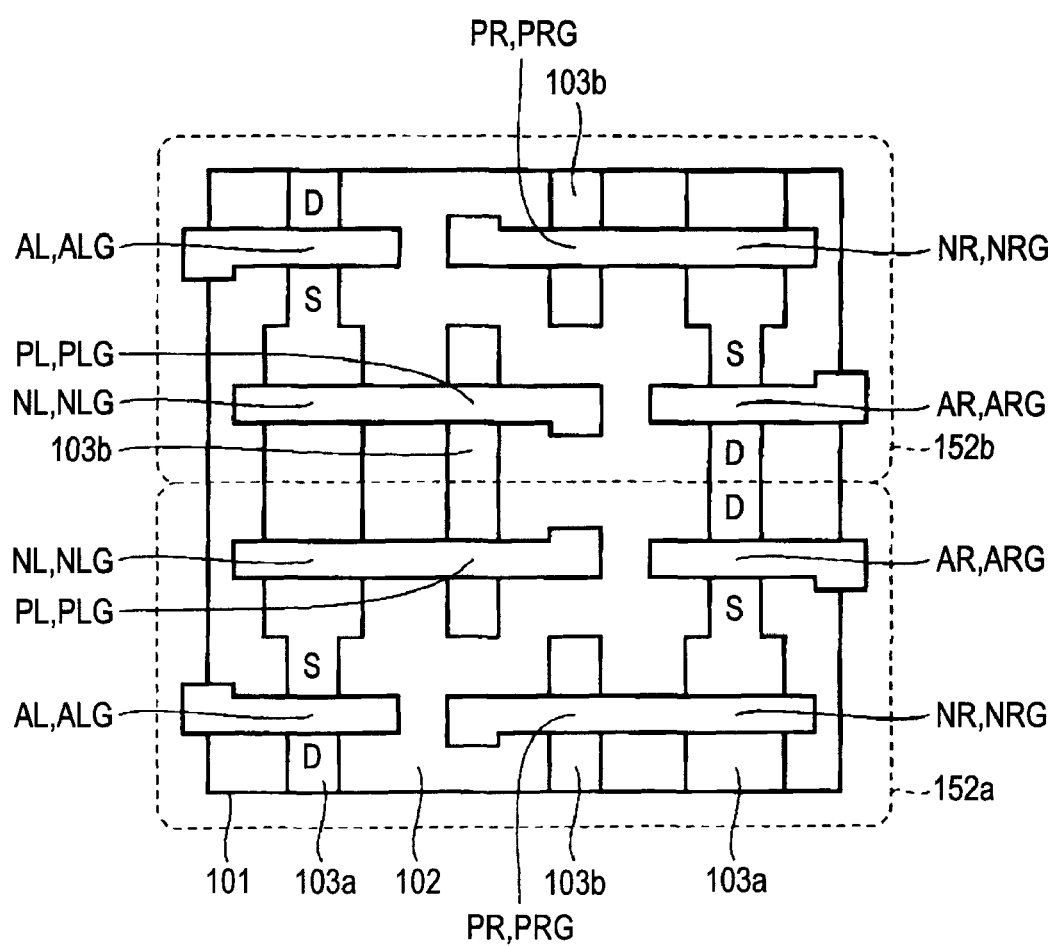
FIG. 33 is a plan view showing a layout pattern of SRAM memory cells in a semiconductor device according to a comparative example.

In a semiconductor device according to the comparative example, first as shown in FIG. 33, an isolation insulating film 102 is formed in a main surface of a semiconductor substrate 101 to define element formation regions 103a and 103b electrically isolated from each other. Then, access gate electrodes ALG of access transistors AL, access gate electrodes ARG of access transistors AR, drive gate electrodes NLG of drive transistors NL, and drive gate electrodes NRG of drive transistors NR are formed at respective predetermined positions so as to traverse the element formation regions 103a. Also, load gate electrodes PLG of load transistors PL and load gate electrodes PRG of load transistors PR are formed at respective predetermined positions so as to traverse the element formation regions 103b. Note that, in FIG. 33, two SRAM memory cells (dot-line frames 152a and 152b) are shown.

Figure 34:
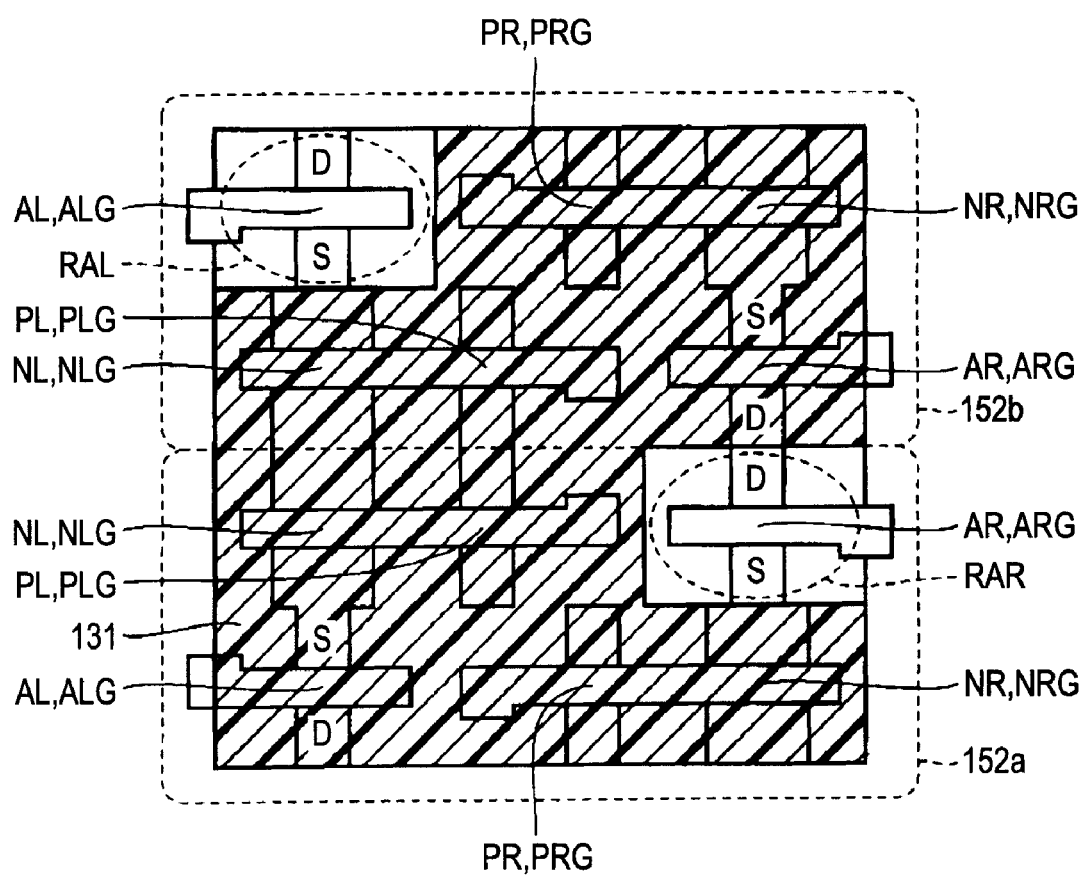
FIG. 34 is a plan view showing a step of a method of manufacturing the semiconductor device according to the comparative example.

Next, a description will be given of the step of forming halo regions and the like. As shown in FIG. 34, a resist mask 131 for forming the halo regions of the access transistors AL and AR are formed first. The resist mask 131 is formed so as to expose a region RAR where the access transistor AR of the SRAM memory cell in the dot-line frame 152a is formed and a region RAL where the access transistor AL of the SRAM memory cell in the dot-line frame 152b is formed, and cover the other region.

Next, using the resist mask 131 as an implantation mask, a p-type impurity is implanted into the exposed element formation regions 103a by oblique ion implantation, thereby forming halo regions. At this time, in the region RAL, the p-type impurity is implanted in a larger amount in the portion of the element formation region 103a located on the side of the access transistor AL provided with the drive transistor NL. In the region RAR, the p-type impurity is implanted in a larger amount in the portion of the element formation region 103a located on the side of the access transistor AR provided with the drive transistor NR. In this manner, in the access transistors AL and AR, halo regions having asymmetric impurity concentrations are formed. Thereafter, the resist mask 131 is removed.

Figure 35:
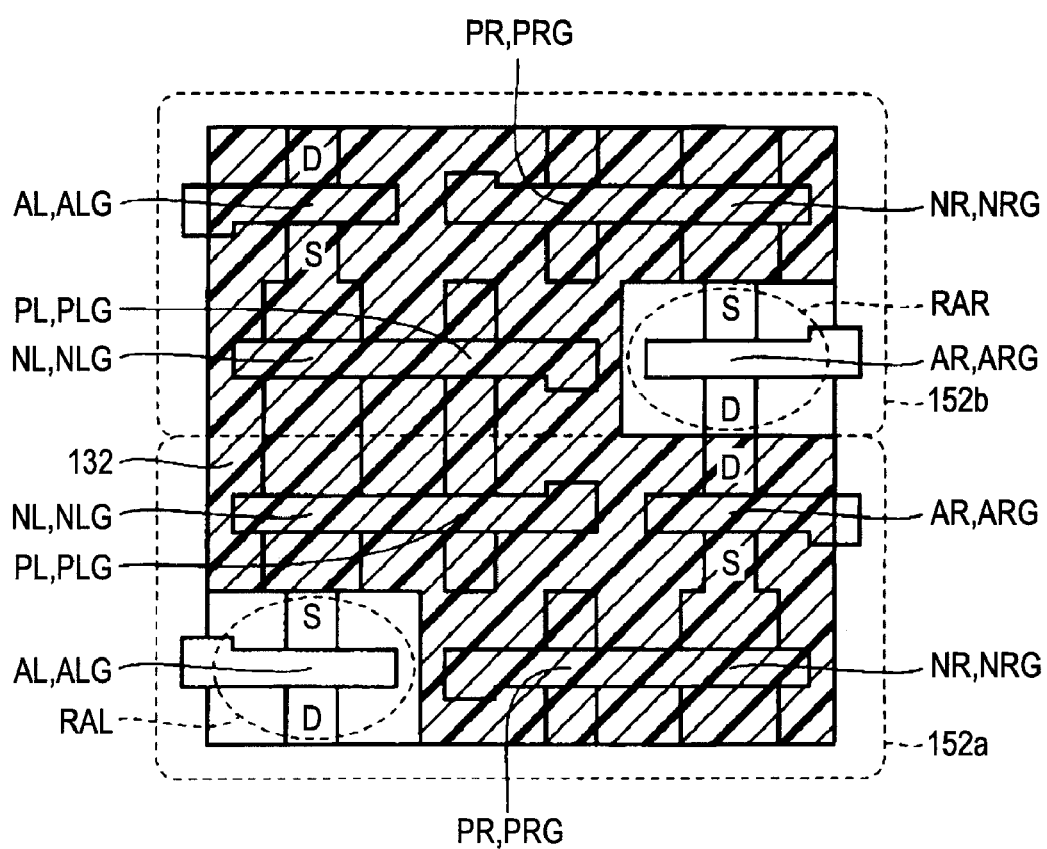
FIG. 35 is a plan view showing a step performed after the step shown in FIG. 34.

Next, as shown in FIG. 35, a resist mask 132 for forming the halo regions of the other access transistors AL and AR is formed. The resist mask 132 is formed so as to expose the region RAL where the access transistor AL of the SRAM memory cell in the dot-line frame 152a is formed and the region RAR where the access transistor AR of the SRAM memory cell in the dot-line frame 152b is formed, and cover the other region.

Next, using the resist mask 132 as an implantation mask, a p-type impurity is implanted into the exposed element formation regions 103a by oblique ion implantation, thereby forming halo regions. At this time, in the region RAL, the p-type impurity is implanted in a larger amount in the portion of the element formation region 103a located on the side of the access transistor AL provided with the drive transistor NL. In the region RAR, the p-type impurity is implanted in a larger amount in the portion of the element formation region 103a located on the side of the access transistor AR provided with the drive transistor NR. In this manner, in the access transistors AL and AR, halo regions having asymmetric impurity concentrations are formed. Thereafter, the resist mask 132 is removed.

Figure 36:
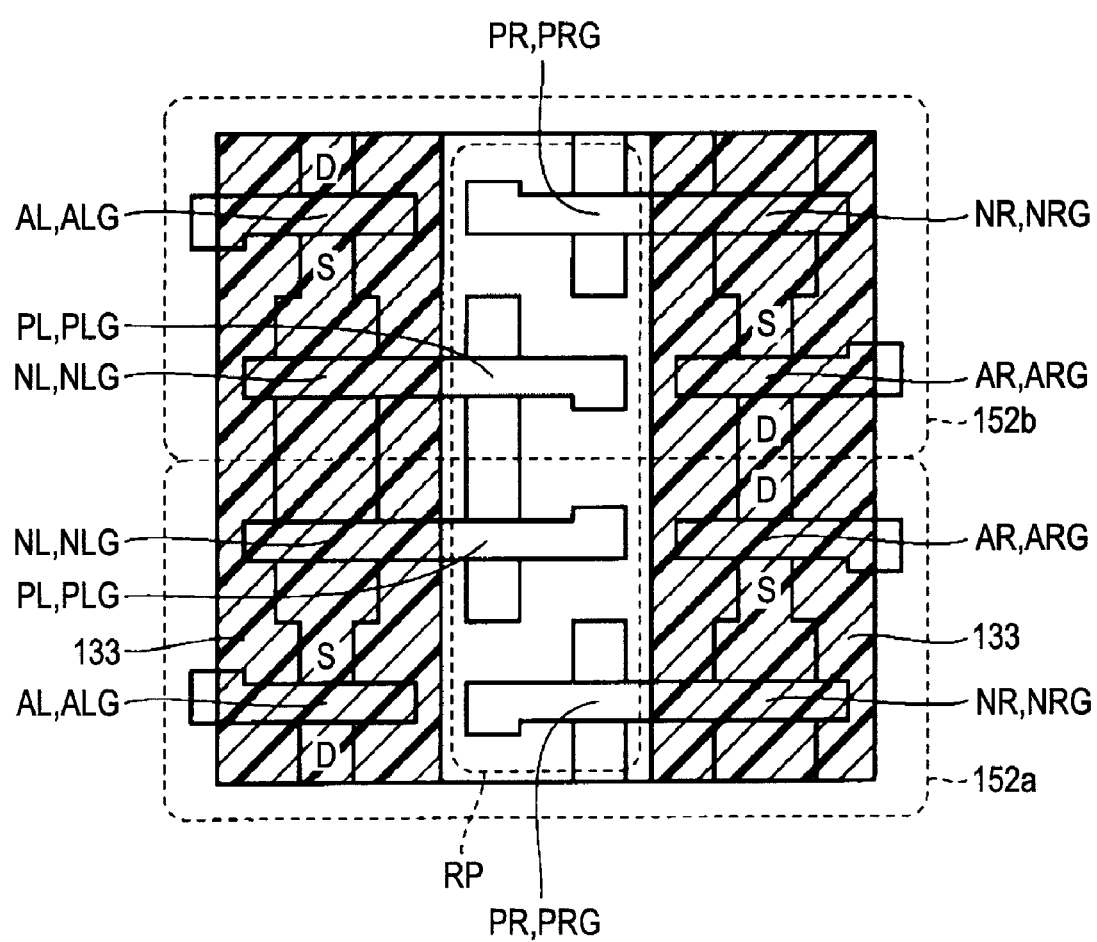
FIG. 36 is a plan view showing a step performed after the step shown in FIG. 35.

Next, as shown in FIG. 36, a resist mask 133 for forming the halo regions and the extension regions of the load transistors PL and PR is formed. The resist mask 133 is formed so as to expose regions where the load transistors PL and PR of the SRAM memory cell in the dot-line frame 152a are formed and a region where the load transistors PL and PR of the SRAM memory cell in the dot-line frame 152b are formed, and cover regions where the access transistors AL and AR and the drive transistors NL and NR are formed.

Next, using the resist mask 133 as an implantation mask, an n-type impurity is implanted into the exposed element formation regions 103b by oblique ion implantation, thereby forming halo regions. Also, using the resist mask 133 as an implantation mask, a p-type impurity is implanted into the exposed element formation regions 103b, thereby forming extension regions. Thereafter, the resist mask 133 is removed.

Figure 37:
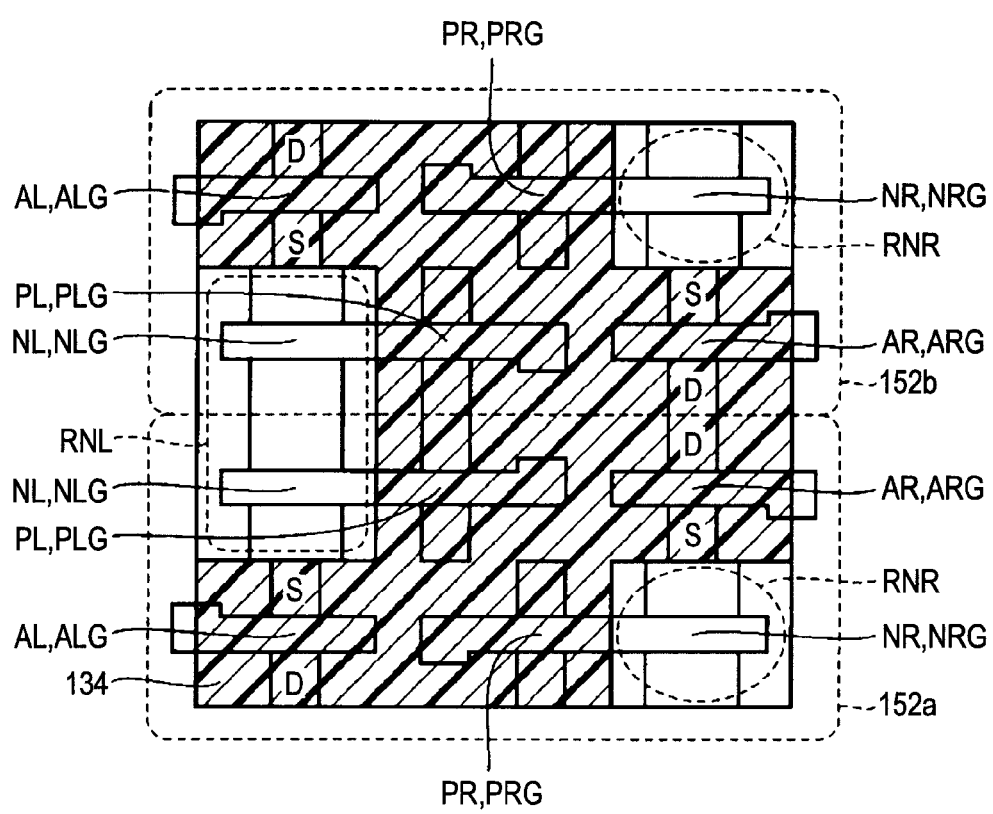
FIG. 37 is a plan view showing a step performed after the step shown in FIG. 36.

Next, as shown in FIG. 37, a resist mask 134 for forming the halo regions of the load transistors NL and NR is formed. The resist mask 134 is formed so as to expose respective regions RNL and RNR where the load transistors NL and NR of the SRAM memory cell in the dot-line frame 152a are formed and the regions RNL and RNR where the load transistors NL and NR of the SRAM memory cell in the dot-line frame 152b are formed, and cover the other region. Then, using the resist mask 134 as an implantation mask, a p-type impurity is implanted into the exposed element formation regions 103a by oblique ion implantation, thereby forming halo regions. Thereafter, the resist mask 134 is removed.

Thus, in the semiconductor device according to the comparative example, the SRAM memory cells each including the asymmetric halo regions are formed. As the implantation masks for forming the halo regions including the asymmetric halo regions in the SRAM memory cells, at least four resist masks which are the resist masks 131, 132, 133, and 134 are needed.

In contrast to the semiconductor device according to the comparative example, in the semiconductor device described above, the asymmetric halo regions of the access transistors T1 and T2 and the halo regions of the drive transistors T3 and T4 are formed using the resist mask 31 (implantation mask A) and the resist mask (implantation mask B). In addition, the halo regions of the load transistors T5 and T6 are formed using the resist mask 33 (implantation mask C).

That is, to form the halo regions of the individual transistors forming each of the SRAM memory cells, at least four implantation masks (resist masks) are needed in the semiconductor device according to the comparative example. By contrast, in the semiconductor device described above, the halo regions of the individual transistors can be formed using three implantation masks (resist masks). Therefore, it is possible to reduce at least one of the photographic masks for patterning the resist masks, and consequently contribute to a reduction in production cost.

In the semiconductor device described above, the impurity concentrations of the pairs of halo regions 17c of the drive transistors T3 and T4 are the same as the impurity concentrations of the halo regions 17a that have the higher impurity concentrations of the pairs of halo regions 17a and 17b of the access transistors T1 and T2. Specifically, impurity concentration profiles in the depth direction (corresponding to the arrows F1 and F2 shown in FIG. 9) from the surface portions of the semiconductor substrate under the lower end portions of the side surfaces of the drive gate electrodes of the drive transistors T3 and T4 are the same as the impurity concentration profile of F1 shown in FIG. 10 in each of the pairs of halo regions 17c. Accordingly, the threshold voltages of the drive transistors T3 and T4 increase to allow a leakage current to be suppressed, and consequently allow a reduction in power consumption.

Note that, the increased threshold voltages affect the operating speeds of the drive transistors T3 and T4 to a certain degree. In the semiconductor device described above, the widths of the drive gate electrodes DG1 and DG2 of the drive transistors T3 and T4 are set larger than the widths of the access gate electrodes AG1 and AG2 of the access transistors T1 and T2. This improves the driving abilities of the drive transistors T3 and T4 to allow improvements in the operating speeds thereof.

In the exemplary case described above, for the access transistors and the drive transistors of the foregoing semiconductor device, the halo implantation A and the halo implantation B are performed using the respective implantation masks A and B, and then the extension implantation is performed using the implantation mask B. However, it is also possible that, after the extension implantation is performed, the halo implantations may be performed. In this case, it is also possible that the extension implantation and the halo implantation B may be successively performed first using the implantation mask B, and then the halo implantation A may be performed using the implantation mask A. Otherwise, it is also possible that the halo implantation B and the extension implantation may be successively performed using the implantation mask B, and the halo implantation A may be performed using the implantation mask A.

In the resist masks 31 and 32 formed as the implantation masks A and B, as openings (space pattern), sufficiently large openings relative to the spacings between the adjacent access (drive) gate electrodes are formed. Accordingly, even when boron (p-type impurity) is obliquely implanted, boron can be reliably implanted into areas where boron is to be implanted without being shielded by the resist masks.

Variation in Embodiment 1

Figure 38:
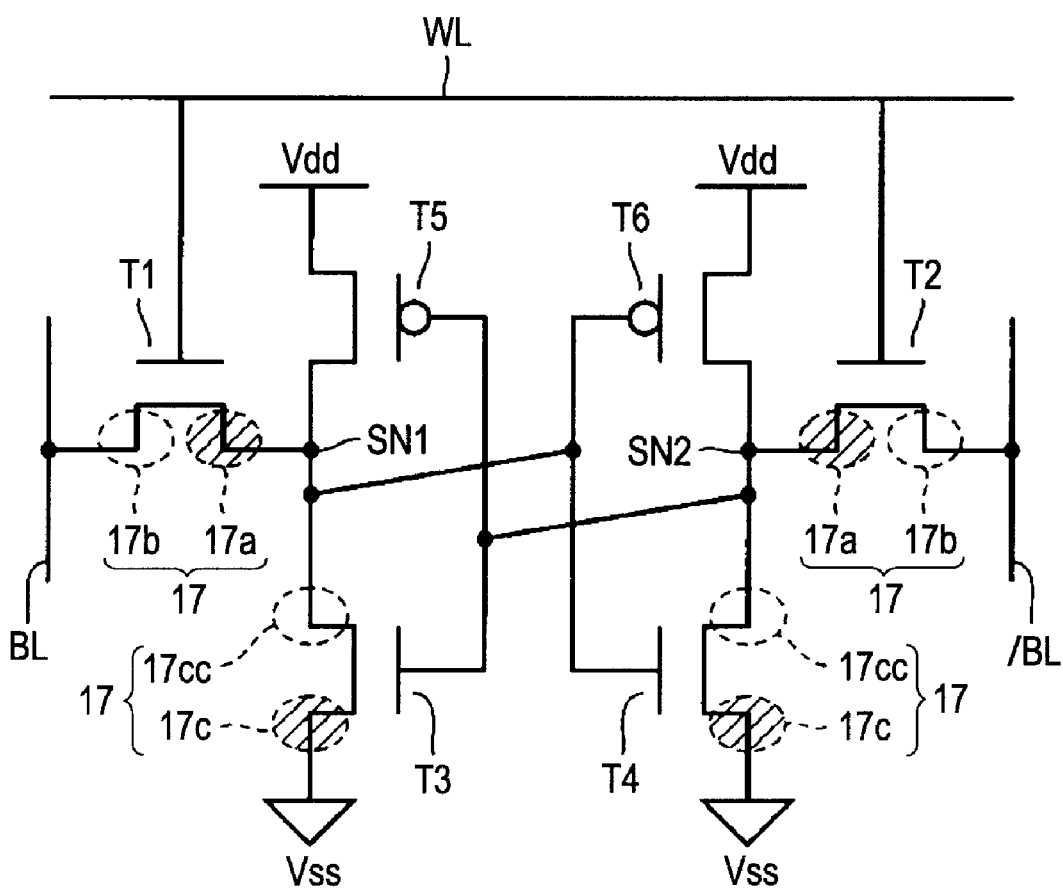
FIG. 38 is a view showing an equivalent circuit of the SRAM memory cell in the semiconductor device according to a variation in Embodiment 1.

In the semiconductor described above, the impurity concentrations of the pairs of halo regions 17c in the drive transistors T3 and T4 are set the same. However, with regard to an operation of the SRAM, currents from the ground lines Vss to the storage nodes SN1 and SN2 do not flow in the drive transistors. Therefore, as shown in, e.g., FIG. 38, it is also possible that the impurity concentrations of halo regions 17cc closer to the S/D regions coupled to the storage nodes SN1 and SN2 may be set lower than the impurity concentrations of the halo regions 17c closer to the S/D regions coupled to the ground lines Vss.

Figure 39:
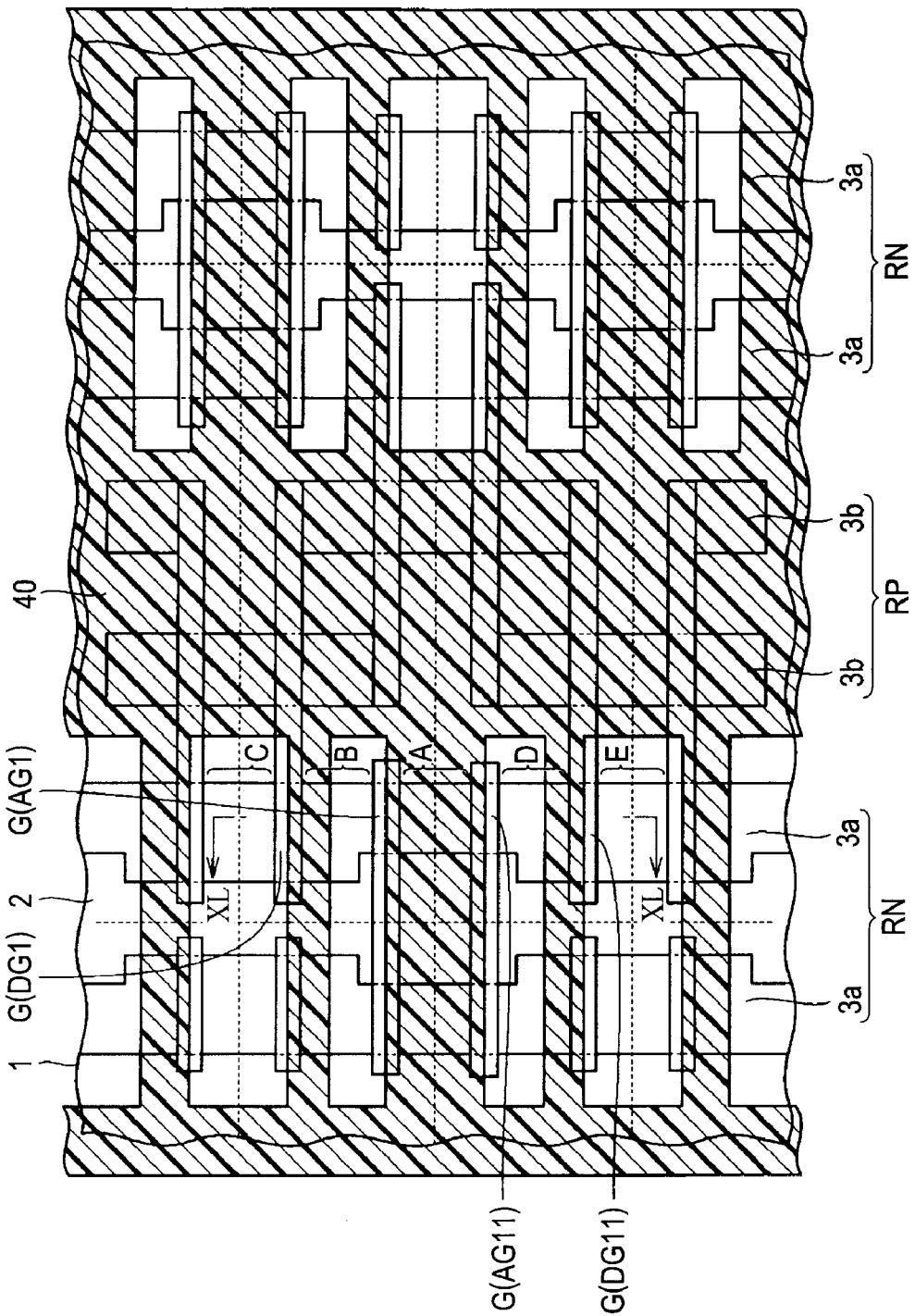
FIG. 39 is a plan view showing a mask pattern of an implantation mask A used in the manufacturing of the semiconductor device according to the variation in Embodiment 1.
Figure 40:
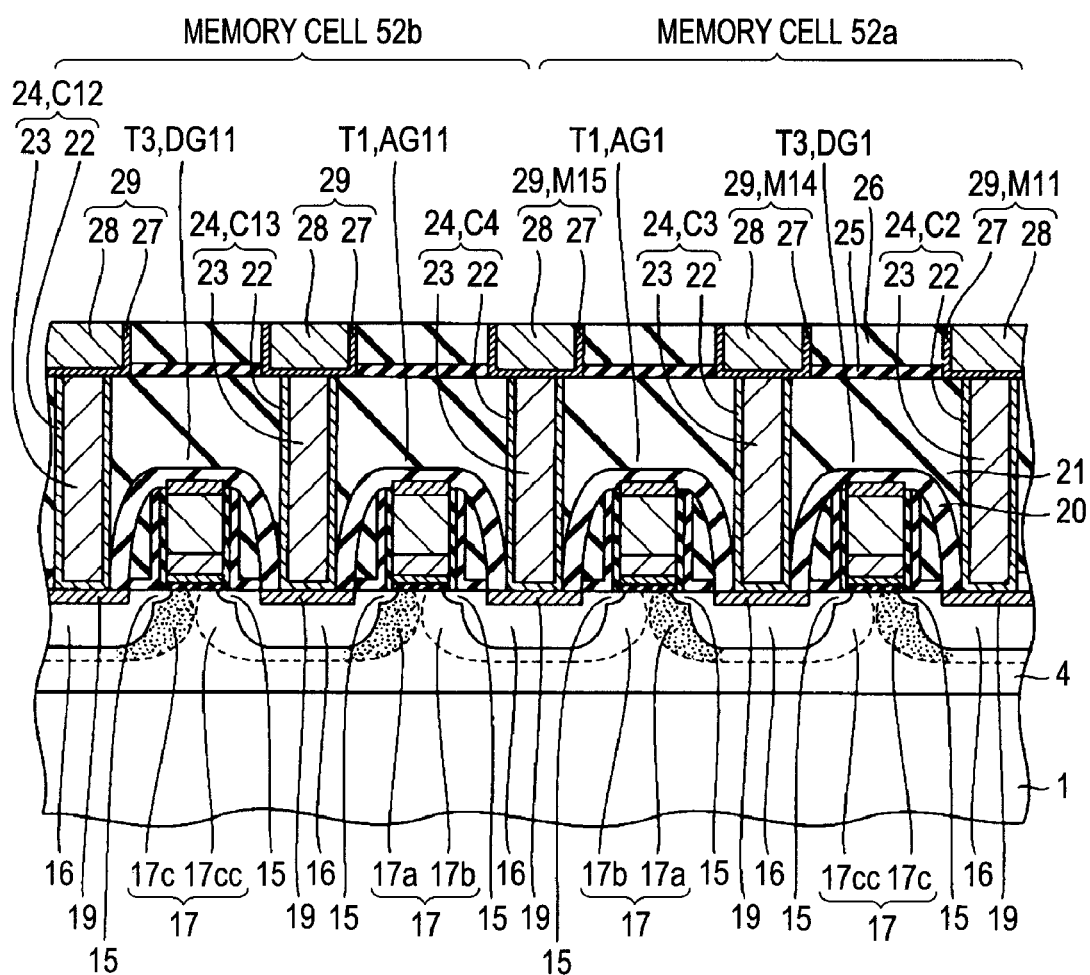
FIG. 40 is a cross-sectional view showing a structure of the semiconductor device according to the variation in Embodiment 1.

The resulting semiconductor device is formed by the same method as the method of manufacturing the semiconductor device shown in FIG. 3 described above except that, instead of the resist mask 31 shown in FIG. 12, the resist mask 40 shown in FIG. 39 is used. The resist mask 40 serving as the implantation mask A has an opening exposing a part of the area B extending from the side surface of the access gate electrode AG1 (gate structure) to a midpoint between the access gate electrode AG1 and the drive gate electrode DG1 (gate structure) and an opening exposing the entire area C, and covers the entire area A, the remaining part of the area B, and the PMIS region RP. A cross-sectional structure along a cross-sectional line corresponding to the cross-sectional line V-V shown in FIG. 4 is as shown in FIG. 40. The semiconductor device according to a variation is different from the semiconductor device shown in FIG. 5 in that the impurity concentrations of the halo regions 17 cc of each of the memory cells are the same as the impurity concentrations of the halo regions 17b.

Embodiment 2

In the embodiment described above, the exemplary case has been described in which the impurities of the pair of halo regions of each of the drive transistors are the same. Here, a description will be given of a semiconductor device in which the impurity concentrations of the pair of halo regions of each of the access transistors are set asymmetrically, and the impurity concentrations of the pair of halo regions of each of the drive transistors are also set asymmetrically.

Figure 41:
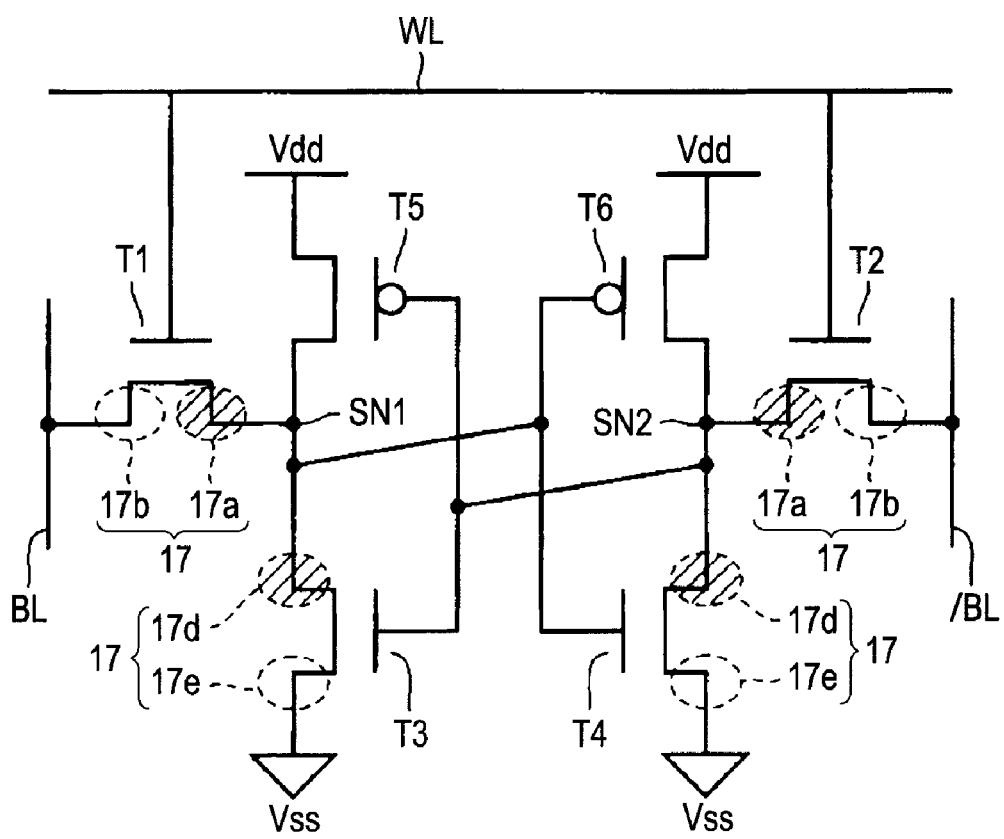
FIG. 41 is a view showing an equivalent circuit of a SRAM memory cell in a semiconductor device according to Embodiment 2 of the present invention.

First, a description will be given of an equivalent circuit of a SRAM memory cell. As shown in FIG. 41, in the access transistors T1 and T2 of each of the memory cells in the semiconductor device according to Embodiment 2, the respective pairs of halo regions 17 formed therein include the halo regions 17a coupled to the storage nodes SN1 and SN2 and the halo regions 17b coupled to the bit lines BL and /BL, and the impurity concentrations of the halo regions 17a are set higher than the impurity concentrations of the halo regions 17b. In the drive transistors T3 and T4, the respective pairs of halo regions 17 (17d and 17e) formed therein include the halo regions 17d coupled to the storage nodes SN1 and SN2 and the halo regions 17e coupled to the ground potential, and the impurity concentrations of the halo regions 17d are set higher than the impurity concentrations of the halo regions 17e. Note that the configuration is otherwise the same as the configuration of the equivalent circuit shown in FIG. 3, and therefore the same members are designated by the same reference numerals and the description thereof will not be repeated.

Figure 42:
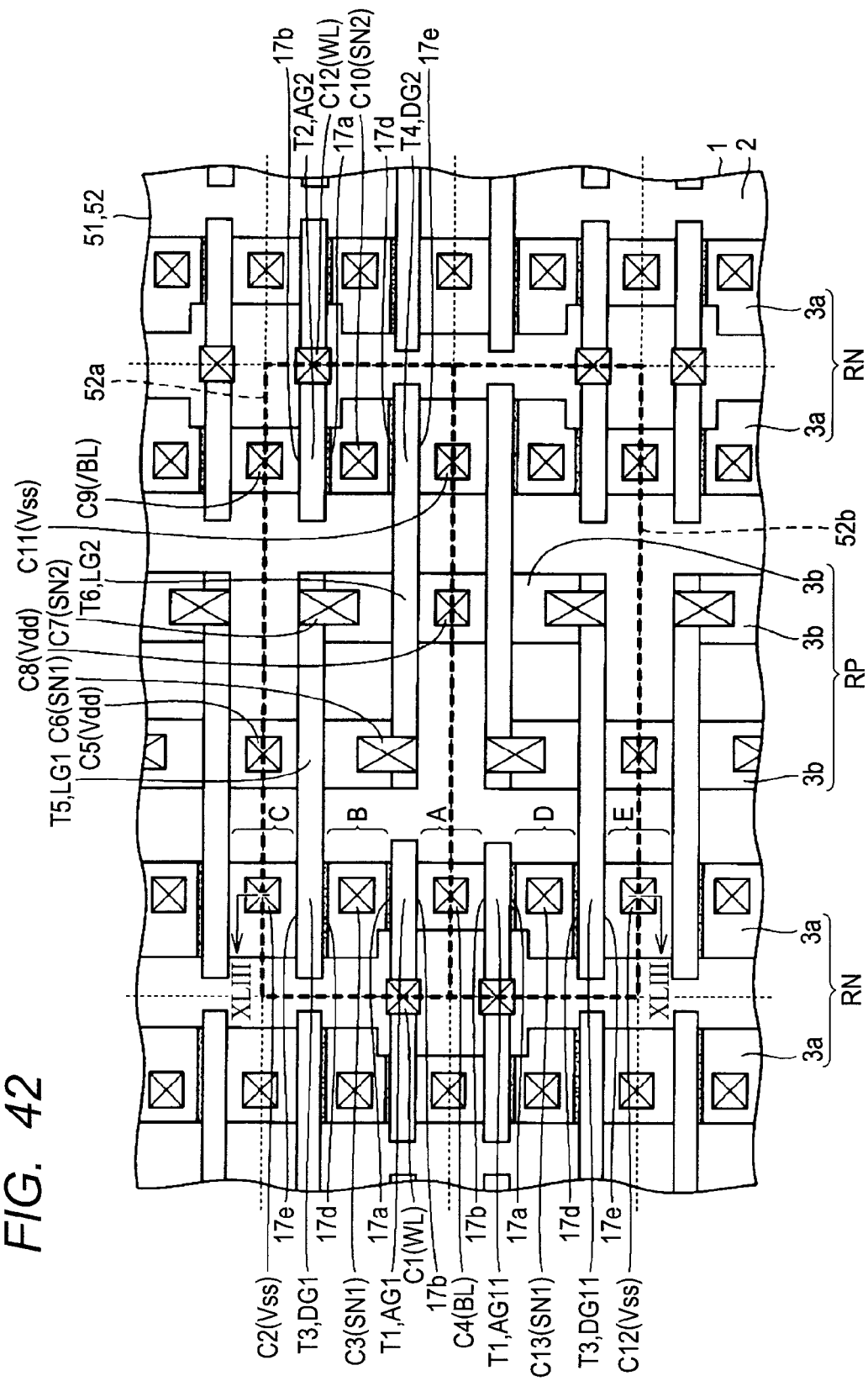
FIG. 42 is a plan view showing a layout pattern of the SRAM memory cells in Embodiment 2.
Figure 43:
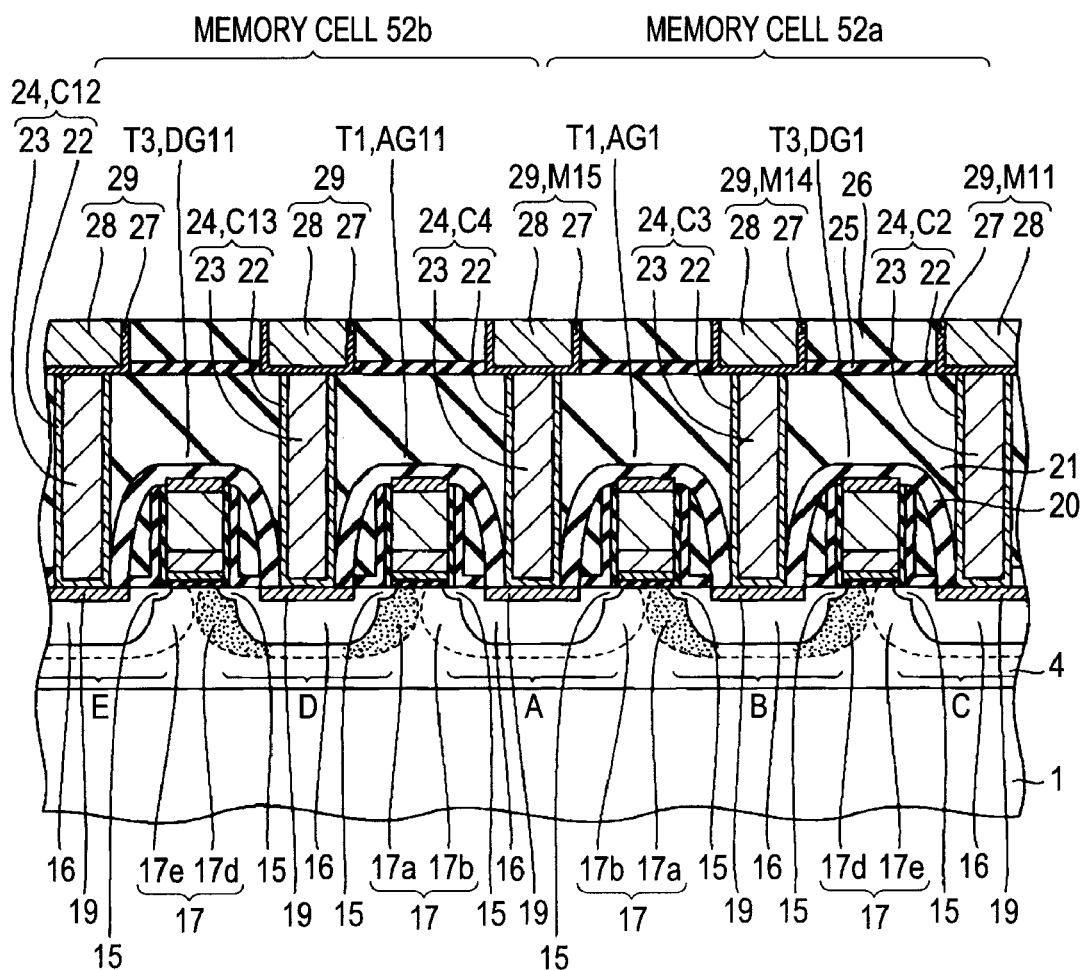
FIG. 43 is a cross-sectional view along the cross-sectional line XLIII-XLIII shown in FIG. 42 in Embodiment 2.

Next, a description will be given of a structure of the SRAM memory cell. As shown in FIGS. 42 and 43, in the portion (area A located between the access gate electrodes AG1 and AG11) of each of the element formation regions 3a located on the opposite side of the drive gate electrode DG1 relative to the access gate electrode AG1, there are formed the halo regions 17b, the extension regions 15, the source or drain region 16, and the metal silicide film 19.

In the portion (area B) of the element formation region 3a located between the access gate electrode AG1 and the drive gate electrode DG1, there are formed the halo region 17a, the halo region 17d, the extension regions 15, the source or drain region 16, and the metal silicide film 19.

In the portion (area C) of the element formation region 3a located on the opposite side of the access gate electrode AG1 relative to the drive gate electrode DG1, there are formed the halo region 17e, the extension region 15, the source or drain region 16, and the metal silicide film 19. In the portion (area D) of the element formation region 3a located between the access gate electrode AG11 and the drive gate electrode DG11, there are formed the halo region 17a, the halo region 17d, the extension regions 15, the source or drain region 16, and the metal silicide film 19. In the portion (area E) of the element formation region 3a located on the opposite side of the access gate electrode AG11 relative to the drive gate electrode DG11, there are formed the halo region 17e, the extension region 15, the source or drain region 16, and the metal silicide film 19. The halo regions 17a and 17b are formed so as to reach respective areas immediately under the access gate electrodes AG1 and AG11. The halo regions 17d and 17e are formed so as to reach respective areas immediately under the drive gate electrodes DG1 and DG11.

The pair of halo regions 17a and 17b of each of the access transistors T1 and T2 are formed so as to extend from areas immediately under the sidewall spacers 18, and reach areas immediately under the access gate electrode AG1. The impurity concentration of the halo region 17a is set higher than the impurity concentration of the halo region 17b.

The impurity concentration of the halo region 17d, which is one of the pair of halo regions 17d and 17e of each of the drive transistors T3 and T4, is set the same as the impurity concentration of the halo region 17a, which is the one of the pair of halo regions 17a and 17b having the higher impurity concentration. On the other hand, the impurity concentration of the halo region 17e is set the same as the impurity concentration of the halo region 17b, which is the one of the pair of halo regions 17a and 17b having the lower impurity concentration.

Note that the structure is otherwise the same as that of the semiconductor device described above, and therefore the same members are designated by the same reference numerals and the description thereof will not be repeated. In FIG. 43, a structure up to the copper wires 29 corresponding to first metal wires is shown. To a wiring structure in layers over that of the copper wires 29, the same structure as the wiring structure shown in FIGS. 6 to 8 is applied.

Next, a description will be given of a method of manufacturing the semiconductor device described above. First, through the same step as the step shown in FIG. 4, over the surface of the semiconductor substrate 1, the gate structure G serving as the access gate electrode (AG1) and the gate structure G serving as the drive gate electrode (DG1) are formed with the interface layer 6 interposed therebetween (see FIG. 4).

Figure 44:
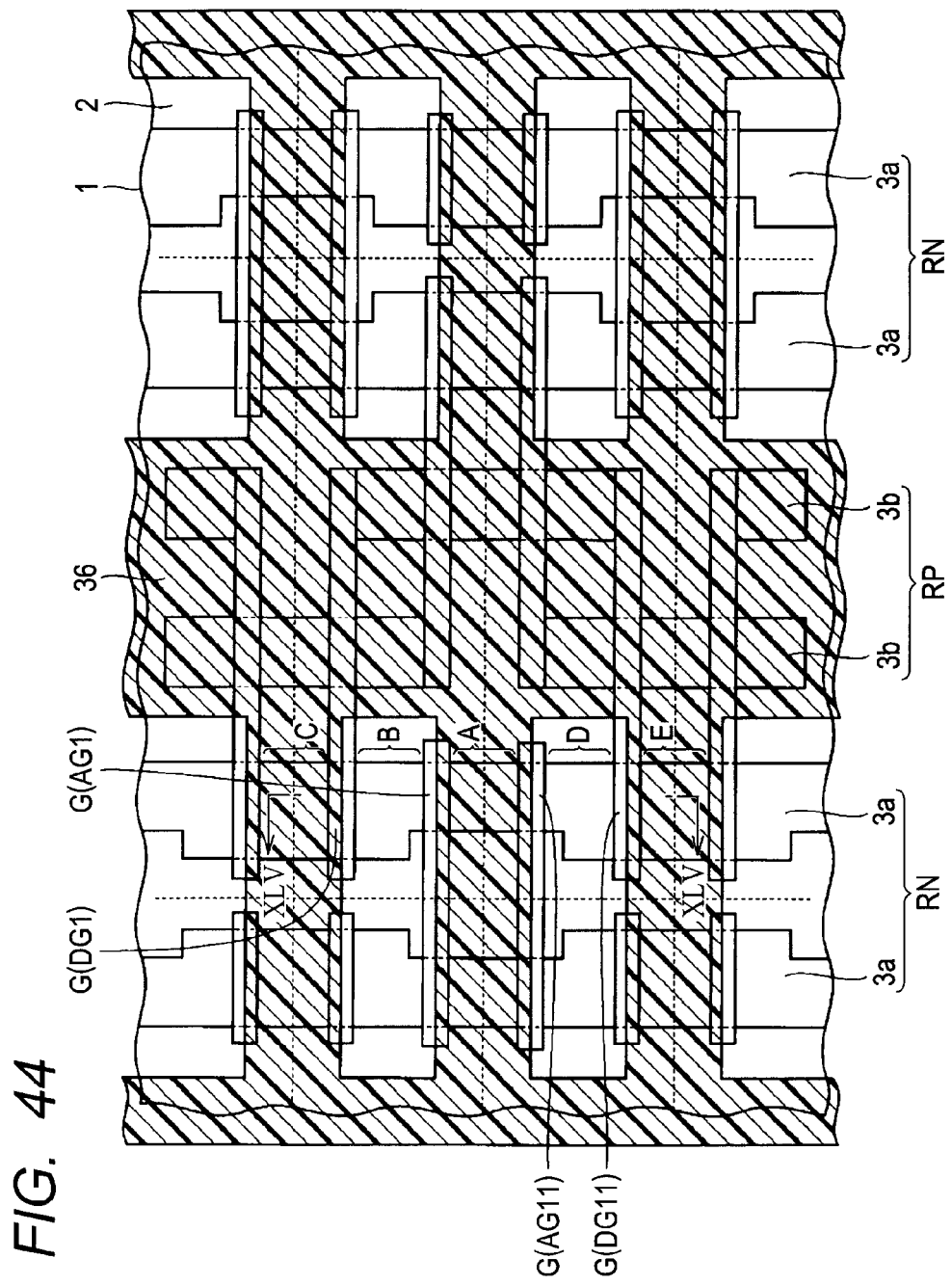
FIG. 44 is a plan view showing a step of a method of manufacturing the semiconductor device in Embodiment 2.
Figure 45:
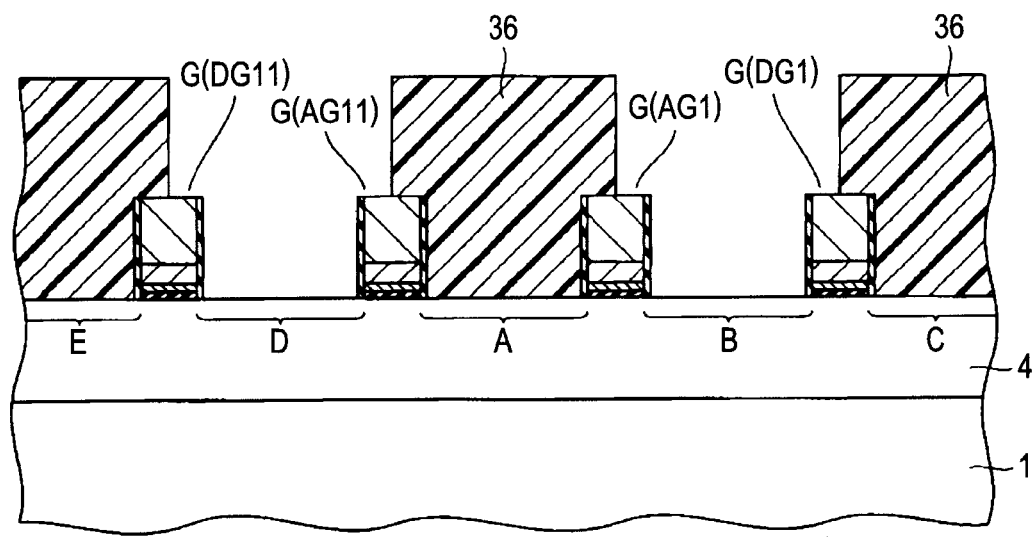
FIG. 45 is a cross-sectional view along the cross-sectional line XLV-XLV shown in FIG. 44 in Embodiment 2.

Next, as shown in FIGS. 44 and 45, a predetermined photographic process is performed to form a resist mask 36 serving as an implantation mask (implantation mask A) for forming halo regions. The resist mask 36 is formed into a pattern covering the portion (area A) of each of the element formation regions 3a located on the opposite side of the gate structure G serving as the drive gate electrode DG1 relative to the gate structure G serving as the access gate electrode AG1, exposing the portion (area B) of the element formation region 3a located between the gate structure G serving as the access gate electrode AG1 and the gate structure G serving as the drive gate electrode DG1 through one opening, and covering the portion (area C) of the element formation region 3a located on the opposite side of the gate structure G serving as the access gate electrode AG1 relative to the gate structure G serving as the drive gate electrode DG1.

That is, the individual openings of the resist mask 36 continuously expose areas extending from one side surfaces of the gate structures serving as the access gate electrodes of the individual SRAM memory cells to one side surfaces of the gate structures serving as the drive gate electrodes. The resist mask 36 covers the other side surfaces of the gate structures serving as the access gate electrodes opposite to the one side surfaces thereof and the portions (areas coupled to the bit lines) of the element formation regions adjacent to the other side surfaces, also covers the other side surfaces of the gate structures serving as the drive gate electrodes opposite to the one side surfaces thereof and the portions (areas coupled to the ground lines) of the element formation regions adjacent to the other side surfaces, and further covers the PMIS region RP.

Figure 46:
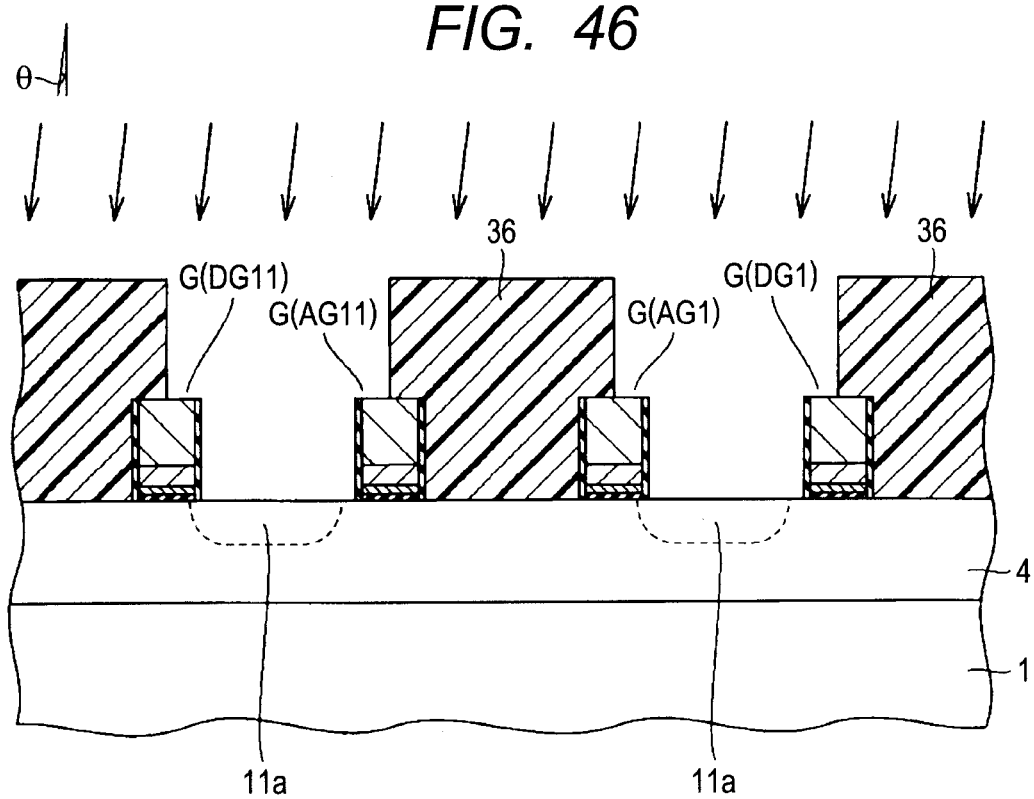
FIG. 46 is a cross-sectional view showing a step performed after the step shown in FIG. 45 in Embodiment 2.
Figure 47:
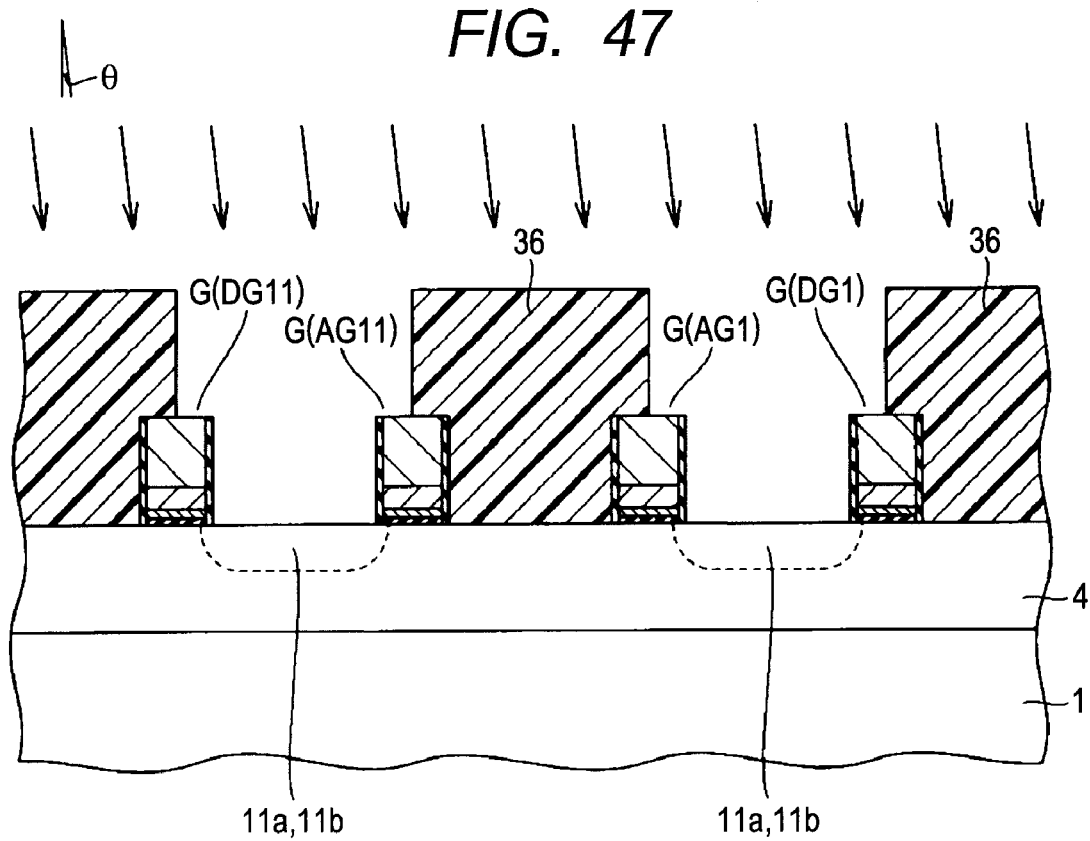
FIG. 47 is a cross-sectional view showing a step performed after the step shown in FIG. 46 in Embodiment 2.

Next, as shown in FIG. 46, using the resist mask 36 as an implantation mask, boron, for example, is implanted obliquely ($\theta$=about 7°) to a direction perpendicular to the main surface of the semiconductor substrate 1 from one side in a direction generally orthogonal to the extending directions of the gate structures G, thereby forming the p-type impurity regions 11a in the exposed p-well 4 in the areas B and D. Then, as shown in FIG. 47, using the same resist mask 36 as an implantation mask, boron is implanted obliquely ($\theta$=about 7°) to a direction perpendicular to the main surface of the semiconductor substrate 1 from the other side opposite to the one side in a direction generally orthogonal to the extending directions of the gate structures G, thereby forming the p-type impurity regions 11b in the exposed p-well 4 in the areas B and D (halo implantation A). Thereafter, the resist mask 36 is removed. Note that, in each of the implantation in the step shown in FIG. 46 and the implantation in the step shown in FIG. 47, boron is implanted at the same implantation dose and with the same implantation energy.

Figure 48:
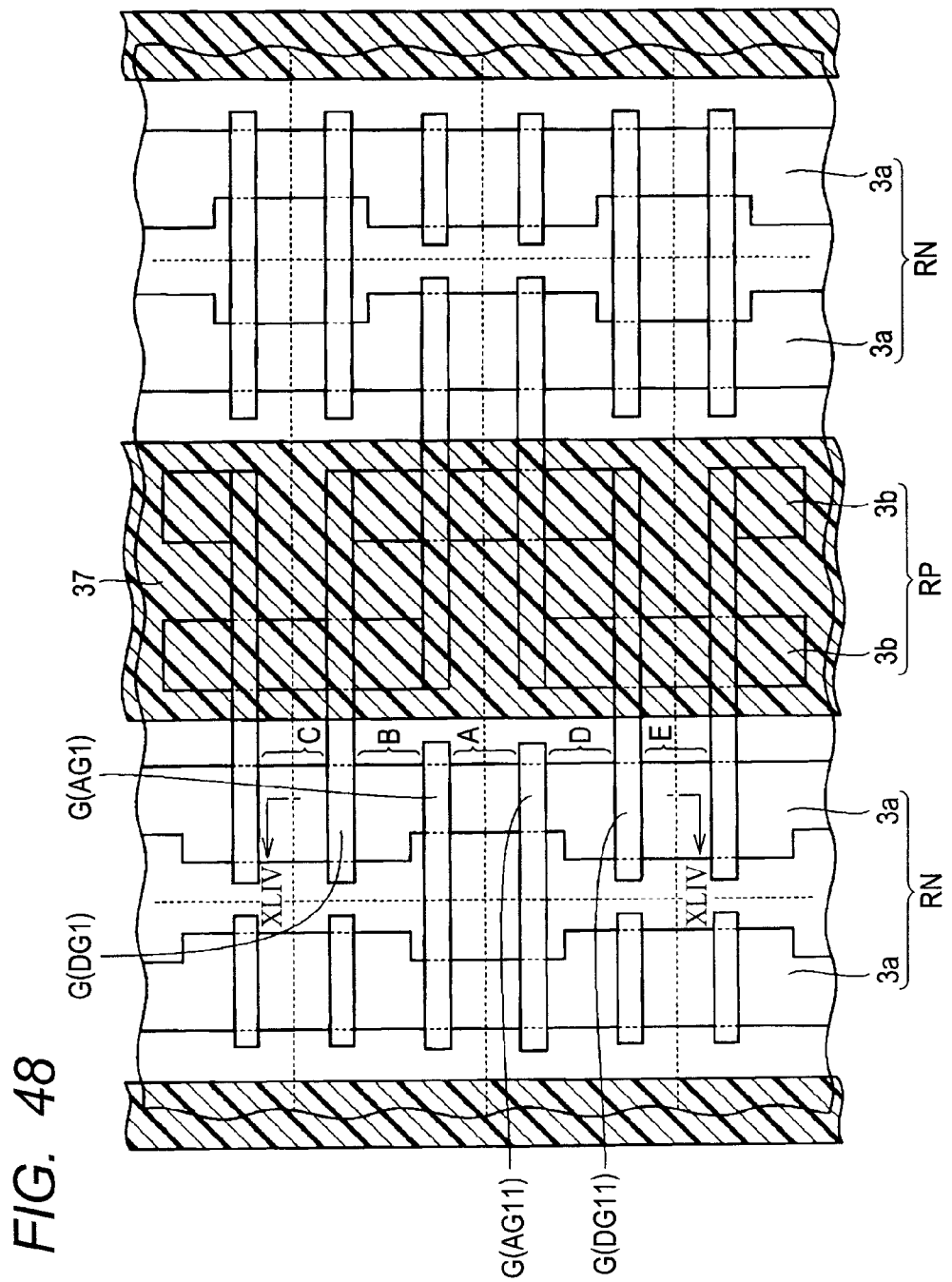
FIG. 48 is a plan view showing a step performed after the step shown in FIG. 47 in Embodiment 2.

Next, as shown in FIG. 48, a predetermined photographic process is performed to form a resist mask 37 serving as an implantation mask (implantation mask B) for forming halo regions. The resist mask 37 is formed into a pattern exposing the NMIS regions NP including the areas A to E, and covering the PMIS region RP.

Figure 49:
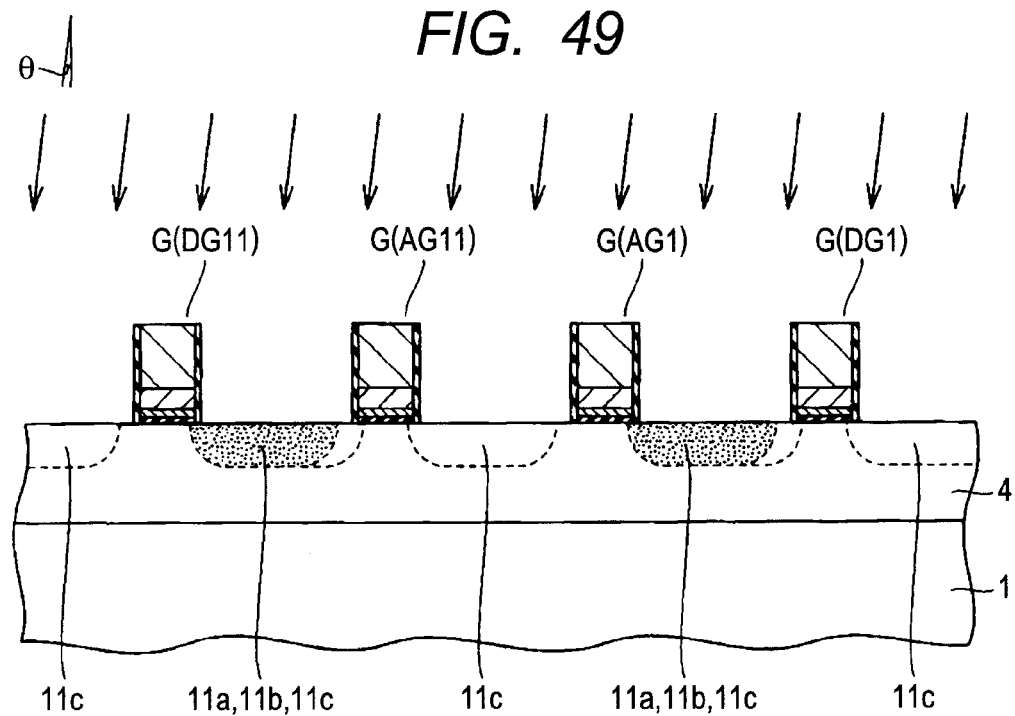
FIG. 49 is a cross-sectional view showing a step performed after the step shown in FIG. 48 in Embodiment 2, which is a cross-sectional view along a cross-sectional line corresponding to the cross-sectional line XLIX-XLIX shown in FIG. 48.

Next, as shown in FIG. 49, using the resist mask 37 (see FIG. 48) as an implantation mask, boron, for example, is implanted obliquely ($\theta$=about 7°) to a direction perpendicular to the main surface of the semiconductor substrate 1 from one side in a direction generally orthogonal to the extending directions of the gate structures G, thereby forming the p-type impurity regions 11c in the exposed p-well 4 in the areas A to E. Then, as shown in FIG. 50, using the same resist mask 37 as an implantation mask, boron is implanted obliquely ($\theta$=about 7°) to a direction perpendicular to the main surface of the semiconductor substrate 1 from the other side opposite to the one side in a direction generally orthogonal to the extending directions of the gate structures G, thereby forming the p-type impurity regions 11d in the exposed p-well 4 in the areas A to E (halo implantation B).

Figure 50:
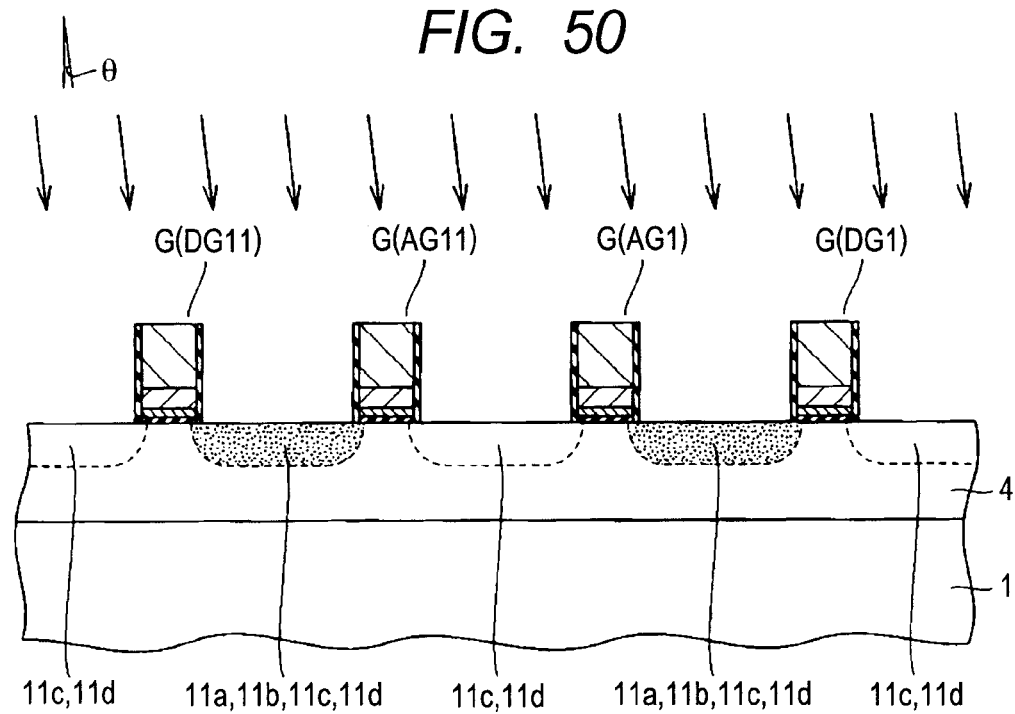
FIG. 50 is a cross-sectional view showing a step performed after the step shown in FIG. 49 in Embodiment 2.

Note that, in each of the implantation in the step shown in FIG. 49 and the implantation in the step shown in FIG. 50, boron is implanted at the same implantation dose and with the same implantation energy. The implantation doses in the steps shown in FIGS. 46 and 47 and the implantation doses in the steps shown in FIGS. 49 and 50 may be set the same or different from each other. Also, the implantation energies in the steps shown in FIGS. 46 and 47 and the implantation energies in the steps shown in FIGS. 49 and 50 may be set the same or different from each other.

Figure 51:
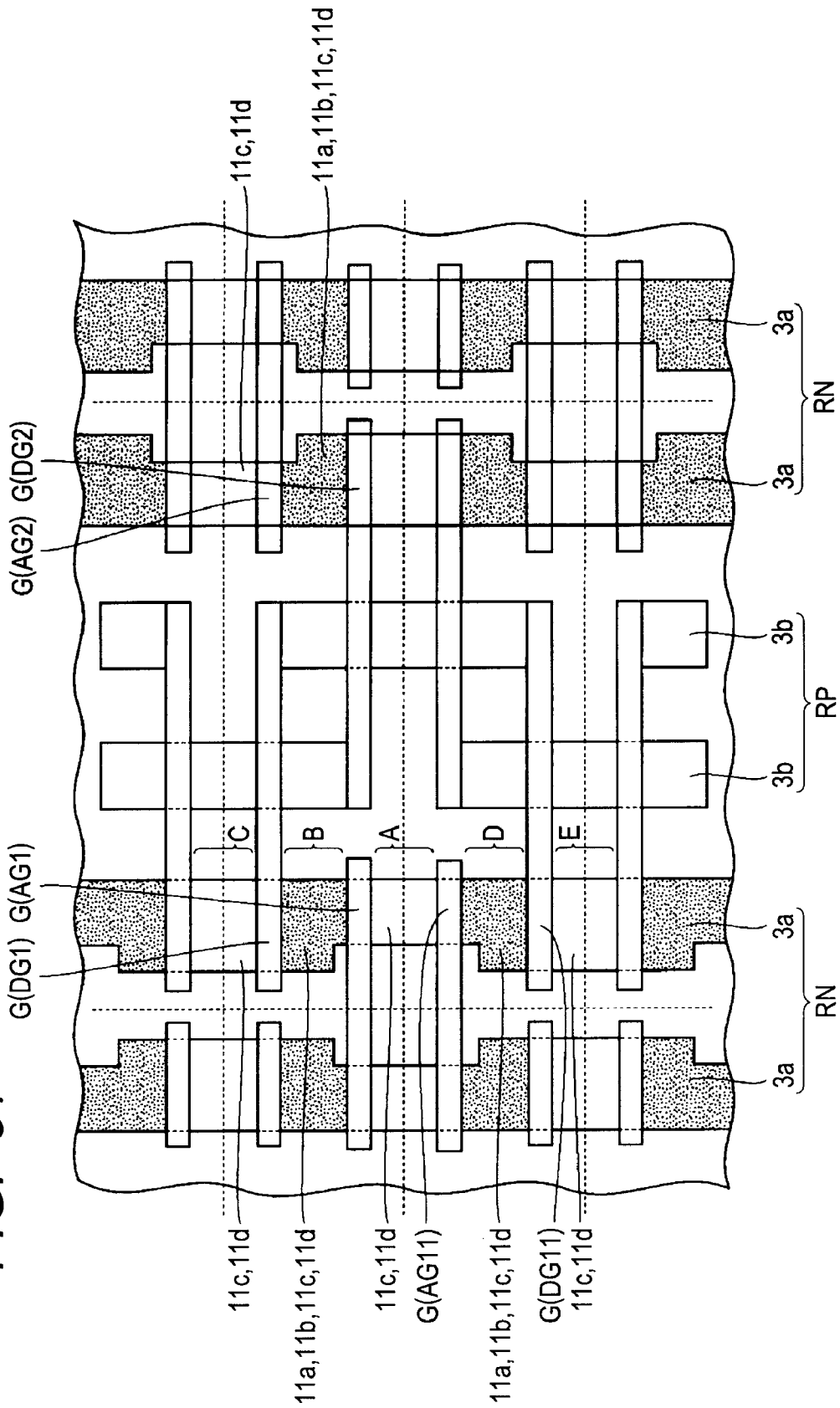
FIG. 51 is a plan view showing the implantation of boron at a time when the step shown in FIG. 50 is ended in Embodiment 2.

In this manner, as shown in FIG. 51, the p-type impurity regions 11c and 11d are formed in the areas A, C, and E, while the p-type impurity regions 11a, 11b, 11c, and 11d are formed in the areas B and D. Respective parts of the p-type impurity regions 11a, 11b, 11c, and 11d serve as halo regions.

Next, in the same manner as in the step shown in FIG. 21, using the same resist mask 37 as an implantation mask, phosphorus or arsenic is implanted into the semiconductor substrate 1 from a direction perpendicular to the main surface of the semiconductor substrate 1, thereby forming extension regions (not shown) each extending from the exposed surface of the p-well 4 to a predetermined depth (extension implantation). Thereafter, the resist mask 37 is removed.

Next, in the same manner as in the step shown in FIG. 22, a resist mask (implantation mask C not shown) covering the NMIS regions RN, and exposing the PMIS region RP is formed. Then, using the resist mask as an implantation mask, phosphorus or arsenic is implanted into the semiconductor substrate 1, thereby forming halo regions (not shown) in the element formation regions 3b. Then, boron is implanted into the semiconductor substrate 1, thereby forming extension regions (not shown). Thereafter, the resist mask is removed.

Next, through the same step as the step shown in FIG. 23, sidewall spacers (not shown) are formed over the both side surfaces of the gate structures G. Then, through the same steps as the steps shown in FIGS. 24 and 25, source or drain regions (not shown) are each formed to extend from the exposed surface of the p-well 4 to a predetermined depth. Then, through the same step as the step shown in FIG. 26, source or drain regions (not shown) are formed to extend from the exposed surfaces of the element formation regions 3b to a predetermined depth.

Next, through the same step as the step shown in FIG. 27, the source or drain regions 16, the extension regions 15, and the halo regions 17a and 17b are activated. Then, through the same step as the step shown in FIG. 28, the metal silicide films 19 comprised of, e.g., nickel silicide or the like are formed in the exposed surfaces of the polysilicon films of the source or drain regions 16, the access gate electrode AG1, and the drive gate electrode DG1.

Then, through the same step as the step shown in FIG. 29, the stress liner film 20 is formed so as to cover the access gate electrode AG1 and the drive gate electrode DG1. Further, the interlayer insulating film 21 comprised of TEOS or the like is formed so as to cover the stress liner film 20. Then, through the same step as the step shown in FIG. 30, the plugs 24 each including the barrier metal film 22 and the tungsten film 23 are formed. Then, as shown in FIG. 43, in the trenches 26a of the interlayer insulating film 26, the copper wires 29 each including the barrier metal film 27 and the copper film 28 and serving as the first metal wires are formed.

Thereafter, over the copper wires 29, the second metal wires M21 to M27 (see FIG. 7) are formed to be electrically coupled to the respective copper wires 29 via the vias V11 to V18. Further, via the vias V21 to V24, the third metal wires M31 to M33 (see FIG. 8) are formed to be electrically coupled to the respective second metal wires M21 to M27. In this manner, the main portions of the SRAM memory cells are formed.

In the semiconductor device described above, the asymmetric halo regions of the access transistors T1 and T2 and the halo regions of the drive transistors T3 and T4 are formed using the resist mask 36 (implantation mask A) and the resist mask 37 (implantation mask B) as the implantation masks. On the other hand, the halo regions of the load transistors T5 and T6 are formed using the resist mask 33 (implantation mask C shown in FIG. 22) as the implantation mask. Therefore, in the same manner as in the semiconductor device described above, at least one of the photographic masks for patterning the resist masks can be reduced, unlike in the semiconductor device according to the comparative example in which at least four implantation masks are needed. As a result, it is possible to contribute to a reduction in production cost.

In the semiconductor device described above, the impurity concentrations of the pairs of halo regions 17d and 17e of the drive transistors T3 and T4 are set asymmetrically. That is, the impurity concentrations of the halo regions 17d, which are the ones of the pairs of halo regions 17 (17d and 17e) of the drive transistors T3 and T4 coupled to the storage nodes SN1 and SN2, are set higher than the impurity concentrations of the other halo regions 17e coupled to the ground potential to be the same as the impurity concentrations of the halo regions 17a of the access transistors T1 and T2. Specifically, the impurity concentration profiles in the depth direction (corresponding to the arrows F1 and F2 shown in FIG. 9) from the surface portions of the semiconductor substrate under the lower end portions of the side surfaces of the drive gate electrodes of the drive transistors T3 and T4 are the same as the impurity concentration profile of F1 shown in FIG. 10 in each of the halo regions 17d, and are the same as the impurity concentration profile of F2 shown in FIG. 10 in each of the halo regions 17e.

In the drive transistors T3 and T4, currents flow from the storage nodes SN1 and SN2 toward the ground potential side, and do not flow in the opposite direction. Therefore, by setting the impurity concentrations of the halo regions coupled to the storage nodes relatively high, it is possible to increase the operation speeds of the drive transistors. That is, as shown in FIGS. 31 and 32, by setting the impurity concentrations of the upstream halo regions (coupled to the storage nodes) in the flow relatively high, the threshold voltages of the drive transistors can be set low with respect to the same currents. This allows an increase in operation speed when data is read.

Variation in Embodiment 2

Figure 52:
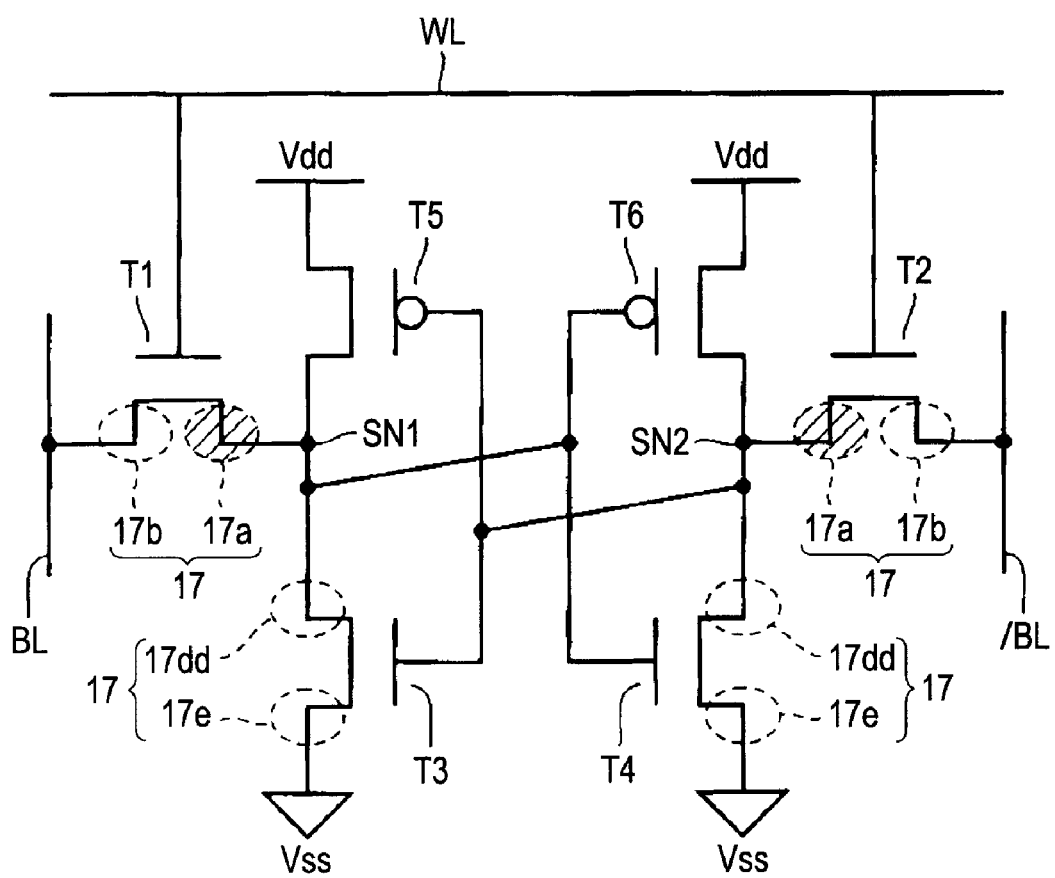
FIG. 52 is a view showing an equivalent circuit of a SRAM memory cell in a semiconductor device according to a variation of Embodiment 2.

In the semiconductor described above, the impurity concentrations of the halo regions 17a of the access transistors and the impurity concentrations of the halo regions 17d of the drive transistors are set at the same level. However, with regard to an operation of the SRAM, currents from the ground lines Vss to the storage nodes SN1 and SN2 do not flow in the drive transistors. Therefore, as shown in, e.g., FIG. 52, it is also possible that the impurity concentrations of halo regions 17dd closer to the S/D regions coupled to the storage nodes SN1 and SN2 may be set lower than the impurity concentrations of the halo regions 17a.

Figure 53:
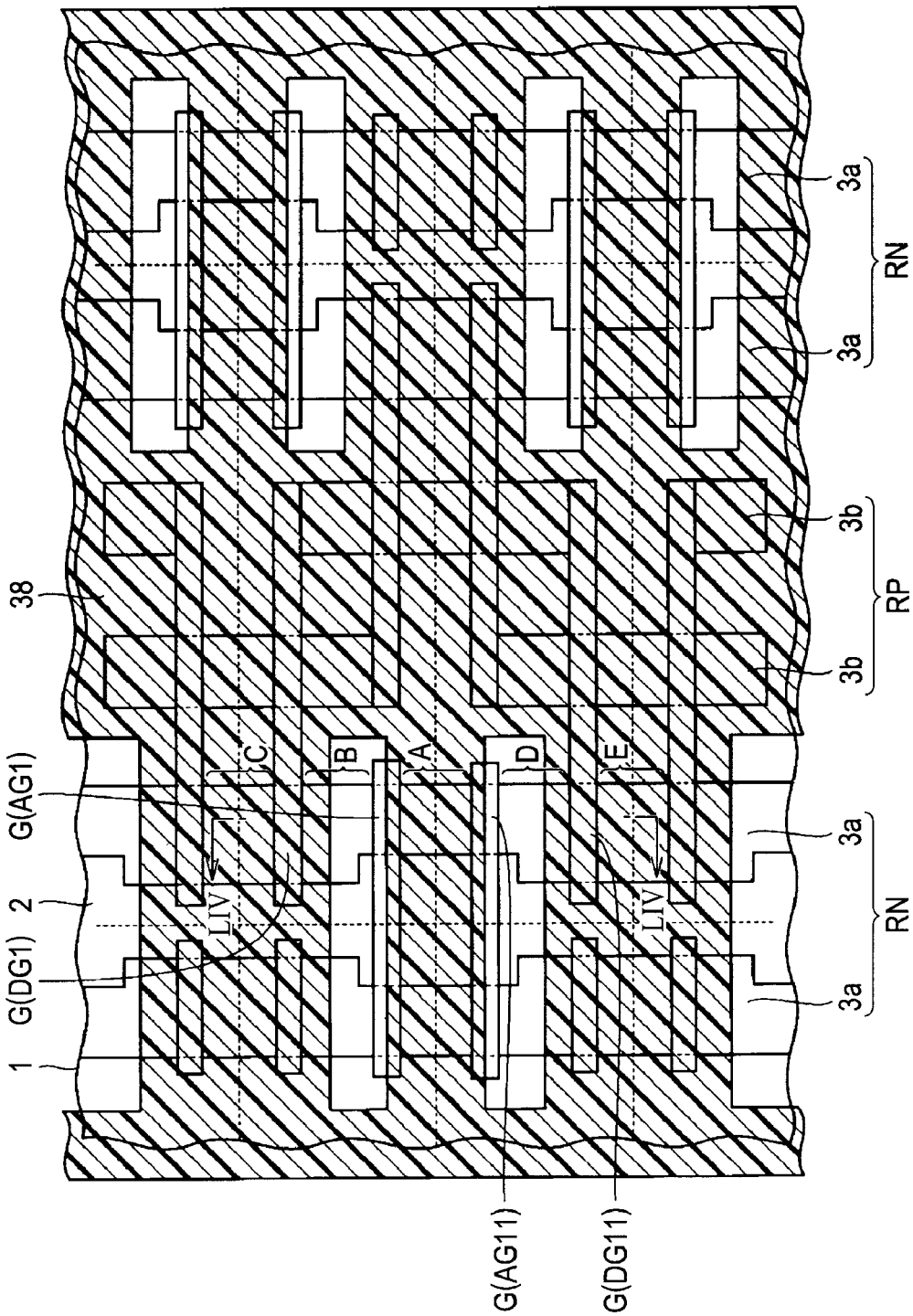
FIG. 53 is a plan view showing a mask pattern of the implantation mask A used in the manufacturing of the semiconductor device according to the variation in Embodiment 2.
Figure 54:
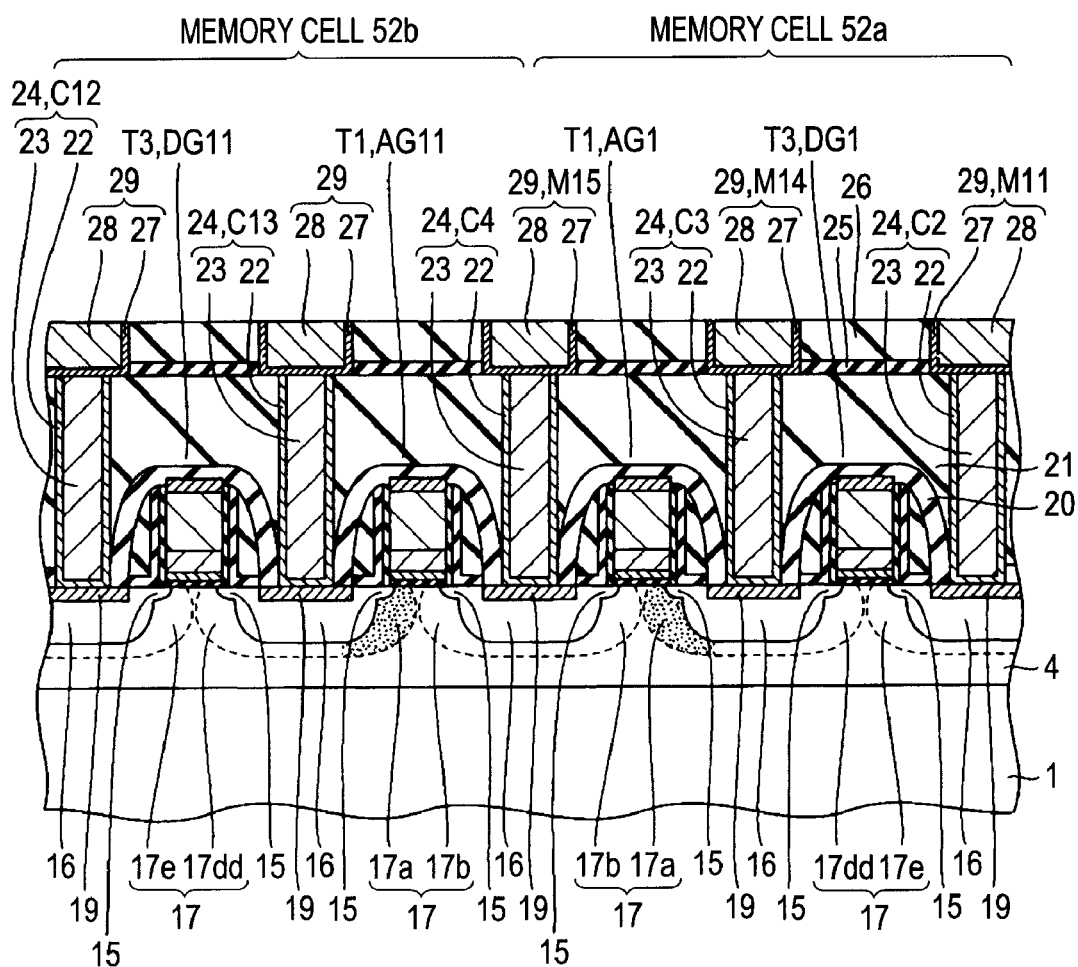
FIG. 54 is a cross-sectional view showing a structure of the semiconductor device according to the variation in Embodiment 2.

The resulting semiconductor device is formed by the same method as the method of manufacturing the semiconductor device of FIG. 41 described above except that, instead of the resist mask 36 shown in FIG. 44, the resist mask 38 shown in FIG. 53 is used. The resist mask 38 serving as the implantation mask A has an opening exposing a part of the area B extending from the side surface of the access gate electrode AG1 (gate structure) to a midpoint between the access gate electrode AG1 and the drive gate electrode DG1 (gate structure), and covers the entire area A, the remaining part of the area B, the entire area C, and the PMIS region RP. A cross-sectional structure along a cross-sectional line corresponding to the cross-sectional line XLVIII-XLVIII shown in FIG. 42 is as shown in FIG. 54. The semiconductor device according to a variation is different from the semiconductor device shown in FIG. 43 in that the impurity concentrations of the halo regions 17dd of each of the memory cells are the same as the impurity concentrations of the halo regions 17b and 17e.

Embodiment 3

Here, a description will be given of the case where, as an impurity implanted to form the halo regions of the nMIS transistors, carbon (C) is implanted in addition to the p-type impurity.

FIRST EXAMPLE

In a first example, the case will be described where, using the individual resist masks described in Embodiment 1, boron and carbon are implanted.

Figure 55:
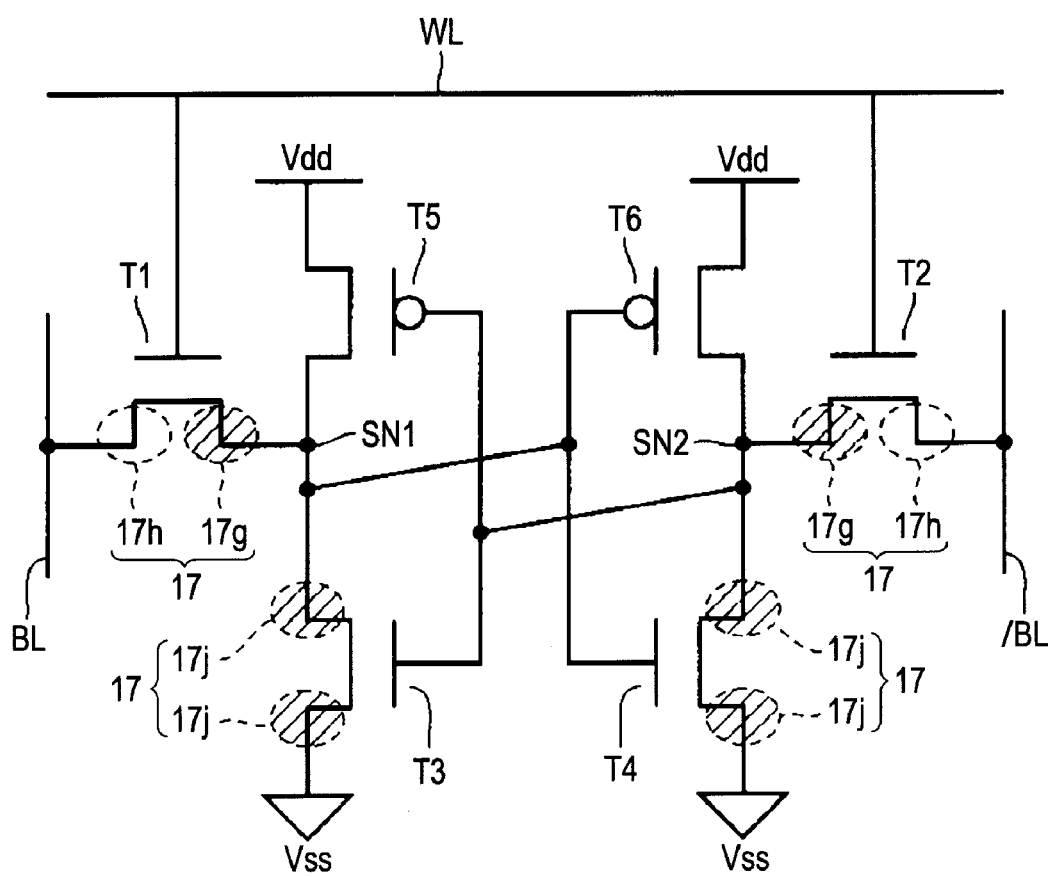
FIG. 55 is a view showing an equivalent circuit of a SRAM memory cell according to a first example in a semiconductor device according to Embodiment 3 of the present invention.

First, a description will be given of an equivalent circuit of a SRAM memory cell. As shown in FIG. 55, in the access transistors T1 and T2 in the semiconductor device according to the first example, the respective pairs of halo regions 17 formed therein include halo regions 17g coupled to the storage nodes SN1 and SN2 and halo regions 17h coupled to the bit lines BL and /BL, and the impurity concentrations of the halo regions 17g are set higher than the impurity concentrations of the halo regions 17h. In the drive transistors T3 and T4, the impurity concentrations of the respective pairs of halo regions 17 (17j) formed therein are set the same as the impurity concentrations of the halo regions 17g. Into the halo regions 17g and 17j among the halo regions 17g, 17h, and 17j, as an impurity, carbon is implanted in addition to boron. Note that the configuration is otherwise the same as the configuration of the equivalent circuit shown in FIG. 3, and therefore the same members are designated by the same reference numerals and the description thereof will not be repeated.

Figure 56:
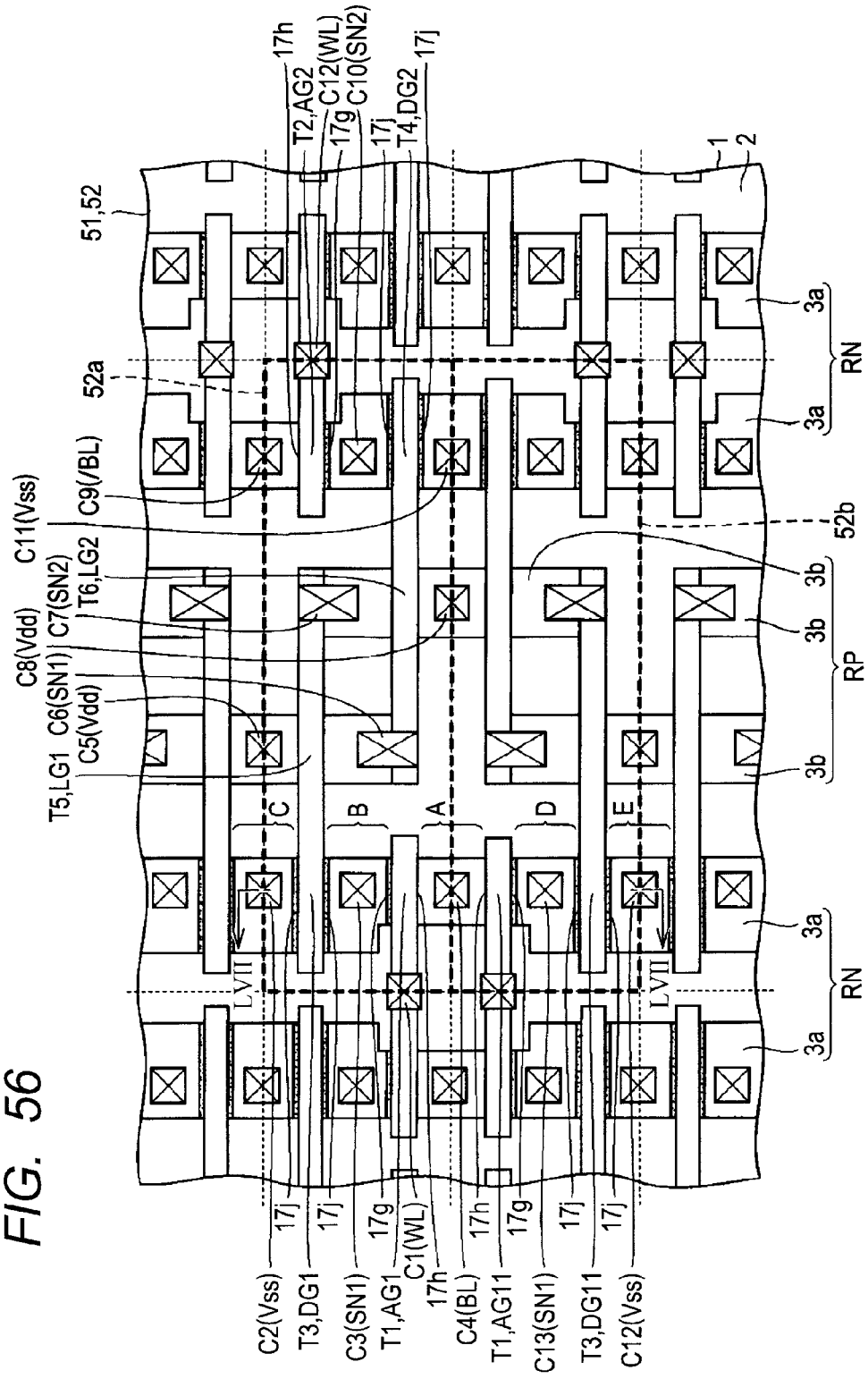
FIG. 56 is a plan view showing a layout pattern of the SRAM memory cells according to the first example in Embodiment 3.
Figure 57:
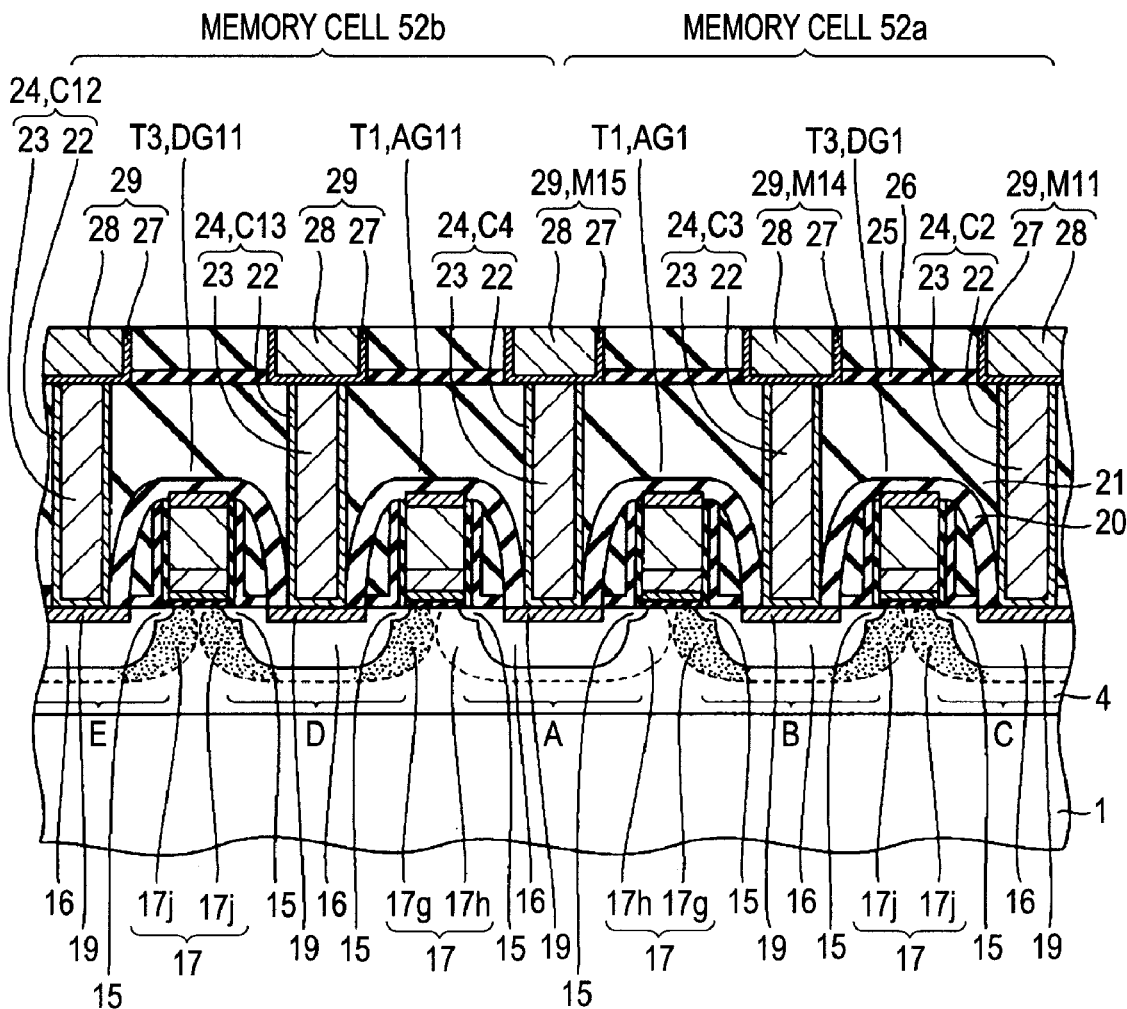
FIG. 57 is a cross-sectional view along the cross-sectional line LVII-LVII shown in FIG. 56 in Embodiment 3.

Next, a description will be given of a structure of the SRAM memory cell. As shown in FIGS. 56 and 57, in the SRAM memory cell, in the portion (area A) of each of the element formation regions 3a located on the opposite side of the drive gate electrode DG1 relative to the access gate electrode AG1, there are formed the halo regions 17h, the extension regions 15, the source or drain region 16, and the metal silicide film 19.

In the portion (area B) of the element formation region 3a located between the access gate electrode AG1 and the drive gate electrode DG1, there are formed the halo region 17g, the halo region 17j, the extension regions 15, the source or drain region 16, and the metal silicide film 19.

In the portion (area C) of the element formation region 3a located on the opposite side of the access gate electrode AG1 relative to the drive gate electrode DG1, there are formed the halo region 17j, the extension region 15, the source or drain region 16, and the metal silicide film 19.

Figure 58:
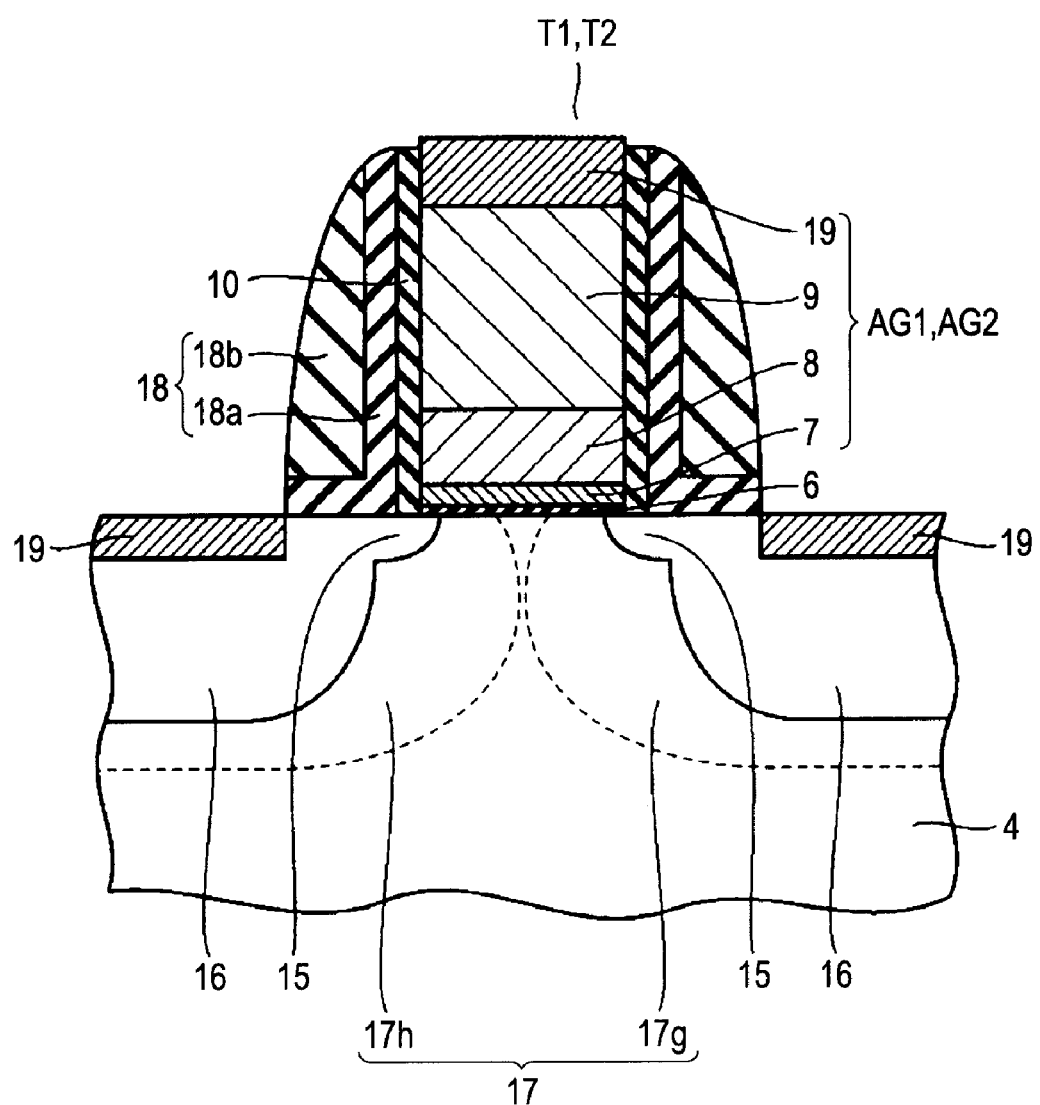
FIG. 58 is a partial enlarged cross-sectional view showing an access transistor in Embodiment 3.

As shown in FIG. 58, the pair of halo regions 17g and 17h are formed so as to extend from areas immediately under the sidewall spacers 18, and reach areas immediately under the access gate electrode AG1. In the halo region 17h, 17g, and 17j, carbon is implanted in addition to boron (p-type impurity). The impurity concentration of the halo region 17g is set higher than the impurity concentration of the halo region 17h. A peak (maximum value) impurity concentration is about $6 \times 10^{18}/cm^3$ in the halo region 17g, and is about $5 \times 10^{18}/cm^3$ in the halo region 17h.

Note that the structure is otherwise the same as the structure shown in each of FIGS. 4, 5, and 9, and therefore the same members are designated by the same reference numerals and the description thereof will not be repeated.

Figure 59:
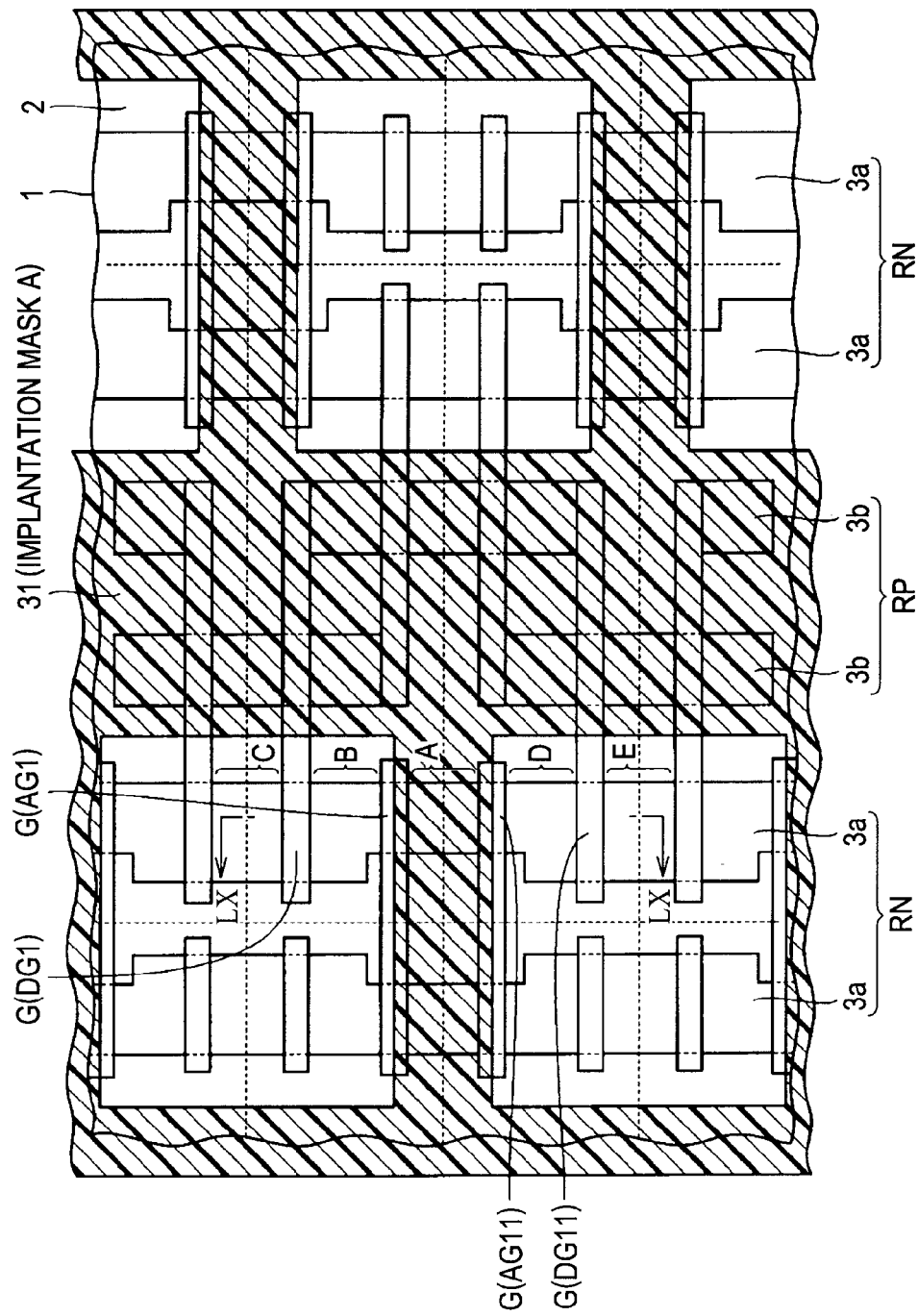
FIG. 59 is a plan view showing a step of a method of manufacturing the semiconductor device including the SRAM memory cells according to the first example in Embodiment 3.
Figure 60:
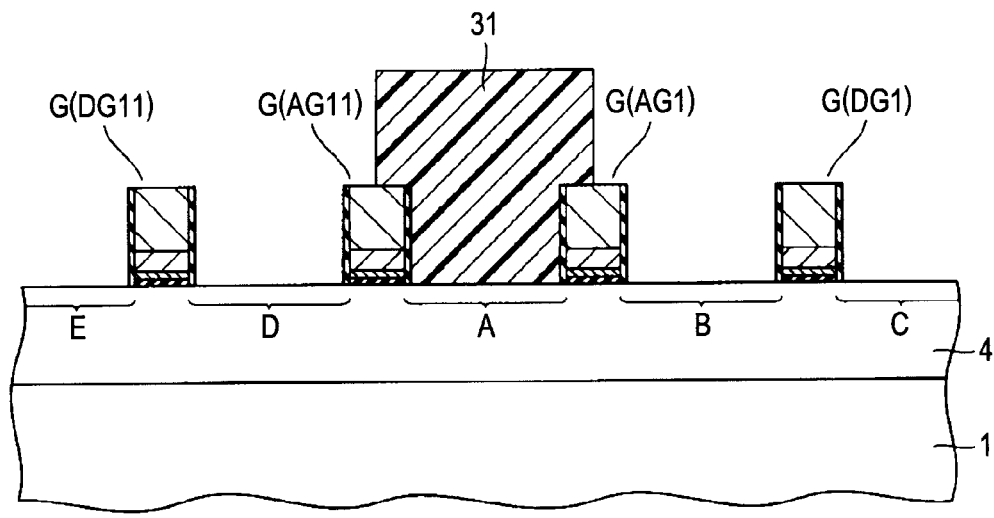
FIG. 60 is a cross-sectional view along the cross-sectional line LX-LX shown in FIG. 59 in Embodiment 3.

Next, a description will be given of a method of manufacturing the semiconductor device described above. After the same step as shown in FIG. 11 is performed, as shown in FIGS. 59 and 60, a predetermined photographic process is performed to form the resist mask 31 serving as an implantation mask (implantation mask A) for forming halo regions. The resist mask 31 is formed into a pattern covering the portion (area A) of each of the element formation regions 3a located on the opposite side of the gate structure G serving as the drive gate electrode DG1 relative to the gate structure G serving as the access gate electrode AG1, and exposing the portion (area B) of the element formation region 3a located between the gate structure G serving as the access gate electrode AG1 and the gate structure G serving as the drive gate electrode DG1 and the portion (area C) of the element formation region 3a located on the opposite side of the gate structure G serving as the access gate electrode AG1 relative to the gate structure G serving as the drive gate electrode DG1.

Figure 61:
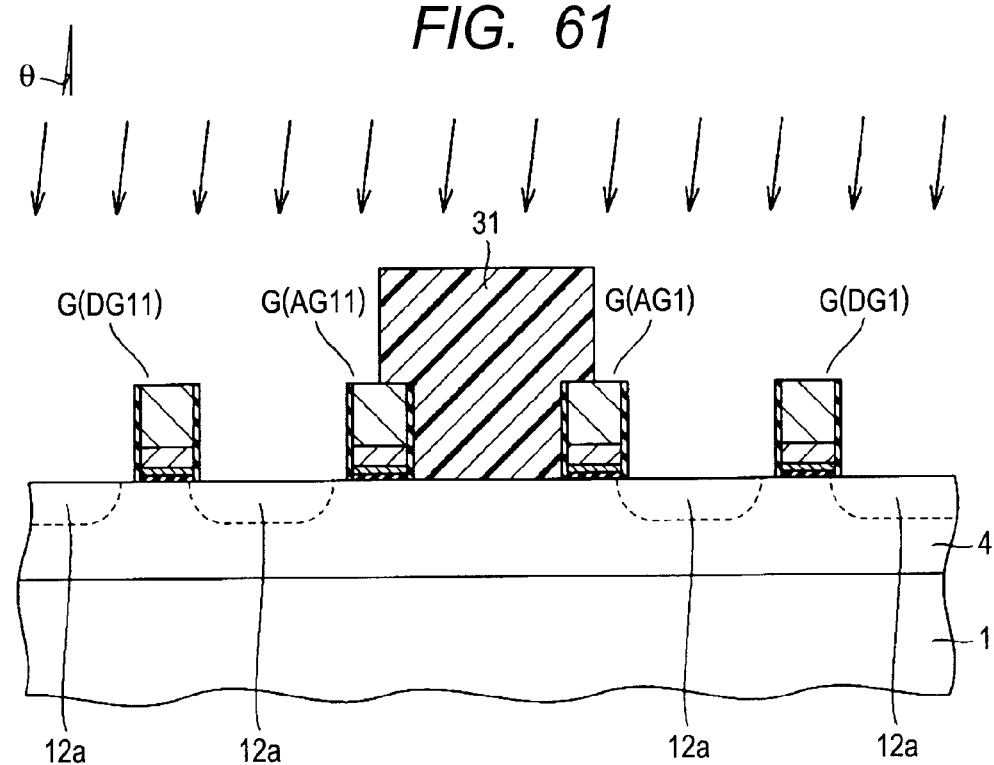
FIG. 61 is a cross-sectional view showing a step performed after the step shown in FIG. 60 in Embodiment 3.
Figure 62:
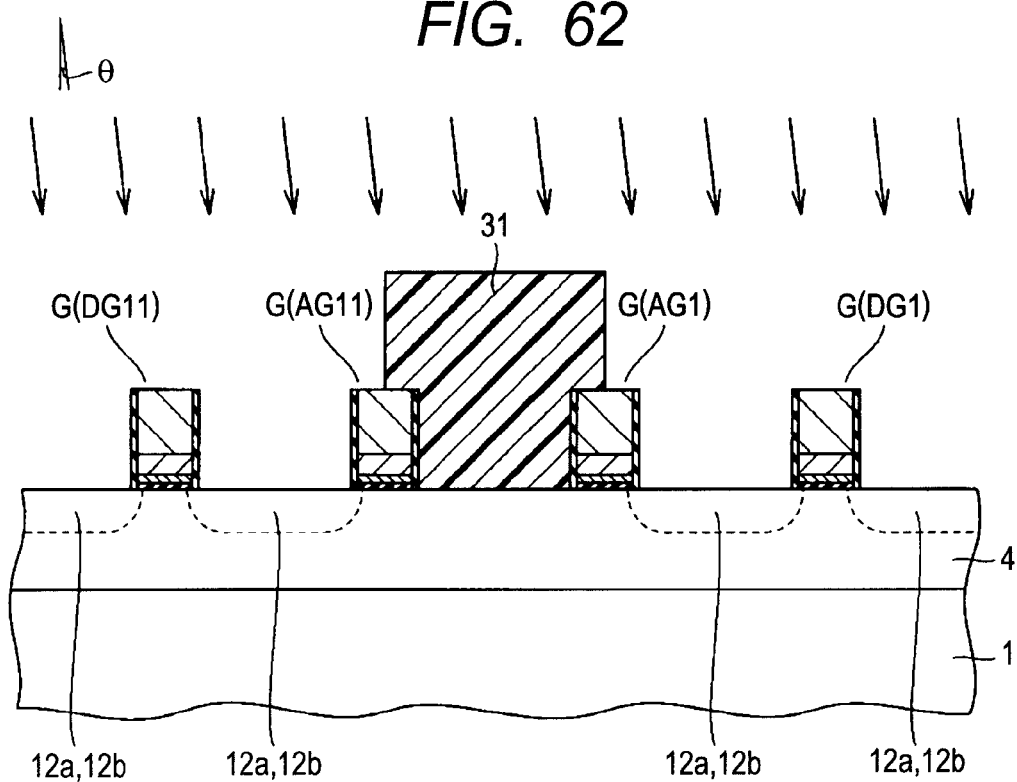
FIG. 62 is a cross-sectional view showing a step performed after the step shown in FIG. 61 in Embodiment 3.

Next, as shown in FIG. 61, using the resist mask 31 as an implantation mask, boron is implanted obliquely ($\theta$=about 7°) to a direction perpendicular to the main surface of the semiconductor substrate 1 from one side in a direction generally orthogonal to the extending directions of the gate structures G, and carbon is further implanted into the semiconductor substrate 1 from the same direction as in the case of implanting boron, thereby forming p-type impurity regions 12a in the exposed p-well 4 in the areas B and C. Then, as shown in FIG. 62, using the same resist mask 31 as an implantation mask, boron is implanted obliquely ($\theta$=about 7°) to a direction perpendicular to the main surface of the semiconductor substrate 1 from the other side opposite to the one side in a direction generally orthogonal to the extending directions of the gate structures G, and carbon is further implanted into the semiconductor substrate 1 from the same direction as in the case of implanting boron, thereby forming p-type impurity regions 12b in the exposed p-well 4 in the areas B and C (halo implantation A). Thereafter, the resist mask 31 is removed. Note that, in each of the implantation in the step shown in FIG. 61 and the implantation in the step shown in FIG. 62, boron is implanted at the same implantation dose and with the same implantation energy. As for carbon, it is also implanted at the same implantation dose and with the same implantation energy.

Figure 63:
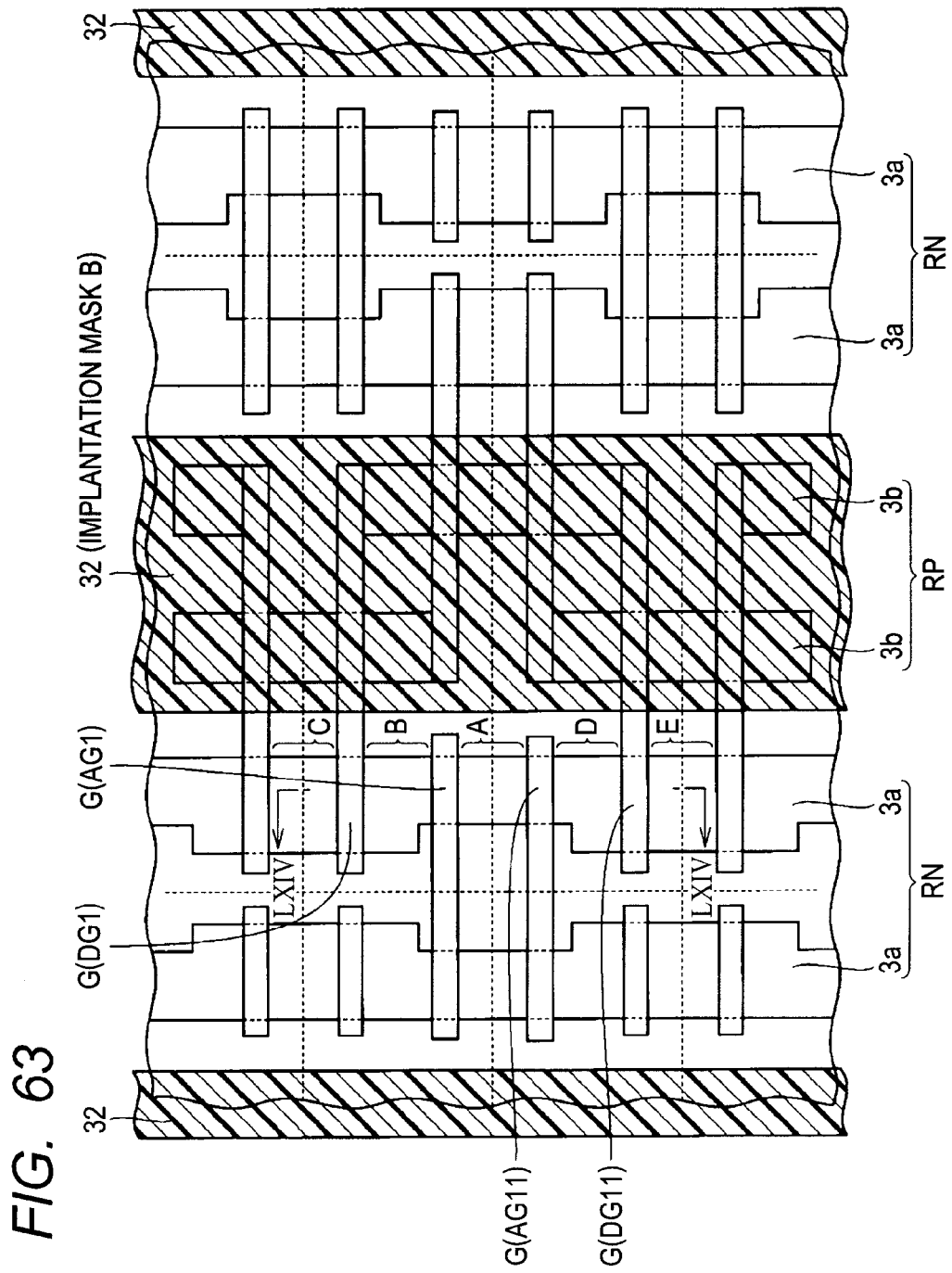
FIG. 63 is a plan view showing a step performed after the step shown in FIG. 62 in Embodiment 3.

Next, as shown in FIG. 63, a predetermined photographic process is performed to form a resist mask 32 serving as an implantation mask (implantation mask B) for forming halo regions. The resist mask 32 is formed into a pattern exposing the areas A, B, and C, and covering the PMIS region RP. That is, the resist mask 32 is formed so as to expose the NMIS regions RN, and cover the PMIS region RP.

Figure 64:
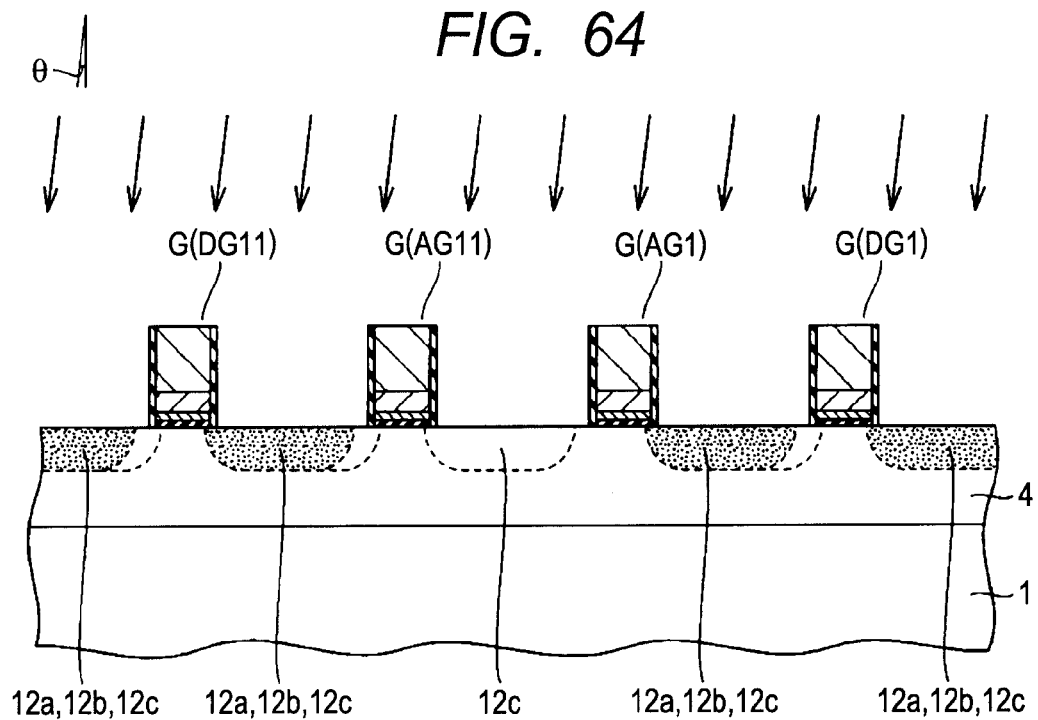
FIG. 64 is a cross-sectional view showing a step performed after the step shown in FIG. 63 in Embodiment 3, which is a cross-sectional view along a cross-sectional line corresponding to the cross-sectional line LXIV-LXIV shown in FIG. 63.
Figure 65:
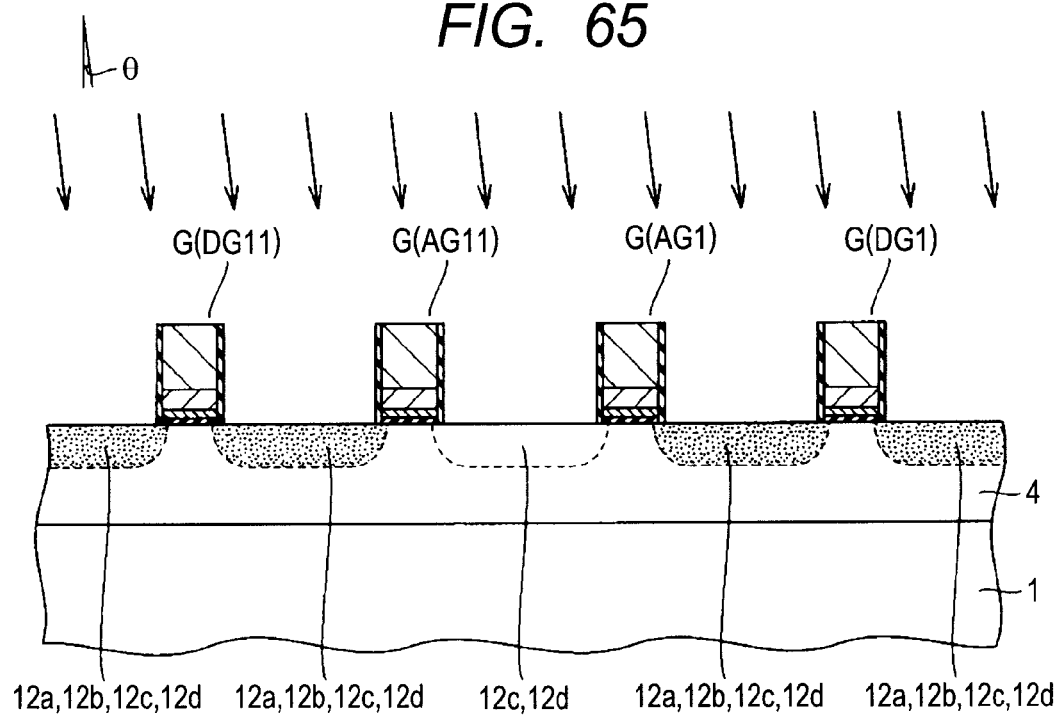
FIG. 65 is a cross-sectional view showing a step performed after the step shown in FIG. 64 in Embodiment 3.

Next, as shown in FIG. 64, using the resist mask 32 (see FIG. 63) as an implantation mask, boron is implanted obliquely ($\theta$=about 7°) to a direction perpendicular to the main surface of the semiconductor substrate 1 from one side in a direction generally orthogonal to the extending directions of the gate structures G, thereby forming p-type impurity regions 12c in the exposed p-well 4 in the areas A, B, and C. Then, as shown in FIG. 65, using the same resist mask 32 as an implantation mask, boron is implanted obliquely ($\theta$=about 7°) to a direction perpendicular to the main surface of the semiconductor substrate 1 from the other side opposite to the one side in a direction generally orthogonal to the extending directions of the gate structures G, thereby forming p-type impurity regions 12d in the exposed p-well 4 in the areas A, B, and C (halo implantation B). Respective parts of the p-type impurity regions 12a, 12b, 12c, and 12d thus formed, and respective parts of the p-type impurity regions 12c and 12d serve as halo regions.

Note that, in each of the implantation in the step shown in FIG. 18 and the implantation in the step shown in FIG. 19, boron is implanted at the same implantation dose and with the same implantation energy. As boron implantation doses, the implantation doses in the steps shown in FIGS. 14 and 15 and the implantation doses in the steps shown in FIGS. 18 and 19 may be set the same or different from each other. Also, as boron implantation energies, the implantation energies in the steps shown in FIGS. 14 and 15 and the implantation energies in the steps shown in FIGS. 18 and 19 may be set the same or different from each other.

Next, as in the same manner as in the step shown in FIG. 21, using the same resist mask 32 as an implantation mask, phosphorus or arsenic is implanted, thereby forming extension regions (not shown) each extending from the exposed surface of the p-well 4 to a predetermined depth (extension implantation). Thereafter, the resist mask 32 is removed.

Next, in the same manner as in the step shown in FIG. 22, a resist mask (implantation mask C not shown) covering the NMIS regions RN, and exposing the PMIS region RP is formed. Then, using the resist mask as an implantation mask, phosphorus or arsenic is implanted into the semiconductor substrate 1, thereby forming halo regions (not shown) in the element formation regions 3b. Then, boron is implanted into the semiconductor substrate 1, thereby forming extension regions (not shown). Thereafter, through the same steps as the steps shown in FIGS. 23 to 30, as shown in FIG. 57, the copper wires 29 corresponding to the first metal wires are formed. Subsequently, the same structure as the wiring structure shown in each of FIGS. 6 to 8 is further formed, whereby the main portions of the SRAM memory cells are formed.

In the semiconductor device described above, in addition to the effect of reducing the masks described in Embodiment 1, the following effects can be obtained. First, as the impurity concentrations of the impurity regions of the transistors such as the halo regions increase, threshold variations tend to be larger. In the semiconductor device described above, by implanting carbon into the impurity regions, the impurity concentrations of the impurity regions are reduced. This suppresses the threshold variations of the transistors, and allows more stable operations to be performed.

As the boron concentrations of the halo regions, the boron concentrations of the halo regions 17g are set higher than the boron concentrations of the halo regions 17h. However, it is also possible that the boron concentrations of the halo regions 17g and the boron concentrations of the halo regions 17h may be set the same. The mere presence of carbon in the halo regions 17g can allow an asymmetry property of the amounts of currents dependent on the flowing directions of the currents. Therefore, in the steps shown in FIGS. 61 and 62, it is possible to omit boron implantation.

As in the variation in Embodiment 1, as the implantation mask A, a resist mask having the same pattern as that of the resist mask 40 shown in FIG. 39 may also be used instead of the resist mask 31 shown in FIG. 59. In this case, in the halo regions 17j provided around the source or drain regions coupled to the storage nodes SN1 and SN2, carbon is not implanted, and the boron concentrations of the halo regions 17j are on the same order as that of the boron concentrations of the halo regions 17h.

SECOND EXAMPLE

Figure 66:
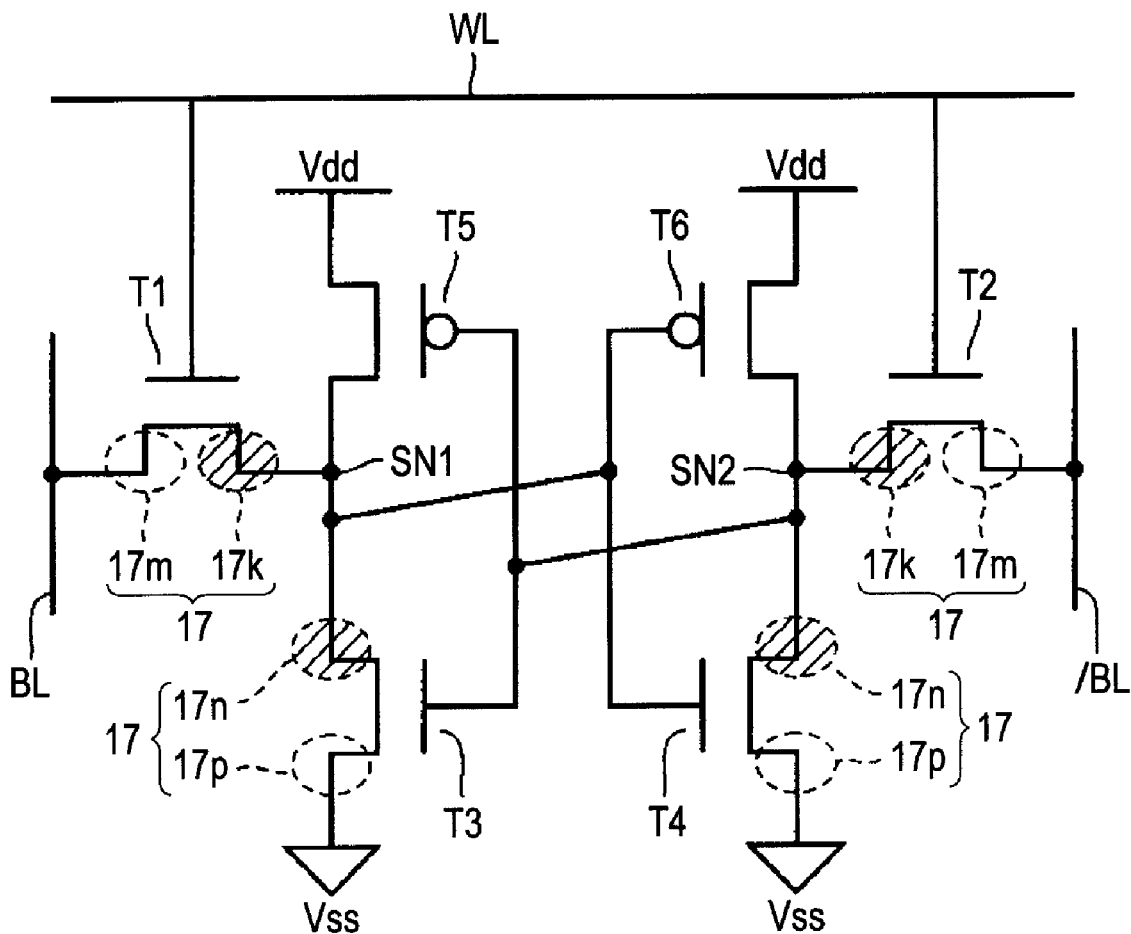
FIG. 66 is a view showing an equivalent circuit of a SRAM memory cell according to a second example in Embodiment 3.

In a second example, the case will be described where, using the individual resist masks described in Embodiment 2, boron (p-type impurity) and carbon are implanted. As shown in FIG. 66, in the access transistors T1 and T2 of the semiconductor device according to the second example, the respective pairs of halo regions 17 formed therein include halo regions 17k coupled to the storage nodes SN1 and SN2 and halo regions 17m coupled to the bit lines BL and /BL, and the impurity concentrations of the halo regions 17k are set higher than the impurity concentrations of the halo regions 17m. In the drive transistors T3 and T4, the respective pairs of halo regions 17 (17p and 17n) formed therein include halo regions 17n coupled to the storage nodes SN1 and SN2 and halo regions 17p coupled to the ground potential, and the impurity concentrations of the halo regions 17n are set higher than the impurity concentrations of the halo regions 17p. Into the halo regions 17k and 17n among the halo regions 17k, 17m, 17n, and 17p, carbon is implanted as an impurity in addition to boron.

Figure 67:
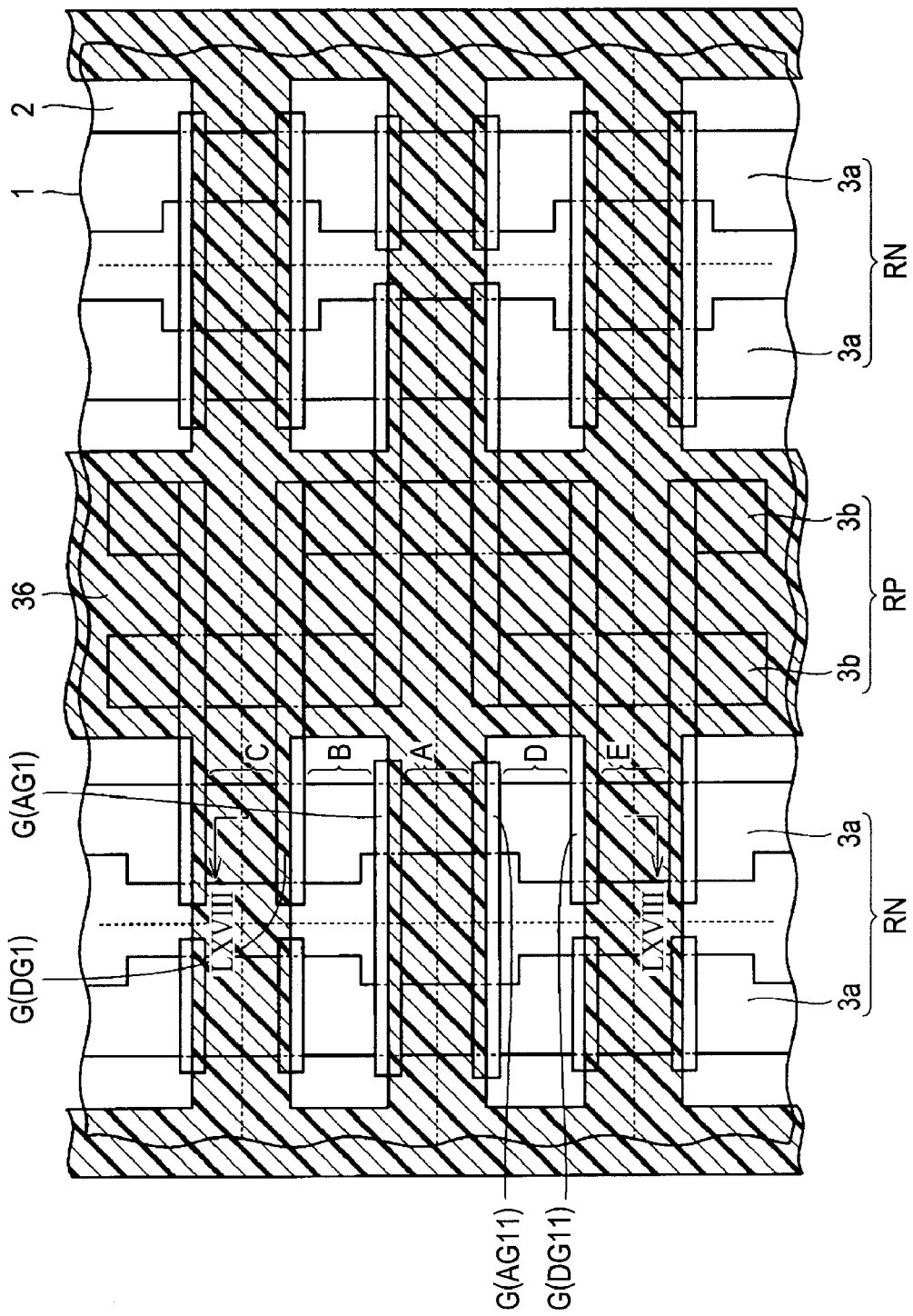
FIG. 67 is a plan view showing a step of a method of manufacturing the semiconductor device including the SRAM memory cells according to the second example in Embodiment 3.
Figure 68:
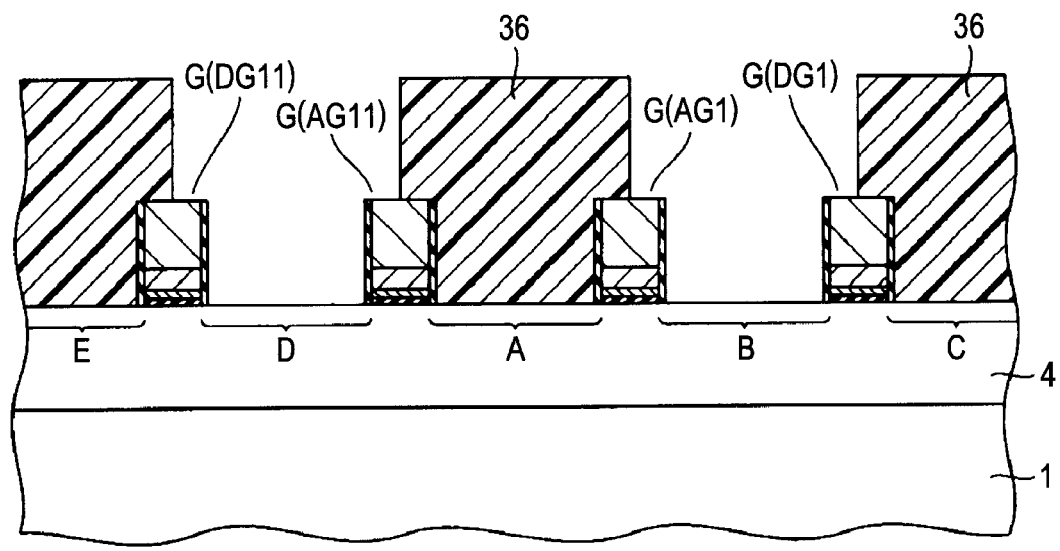
FIG. 68 is a cross-sectional view along the cross-sectional line LXVIII-LXVIII shown in FIG. 67 in Embodiment 3.

Next, a description will be given of a method of manufacturing the semiconductor device described above. After the same step as shown in FIG. 11 is performed, as shown in FIGS. 67 and 68, a predetermined photographic process is performed to form the resist mask 36 serving as an implantation mask (implantation mask A) for forming halo regions. The resist mask 36 is formed into a pattern covering the portion (area A) of each of the element formation regions 3a located on the opposite side of the gate structure G serving as the drive gate electrode DG1 relative to the gate structure G serving as the access gate electrode AG1, exposing the portion (area B) of the element formation region 3a located between the gate structure G serving as the access gate electrode AG1 and the gate structure G serving as the drive gate electrode DG1, and covering the portion (area C) of the element formation region 3a located on the opposite side of the gate structure G serving as the access gate electrode AG1 relative to the gate structure G serving as the drive gate electrode DG1.

Figure 69:
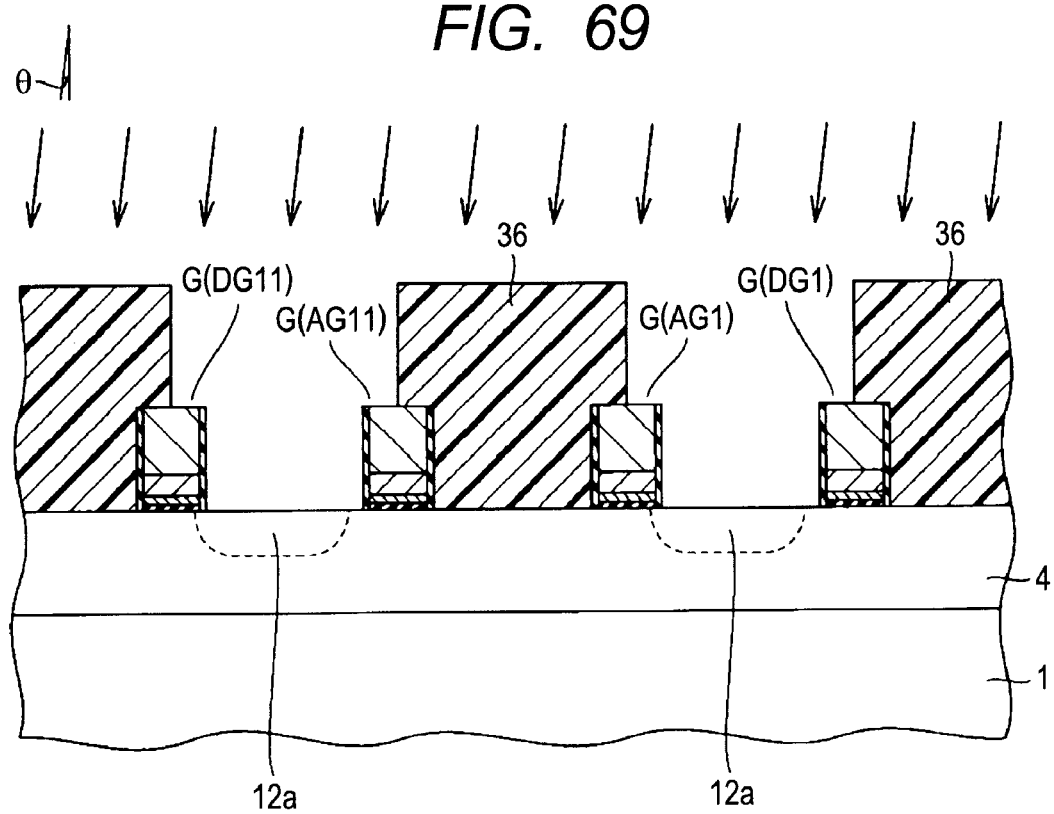
FIG. 69 is a cross-sectional view showing a step performed after the step shown in FIG. 68 in Embodiment 3.
Figure 70:
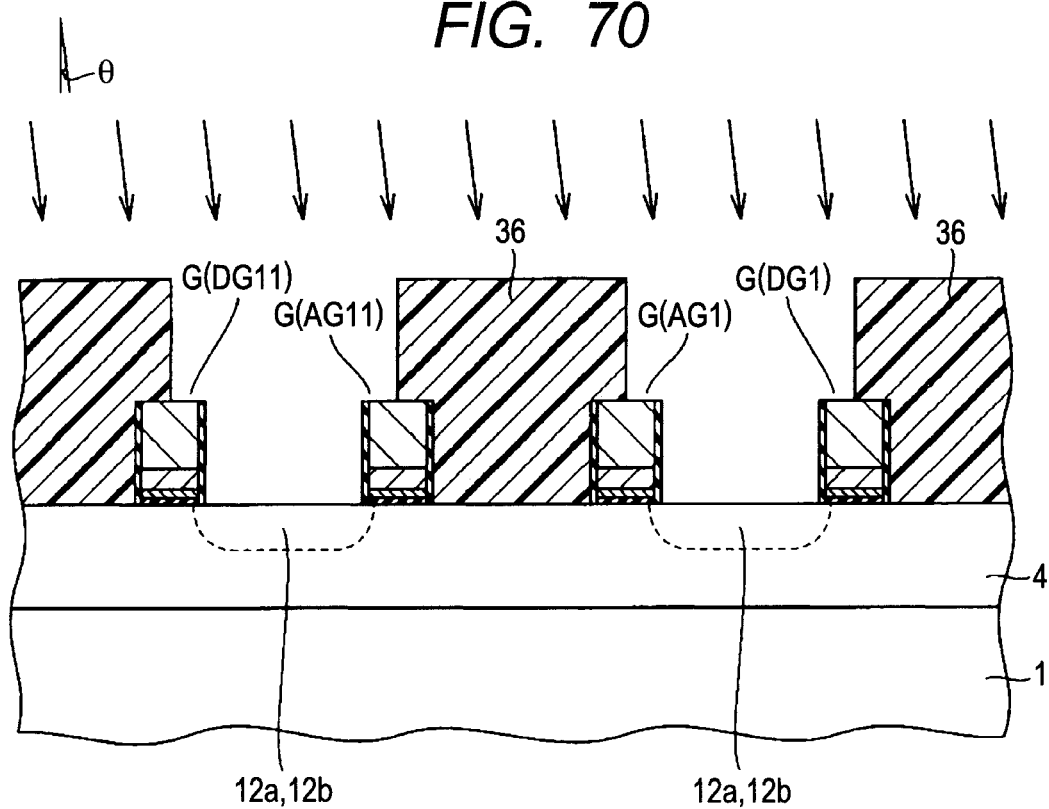
FIG. 70 is a cross-sectional view showing a step performed after the step shown in FIG. 69 in Embodiment 3.

Next, as shown in FIG. 69, using the resist mask 36 as an implantation mask, boron is implanted obliquely ($\theta$=about 7°) to a direction perpendicular to the main surface of the semiconductor substrate 1 from one side in a direction generally orthogonal to the extending directions of the gate structures G, and carbon is further implanted into the semiconductor substrate 1 from the same direction as in the case of implanting boron, thereby forming the p-type impurity regions 12a in the exposed p-well 4 in the areas B and C. Then, as shown in FIG. 70, using the same resist mask 36 as an implantation mask, boron is implanted obliquely ($\theta$=about 7°) to a direction perpendicular to the main surface of the semiconductor substrate 1 from the other side opposite to the one side in a direction generally orthogonal to the extending directions of the gate structures G, and carbon is further implanted into the semiconductor substrate 1 from the same direction as in the case of implanting boron, thereby forming the p-type impurity regions 12b in the exposed p-well 4 in the areas B and C (halo implantation A). Thereafter, the resist mask 36 is removed.

Figure 71:
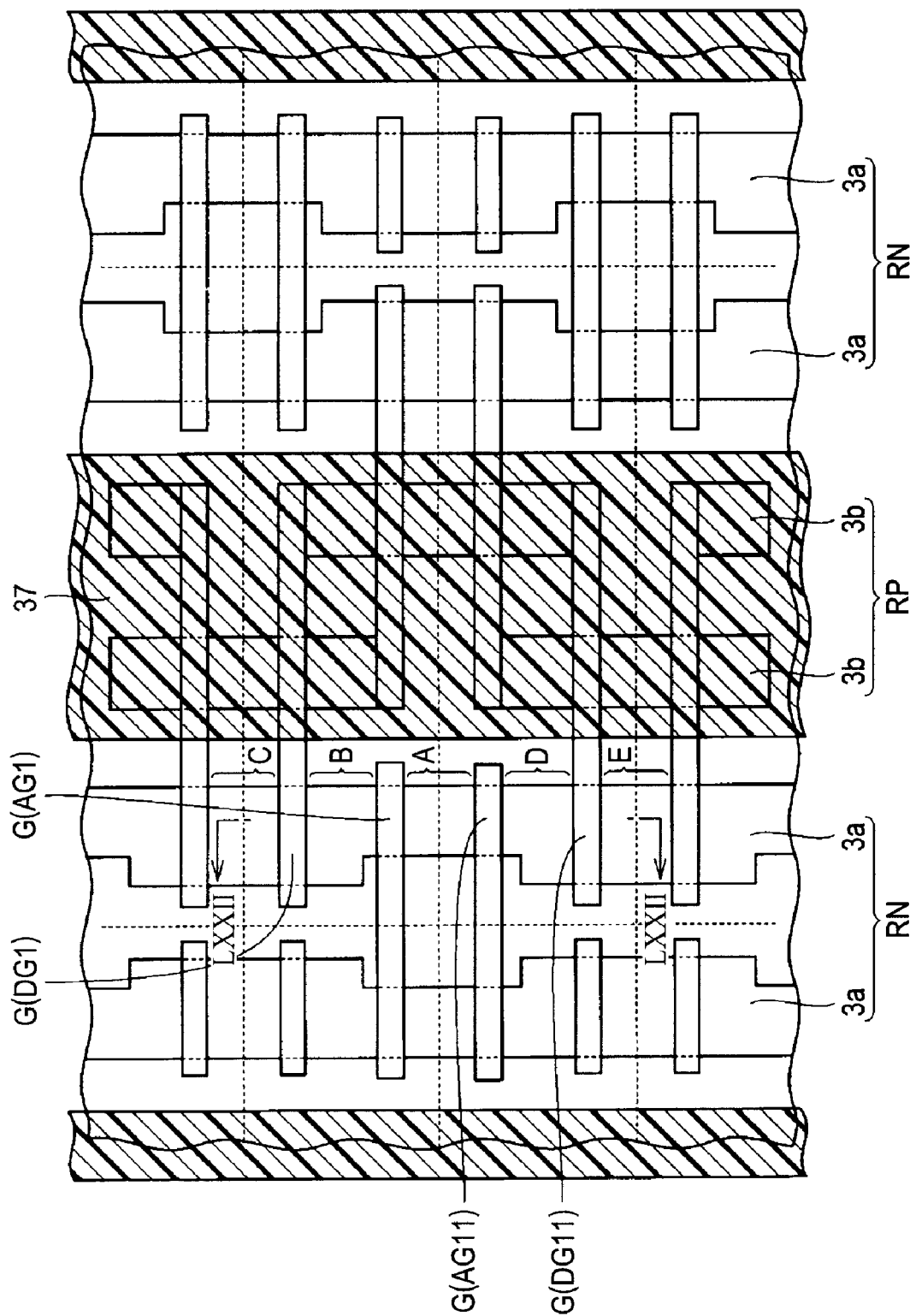
FIG. 71 is a plan view showing a step performed after the step shown in FIG. 70 in Embodiment 3.

Next, as shown in FIG. 71, a predetermined photographic process is performed to form the resist mask 37 serving as an implantation mask (implantation mask B) for forming halo regions. The resist mask 37 is formed into a pattern exposing the areas A, B, and C, and covering the PMIS region RP. That is, the resist mask 37 is formed so as to expose the NMIS regions RN, and cover the PMIS region RP.

Next, as shown in FIG. 72, using the resist mask 37 (see FIG. 71) as an implantation mask, boron is implanted obliquely ($\theta$=about 7°) to a direction perpendicular to the main surface of the semiconductor substrate 1 from one side in a direction generally orthogonal to the extending directions of the gate structures G, thereby forming the p-type impurity regions 12c in the exposed p-well 4 in the areas A, B, and C. Then, as shown in FIG. 73, using the same resist mask 37 as an implantation mask, boron is implanted obliquely ($\theta$=about 7°) to a direction perpendicular to the main surface of the semiconductor substrate 1 from the other side opposite to the one side in a direction generally orthogonal to the extending directions of the gate structures G, thereby forming the p-type impurity regions 12d in the exposed p-well 4 in the areas A, B, and C (halo implantation B). Respective parts of the p-type impurity regions 12a, 12b, 12c, and 12d thus formed, and respective parts of the p-type impurity regions 12c and 12d serve as halo regions.

Next, in the same manner as in the step shown in FIG. 21, using the same resist mask 37 as an implantation mask, phosphorus or arsenic is implanted into the semiconductor substrate 1, thereby forming extension regions (not shown) each extending from the exposed surface of the p-well 4 to a predetermined depth (extension implantation). Thereafter, the resist mask 37 is removed.

Figure 74:
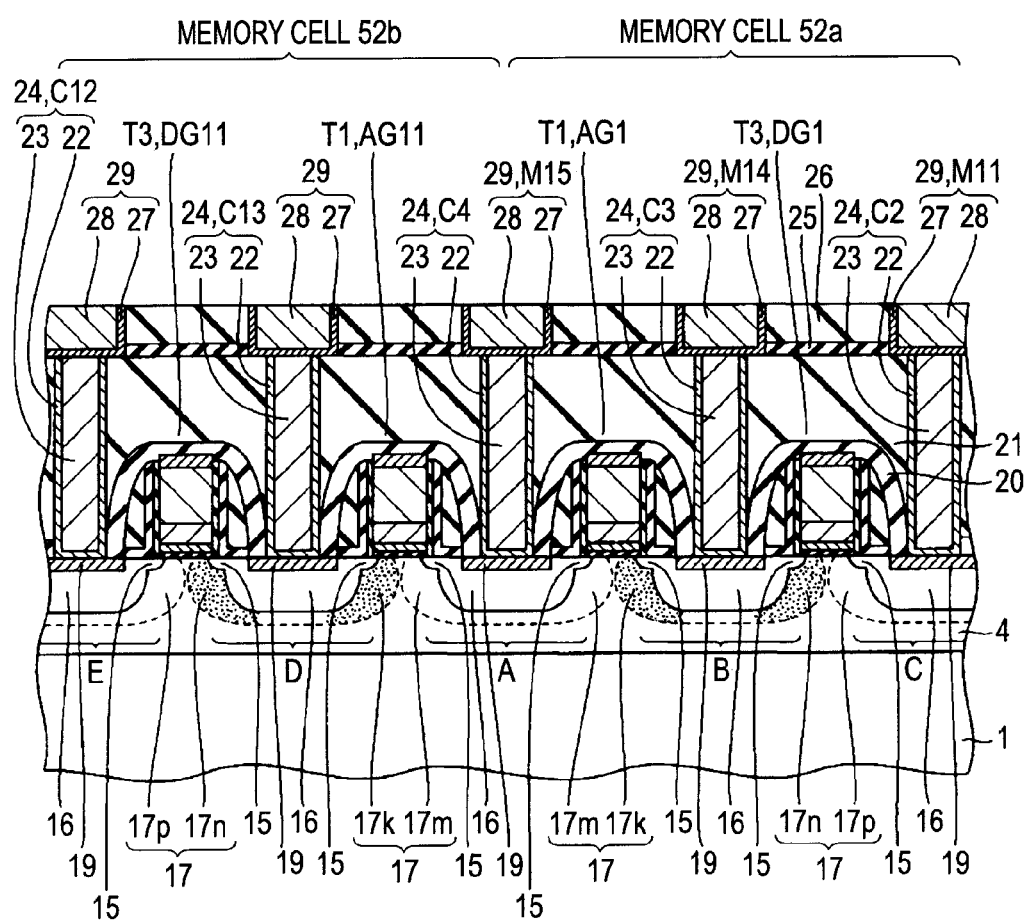
FIG. 74 is a cross-sectional view showing a step performed after the step shown in FIG. 73 in Embodiment 3.

Next, in the same manner as in the step shown in FIG. 22, a resist mask (implantation mask C not shown) covering the NMIS regions RN, and exposing the PMIS region RP is formed. Then, using the resist mask as an implantation mask, phosphorus or arsenic is implanted into the semiconductor substrate 1, thereby forming halo regions (not shown) in the element formation regions 3b. Then, boron is implanted into the semiconductor substrate 1, thereby forming extension regions (not shown). Thereafter, through the same steps as the steps shown in FIGS. 23 to 30, as shown in FIG. 74, the copper wires 29 corresponding to first metal wires are formed. Subsequently, the same structure as the wiring structure as shown in each of FIGS. 6 to 8 is further formed, whereby the main portions of the SRAM memory cells are formed.

In the semiconductor device described above, in addition to the effects of reducing the masks and increasing the operation speeds of the transistors described in Embodiment 2, the following effects can be obtained. That is, as described in the first example, as the impurity concentrations of the impurity regions of the transistors such as the halo regions increase, threshold variations tend to be larger. However, by implanting carbon into the impurity regions, the impurity concentrations of the impurity regions are reduced. This suppresses the threshold variations of the transistors, and allows more stable operations to be performed.

As the boron concentrations of the halo regions, the boron concentrations of the halo regions 17k are set higher than the boron concentrations of the halo regions 17m. However, it is also possible that the boron concentrations of the halo regions 17k and the boron concentrations of the halo regions 17m may be set the same. The mere presence of carbon in the halo regions 17k can allow an asymmetry property of the amounts of currents dependent on the flowing directions of the currents. Therefore, in the step shown in FIGS. 72 and 73, it is possible to omit boron implantation.

As in the variation in Embodiment 2, as the implantation mask A, a resist mask having the same pattern as that of the resist mask 38 shown in FIG. 53 may also be used instead of the resist mask 36 shown in FIG. 67. In this case, in the halo regions 17n provided around the source or drain regions coupled to the storage nodes SN1 and SN2, carbon is not implanted, and the boron concentrations of the halo regions 17n are on the same order as that of the boron concentrations of the halo regions 17m and 17p.

Embodiment 4

Figure 75:
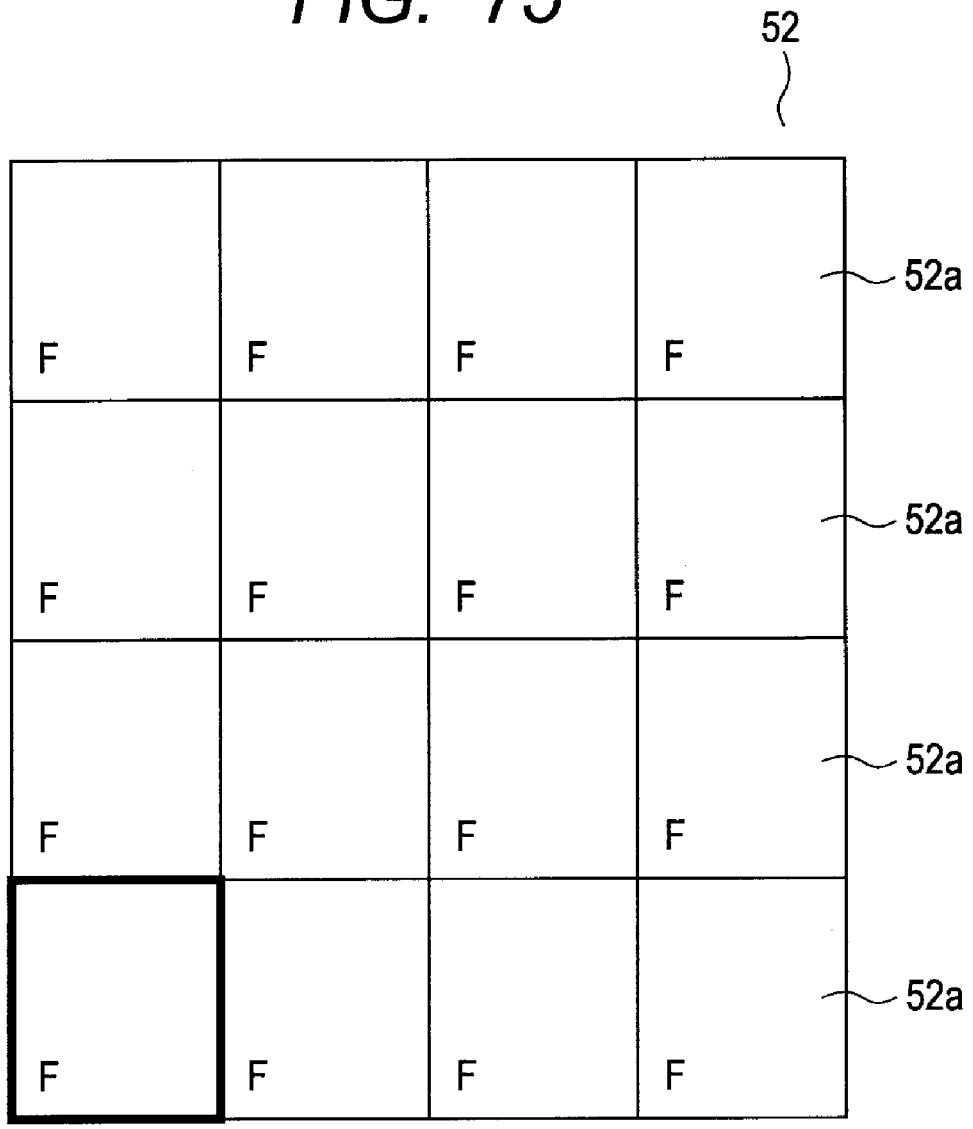
FIG. 75 is a plan view schematically showing a layout pattern of SRAM memory cells in a semiconductor device according to Embodiment 4 of the present invention.

Here, a description will be given of a semiconductor device having a layout pattern different from that of the SRAM memory cells in each of the semiconductor devices described above. As shown in FIG. 75, a SRAM cell array has a plurality of memory cells arranged in a matrix of a plurality of columns and rows (4 columns×4 rows in FIG. 75) over the main surface of a semiconductor substrate. In the SRAM cell array of the semiconductor device, the patterns of individual SRAM memory cells 52a are each in the same size and the same shape, and laid out in the same place without being mirror-symmetrically inverted.

Figure 76:
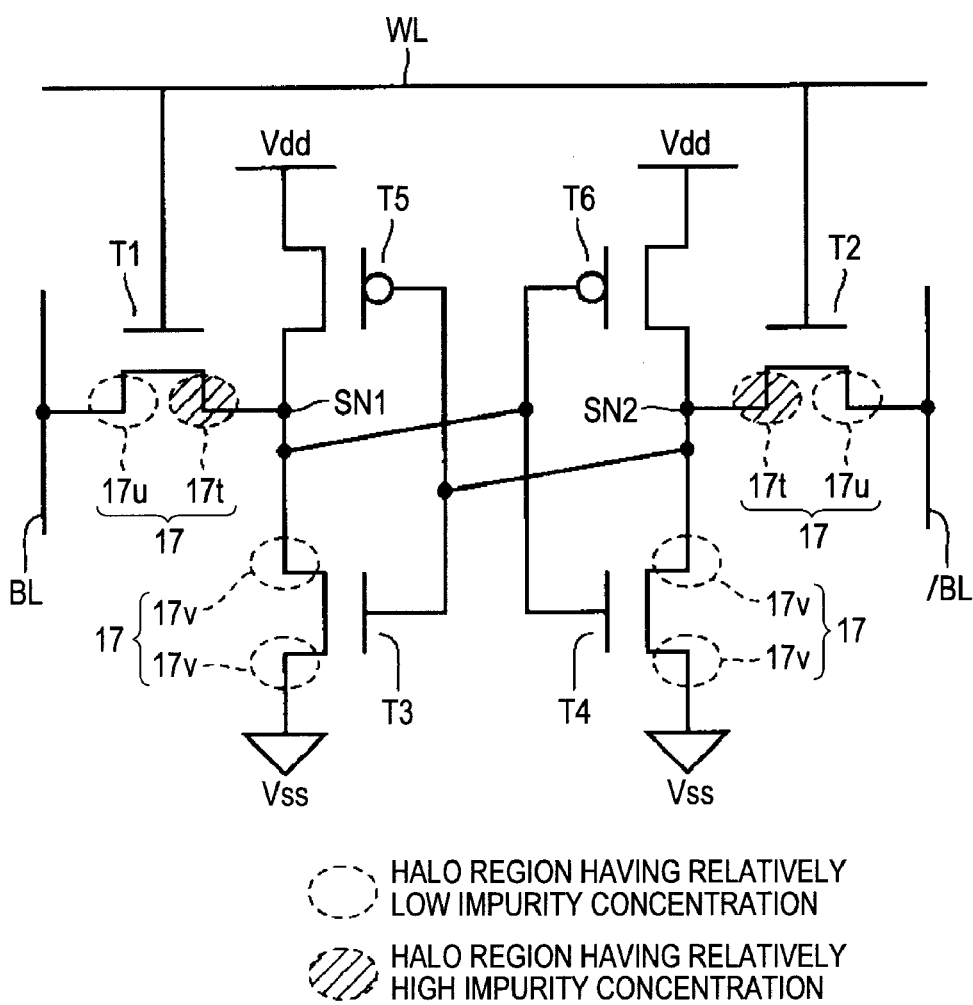
FIG. 76 is a view showing an equivalent circuit of each of the SRAM memory cells in Embodiment 4.

First, a description will be given of an equivalent circuit of each of the SRAM memory cells. As shown in FIG. 76, in the access transistors T1 and T2 in the semiconductor device according to Embodiment 4, the respective pairs of halo regions 17 formed therein include halo regions 17t coupled to the storage nodes SN1 and SN2 and halo regions 17u coupled to the bit lines BL and /BL, and the impurity concentrations of the halo regions 17t are set higher than the impurity concentrations of the halo regions 17u. In the drive transistors T3 and T4, the respective pairs of halo regions 17 (17v) formed therein have equal impurity concentrations, which are set the same as the impurity concentrations of the halo regions 17u. Note that the configuration is otherwise the same as the configuration of the equivalent circuit shown in FIG. 3, and therefore the same members are designated by the same reference numerals and the description thereof will not be repeated.

Figure 77:
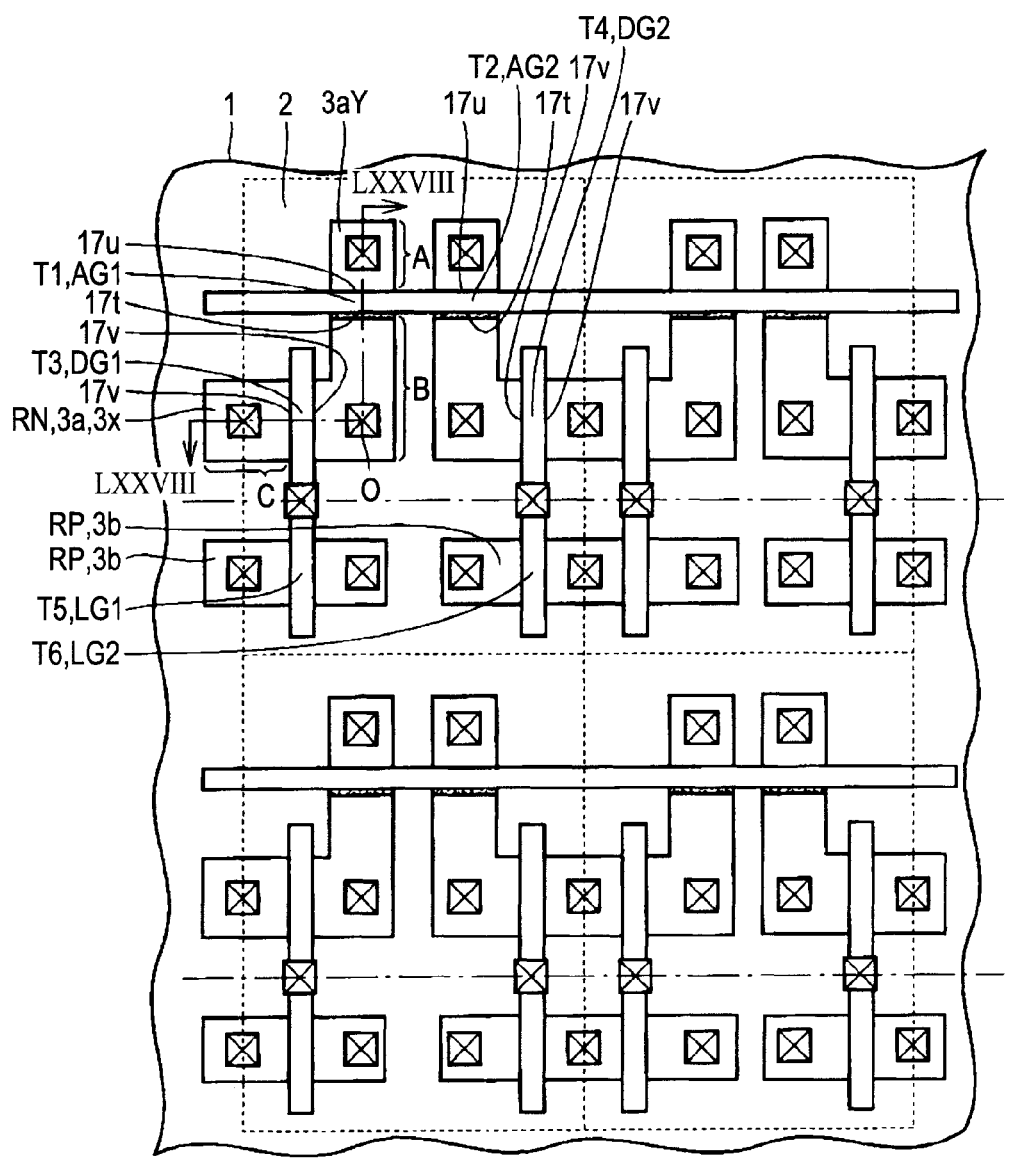
FIG. 77 is a plan view showing a layout pattern of the SRAM memory cells in Embodiment 4.

Next, a description will be given of a structure of the SRAM memory cell. As shown in FIG. 77, in the main surface of the semiconductor substrate 1, the isolation insulating film 2 is formed to define the element formation regions 3a and 3b electrically isolated from each other. In the element formation regions 3a, portions 3aX extending in a first direction (X-direction) and portions 3aY extending in a second direction (Y-direction) are provided.

In the element formation regions 3a, as n-channel MIS transistors, the access transistors T1 and T2 and the drive transistors T3 and T4 are formed. The access transistors T1 and T2 are disposed in the element formation regions 3aY, while the drive transistors T3 and T4 are disposed in the element formation regions 3aX. The access gate electrodes AG1 and AG2 of the access transistors T1 and T2 are formed so as to extend in the X-direction, and traverse the element formation regions 3a. The drive gate electrodes DG1 and DG2 of the drive transistors T3 and T4 are formed so as to extend in the Y-direction, and traverse the element formation regions 3b.

The element formation regions 3b are disposed to extend in the first direction (X-direction) in spaced-apart relation from the element formation regions 3aX. In the element formation regions 3b, as p-channel MIS transistors, the load transistors T5 and T6 are formed. The load gate electrodes LG1 and LG2 of the load transistors T5 and T6 are formed so as to extend in the Y-direction, and traverse the element formation regions 3b. Note that, in FIG. 77, four cells are shown as the SRAM memory cells.

In the portion (area A) of each of the element formation regions 3a located on the opposite side of the drive gate electrode DG1 relative to the access gate electrode AG1, there are formed the halo region 17u, the extension region 15, the source or drain region 16, and the metal silicide film 19.

In the portion (area B) of the element formation region 3a located between the access gate electrode AG1 and the drive gate electrode DG1, there are formed the halo region 17t, the halo region 17v, the extension regions 15, the source or drain region 16, and the metal silicide film 19.

In the portion (area C) of the element formation region 3a located on the opposite side of the access gate electrode AG1 relative to the drive gate electrode DG1, there are formed the halo region 17v, the extension region 15, the source or drain region 16, and the metal silicide film 19. The halo regions 17t and 17u are formed so as to reach areas immediately under the access gate electrode AG1, while the halo regions 17v are formed so as to reach areas immediately under the drive gate electrode DG1.

The stress liner film 20 such as a silicon nitride film is formed so as to cover the access gate electrode AG1 and the drive gate electrode DG1. The interlayer insulating film 21 such as a TEOS film is formed so as to cover the stress liner film 20. There are formed the plugs 24 which extend through the interlayer insulating film 21 and the stress liner film 20 to be electrically coupled to the metal silicide films 19. Each of the plugs 24 includes the barrier metal film 22 such as a TiN film and the tungsten film 23.

The etching stopper film 25 such as a silicon nitride film is formed over the interlayer insulating film 21 so as to cover the plugs 24. Over the etching stopper film 25, the interlayer insulating film 26 such as a silicon oxide film is formed. There are formed the copper wires 29 which extend through the interlayer insulating film 26 and the etching stopper film 25 to be electrically coupled to the plugs 24. Each of the copper wires 29 includes the barrier metal film 27 such as a TaN film and the copper film 28.

Figure 79:
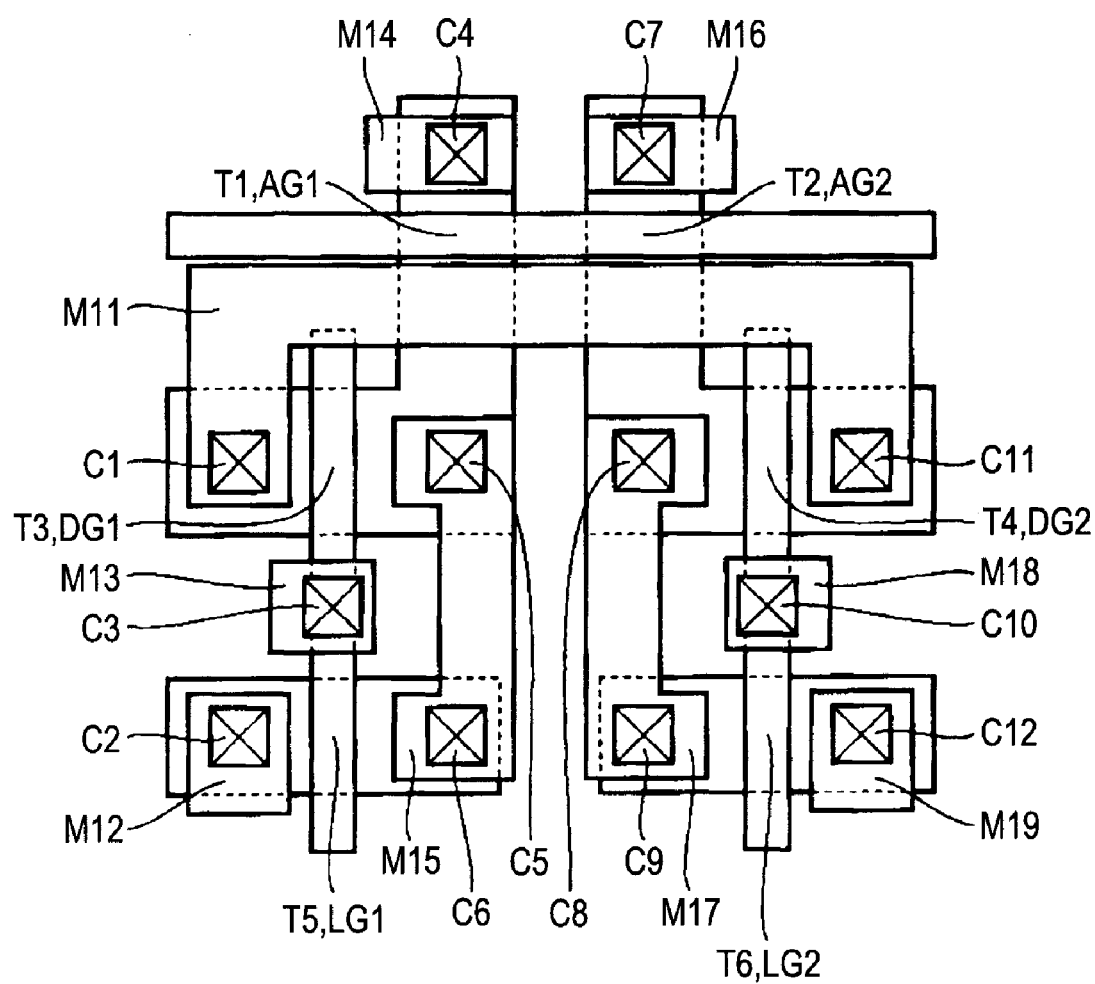
FIG. 79 is a plan view showing a coupling structure between individual transistors and first metal wires in Embodiment 4.
Figure 80:
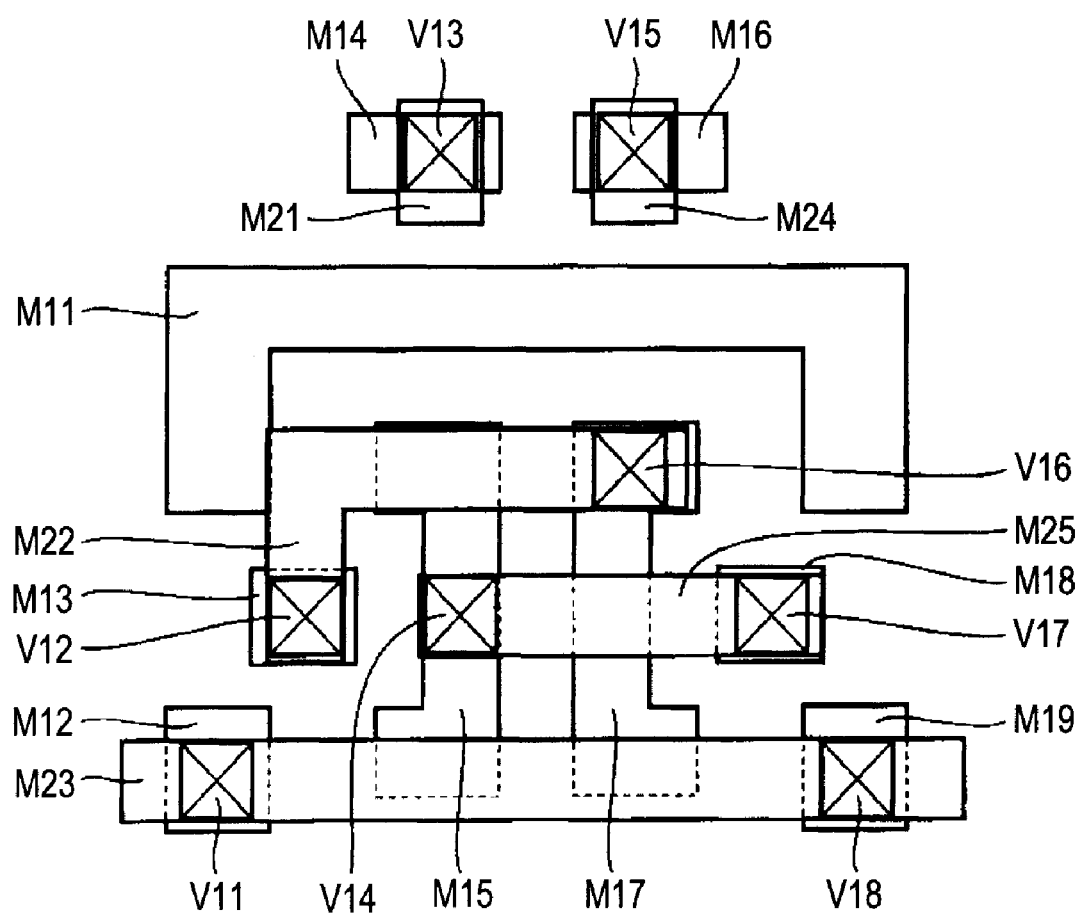
FIG. 80 is a plan view showing a coupling structure between the first metal wires and second metal wires in Embodiment 4.
Figure 81:
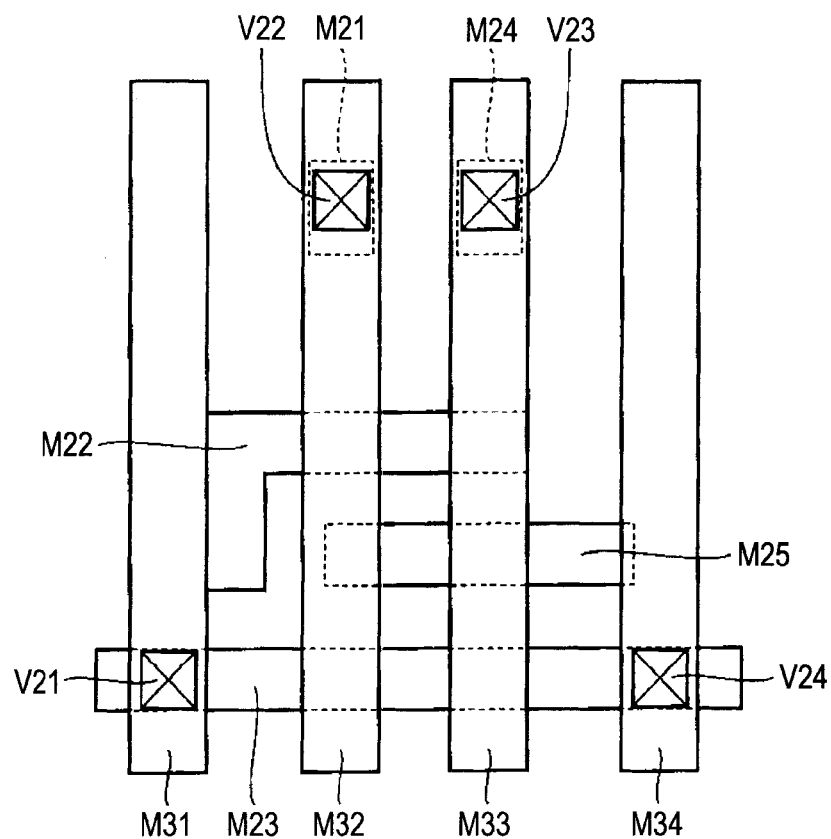
FIG. 81 is a plan view showing a coupling structure between the second metal wires and third metal wires in Embodiment 4.

Next, a description will be given of a multilayer wiring structure which electrically couples the individual transistors. As shown in FIGS. 79, 80, and 81, in the semiconductor device according to Embodiment 4, over the copper wires 29 serving as the first metal wires M11 to M19, the second metal wires M21 to M25 are formed and, over the second metal wires M21 to M25, the third metal wires M31 to M34 are formed.

One (area A) of the S/D regions of the access transistor T1 is electrically coupled to the third metal wire M32 serving as the bit line BL via the contact C4 (plug 24), the first metal wire M14 (copper wire 29), the via V13, the second metal wire M21, and the via V22. The other (area B) of the S/D regions of the access transistor T1 is electrically coupled to one (area) of the S/D regions of the load transistor T5 via the contact C5 (plug 24), the first metal wire M15, and the contact C6.

The other (area B) of the S/D regions of the access transistor T1 and one (area B) of the S/D regions of the drive transistor T3 are electrically coupled to the drive gate electrode DG2 of the drive transistor T4 and the load gate electrode LG2 of the load transistor T6 via the contact C5 (plug 24), the first metal wire M15, the via V14, the second metal wire M25, and the via V17. The other of the S/D regions of the access transistor T1 is also electrically coupled to one of the S/D regions of the drive transistor T3. The access gate electrode AG1 of the access transistor T1 is formed as a part of the word line WL.

The other (area C) of the S/D regions of the drive transistor T3 is electrically coupled to the first metal wire M11 fixed to the ground potential via the contact C1 (plug 24). The other of the S/D regions of the load transistor T5 is electrically coupled to the third metal wire M31 as the power source line via the contact C2, the first metal wire M12, the via V11, the second metal wire M23, and the via V21.

One of the S/D regions of the access transistor T2 is electrically coupled to the third metal wire M33 serving as the bit line /BL via the contact C7, the first metal wire M16, the via V15, the second metal wire M24, and the via V23. The other of the S/D regions of the access transistor T2 is electrically coupled to one (area) of the S/D regions of the load transistor T6 via the contact C8, the first metal wire M17, and the contact C9.

The other of the S/D regions of the access transistor T2 and one of the S/D regions of the drive transistor T4 are electrically coupled to the drive gate electrode DG1 of the drive transistor T3 and the load gate electrode LG1 of the load transistor T5 via the contact C8 (plug 24), the first metal wire M17, the via V16, the second metal wire M22, and the via V12. The other of the S/D regions of the access transistor T2 is electrically coupled to one of the S/D regions of the drive transistor T4. The access gate electrode AG2 of the access transistor T2 is formed as a part of the word line WL.

Next, a description will be given of a method of manufacturing the semiconductor device described above. In the semiconductor device, a logic circuit and the like are also included besides a SRAM circuit. However, the description will be given mainly of a method of forming the access transistor T1 and the drive transistor T3.

Figure 82:
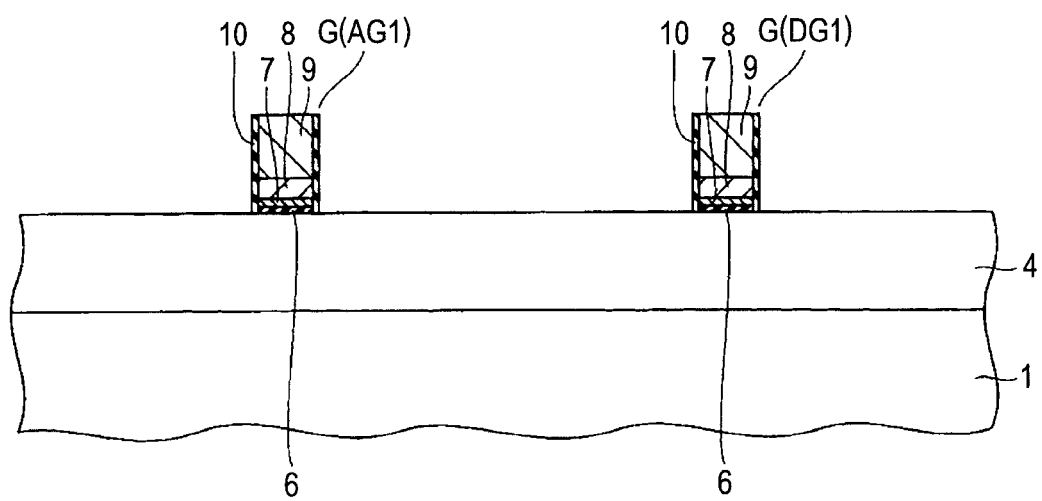
FIG. 82 is a cross-sectional view showing a step of a method of manufacturing the semiconductor device in Embodiment 4.

First, in the main surface of the semiconductor substrate 1, the isolation insulating film 2 is formed to define the element formation regions 3*a* and 3*b* electrically isolated from each other (see FIG. 77). Then, as shown in FIG. 82, the p-well 4 is formed in each of the element formation regions 3*a*. Then, in a form in which the High-k film 7 having the predetermined dielectric constant, the metal film 8 having the predetermined work function, and the polysilicon film 9 are stacked over the surface of the semiconductor substrate 1 with the interface layer 6 interposed therebetween, the gate structure G serving as the access gate electrode (AG1) and the gate structure G serving as the drive gate electrode (DG1) are formed. Then, over the semiconductor substrate 1, a silicon nitride film (not shown), for example, is formed so as to cover the gate structures G. Then, anisotropic etching is performed to the silicon nitride film to form the offset spacers 10 over the both side surfaces of the gate structures G.

Figure 83:
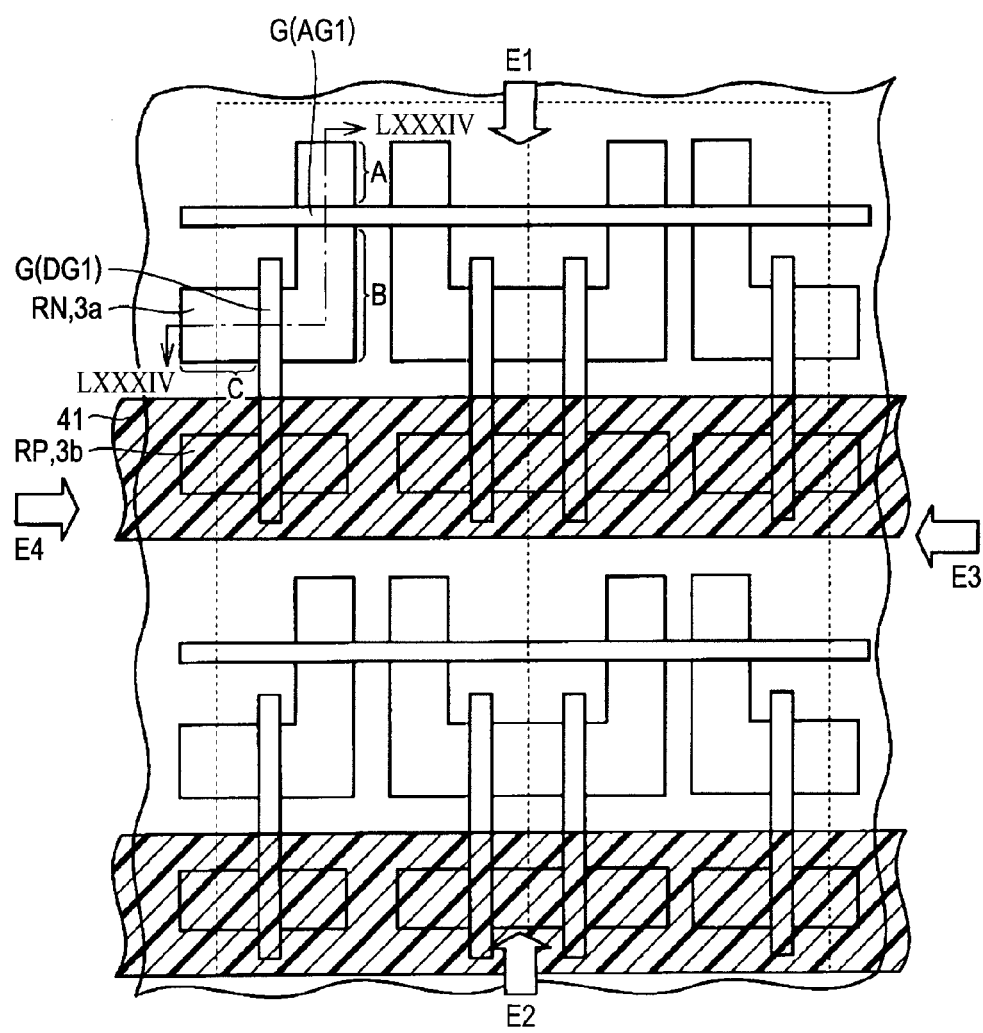
FIG. 83 is a plan view showing a step performed after the step shown in FIG. 82 in Embodiment 4.

Next, as shown in FIG. 83, a predetermined photographic process is performed to form a resist mask 41 serving as an implantation mask (implantation mask A) for forming halo regions. The resist mask 41 is formed into a pattern exposing the NMIS regions RN where the element formation regions 3*a* are formed, and covering the PMIS regions RP where the element formation regions 3*b* are formed. Then, using the resist mask 41 as an implantation mask, boron is implanted from a predetermined direction.

Figure 84:
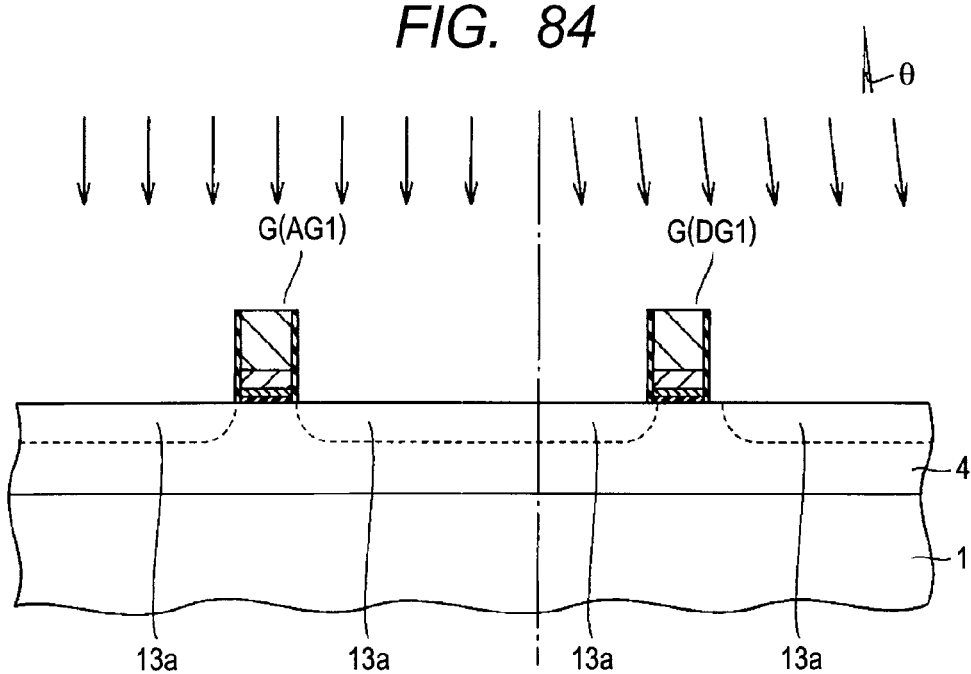
FIG. 84 is a cross-sectional view showing a step performed after the step shown in FIG. 83 in Embodiment 4, which is a cross-sectional view along a cross-sectional line corresponding to the cross-sectional line LXXXIV-LXXXIV shown in FIG. 83.

First, as shown in FIG. 84, using the resist mask 41 as an implantation mask, boron is implanted obliquely ($\theta$=about 7°) to a direction perpendicular to the main surface of the semiconductor substrate 1 from a direction E3 (see FIG. 83), thereby forming p-type impurity regions 13*a* in the exposed p-well 4 in the element formation regions 3*a*.

Figure 85:
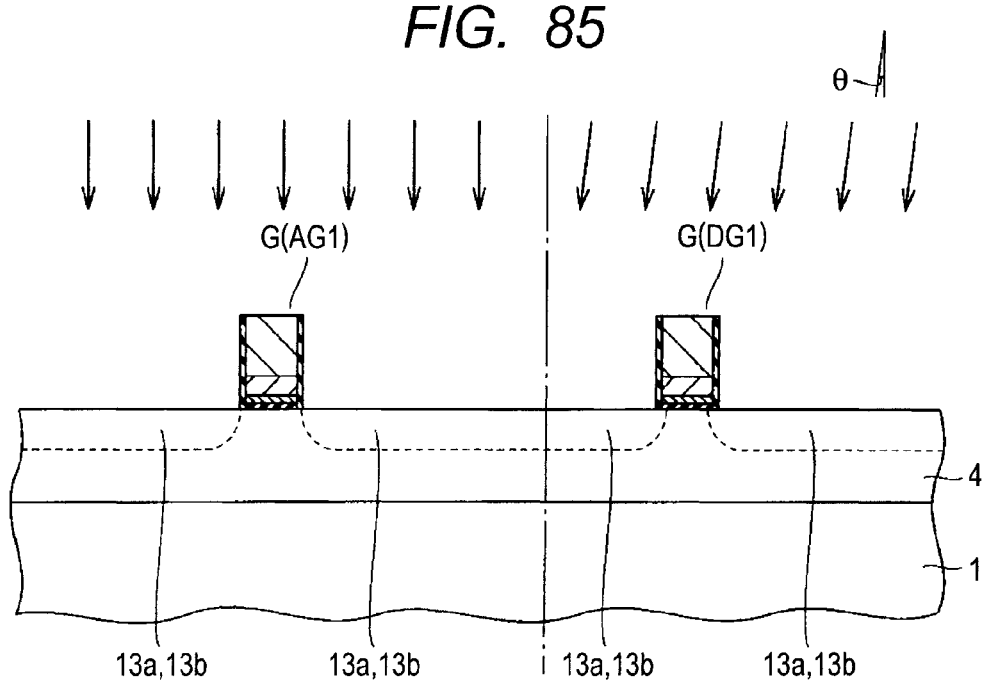
FIG. 85 is a cross-sectional view showing a step performed after the step shown in FIG. 84 in Embodiment 4.

Next, as shown in FIG. 85, using the resist mask 41 as an implantation mask, boron is implanted obliquely ($\theta$=about 7°) to a direction perpendicular to the main surface of the semiconductor substrate 1 from a direction E4 (see FIG. 83), thereby forming p-type impurity regions 13*b* in the exposed p-well 4 in the element formation regions 3*a*.

Figure 86:
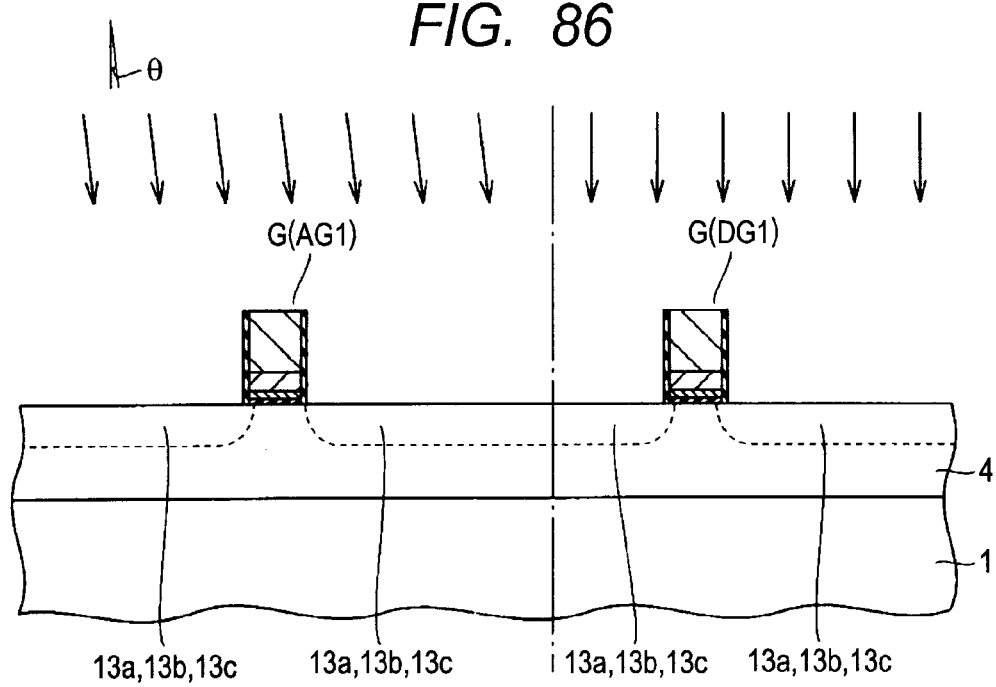
FIG. 86 is a cross-sectional view showing a step performed after the step shown in FIG. 85 in Embodiment 4.

Next, as shown in FIG. 86, using the resist mask 41 as an implantation mask, boron is implanted obliquely ($\theta$=about 7°) to a direction perpendicular to the main surface of the semiconductor substrate 1 from a direction E1 (see FIG. 83), thereby forming p-type impurity regions 13*c* in the exposed p-well 4 in the element formation regions 3*a*.

Figure 87:
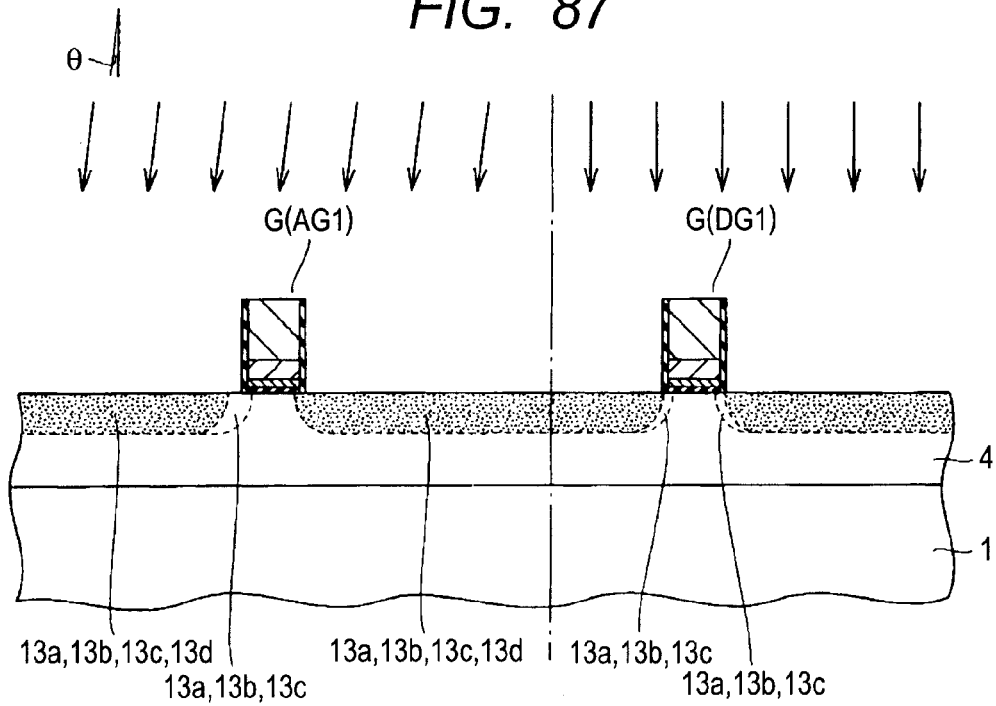
FIG. 87 is a cross-sectional view showing a step performed after the step shown in FIG. 86 in Embodiment 4.

Next, as shown in FIG. 87, using the resist mask 41 as an implantation mask, boron is implanted obliquely ($\theta$=about 7°) to a direction perpendicular to the main surface of the semiconductor substrate 1 from a direction E2 (see FIG. 83), thereby forming p-type impurity regions 13*d* in the exposed p-well 4 in the element formation regions 3*a* (halo implantation A).

By setting the implantation dose of boron implanted from the direction E2 higher than the implantation doses of boron implanted from the directions E1, E3, and E4, in the p-well 4 over which the access gate electrode AG1 (AG2) is disposed, impurity regions serving as the halo regions having asymmetric impurity concentrations are formed. Note that, from each of the directions E1 to E4, boron is implanted with the same implantation energy.

Figure 88:
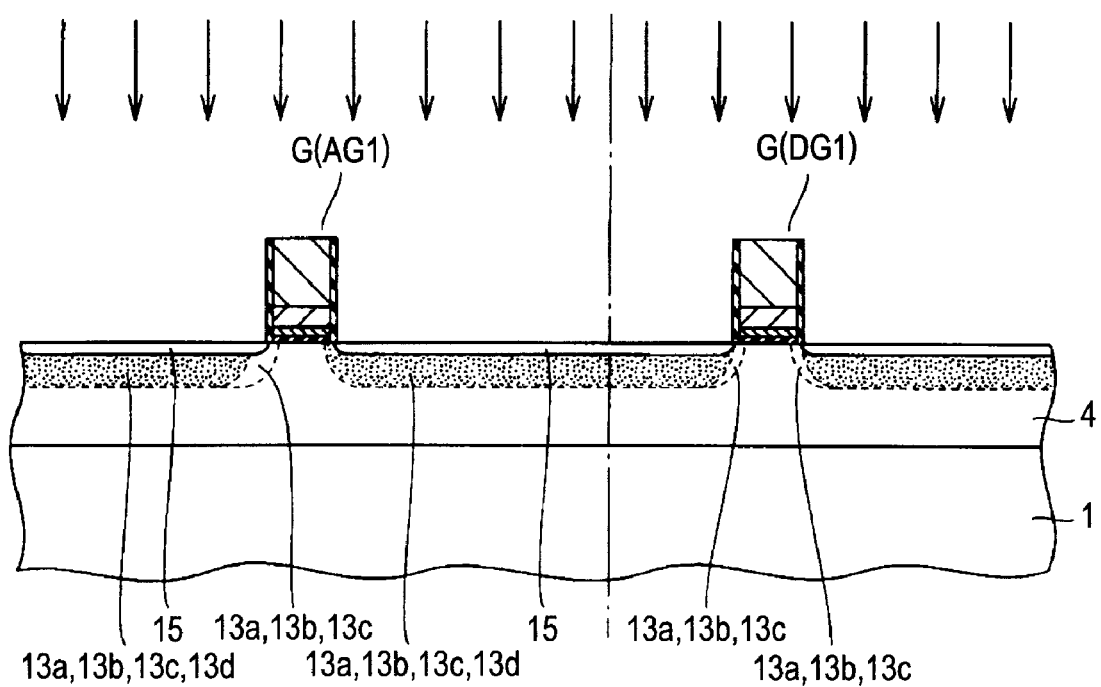
FIG. 88 is a cross-sectional view showing a step performed after the step shown in FIG. 87 in Embodiment 4.

Next, as shown in FIG. 88, using the same resist mask 41 (see FIG. 83) as an implantation mask, phosphorus or arsenic is implanted into the semiconductor substrate 1, thereby forming the extension regions 15 each extending from the exposed surface of the p-well 4 to a predetermined depth (extension implantation). Thereafter, the resist mask 41 is removed.

Figure 89:
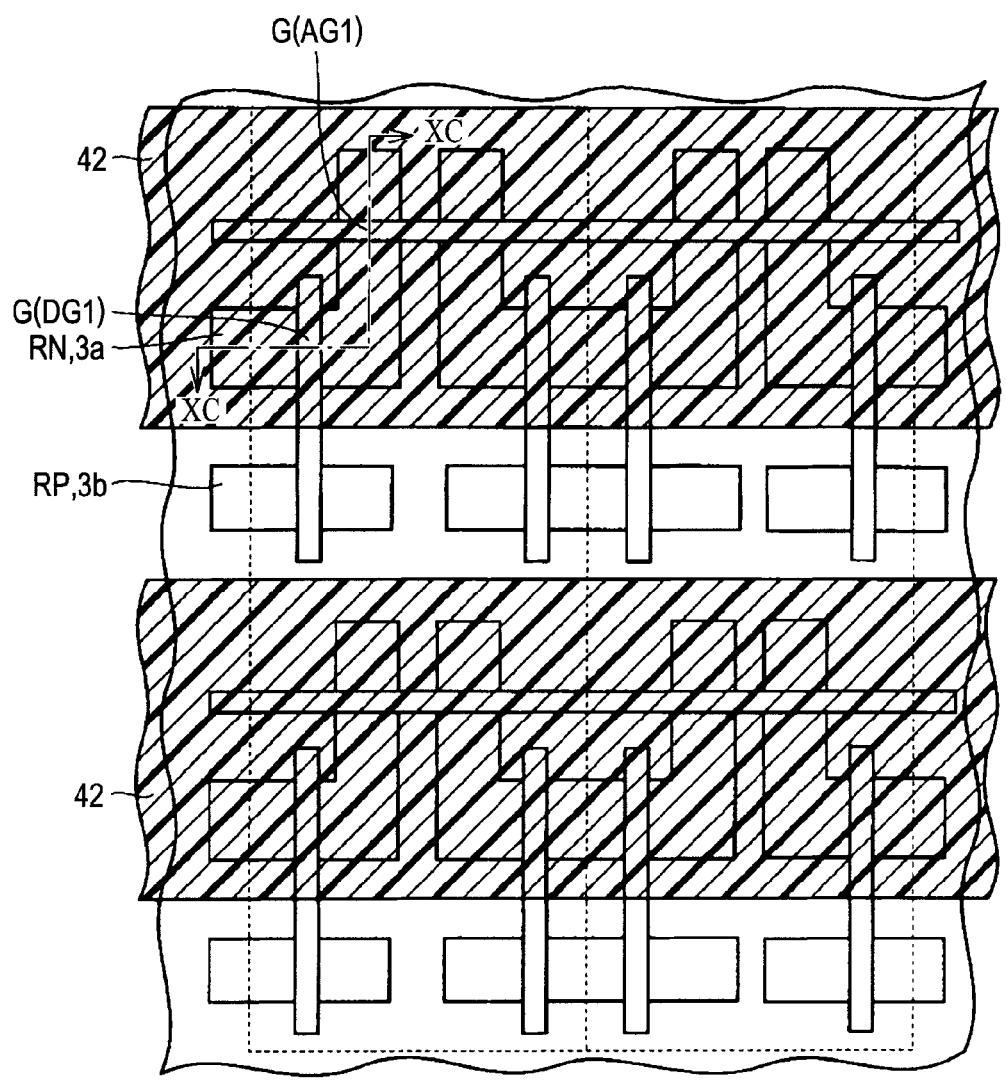
FIG. 89 is a plan view showing a step performed after the step shown in FIG. 88 in Embodiment 4.

Next, as shown in FIG. 89, a resist mask 42 (implantation mask B) covering the NMIS regions RN, and exposing the PMIS regions RP is formed. Then, using the resist mask 42 as an implantation mask, phosphorus or arsenic is implanted into the semiconductor substrate 1, thereby forms halo regions (not shown) in the element formation regions 3*b*. Then, boron is implanted into the semiconductor substrate 1, thereby forming extension regions (not shown). Thereafter, the resist mask 42 is removed.

Next, a silicon oxide film and a silicon nitride film (each not shown), for example, are successively formed so as to cover the gate structures G (the access gate electrode AG1, the drive gate electrode DG1, and the like). Then, anisotropic etching is performed to the silicon oxide film and the silicon nitride film to form the sidewall spacers 18 each comprised of the silicon oxide film 18a and the silicon nitride film 18b over the both side surfaces of the gate structures G.

Figure 90:
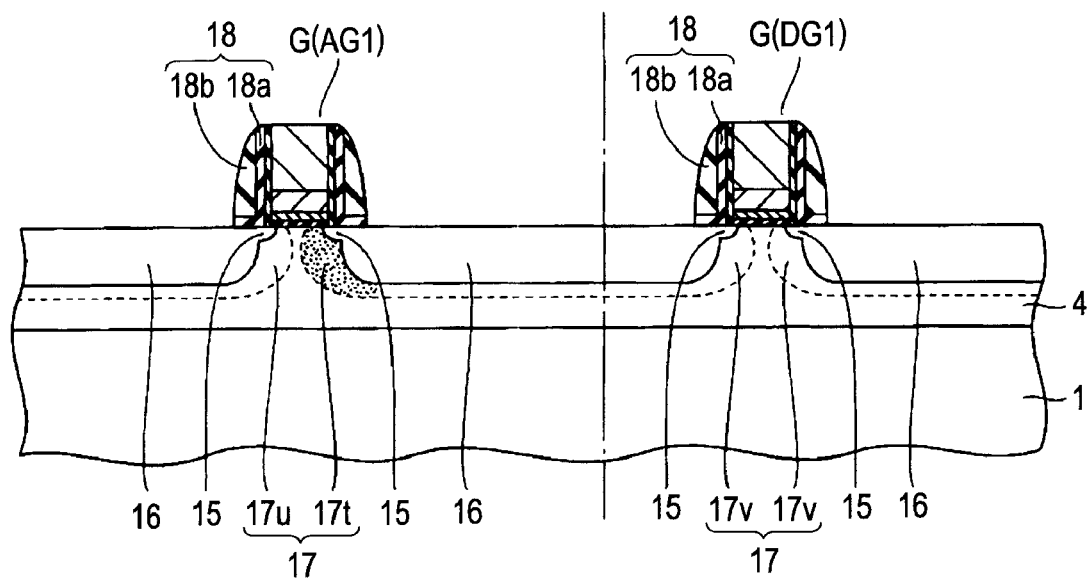
FIG. 90 is a cross-sectional view showing a step performed after the step shown in FIG. 89 in Embodiment 4, which is a cross-sectional view along a cross-sectional line corresponding to the cross-sectional line XC-XC shown in FIG. 89.

Next, a resist mask (not shown) exposing the NMIS regions RN, and covering the PMIS regions RP is formed. Then, as shown in FIG. 90, using the resist mask, the sidewall spacers, and the like as an implantation mask, phosphorus or arsenic is implanted into the semiconductor substrate 1, thereby forming the source or drain regions 16 each extending from the exposed surface of the p-well 4 to a predetermined depth. Thereafter, the resist mask is removed.

Next, a resist mask (not shown) covering the NMIS regions RN, and exposing the PMIS regions RP is formed. Then, using the resist mask as an implantation mask, boron is implanted into the semiconductor substrate 1, thereby forming source or drain regions (not shown) extending from the exposed surfaces of the element formation regions 3b to a predetermined depth. Thereafter, the resist mask is removed.

Next, a predetermined annealing process is performed to thermally diffuse the implanted impurities, and thereby activate the source or drain regions 16, the extension regions 15, and the halo regions 17t, 17u, and 17v. At this time, through the thermal diffusion of the impurities, the source or drain regions 16, the extension regions 15, and the halo regions 17t, 17u, and 17v expand in a lateral direction and in a vertical (depth) direction.

Figure 91:
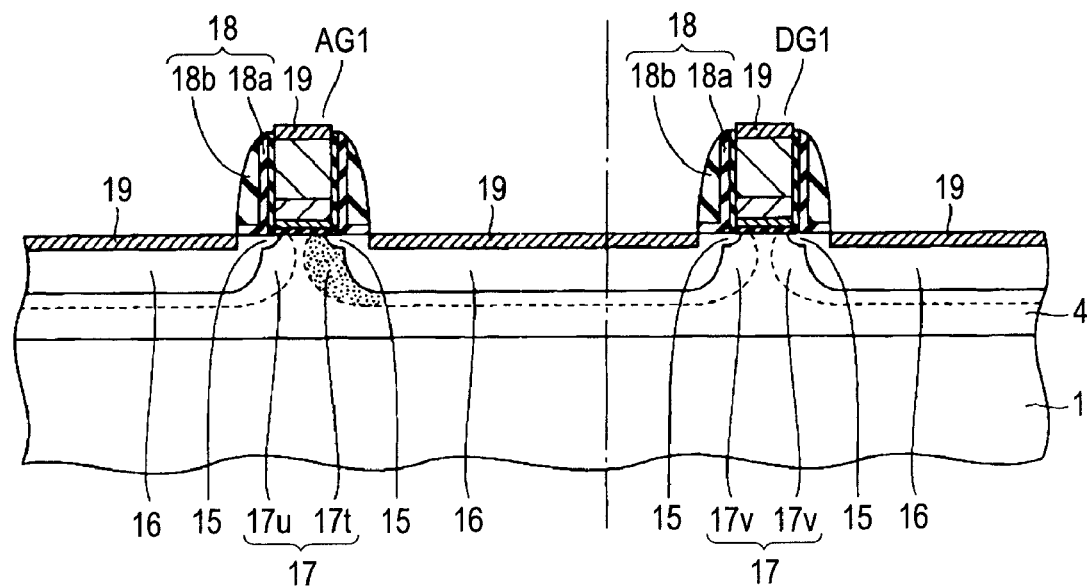
FIG. 91 is a cross-sectional view showing a step performed after the step shown in FIG. 90 in Embodiment 4.
Figure 92:
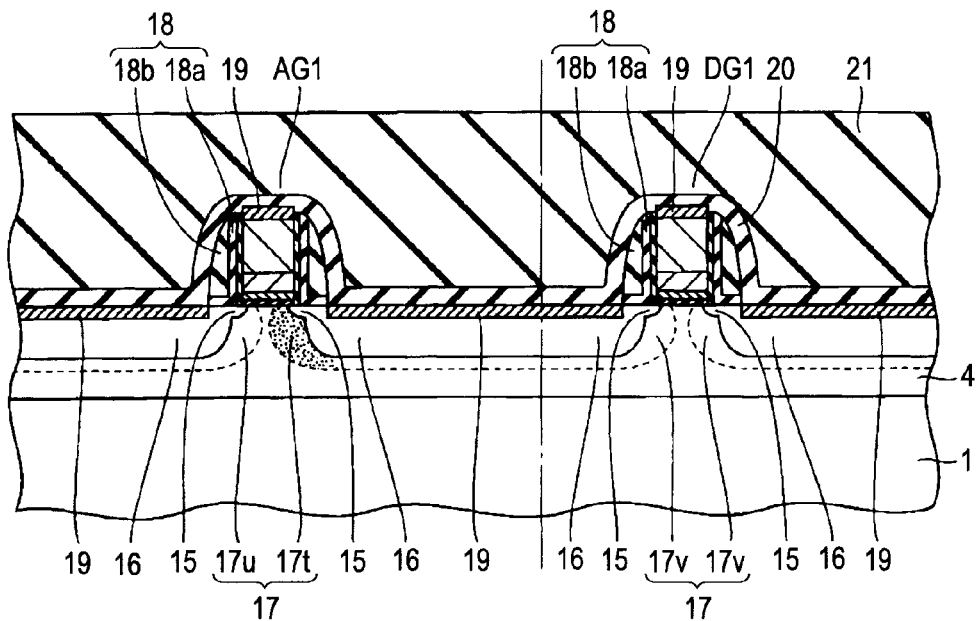
FIG. 92 is a cross-sectional view showing a step performed after the step shown in FIG. 91 in Embodiment 4.

Next, as shown in FIG. 91, by a salicide process, the metal silicide films 19 comprised of nickel silicide or the like are formed in the exposed surfaces of the polysilicon films of the source or drain regions 16, the access gate electrode AG1, and the drive gate electrode DG1. Then, as shown in FIG. 92, the stress liner film 20 such as a silicon nitride film is formed so as to cover the access gate electrode AG1 and the drive gate electrode DG1. Then, the interlayer insulating film 21 comprised of TEOS or the like is formed so as to cover the stress liner film 20.

Figure 93:
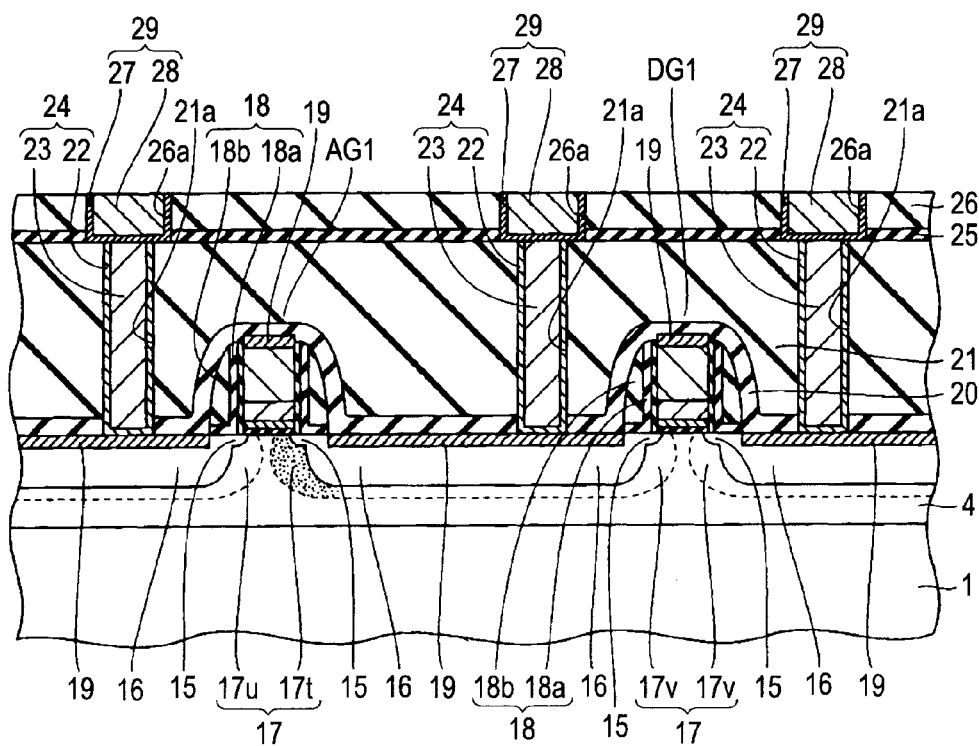
FIG. 93 is a cross-sectional view showing a step performed after the step shown in FIG. 92 in Embodiment 4.

Next, as shown in FIG. 93, anisotropic etching is performed to the interlayer insulating film 21 to form the contact holes 21a which expose the metal silicide films 19. Then, in the contact holes 21a, the plugs 24 each including the barrier metal film 22 and the tungsten film 23 are formed. Then, the etching stopper film 25 such as a silicon nitride film and the interlayer insulating film 26 such as a silicon oxide film are formed so as to cover the plugs 24. Then, the trenches 26a are formed to expose the surfaces of the plugs 24. Then, in the trenches 26a, the copper wires 29 each including the barrier metal film 27 and the copper film 28 are formed. The copper wires 29 correspond to the first metal wires.

Thereafter, an interlayer insulating film (not shown) is formed so as to cover the copper wires 29. In the interlayer insulating film, the vias V11 to V18 (see FIG. 80) are formed by the same method as the method of forming the plugs 24. Then, an interlayer insulating film (not shown) is formed so as to cover the vias V11 to V18. In the interlayer insulating film, the second metal wires M21 to M25 (see FIG. 80) are formed by the same method as the method of forming the copper wires 29.

Next, an interlayer insulating film (not shown) is formed so as to cover the second metal wires M21 to M25. In the interlayer insulating film, the vias V21 to V24 (see FIG. 81) are formed by the same method as the method of forming the plugs 24. Then, an interlayer insulating film (not shown) is formed so as to cover the vias V21 to V24. In the interlayer insulating film, the third metal wires M31 to M34 (see FIG. 81) are formed by the same method as the method of forming the copper wires 29. In this manner, the main portions of the SRAM memory cells are formed.

In the semiconductor device described above, the asymmetric halo regions of the access transistors T1 and T2 and the halo regions of the drive transistors T3 and T4 are formed using the resist mask 41 (implantation mask A shown in FIG. 83) as the implantation mask. Also, the halo regions of the load transistors T5 and T6 are formed using the resist mask 42 (implantation mask B shown in FIG. 89) as the implantation mask. That is, to form the halo regions of the individual transistors forming the SRAM memory cell, in the semiconductor device described above, the two resist masks are used as the implantation masks to allow the halo regions of the individual transistors to be formed.

In the semiconductor device according to Embodiment 4, the access gate electrodes of the access transistors extend in the same direction in the plurality of memory cells arranged adjacent to each other in a matrix. In addition, when the main surface of the semiconductor substrate is viewed in a plan view, in each of the plurality of memory cells, the direction of the one (area B) of the source or drain regions of each of the access transistors coupled to the bit line with respect to the other source or drain region (area A) thereof serving as the storage node is the same. As a result, there is no need for implantation masks to provide the halo regions 17t and 17u with asymmetric impurity concentrations (different impurity concentrations). Therefore, it is possible to reduce one more of the photographic masks used for the semiconductor device according to each of the embodiments described above, which are smaller in number than at least four implantation masks needed for the semiconductor device according to the comparative example. Accordingly, at least two of the photographic masks can be reduced. This allows a further reduction in production cost.

Moreover, in each of the plurality of memory cells, the drive gate electrodes of the drive transistors are also configured to extend in the same direction (direction orthogonal to the access gate electrodes). Therefore, it is possible to provide the pair of halo regions 17v of each of the drive transistors with symmetric impurity concentrations.

Note that, in the method of manufacturing the semiconductor device described above, the exemplary case has been described in which, in the halo implantation A, the implantation dose when implantation is performed from the direction E2 is set higher than the implantation doses when implantation is performed from the directions E1, E3, and E4. Besides, it is also possible that the implantation doses when implantation is performed from the directions E2, E3, and E4 may be set the same, and the implantation dose when implantation is performed from the direction E1 is set lower than the foregoing implantation dose.

Embodiment 5

Here, a description will be given of another example of the semiconductor device in which each of SRAM cells is laid out in the same orientation.

Figure 94:
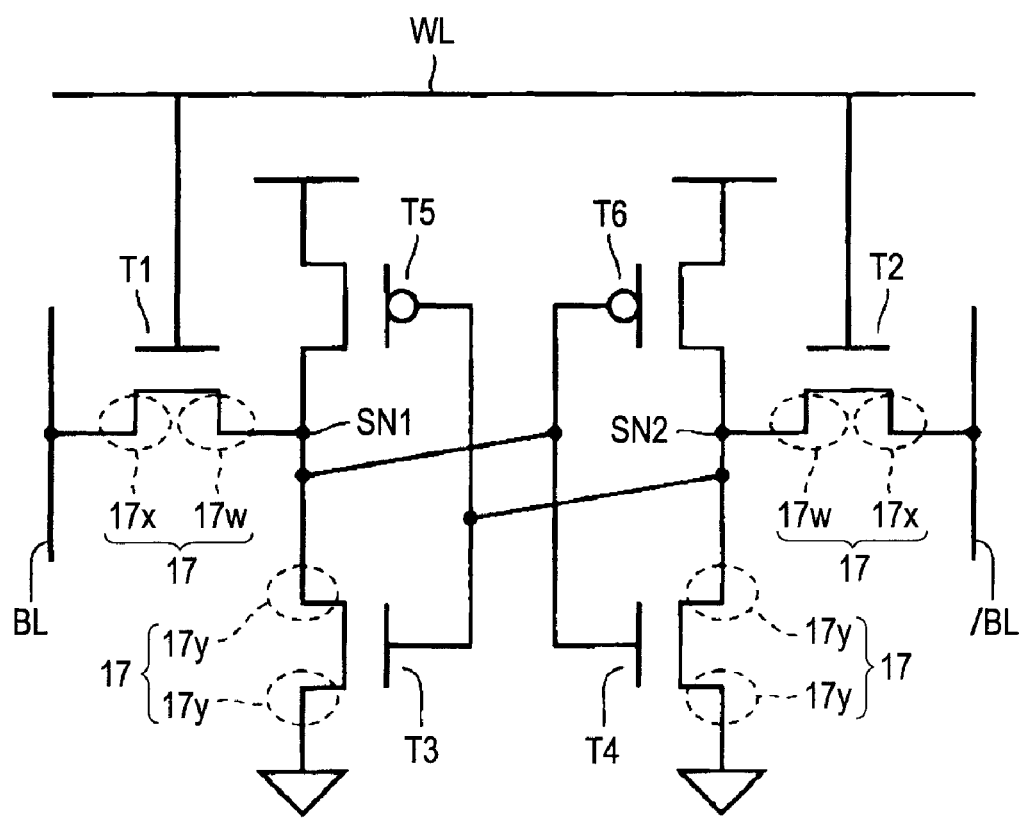
FIG. 94 is a view showing an equivalent circuit of a SRAM memory cell in a semiconductor device according to Embodiment 5 of the present invention.

First, a description will be given of an equivalent circuit of each of the SRAM memory cells. As shown in FIG. 94, in the access transistors T1 and T2 of the semiconductor device according to Embodiment 5, the impurity concentrations of the respective pairs of halo regions 17 (17w and 17x) formed therein are set the same. In addition, the shapes of the halo regions 17w coupled to the storage nodes SN1 and SN2 and the shapes of the halo regions 17x coupled to the bit lines BL and /BL are designed to be asymmetric relative to the access gate electrodes. In the drive transistors T3 and T4, the respective pairs of halo regions 17 (17y) formed therein have equal impurity concentrations, which are set the same as the impurity concentrations of the halo regions 17w and 17x. Note that the configuration is otherwise the same as the configuration of the equivalent circuit shown in FIG. 3, and therefore the same members are designated by the same reference numerals and the description thereof will not be repeated.

Figure 95:
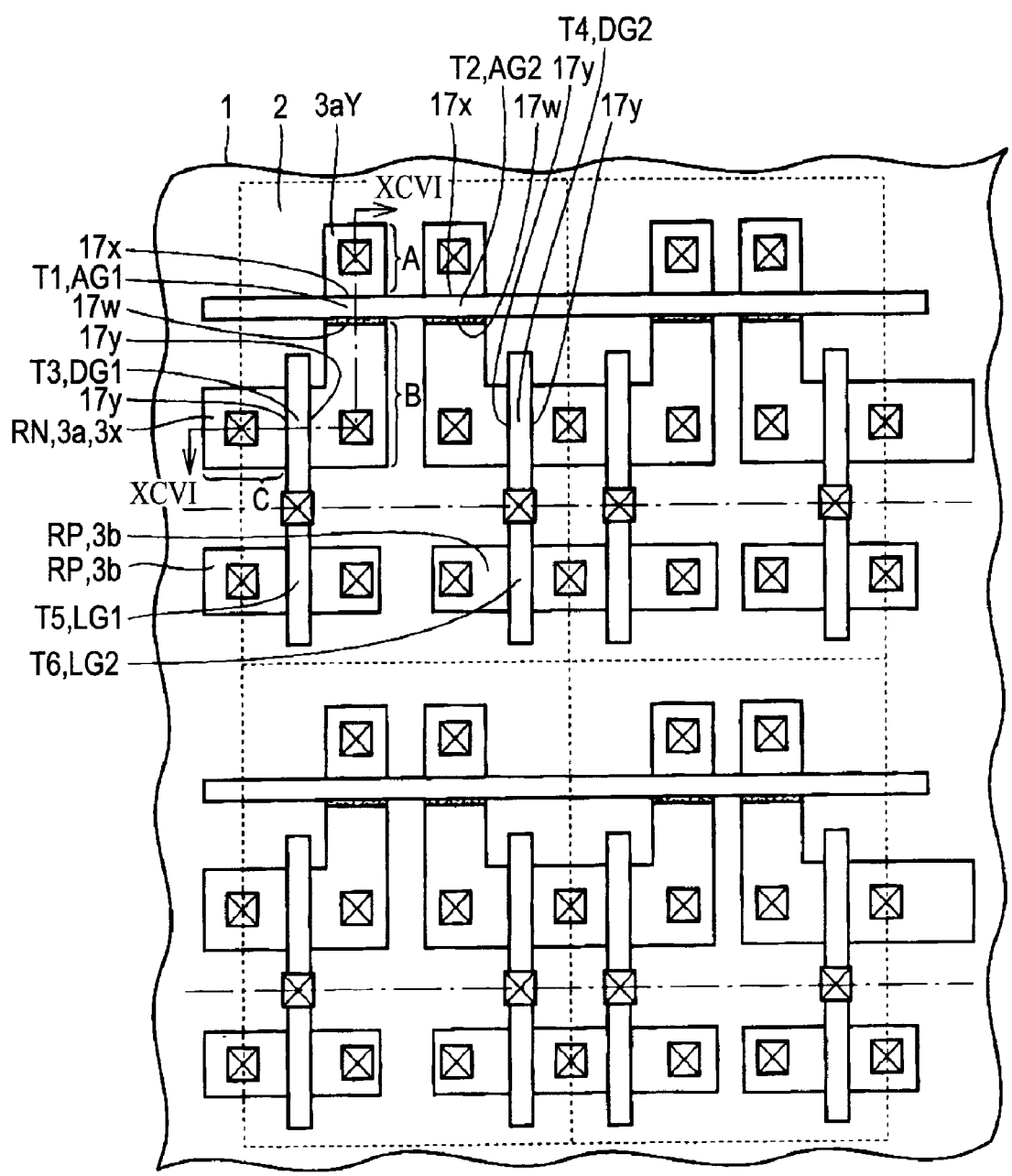
FIG. 95 is a plan view showing a layout pattern of the SRAM memory cells in Embodiment 5.
Figure 96:
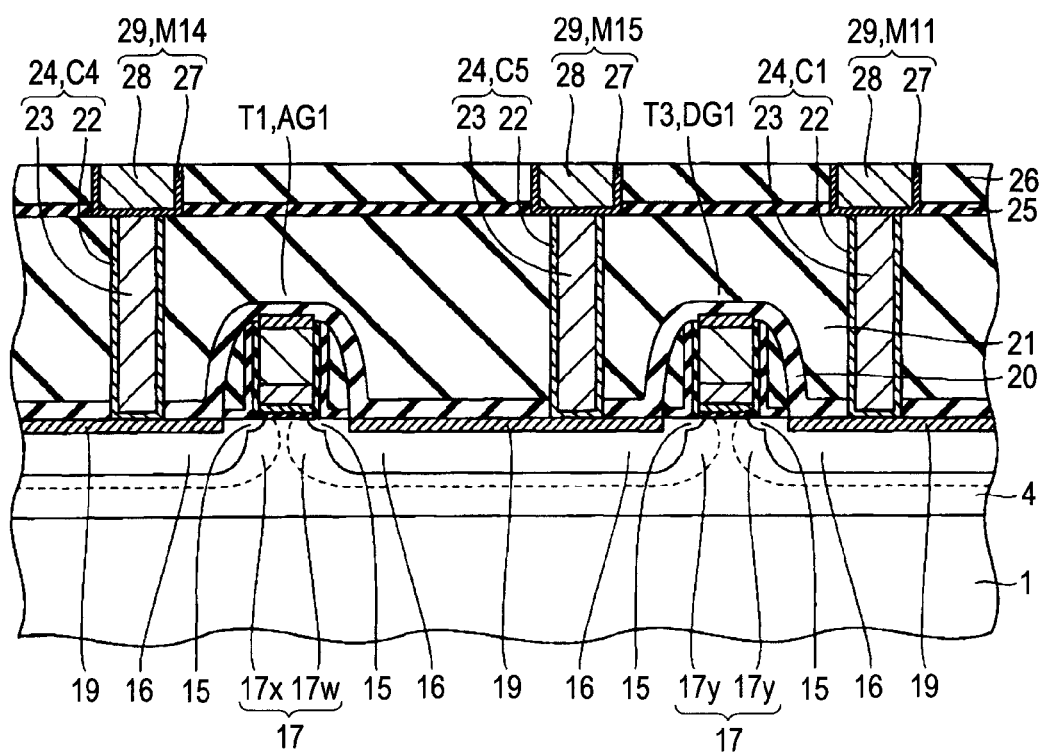
FIG. 96 is a cross-sectional view along the cross-sectional line XCVI-XCVI shown in FIG. 95 in Embodiment 5.

Next, a description will be given of a structure of the SRAM memory cell. As shown in FIGS. 95 and 96, in the portion (area A) of each of the element formation regions 3a located on the opposite side of the drive gate electrode DG1 relative to the access gate electrode AG1, there are formed the halo region 17x, the extension region 15, the source or drain region 16, and the metal silicide film 19. In the portion (area B) of the element formation region 3a located between the access gate electrode AG1 and the drive gate electrode DG1, there are formed the halo region 17w, the halo region 17y, the extension regions 15, the source or drain region 16, and the metal silicide film 19. In the portion (area C) of the element formation region 3a located on the opposite side of the access gate electrode AG1 relative to the drive gate electrode DG1, there are formed the halo region 17y, the extension region 15, the source or drain region 16, and the metal silicide film 19.

Figure 78:
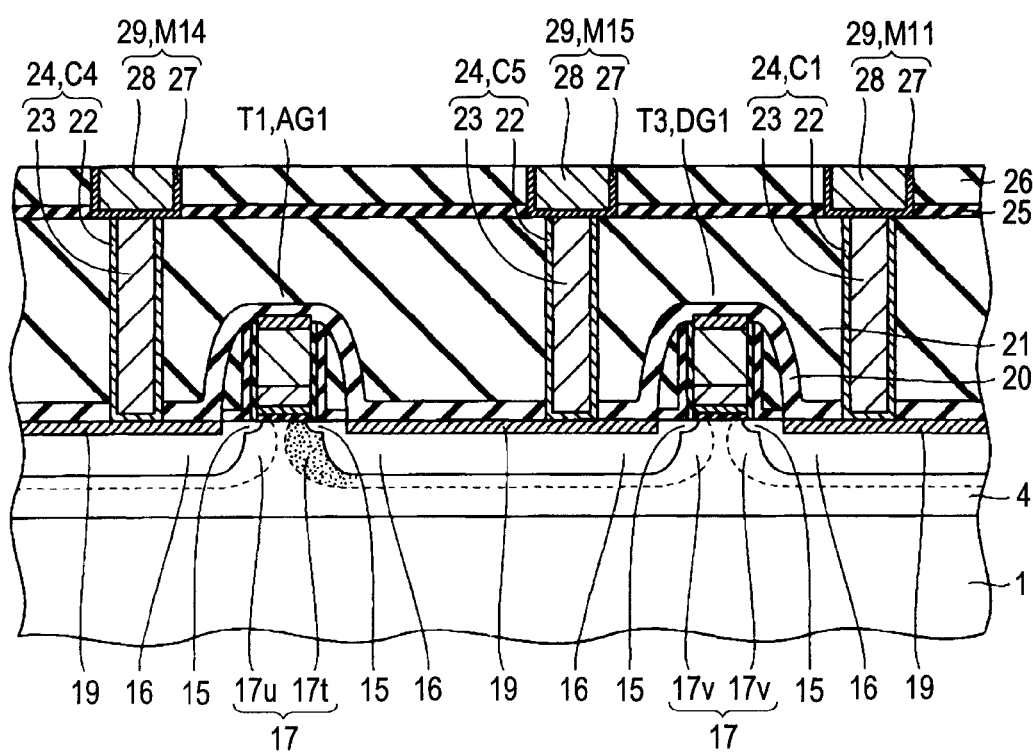
FIG. 78 is a cross-sectional view along the cross-sectional line LXXVIII-LXXVIII shown in FIG. 77 in Embodiment 4.
Figure 97:
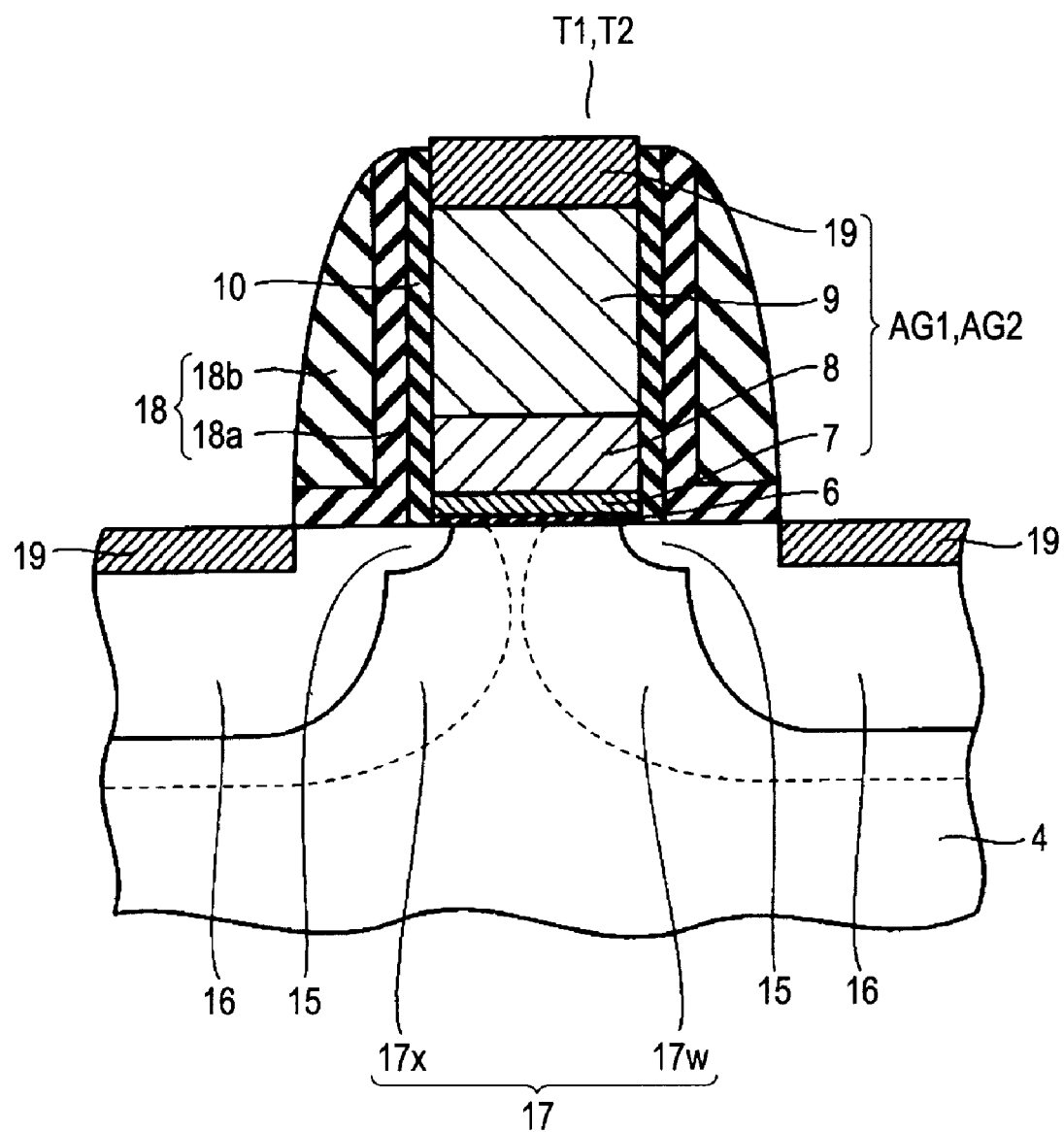
FIG. 97 is a partial enlarged cross-sectional view showing an access transistor in Embodiment 5.

As shown in FIG. 97, particularly in the access transistor T1 (T2), the halo regions 17w and 17x are formed to have asymmetric shapes relative to the access gate electrode AG1 (AG2) in the gate length direction thereof. That is, the halo region 17w is formed so as to extend toward an area immediately under a middle portion in the gate length direction of the access gate electrode AG1 (AG2) to reach a portion more inward than a portion reached by the halo region 17x. Note that the configuration is otherwise the same as the configuration shown in FIGS. 77, 78, or the like, and therefore the same members are designated by the same reference numerals and the description thereof will not be repeated.

Figure 98:
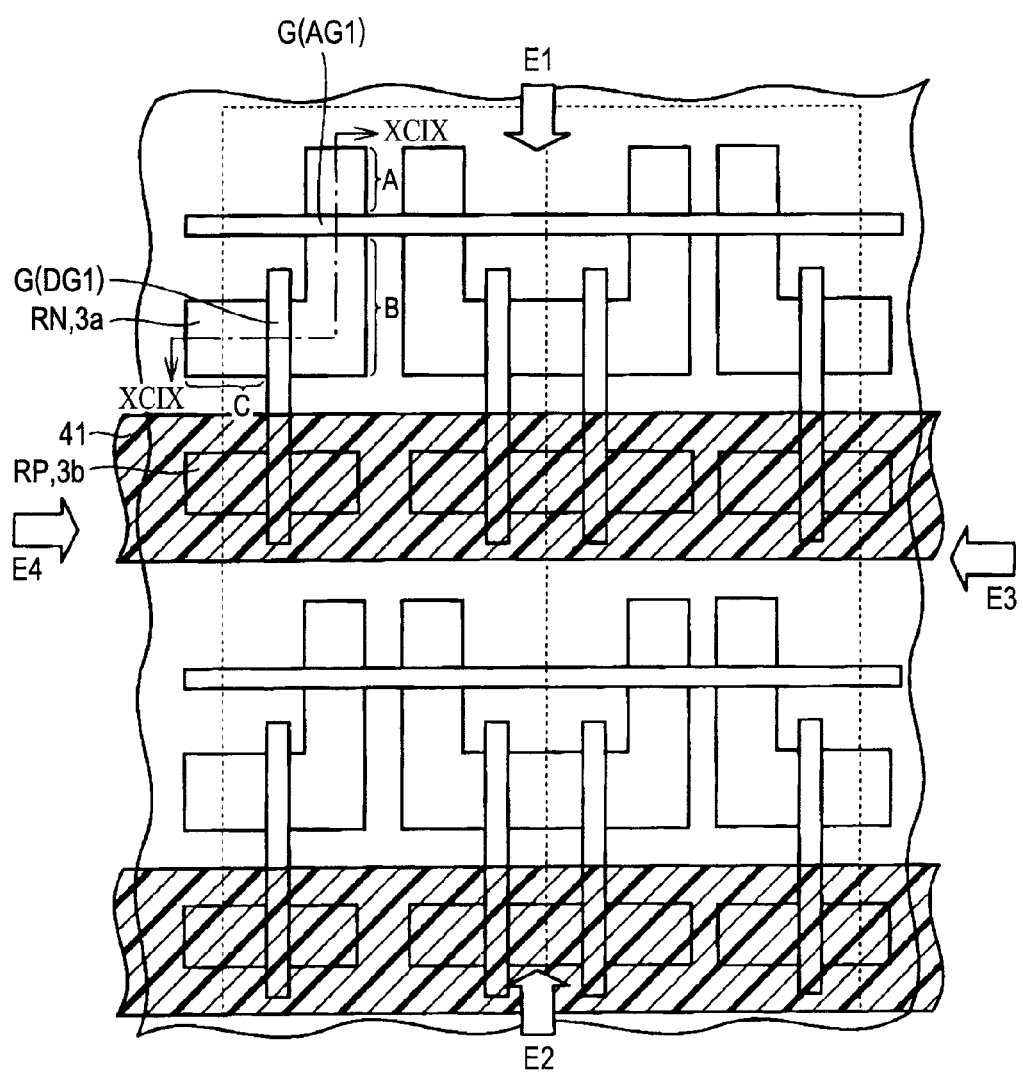
FIG. 98 is a plan view showing a step of a method of manufacturing the semiconductor device in Embodiment 5.

Next, a description will be given of a method of manufacturing the semiconductor device described above. After the same step as shown in FIG. 82 is performed, as shown in FIG. 98, a predetermined photographic process is performed to form a resist mask 41 serving as an implantation mask (implantation mask A) for forming halo regions. The resist mask 41 is formed into a pattern exposing the NMIS regions RN where the element formation regions 3a are formed, and covering the PMIS regions RP where the element formation regions 3b are formed. Then, using the resist mask 41 as an implantation mask, boron is implanted from a predetermined direction.

Figure 99:
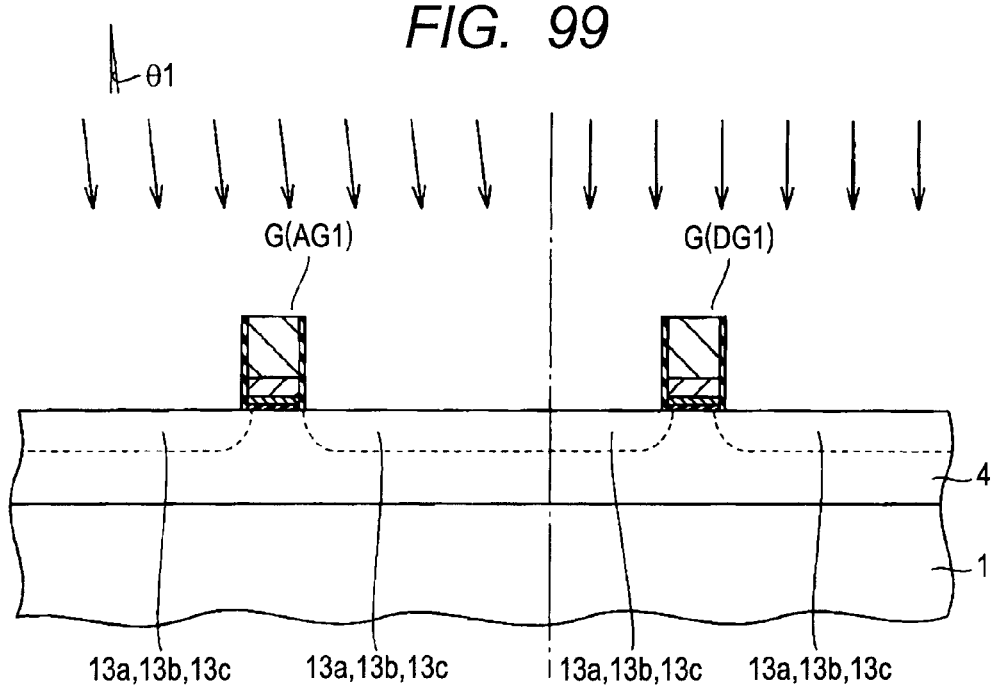
FIG. 99 is a cross-sectional view showing a step performed after the step shown in FIG. 98 in Embodiment 5, which is a cross-sectional view along a cross-sectional line corresponding to the cross-sectional line XCIX-XCIX shown in FIG. 98.

First, using the resist mask 41 as an implantation mask, boron is implanted obliquely ($\theta 1$=about 7° to 8°) to a direction perpendicular to the main surface of the semiconductor substrate 1 from the directions E3 and E4 (see FIG. 98), thereby forming the p-type impurity regions 13a and 13b (see FIG. 99) in the exposed p-well 4 in the element formation regions 3a. Next, as shown in FIG. 99, using the resist mask 41 as an implantation mask, boron is implanted obliquely ($\theta 1$=about 7° to 8°) to a direction perpendicular to the main surface of the semiconductor substrate 1 from the direction E1 (see FIG. 98), thereby forming the p-type impurity regions 13c in the exposed p-well 4 in the element formation regions 3a.

Figure 100:
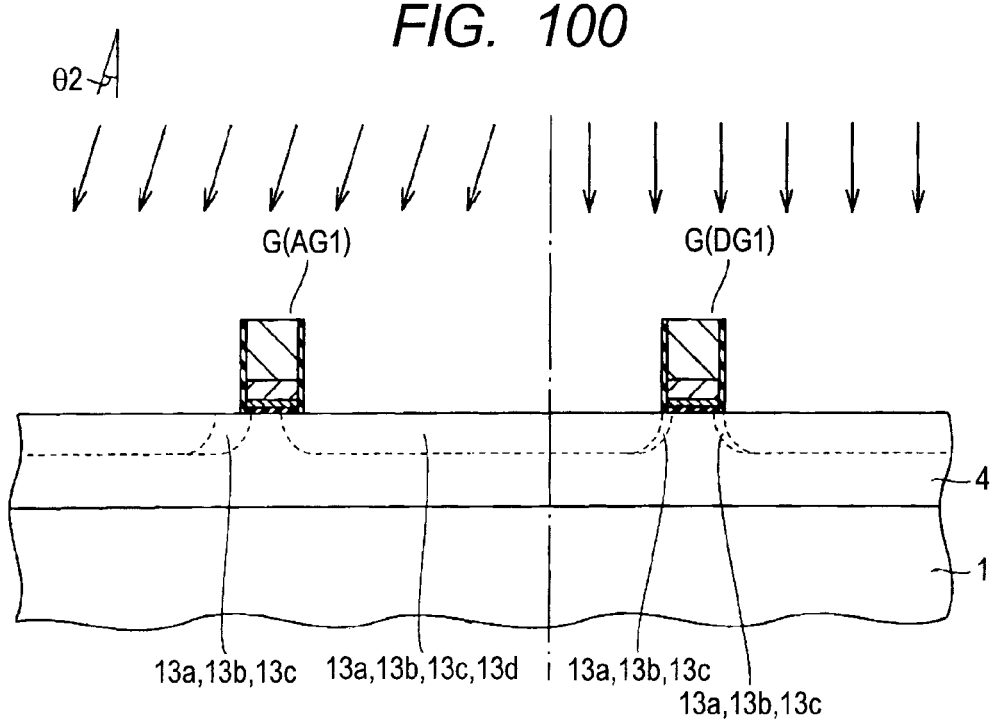
FIG. 100 is a cross-sectional view showing a step performed after the step shown in FIG. 99 in Embodiment 5.

Next, as shown in FIG. 100, using the resist mask 41 as an implantation mask, boron is implanted obliquely ($\theta 2$=about 10° to 11°) to a direction perpendicular to the main surface of the semiconductor substrate 1 from the direction E2 (see FIG. 98), thereby forming the p-type impurity region 13d in the exposed p-well 4 in the element formation region 3a (halo implantation A). In the implantation from the direction E2, the implantation angle $\theta 2$ is set larger than the implantation angle $\theta 1$ in the implantation from the direction E1 so that boron is introduced into a more inward area (under the middle portion in the gate length direction) immediately under the access gate electrode AG1 (AG2). Note that, from each of the directions E1 to E4, boron is implanted with the same implantation energy.

Figure 101:
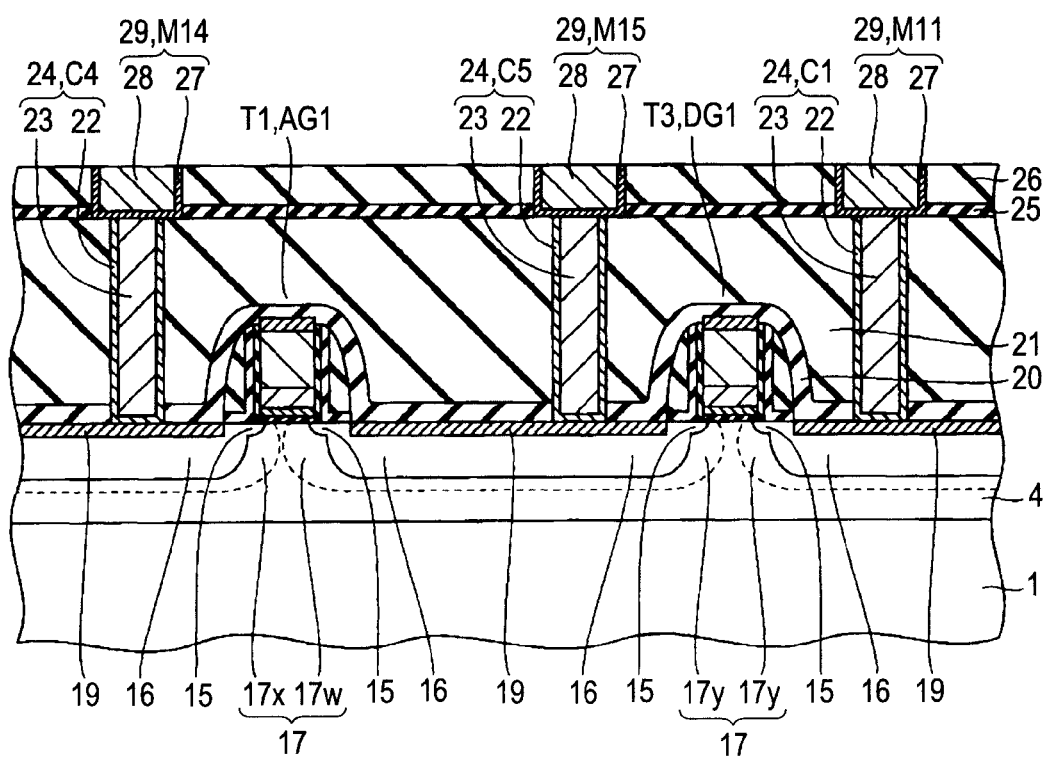
FIG. 101 is a cross-sectional view showing a step performed after the step shown in FIG. 100 in Embodiment 5.

Next, as shown in FIG. 101, the sidewall spacers 18 are formed over the both side surfaces of the gate structures G. Then, the source or drain regions 16 are formed to extend from the exposed surface of the p-well 4 in the NMIS regions RN to a predetermined depth. Then, source or drain regions (not shown) are formed to extend from the surfaces of the element formation regions 3b in the PMIS regions RP to a predetermined depth. Then, a predetermined annealing process is performed to thermally diffuse the implanted impurities, and thereby activate the source or drain regions 16, the extension regions 15, and the halo regions 17w, 17x, and 17y. Then, by a salicide process, the metal silicide films 19 comprised of nickel silicide or the like are formed in the exposed surfaces of the polysilicon films of the source or drain regions 16, the access gate electrode AG1, and the drive gate electrode DG1.

Next, the stress liner film 20 such as a silicon nitride film is formed so as to cover the access gate electrode AG1 and the drive gate electrode DG1. Then, the interlayer insulating film 21 comprised of TEOS or the like is formed so as to cover the stress liner film 20. Then, in the interlayer insulating film 21, the contact holes 21a are formed to expose the metal silicide films 19. Then, in the contact holes 21a, the plugs 24 each including the barrier metal film 22 and the tungsten film 23 are formed. Then, the etching stopper film 25 such as a silicon nitride film and the interlayer insulating film 26 such as a silicon oxide film are formed so as to cover the plugs 24. Then, the trenches 26a are formed to expose the surfaces of the plugs 24. Then, in the trenches 26a, the copper wires 29 each including the barrier metal film 27 and the copper film 28 are formed. The copper wires 29 correspond to first metal wires.

Thereafter, an interlayer insulating film (not shown) is formed so as to cover the copper wires 29. In the interlayer insulating film, the vias V11 to V18 (see FIG. 80) are formed by the same method as the method of forming the plugs 24. Then, an interlayer insulating film (not shown) is formed so as to cover the vias V11 to V18. In the interlayer insulating film, the second metal wires M21 to M25 (see FIG. 80) are formed by the same method as the method of forming the copper wires 29.

Next, an interlayer insulating film (not shown) is formed so as to cover the second metal wires M1 to M25. In the interlayer insulating film, the vias V21 to V24 (see FIG. 81) are formed by the same method as the method of forming the plugs 24. Then, an interlayer insulating film (not shown) is formed so as to cover the vias V21 to V24. In the interlayer insulating film, the third metal wires M31 to M33 (see FIG. 81) are formed by the same method as the method of forming the copper wires 29. In this manner, the main portions of the SRAM memory cells are formed.

In the semiconductor device described above, the halo region 17w of the access transistor T1 (T2) is formed so as to extend toward an area immediately under the middle portion in the gate length direction of the access gate electrode AG1 (AG2) to reach a portion more inward than a portion reached by the halo region 17x. In this case, if the threshold voltage is the same, a current larger in amount is allowed to flow from the halo region 17w toward the halo region 17x than a current flowing from the halo region 17x toward the halo region 17w. Since the halo region 17w is formed on the storage node side and the halo region 17x is formed on the bit line side, it is possible to increase the γ ratio without degrading the β ratio, and increase the β ratio without degrading the γ ratio. Alternatively, it is possible to increase both of the β ratio and the γ ratio. As a result, the read margin and the write margin can be ensured.

In addition, the halo regions 17w and 17x of the access transistors T1 and T2 and the halo regions 17y of the drive transistors T3 and T4 are formed using the resist mask 41 (implantation mask A shown in FIG. 98) as the implantation mask. In particular, the halo regions 17w and 17x having the asymmetric shapes are formed by changing implantation angles. Further, the halo regions of the load transistors T5 and T6 are formed using the resist mask 42 (implantation mask B shown in FIG. 89) as the implantation mask. That is, to form the halo regions of the individual transistors forming the SRAM memory cell, in the semiconductor device described above, the two implantation masks allow the halo regions of the individual transistors to be formed.

Therefore, it is possible to reduce one more of the photographic masks used for the semiconductor device according to each of Embodiments 1 to 5, which are smaller in number than at least four implantation masks needed for the semiconductor device according to the comparative example. Accordingly, at least two of the photographic masks can be reduced. This allows a further reduction in production cost.

Embodiment 6

Here, a description will be given of a semiconductor device including access transistors in each of which a gate length varies relative to a gate width direction.

Figure 102:
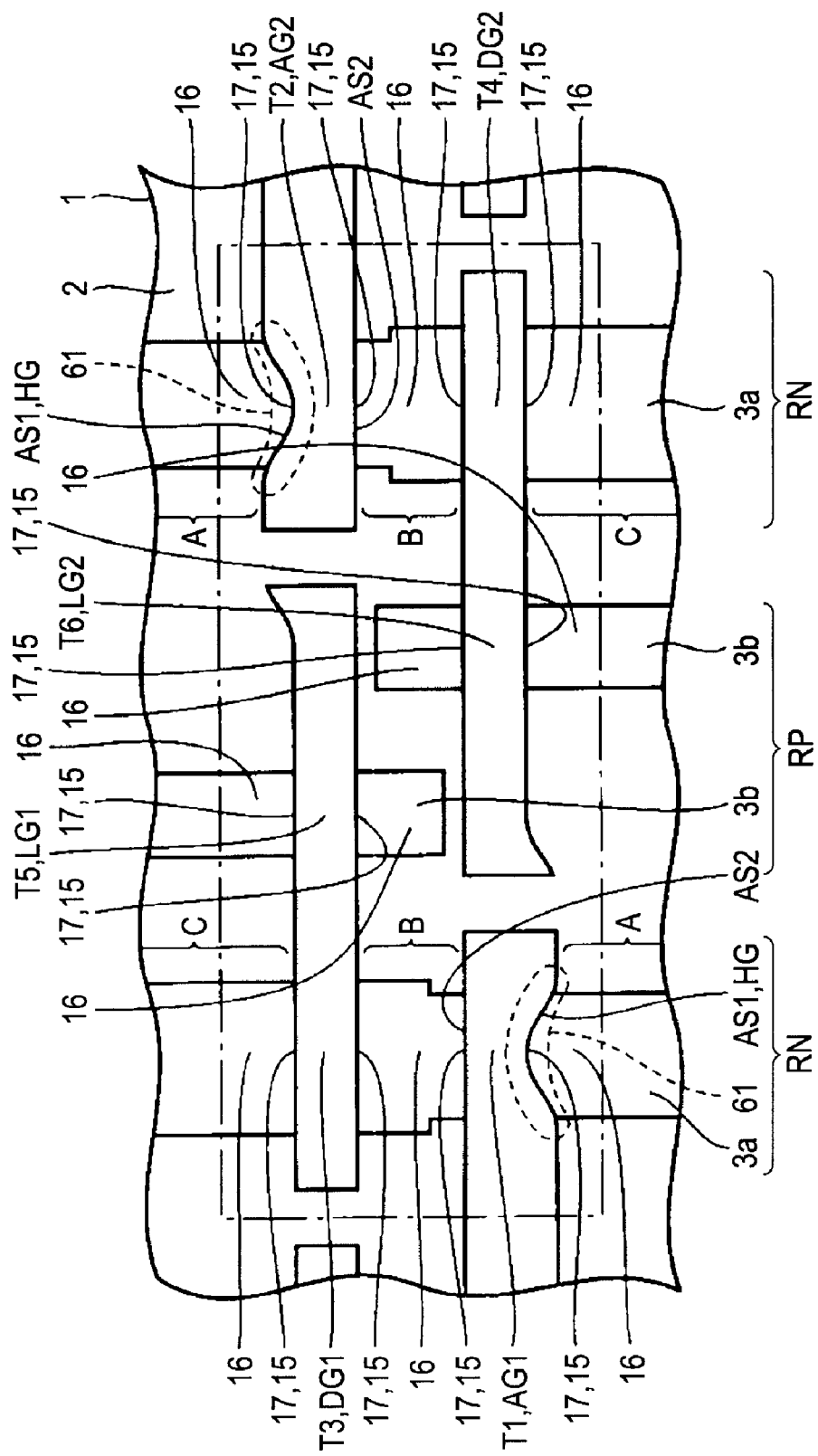
FIG. 102 is a plan view showing a layout pattern of SRAM memory cells in a semiconductor device according to Embodiment 6 of the present invention.

First, a description will be given of a structure of a SRAM memory cell. As shown in FIG. 102, in the main surface of the semiconductor substrate 1, the isolation insulating film 2 is formed to define the element formation regions 3a and 3b electrically isolated from each other. The element formation regions 3a are formed in the NMIS regions RN. In the element formation regions 3a, the access transistors T1 and T2 and the drive transistors T3 and T4 are formed as n-channel MIS transistors. The element formation regions 3b are formed in the PMIS region RP. In the element formation regions 3b, the load transistors T5 and T6 are formed as p-channel MIS transistors.

The access gate electrodes AG1 and AG2 of the access transistors T1 and T2 and the drive gate electrodes DG1 and DG2 of the drive transistors T3 and T4 are formed so as to traverse the element formation regions 3a. The load gate electrodes LG1 and LG2 of the load transistors T5 and T6 are formed so as to traverse the element formation regions 3b. Each of the access gate electrodes AG1 and AG2, the drive gate electrodes DG1 and DG2, and the load gate electrodes LG1 and LG2 is formed so as to extend in one direction.

In the portion (area A) of each of the element formation regions 3a located on the opposite side of the drive gate electrode DG1 (DG2) relative to the access gate electrode AG1 (AG2), there are formed the halo region 17, the extension region 15, the source or drain region 16, and the like. In the portion (area B) of the element formation region 3a located between the access gate electrode AG1 (AG2) and the drive gate electrode DG1 (DG2), there are formed the halo regions 17, the extension regions 15, the source or drain region 16, and the like.

In the portion (area C) of the element formation region 3a located on the opposite side of the access gate electrode AG1 (AG2) relative to the drive gate electrode DG1 (DG2), there are formed the halo region 17, the extension region 15, the source or drain region 16, and the like. Each of the halo regions 17 is formed so as to reach an area immediately under the corresponding access gate electrode AG1 (AG2) or the corresponding drive gate electrode DG1 (DG2) (not shown).

Figure 103:
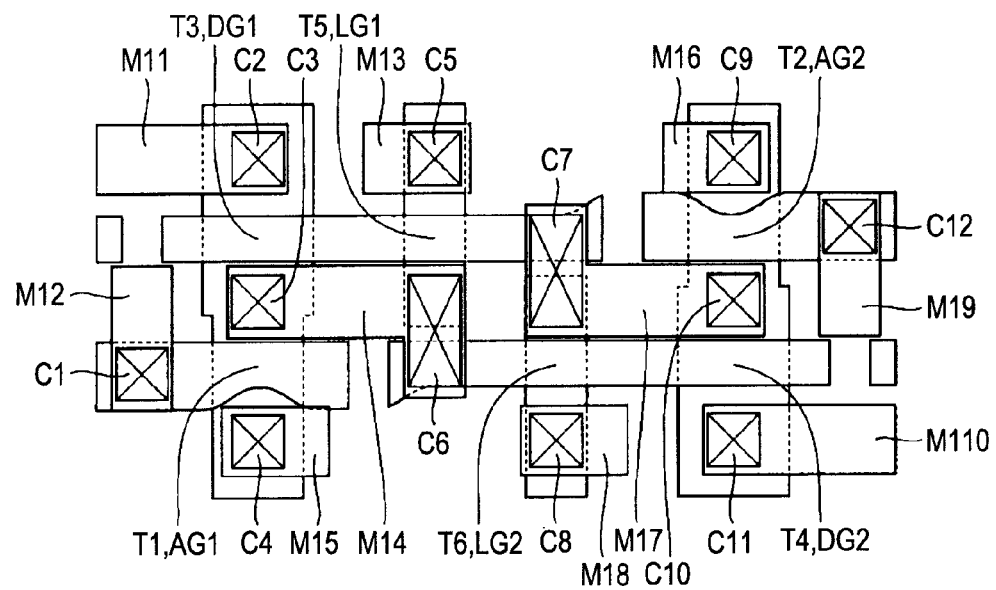
FIG. 103 is a plan view showing a coupling structure between individual transistors and first metal wires in Embodiment 6.
Figure 104:
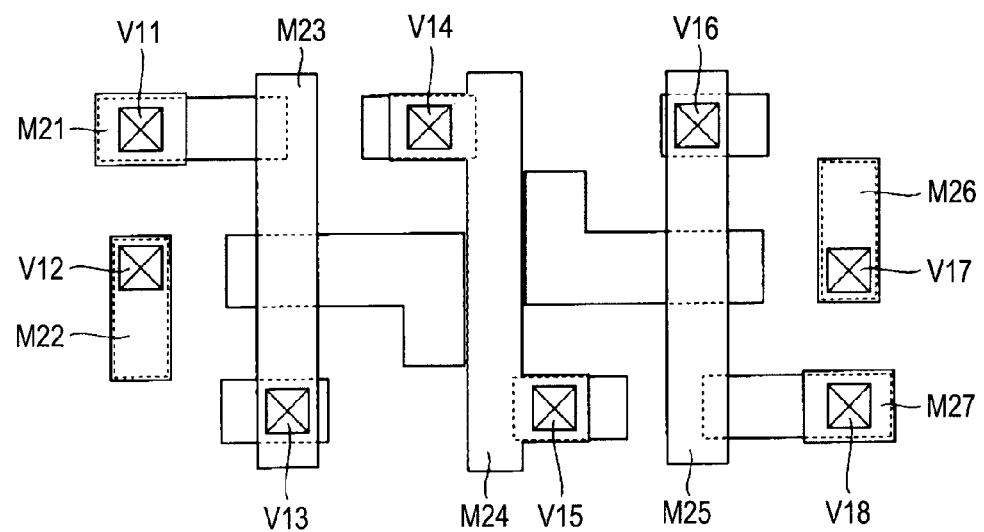
FIG. 104 is a plan view showing a coupling structure between the first metal wires and second metal wires in Embodiment 6.
Figure 105:
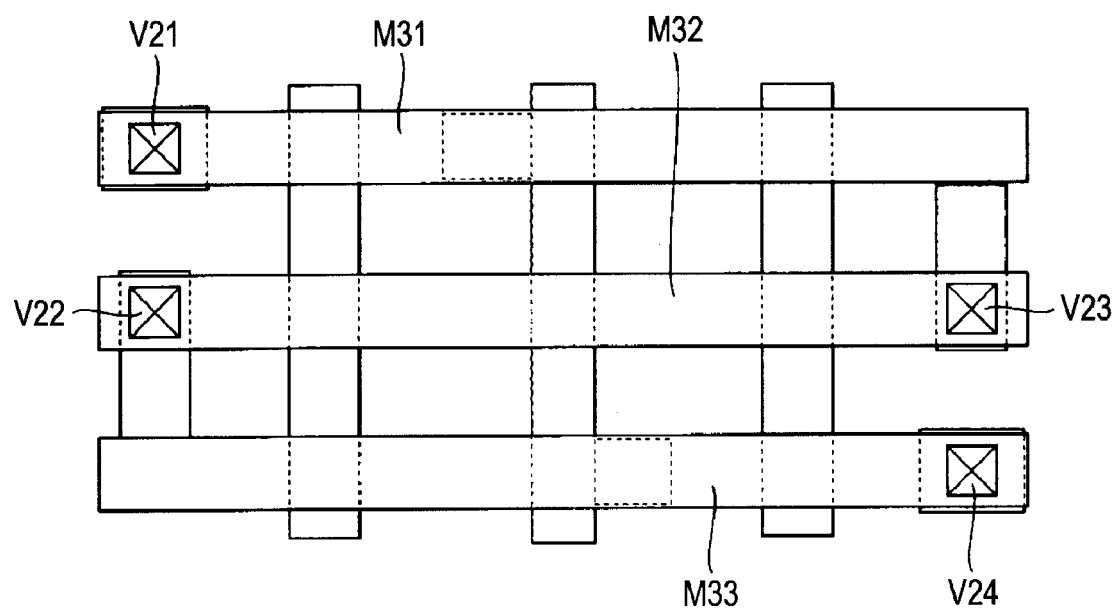
FIG. 105 is a plan view showing a coupling structure between the second metal wires and third metal wires in Embodiment 6.

Next, a description will be given of a multilayer wiring structure which electrically couples the individual transistors. As shown in FIGS. 103, 104, and 105, in the semiconductor device according to Embodiment 6, over the first metal wires M11 to M110, the second metal wires M21 to M27 are formed and, over the second metal wires M21 to M27, the third metal wires M31 to M33 are formed.

One (area A) of the S/D regions of the access transistor T1 is electrically coupled to the second metal wire M23 serving as the bit line BL via the contact C4, the first metal wire M15, and the via V13. The other (area B) of the S/D regions of the access transistor T1 is electrically coupled to one (area) of the S/D regions of the load transistor T5, the load gate electrode LG2 of the load transistor T6, and the drive gate electrode DG2 of the drive transistor T4 via the contact C3, the first metal wire M14, and the contact C6. The other (area B) of the S/D regions of the access transistor T1 is also electrically coupled to one (area B) of the S/D regions of the drive transistor T3.

The access gate electrode AG1 of the access transistor T1 is electrically coupled to the third metal wire M32 serving as the word line WL via the contact C1, the first metal wire M12, the via V12, the second metal wire M22, and the via 22. The other (area C) of the S/D regions of the drive transistor T3 is electrically coupled to the third metal wire M31 fixed to the ground potential via the contact C2, the first metal wire M11, the via V11, the second metal wire M21, and the via V21. The other of the S/D regions of the load transistor T5 is electrically coupled to the second metal wire M24 serving as a power source line via the contact C5, the first metal wire M13, and the via V14.

One of the S/D regions of the access transistor T2 is electrically coupled to the second metal wire M25 serving as the bit line /BL via the contact C9, the first metal wire M16, and the via V16. The other of the S/D regions of the access transistor T2 is electrically coupled to one (area) of the S/D regions of the load transistor T6, the load gate electrode LG1 of the load transistor T5, and the drive gate electrode DG1 of the drive transistor T3 via the contact C10, the first metal wire M17, and the contact C7. The other of the S/D regions of the access transistor T2 is also electrically coupled to one of the S/D regions of the drive transistor T4.

The access gate electrode AG2 of the access transistor T2 is electrically coupled to the third metal wire M32 serving as the word line WL via the contact C12, the first metal wire M19, the via V17, the second metal wire M26, and the via 23. The other of the S/D regions of the drive transistor T4 is electrically coupled to the third metal wire M33 fixed to the ground potential via the contact C11, the first metal wire M110, the via V18, the second metal wire M27, and the via 24. The other of the S/D regions of the load transistor T6 is electrically coupled to the second metal wire M24 serving as a power source line via the contact C8, the first metal wire M18, and the via V15.

As shown in the dot-line frame 61 of FIG. 102, particularly in the access gate electrodes AG1 and AG2 of the access transistors T1 and T2 of the semiconductor device described above, a deformed portion HG is provided in such a form that a side portion AS1, which is the one of the mutually opposing both side portions AS1 and AS2 located on the side (in the area A) coupled to the bit line, is reduced in gate length to be closer to the other side portion AS2 located on the side (in the area B) coupled to the storage node. Since such a deformed portion HG is formed, the same function and effect as obtained in the case where the impurity concentration of one of the halo regions is higher than the impurity concentration of the other halo region can be obtained.

Next, a description will be given of a method of manufacturing the semiconductor device described above. First, in the main surface of the semiconductor substrate 1, the isolation insulating film 2 is formed to define the element formation regions 3a and 3b electrically isolated from each other (see FIG. 106).

Figure 106:
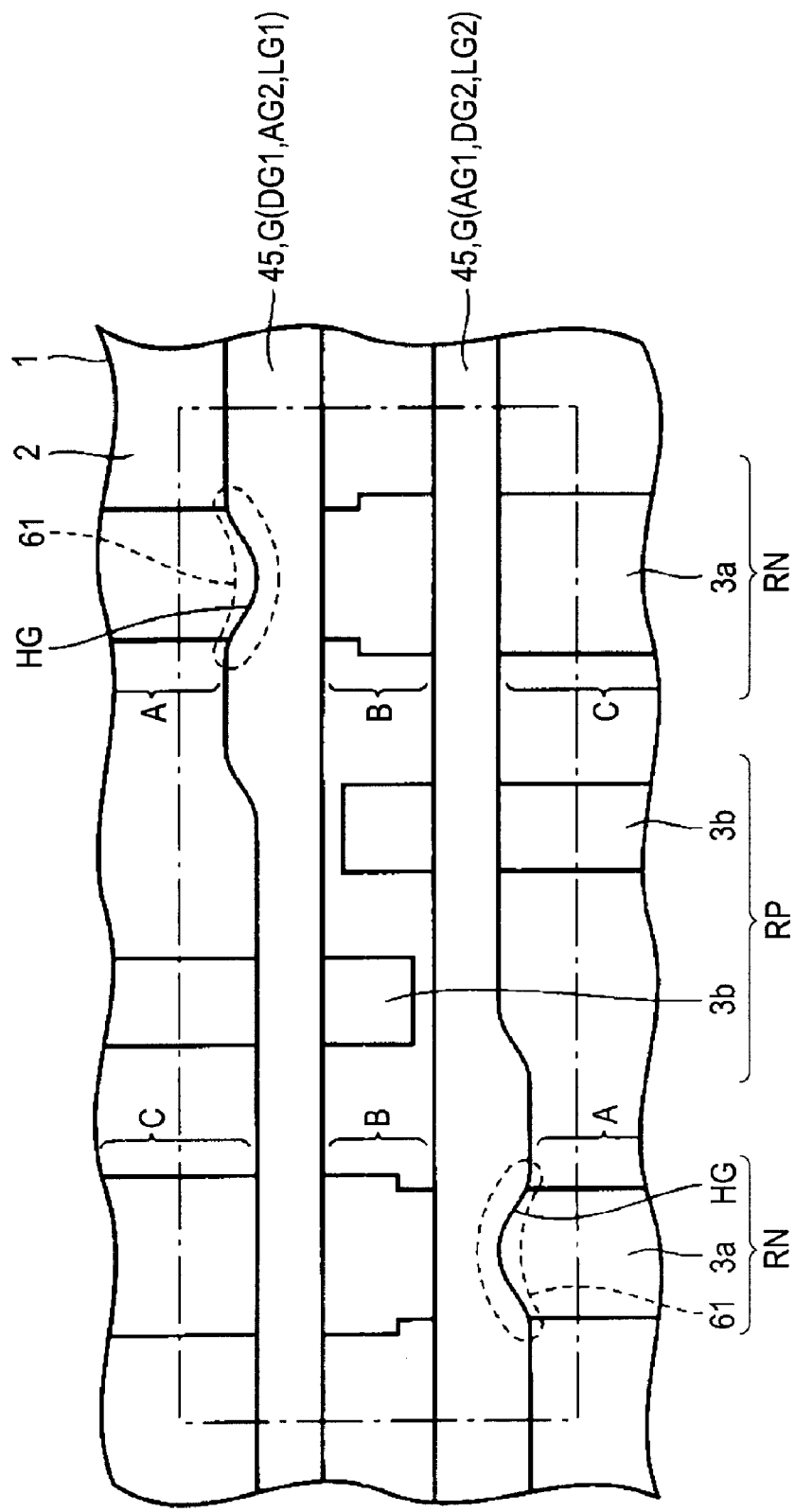
FIG. 106 is a plan view showing a step of a method of manufacturing the semiconductor device in Embodiment 6.

Next, in a form in which a High-k film having a predetermined dielectric constant, a metal film having a predetermined work function, and a polysilicon film are stacked over the surface of the semiconductor substrate 1 with an interface layer formed therebetween, individual layers serving as the respective gate electrodes of the access transistors, the drive transistors, and the load transistors are formed. Then, as shown in FIG. 106, a predetermined photographic process and an etching process are performed to the individual layers to form a layer 45 serving as the gate electrodes. At this time, as shown in the dot-line frame 61, in the portions of the access transistors serving as the gate electrodes, the deformed portions HG are patterned.

Figure 107:
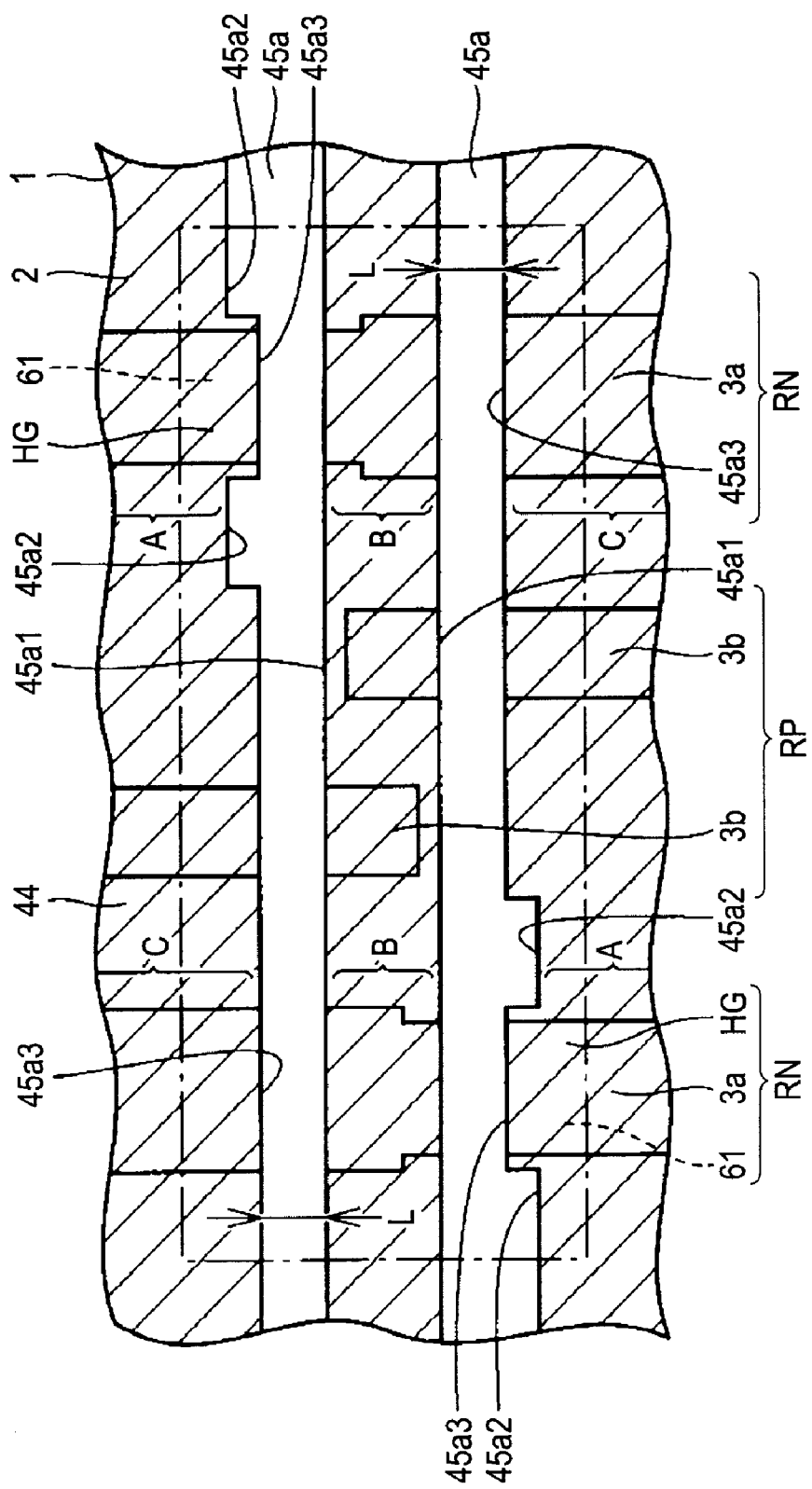
FIG. 107 is a plan view showing a resist mask pattern for forming the gate electrodes shown in FIG. 106 in Embodiment 6.

To form the layer 45 having the deformed portions HG, a photomask 44 having the mask pattern 45a shown in FIG. 107 is prepared. The mask pattern 45a has a horizontally elongated rectangular shape, and the thickness L thereof corresponds to the gate length of each of the respective gate electrodes of the drive transistors and the load transistors. In one side surface in the longitudinal direction of the mask pattern 45a, two protruding shapes are provided. Specifically, the mask pattern 45a has a linear side 45a1, and linear sides 45a2 and 45a3 each opposing the side 45a1 and arranged in parallel with each other. The distance between the sides 45a1 and 45a2 is larger than the distance between the sides 45a1 and 45a3. The sides 45a2 and 45a3 are coupled with linear sides each extending in a direction orthogonal to the longitudinal direction.

After the photomask is aligned so as to position the area A of each of the element formation regions 3a between the two protruding shapes, a photoresist coated over the semiconductor substrate is exposed to light via the photomask. To the photoresist, the pattern shape of the mask pattern 45a is transferred, and the corner portions of the depressed/protruding portions of the mask pattern 45a are rounded and transferred. By etching the underlying film having the layered structure for the gate electrodes through the rounded photoresist pattern, when the semiconductor substrate is viewed in a plan view, the side (side surface AS1) of the layer 45 facing the area-A side coupled to the bit line is provided with a shape which is rounded to be closer to the side (side surface AS2) opposed thereto. On the other hand, the side (side surface AS2) opposed thereto has a linear shape without being rounded.

Figure 108:
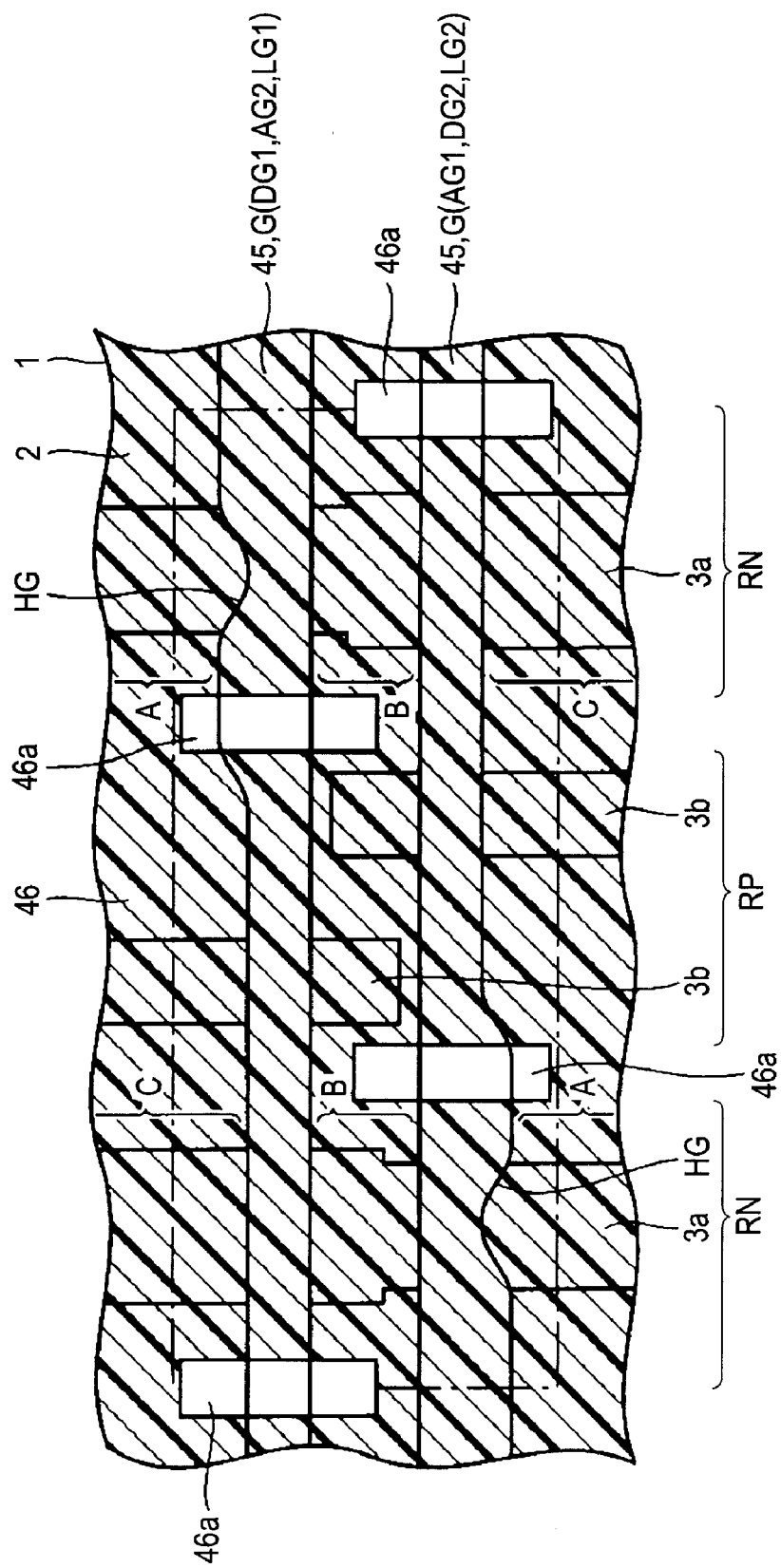
FIG. 108 is a plan view showing a step performed after the step shown in FIG. 106 in Embodiment 6.
Figure 109:
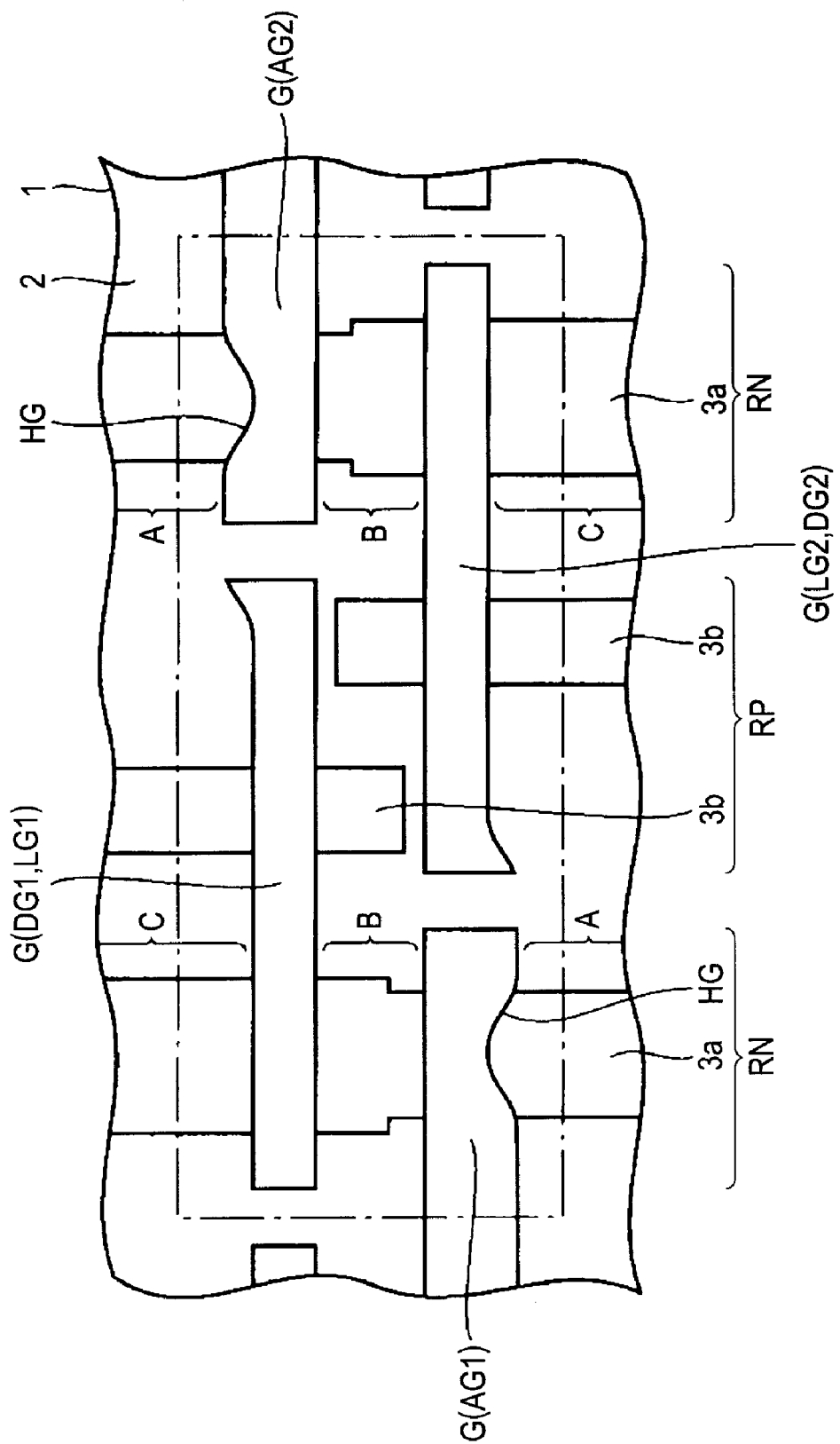
FIG. 109 is a plan view showing a step performed after the step shown in FIG. 108 in Embodiment 6.

Next, as shown in FIG. 108, over the layer 45 serving as the gate electrodes, a photoresist 46 having openings 46a for boring holes at predetermined positions in the layer 45 serving as the gate electrodes is formed. Then, using the photoresist 46 as a mask, etching is performed to the layer 45 serving as the gate electrodes to form the gate structures G serving as the access gate electrodes AG1 and AG2, the gate structures G serving as the drive gate electrodes DG1 and DG2, and the gate structures G serving as the load gate electrodes LG1 and LG2. Further, over the side surfaces of the gate structures G, offset spacers are formed.

Figure 110:
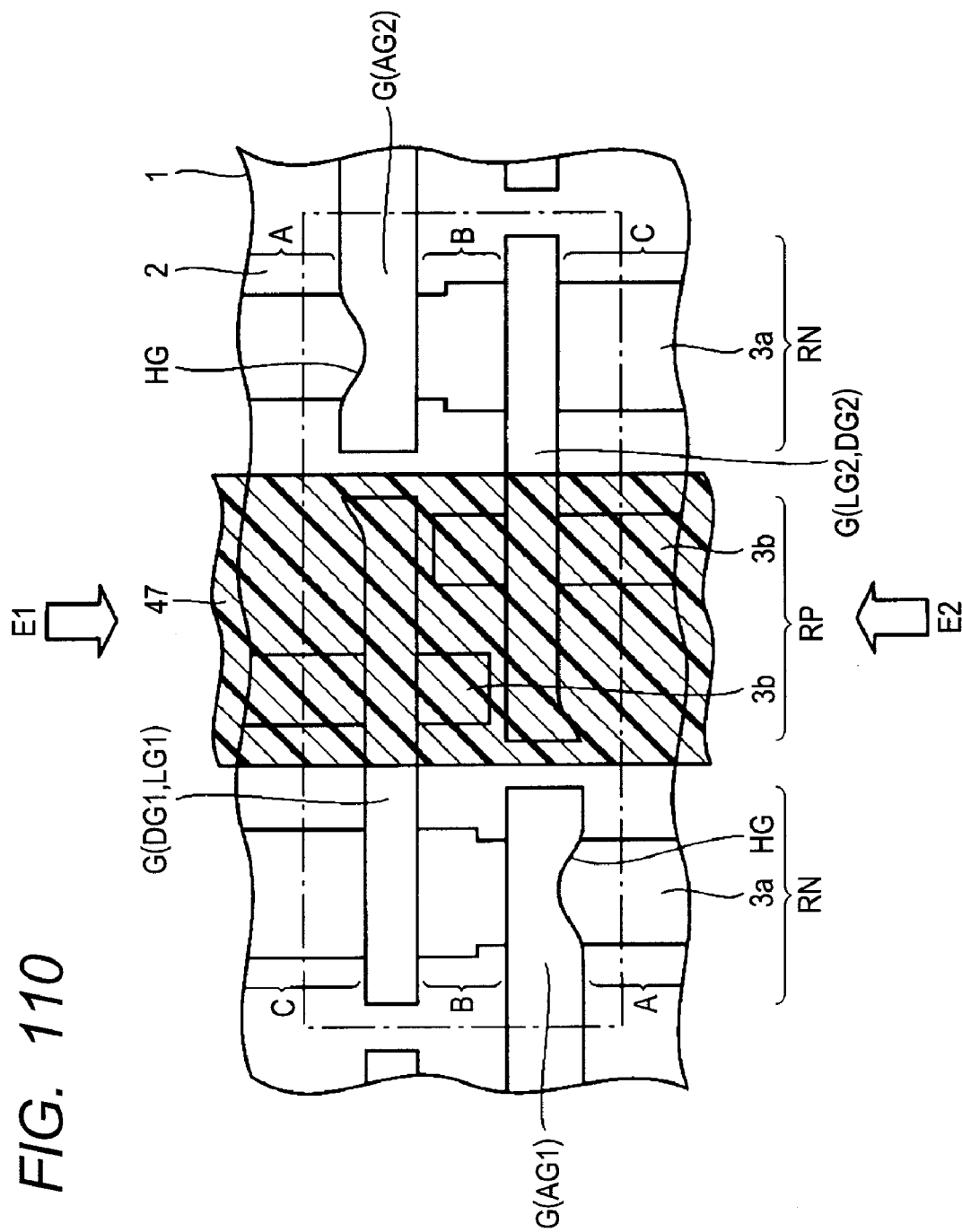
FIG. 110 is a plan view showing a step performed after the step shown in FIG. 109 in Embodiment 6.

Next, as shown in FIG. 110, a predetermined photographic process is performed to form a resist mask 47 serving as an implantation mask (implantation mask A) for forming halo regions. The resist mask 47 is formed into a pattern exposing the NMIS regions RN where the element formation regions 3a are formed, and cover the PMIS region RP where the element formation regions 3b are formed. Then, using the resist mask 47 as an implantation mask, boron is implanted from a predetermined direction.

First, using the resist mask 47 as an implantation mask, boron is implanted obliquely ($\theta$=about 7°) to a direction perpendicular to the main surface of the semiconductor substrate 1 from the directions E1 and E2, thereby forming p-type impurity regions serving as halo regions in the exposed element formation regions 3a. Next, using the resist mask 47 as an implantation mask, phosphorus or arsenic is implanted into the semiconductor substrate 1, thereby forming extension regions (not shown) in the exposed element formation regions 3a. Thereafter, the resist mask 47 is removed. Note that, in each of the implantation from the direction E1 and the implantation from the direction E2, boron is implanted at the same implantation dose and with the same implantation energy.

Figure 111:
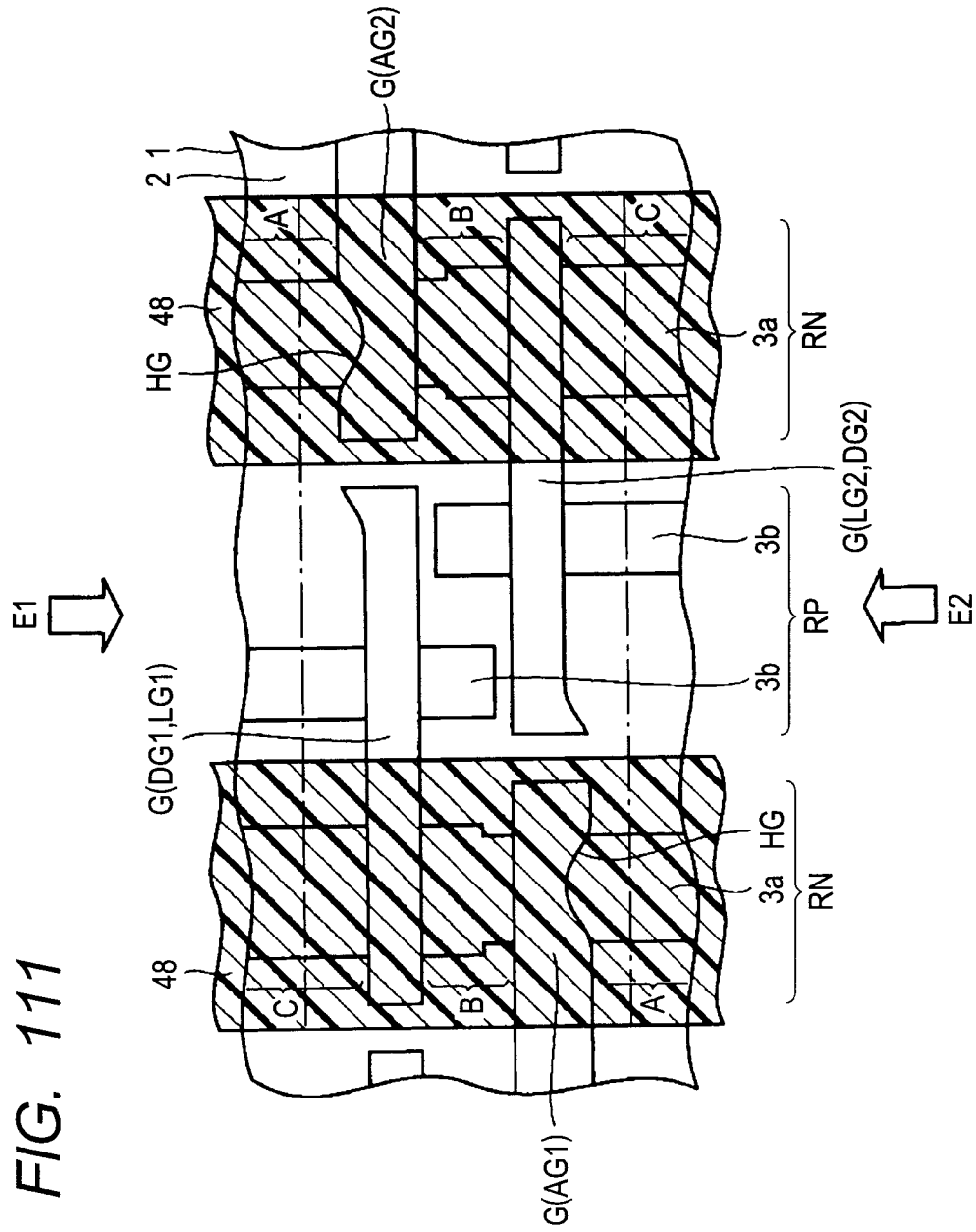
FIG. 111 is a plan view showing a step performed after the step shown in FIG. 110 in Embodiment 6.

Next, as shown in FIG. 111, a resist mask 48 (implantation mask B) covering the NMIS regions RN, and exposing the PMIS region RP is formed. Then, using the resist mask 48 as an implantation mask, phosphorus or arsenic is implanted into the semiconductor substrate 1 to form n-type impurity regions (not shown) serving as the halo regions in the element formation regions 3b. Then, using the resist mask 48 as an implantation mask, boron is implanted into the semiconductor substrate 1 to form extension regions (not shown). Thereafter, the resist mask 48 is removed.

Next, over the both side surfaces of the gate structures G, sidewall spacers (not shown) are formed. Then, a resist mask (not shown) exposing the NMIS regions RN, and covering the PMIS region RP is formed. Then, using the resist mask, the sidewall spacers, and the like as an implantation mask, phosphorus or arsenic is implanted into the semiconductor substrate 1, thereby forming the source or drain regions 16 (see FIG. 126) extending from the exposed surfaces of the element formation regions 3a to a predetermined depth. Thereafter, the resist mask is removed.

Next, a resist mask (not shown) covering the NMIS regions RN, and exposing the PMIS region RP is formed. Then, using the resist mask as an implantation mask, boron is implanted into the semiconductor substrate 1, thereby forming the source or drain regions 16 (see FIG. 102) extending from the exposed surfaces of the element formation regions 3a to a predetermined depth. Thereafter, the resist mask is removed.

Next, a predetermined annealing process is performed to thermally diffuse the implanted impurities, and thereby activate the source or drain regions 16, the extension regions 15, and the halo regions 17. In this manner, as shown in FIG. 102, in the element formation regions 3a, the access transistors T1 and T2 and the drive transistors T3 and T4 are formed while, in the element formation regions 3b, the load transistors T5 and T6 are formed. Then, through the same steps as the steps shown in FIGS. 29 and 30, metal silicide films, a stress liner film, an interlayer insulating film, plugs, an etching stopper film, and an interlayer insulating film (each of which is not shown) are formed. Then, copper wires as the first metal wires M11 to M110 (see FIG. 103) are formed.

Thereafter, an interlayer insulating film (not shown) is formed so as to cover the copper wires. In the interlayer insulating film, the vias V11 to V18 (see FIG. 104) are formed. Then, an interlayer insulating film (not shown) is formed so as to cover the vias V11 to V18. In the interlayer insulating film, the second metal wires M21 to M25 (see FIG. 104) are formed.

Next, an interlayer insulating film (not shown) is formed so as to cover the second metal wires M21 to M25. In the interlayer insulating film, the vias V21 to V24 (see FIG. 105) are formed. Then, an interlayer insulating film (not shown) is formed so as to cover the vias V21 to V24. In the interlayer insulating film, the third metal wires M31 to M34 (see FIG. 105) are formed. In this manner, the main portions of the SRAM memory cells are formed.

In the access gate electrodes AG1 and AG2 of the access transistors T1 and T2 of the semiconductor device described above, as shown in FIG. 102, the deformed portion HG is provided which varies in gate length relative to the gate width in such a manner that the side portion AS1 that is the one of the mutually opposing both side portions AS1 and AS2 located on the side (in the area A) coupled to the bit line is reduced in gate length to be closer to the other side portion AS2 located on the side (in the area B) coupled to the storage node.

Figure 112:
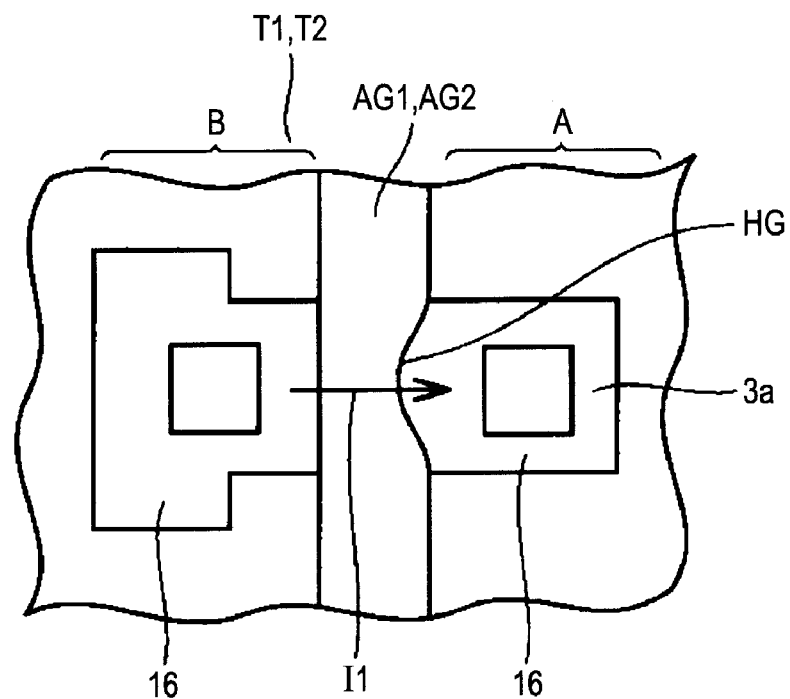
FIG. 112 is a plan view of a first portion for illustrating a current flowing in an access transistor in Embodiment 6.
Figure 113:
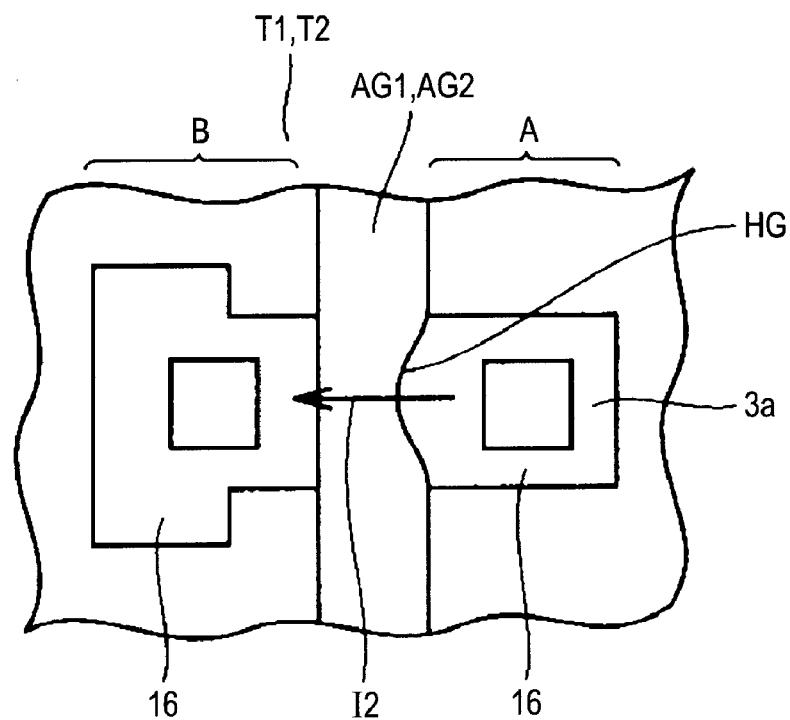
FIG. 113 is a plan view of a second portion for illustrating the current flowing in the access transistor in Embodiment 6.

Consequently, the widths of the offset spacers and the impurity concentration profiles of the halo regions in the gate length direction (channel direction) are different on the side provided with the side portion AS1 and on the side provided with the side portion AS2 so that current flows become asymmetric. That is, if the threshold voltage is the same, as shown in FIG. 112, a current I1 larger in amount is allowed to flow from the side (area B) coupled to the storage node to the side (area A) coupled to the bit line than a current I2 flowing from the side (area A) coupled to the bit line to the side (area B) coupled to the storage node, as shown in FIG. 113. This can increase the γ ratio without degrading the β ratio, and increase the β ratio without degrading the γ ratio. Alternatively, it is possible to increase both of the β ratio and the γ ratio. As a result, the read margin and the write margin can be ensured.

Moreover, the deformed portion HG of each of the access gate electrodes AG1 and AG2 of the access transistors needs a mere change of the mask pattern for patterning the gate structures G (see FIG. 106), and does not need a new mask. In addition, the halo regions 17 of the access transistors T1 and T2 and the halo regions 17 of the drive transistors T3 and T4 are formed using the resist mask 47 (implantation mask A shown in FIG. 110) as an implantation mask. Furthermore, the halo regions 17 of the load transistors T5 and T6 are formed using the resist mask 48 (implantation mask B shown in FIG. 111). That is, to form the halo regions of the individual transistors forming the SRAM memory cell, in the semiconductor device described above, the two implantation masks allow the halo regions of the individual transistors to be formed.

Therefore, it is possible to reduce one more of the photographic masks used for the semiconductor device according to each of Embodiments 1 to 3, which are smaller in number than at least four implantation masks needed for the semiconductor device according to the comparative example. Accordingly, at least two of the photographic masks can be reduced. This allows a further reduction in production cost.

Figure 114:
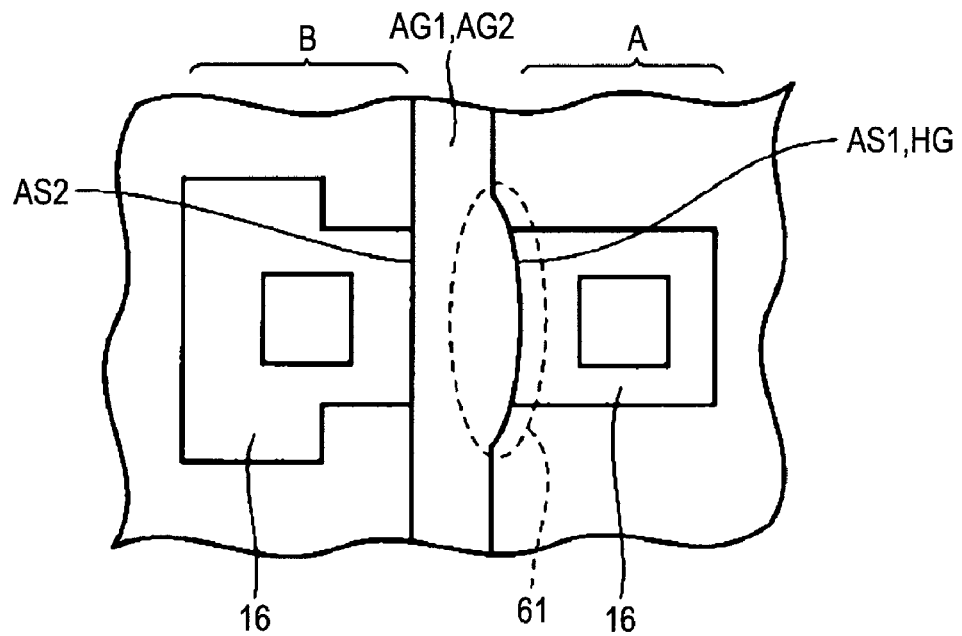
FIG. 114 is a partial plan view showing an access transistor according to a first variation in Embodiment 6.

In the semiconductor device described above, by way of example, the deformed portion HG has been described in which the side portion AS1 is reduced in gate length to be closer to the side portion AS2. However, the deformed portion is not limited to this form. As shown in FIG. 114, the deformed portion HG may also be such that the side portion AS1 located on the side (in the area A) coupled to the bit line is increased in gate length to be farther away from the side portion AS2 located on the side (in the area B) coupled to the storage node.

Figure 115:
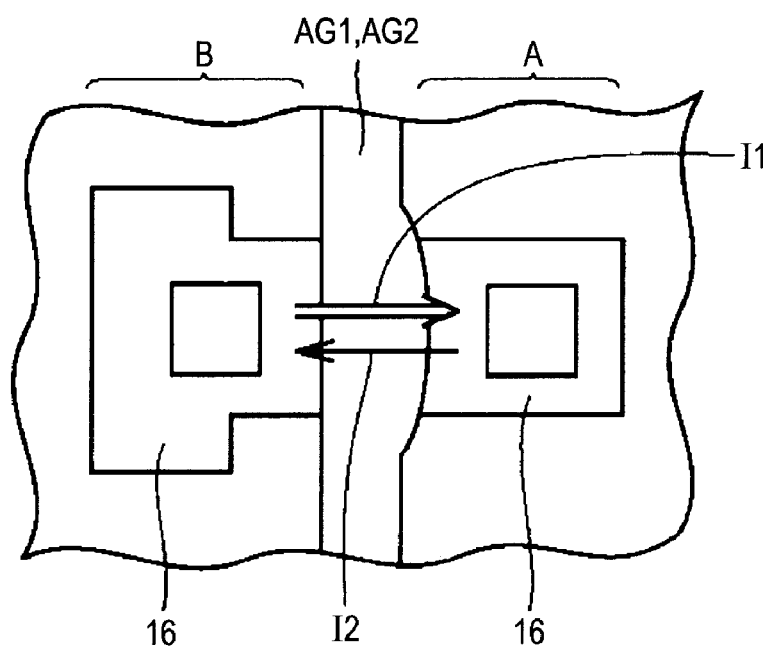
FIG. 115 is a partial plan view for illustrating a current flowing in the access transistor according to the first variation in Embodiment 6.

In this case also, as shown in FIG. 115, if the threshold voltage is the same, the current I1 larger in amount is allowed to flow from the side (area B) coupled to the storage node to the side (area A) coupled to the bit line than the current I2 flowing from the side (area A) coupled to the bit line to the side (area B) coupled to the storage node.

Figure 116:
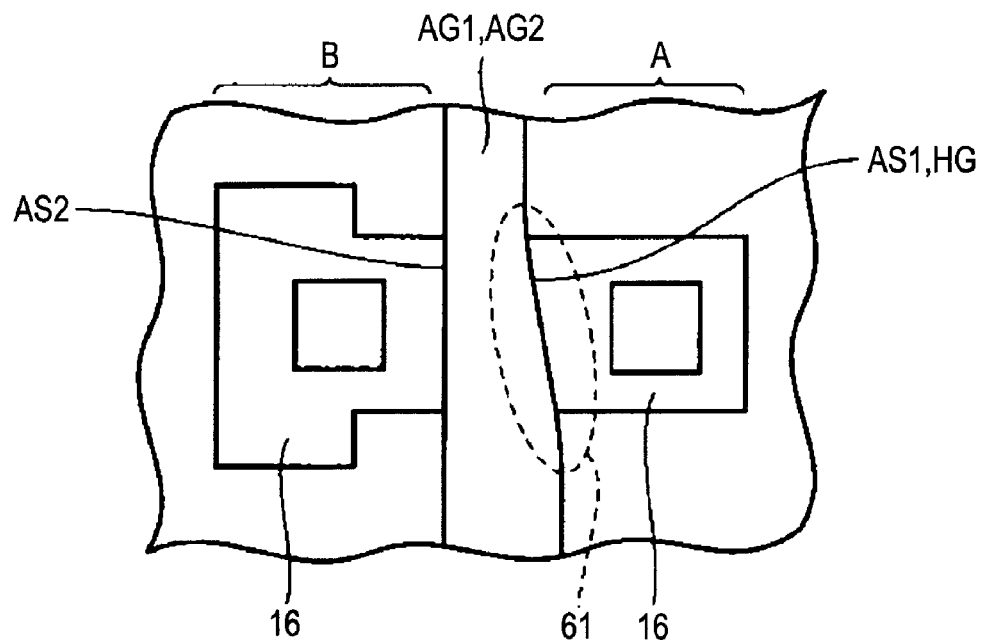
FIG. 116 is a partial plan view showing an access transistor according to a second variation in Embodiment 6.

Alternatively, as shown in FIG. 116, the deformed portion HG may also be such that the side portion AS1 located on the side (in the area A) coupled to the bit line is gradually increased (or reduced) in gate length to be farther away from (or closer to) the side portion AS2 located on the side (in the area B) coupled to the storage node.

Figure 117:
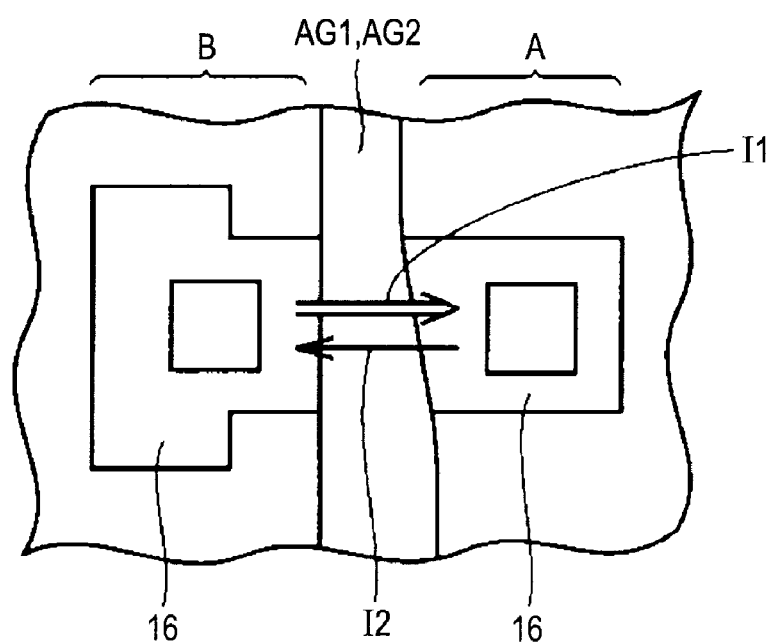
FIG. 117 is a partial plan view for illustrating a current flowing in the access transistor according to the second variation in Embodiment 6.

In this case also, as shown in FIG. 117, if the threshold voltage is the same, the current I1 larger in amount is allowed to flow from the side (area B) coupled to the storage node to the side (area A) coupled to the bit line than the current I2 flowing from the side (area A) coupled to the bit line to the side (area B) coupled to the storage node.

In each of the embodiments described above, as an example of each of the gate electrodes of the individual transistors, the gate electrode has been described in which the High-k film having the predetermined dielectric constant, the metal film having the predetermined work function, and the polysilicon film are stacked. However, it is also possible that the gate insulating film may be a silicon oxide film without using the High-k film, and the structure of the gate electrode corresponding thereto may be a multilayer structure of a doped polysilicon film and a metal silicide film. It will also be appreciated that implantation conditions (an implantation dose, an implantation energy, and an implantation tilt angle) when an impurity such as boron or carbon is implanted to form the halo regions are only exemplary, and may be changed appropriately as necessary.

Further, in each of the embodiments described above, by way of example, the High-k/Metal gate structures according to a "gate-first method" have been described in which the gate structures are formed prior to the formation of the source or drain regions. To the gate structures, a "gate-last method" is also applicable in which the High-k/Metal gate structures are formed after the formation of the source/drain regions. For example, if an example is shown in the case of Embodiment 1, instead of the gate structures formed in the step shown in FIG. 11, dummy gate structures comprised mainly of polysilicon are formed. Thereafter, to at least the steps previous to and including the step of forming the source or drain regions shown in FIG. 27, the same steps as performed in Embodiment 6 are applied. Thereafter, the "gate-last method" has the step of depositing an interlayer insulating film covering the dummy gate structures over a semiconductor substrate, the step of polishing the interlayer insulating film by CMP (Chemical Mechanical Polishing) till the upper surfaces of the dummy gate structures are exposed, and the step of removing the dummy gate structures, and forming the High-k/Metal gate structures instead thereof.

The embodiments disclosed herein are illustrative, and the present invention is not limited thereto. The present invention is not defined by the scope described above but, rather by the claims and is intended to include the meanings equivalent to the claims and all the modifications within the claims.

The present invention is used effectively in a semiconductor device including a static random access memory.

What is claimed is:

1. A method of manufacturing a semiconductor device having a static random access memory, comprising the steps of:

forming an isolation insulating film in a main surface of a semiconductor substrate to define each of a first element formation region where a transistor of a first conductivity type is to be formed and a second element formation region where a transistor of a second conductivity type is to be formed;

forming, in the first element formation region, gate structures including a first gate structure disposed over a region located between a first area and a second area spaced apart from each other, and a second gate structure disposed over a region located between the second area and a third area spaced apart from the second area;

forming a first implantation mask having a first opening exposing a first side surface of the first gate structure facing toward the second area and exposing a region extending from the first side surface to a portion of the second area spaced apart at a predetermined distance from the first side surface, and covering a second side surface of the first gate structure facing toward the first area, the first area, and the second element formation region;

implanting, via the first implantation mask, a first impurity through the first opening at an angle tilted from a direction perpendicular to the main surface of the semiconductor substrate;

removing the first implantation mask;

forming a second implantation mask having a second opening exposing the first gate structure, the second gate structure, the first area, the second area, and the third area, and covering the second element formation region;

implanting, via the second implantation mask, a second impurity of the second conductivity type through the second opening at an angle tilted from a direction perpendicular to the main surface of the semiconductor substrate;

removing the second implantation mask; and forming a bit line electrically coupled to the first area, and forming a wiring which electrically couples an area of the second element formation region serving as a source or drain electrode of the transistor of the second conductivity type to the second area and which serves as a storage node.

2. A method of manufacturing a semiconductor device according to claim 1, wherein, in the step of forming the first implantation mask, the first opening exposes a region extending from the first side surface of the first gate electrode to a third side surface of the second gate structure located close to the second area.

3. A method of manufacturing a semiconductor device according to claim 1, wherein, in the step of forming the first implantation mask, the first opening exposes a region extending from the first side surface of the first gate structure to a third side surface of the second gate structure facing toward the second area, and exposes a region extending from a fourth side surface of the second gate structure facing toward the third area to a portion of the third area spaced apart at a predetermined distance from the fourth side surface.

4. A method of manufacturing a semiconductor device according to claim 3, wherein the step of forming the gate structures includes the step of:

forming, in the first element formation region, a third gate structure disposed over a region located between the third area and a fourth area spaced apart from the third area and a fourth gate structure disposed over a region located between the fourth area and a fifth area spaced apart from the fourth area, wherein, in the step of forming the first implantation mask, the first implantation mask is formed such that the first opening exposes a region extending from the first side surface of the first gate structure to a fifth side surface of the fourth gate structure facing toward the fourth area, and the first implantation mask covers a sixth side surface of the fourth gate structure facing toward the fifth area, and wherein, in the step of forming the second implantation mask, the second implantation mask is formed so as to expose the third gate structure, the fourth gate structure, the fourth area, and the fifth area.

5. A method of manufacturing a semiconductor device according to claim 4, further comprising the step of:

implanting a third impurity of the first conductivity type into each of the first to fifth areas via the first implantation mask.

6. A method of manufacturing a semiconductor device according to claim 4, further comprising the steps of:

after the step of removing the first implantation mask and the step of removing the second implantation mask, forming sidewall spacers over each of the first to fourth gate structures; and, after the step of forming the sidewall spacers, implanting a fourth impurity of the first conductivity type into each of the first to fifth areas.

7. A method of manufacturing a semiconductor device according to claim 2, wherein, in the step of forming the first implantation mask, the first implantation mask is formed so as to cover the fourth side surface of the second gate structure and the third area.

8. A method of manufacturing a semiconductor device according to claim 7, further comprising the step of:

implanting a third impurity of the first conductivity type into each of the first area, the second area, and the third area via the first implantation mask.

9. A method of manufacturing a semiconductor device according to claim 7, further comprising the steps of:

after the step of removing the first implantation mask and the step of removing the second implantation mask, forming sidewall spacers over each of the first gate structure and the second gate structure; and after the step of forming the sidewall spacers, implanting a fourth impurity of the first conductivity type into each of the first area, the second area, and the third area.

10. A method of manufacturing a semiconductor device according to claim 1, wherein, in the first implantation step, carbon is implanted as the first impurity.

11. A method of manufacturing a semiconductor device according to claim 10, wherein, in the first implantation step, an impurity of the second conductivity type is further implanted via the first implantation mask.

12. A method of manufacturing a semiconductor device according to claim 1, wherein, in the first implantation step, an impurity of the second conductivity type is implanted as the first impurity.

13. A method of manufacturing a semiconductor device having a static random access memory including a plurality of memory cells arranged in a matrix of a plurality of columns and rows, comprising the steps of:

forming an isolation insulating film in a main surface of a semiconductor substrate to define a plurality of element formation regions where transistors each of a first conductivity type included in the individual memory cells are to be formed;

forming gate structures each disposed over a region located between a first area and a second area spaced apart from each other in each of the element formation regions, and including first gate structures each extending in the same direction;

implanting a predetermined first impurity in each of the element formation regions at an angle tilted from a direction perpendicular to the main surface of the semiconductor substrate from each of a first direction and a second direction which are orthogonal to the extending direction of the first gate structures; and forming, for each plurality of rows, a bit line electrically coupled to the first area in each of the element formation regions located along one of the rows, and forming a wiring electrically coupled to the second area in each of the element formation regions to serve as a storage node of each of the memory cells, wherein, when the main surface of the semiconductor substrate is viewed in a plan view, a direction extending from the first area toward the second area is the same in each of the element formation regions, and wherein, in the implantation step, an amount of the first impurity implanted from the first direction is set to be different from an amount of the first impurity implanted from the second direction such that the amount of the first impurity implanted in the second area is larger than the amount of the first impurity implanted in the first area.

14. A method of manufacturing a semiconductor device having a static random access memory including a plurality of memory cells arranged in a matrix of a plurality of columns and rows, comprising the steps of:

forming an isolation insulating film in a main surface of a semiconductor substrate to define a plurality of element formation regions where transistors each of a first conductivity type included in the individual memory cells are to be formed;

forming gate structures each disposed over a region located between a first area and a second area spaced apart from each other in each of the element formation regions, and including first gate structures each extending in the same direction;

implanting a predetermined first impurity in each of the element formation regions at an angle tilted from a direction perpendicular to the main surface of the semiconductor substrate from each of a first direction and a second direction which are orthogonal to the extending direction of the first gate structures; and forming, for each plurality of rows, a bit line electrically coupled to the first area in each of the element formation regions located along one of the rows, and forming a wiring electrically coupled to the second area in each of the element formation regions to serve as a storage node of each of the memory cells, wherein, when the main surface of the semiconductor substrate is viewed in a plan view, a direction extending from the first area toward the second area is the same in each of the element formation regions, wherein, in the implantation step, when the main surface of the semiconductor substrate is viewed in a plan view, the first direction matches the direction extending from the first area toward the second area, the second direction matches a direction extending from the second area toward the first area, and wherein the tilt angle when the implantation is performed from the second direction is set to be larger than an angle when the implantation is performed from the first direction.

15. A method of manufacturing a semiconductor device having a static random access memory, comprising the steps of:

forming an isolation insulating film in a main surface of a semiconductor substrate to define each of a first element formation region where a transistor of a first conductivity type is to be formed and a second element formation region where a transistor of a second conductivity type is to be formed;

forming, in the first element formation region, gate structures including a first gate structure disposed over a region located between a first area and a second area spaced apart from each other and a second gate structure disposed over a region located between the second area and a third area spaced apart from the second area;

forming an implantation mask having an opening exposing the first element formation region, and covering the second element formation region;

implanting, via the implantation mask, a first impurity through the opening at an angle tilted from a direction perpendicular to the main surface of the semiconductor substrate;

removing the implantation mask; and forming a bit line electrically coupled to the first area, and forming a wiring which electrically couples an area of the second element formation region serving as a source or drain electrode of the transistor of the second conductivity type to the second area to serve as a storage node, wherein, in the step of forming the gate structures, the first gate structure is formed to have a first side surface facing toward the first area and a second side surface facing toward the second area such that, when the main surface of the semiconductor substrate is viewed in a plan view, in a portion of the first gate structure overlapping the first element formation region, a width of the first gate structure in a direction orthogonal to a direction in which the first gate structure extends varies with progression in the extending direction of the first gate structure.

16. A method of manufacturing a semiconductor device according to claim 15, further comprising the step of:

preparing a photomask having a wiring pattern extending in the first direction for patterning a wiring, wherein the step of forming the gate structures includes the steps of:

performing an exposure process via the photomask to transfer the wiring pattern to a photoresist formed over the semiconductor substrate; and using the wiring pattern transferred to the photoresist to pattern a shape of the portion of the first gate structure overlapping the first element formation region, and wherein, when the main surface of the semiconductor substrate is viewed in a plan view, the wiring pattern of the photomask has a linear first side extending in the first direction, a linear second side parallel with the first side, and a linear third side parallel with the first side, and a distance between the first side and the second side in a second direction perpendicular to the first direction is set larger than a distance between the first side and the third side in the second direction.

17. A semiconductor device having a static random access memory, comprising:
- a first storage node and a second storage node each for storing data therein;
- a first bit line and a second bit line each for performing input and output of data;
- a first access transistor coupled between the first storage node and the first bit line;
- a second access transistor coupled between the second storage node and the second bit line;
- a first drive transistor coupled between the first storage node and a ground line; and
- a second drive transistor coupled between the second storage node and the ground line,
- wherein each of the first access transistor and the second access transistor includes:
- an access gate electrode extending in a predetermined direction;
- a first source or drain region coupled to the corresponding first bit line or the corresponding second bit line, and having an impurity of a first conductivity type;
- a second source or drain region coupled to the corresponding first storage node or the corresponding second storage node, and having the impurity of the first conductivity type;
- a first halo region adjacent to the first source or drain region in an area immediately under the access gate electrode, and having an impurity of a second conductivity type different from the first conductivity type; and
- a second halo region adjacent to the second source or drain region in the area immediately under the access gate electrode, and having the impurity of the second conductivity type at an impurity concentration higher than an impurity concentration of the first halo region, and
- wherein each of the first drive transistor and the second drive transistor includes:
- a third source or drain region coupled to the corresponding first storage node or the corresponding second storage node, and having the impurity of the first conductivity type;
- a fourth source or drain region coupled to the ground line, and having the impurity of the first conductivity type;
- a third halo region adjacent to the third source or drain region in the area immediately under the access gate electrode, and having the impurity of the second conductivity type at an impurity concentration of the same order as that of the impurity concentration of the second halo region; and
- a fourth halo region adjacent to the fourth source or drain region in the area immediately under the access gate electrode, and having the impurity of the second conductivity type at an impurity concentration of the same order as that of the impurity concentration of the second halo region.

18. A semiconductor device having a static random access memory, comprising:
- a first storage node and a second storage node each for storing data therein;
- a first bit line and a second bit line each for performing a data input/output operation;
- a first access transistor coupled between the first storage node and the first bit line;
- a second access transistor coupled between the second storage node and the second bit line;
- a first drive transistor coupled between the first storage node and a ground line; and
- a second drive transistor coupled between the second storage node and the ground line,
- wherein each of the first access transistor and the second access transistor includes:
- an access gate electrode extending in a predetermined direction;
- a first source or drain region coupled to the corresponding first bit line or the corresponding second bit line, and having an impurity of a first conductivity type;
- a second source or drain region coupled to the corresponding first storage node or the corresponding second storage node, and having the impurity of the first conductivity type;
- a first halo region adjacent to the first source or drain region in an area immediately under the access gate electrode, and having an impurity of a second conductivity type; and
- a second halo region adjacent to the second source or drain region in the area immediately under the access gate electrode, and having the impurity of the second conductivity type at an impurity concentration higher than an impurity concentration of the first halo region, and
- wherein each of the first drive transistor and the second drive transistor includes:
- a third source or drain region coupled to the corresponding first storage node or the corresponding second storage node, and having the impurity of the first conductivity type;
- a fourth source or drain region coupled to the ground line, and having the impurity of the first conductivity type;
- a third halo region adjacent to the third source or drain region in the area immediately under the access gate electrode, and having the impurity of the second conductivity type at an impurity concentration of the same order as that of the impurity concentration of the second halo region; and
- a fourth halo region adjacent to the fourth source or drain region in the area immediately under the access gate electrode, and having the impurity of the second conductivity type at an impurity concentration of the same order as that of the impurity concentration of the first halo region.

19. A semiconductor device having a static random access memory, comprising:
- a first storage node and a second storage node each for storing data therein;
- a first bit line and a second bit line each for performing a data input/output operation;
- a first access transistor coupled between the first storage node and the first bit line;
- a second access transistor coupled between the second storage node and the second bit line;
- a first drive transistor coupled between the first storage node and a ground line; and
- a second drive transistor coupled between the second storage node and the ground line,
- wherein each of the first access transistor and the second access transistor includes:
- an access gate electrode;
- a first source or drain region coupled to the corresponding first bit line or the corresponding second bit line, and having an impurity of a first conductivity type;
- a second source or drain region coupled to the corresponding first storage node or the corresponding second storage node, and having the impurity of the first conductivity type;

a first halo region adjacent to the first source or drain region in an area immediately under the access gate electrode, and having an impurity of a second conductivity type different from the first conductivity type; and a second halo region adjacent to the second source or drain region in the area immediately under the access gate electrode, and having the impurity of the second conductivity type and carbon.

20. A semiconductor device having a static random access memory, comprising:

a first storage node and a second storage node each for storing data therein;

a first bit line and a second bit line each for performing a data input/output operation;

a first access transistor coupled between the first storage node and the first bit line; and a second access transistor coupled between the second storage node and the second bit line, wherein each of the first access transistor and the second access transistor includes:

an access gate electrode extending in a predetermined direction, wherein the access gate electrode is formed in a main surface of a semiconductor substrate, and disposed to traverse an element formation region having a peripheral edge thereof defined by an isolation insulating film, and wherein the access gate electrode is formed such that, when the main surface of the semiconductor substrate is viewed in a plan view, in a portion of the access gate electrode overlapping the element formation region, a width of the access gate electrode in a direction orthogonal to the extending direction of the access gate electrode varies with progression in the extending direction of the access gate electrode.

* * * * *